US011063694B2

(12) United States Patent
Coulombe et al.

(10) Patent No.: US 11,063,694 B2
(45) Date of Patent: Jul. 13, 2021

(54) CHECKSUM-FILTERED DECODING, CHECKSUM-AIDED FORWARD ERROR CORRECTION OF DATA PACKETS, FORWARD ERROR CORRECTION OF DATA USING BIT ERASURE CHANNELS AND SUB-SYMBOL LEVEL DECODING FOR ERRONEOUS FOUNTAIN CODES

(71) Applicant: SOCOVAR, SOCIÉTÉ EN COMMANDITE, Montreal (CA)

(72) Inventors: Stéphane Coulombe, Brossard (CA); Firouzeh Golaghazadeh, Ottawa (CA)

(73) Assignee: ÉCOLE DE TECHNOLOGIE SUPERIEURE, Montréal (CA)

( * ) Notice: Subject to any disclaimer, the term of this patent is extended or adjusted under 35 U.S.C. 154(b) by 0 days.

(21) Appl. No.: 16/327,991

(22) PCT Filed: Sep. 7, 2017

(86) PCT No.: PCT/CA2017/051046
§ 371 (c)(1),
(2) Date: Feb. 25, 2019

(87) PCT Pub. No.: WO2018/045459
PCT Pub. Date: Mar. 15, 2018

(65) Prior Publication Data

US 2019/0229844 A1 Jul. 25, 2019

Related U.S. Application Data

(60) Provisional application No. 62/385,475, filed on Sep. 9, 2016, provisional application No. 62/405,906, filed
(Continued)

(51) Int. Cl.
*H04L 1/00* (2006.01)
*H03M 13/37* (2006.01)

(52) U.S. Cl.
CPC ...... *H04L 1/0045* (2013.01); *H03M 13/3761* (2013.01); *H04L 1/0057* (2013.01); *H04L 1/0061* (2013.01)

(58) Field of Classification Search
CPC ... H04L 1/0045; H04L 1/0057; H04L 1/0061; H03M 13/3761
See application file for complete search history.

(56) References Cited

U.S. PATENT DOCUMENTS

| | | | | |
|---|---|---|---|---|
| 5,898,713 A * | 4/1999 | Melzer | H04L 1/0061 709/230 |
| 6,968,498 B1 * | 11/2005 | Pal | H04L 1/0061 714/48 |

(Continued)

FOREIGN PATENT DOCUMENTS

| | | |
|---|---|---|
| CA | 2969143 A1 | 7/2016 |

OTHER PUBLICATIONS

Khan, S.A., et al., "Protocols and Mechanisms to Recover Failed Packets in Wireless Networks: History and Evolution", Trends and Advances for Ambient Intelligence with Internet of Things (IoT) systems, IEEE Access vol. 4, Date of Publication: Jul. 20, 2016, pp. 4207-4224). (Year: 2016).*

(Continued)

*Primary Examiner* — Kyle Vallecillo
(74) *Attorney, Agent, or Firm* — Anglehart et al.

(57) ABSTRACT

A method, device and system for correcting errors in a group of received packets having a redundant packet. The method includes determining an inconsistent bit indicator for a bit position of the packets, determining a bit reliability indicator indicative of a potential bit error location in at least one packet, calculating a number of potential bit error locations for the bit position and identifying a correctable bit location accordingly. A method, device and system for correcting an error in a received packet. The method is adapted to calcu-
(Continued)

late a checksum value of the received packet, verify if the checksum value is indicative of at least one bit error in the received packet, identify a predefined Checksum Pattern Type (CPT) according to the checksum value and determine at least one bit error event (BEE) accordingly. A method, device and system for decoding a plurality of received fountain encoded symbols.

16 Claims, 69 Drawing Sheets

Related U.S. Application Data on Oct. 8, 2016, provisional application No. 62/472,124, filed on Mar. 16, 2017, provisional application No. 62/519,133, filed on Jun. 13, 2017.

(56) References Cited

U.S. PATENT DOCUMENTS

| | | | | |
|---|---|---|---|---|
| 7,689,981 | B1 * | 3/2010 | Gustafson | G06F 11/1004 717/168 |
| 8,204,225 | B2 * | 6/2012 | Balabine | H04L 63/04 380/270 |
| 9,063,664 | B1 * | 6/2015 | Li | G06F 3/0641 |
| 9,087,086 | B1 * | 7/2015 | Li | G06F 16/1748 |
| 2005/0216815 | A1 * | 9/2005 | Novotny | H04N 19/70 714/758 |
| 2006/0088060 | A1 * | 4/2006 | Fujikami | H04L 1/0041 370/474 |
| 2007/0136741 | A1 * | 6/2007 | Stattenfield | G11B 27/105 725/32 |
| 2008/0098440 | A1 * | 4/2008 | Nagano | H04H 20/57 725/75 |
| 2010/0199159 | A1 * | 8/2010 | Isnardi | H03M 13/096 714/807 |
| 2012/0066551 | A1 * | 3/2012 | Palus | G06F 11/28 714/39 |
| 2013/0067187 | A1 * | 3/2013 | Moss | G06F 3/0689 711/170 |
| 2014/0223268 | A1 * | 8/2014 | Yseboodt | G06F 11/1004 714/807 |
| 2014/0294229 | A1 * | 10/2014 | Le Guelvouit | G06T 1/0057 382/100 |
| 2015/0278010 | A1 * | 10/2015 | Rohleder | G06F 11/1004 714/807 |
| 2017/0324519 | A1 | 11/2017 | Guo et al. | |
| 2017/0374405 | A1 * | 12/2017 | Feldman | H04N 21/4425 |

OTHER PUBLICATIONS

F. Golaghazadeh et al., "Low Complexity H.264 List decoder Enhanced Quality Real-time Video over IP," the 30th annual IEEE Canadian conference on electrical and computer engineering (CCECE 2017), Apr. 2017.

Firouzeh Golaghazadeh et al., Checksum-Filtered List Decoding Applied to H.264 and H.265 Video Error Correction, IEEE Transactions on Circuits and Systems for Video Technology (in press), Mar. 2017.

François Caron et al., A maximum likelihood approach to video error correction applied to H.264 decoding, Conference Paper• Sep. 2012.

PCT/CA2017/051046 International Preliminary Report on Patentability.

PCT/CA2017/051046 International Search Report.

PCT/CA2017/051046 Search Strategy.

* cited by examiner

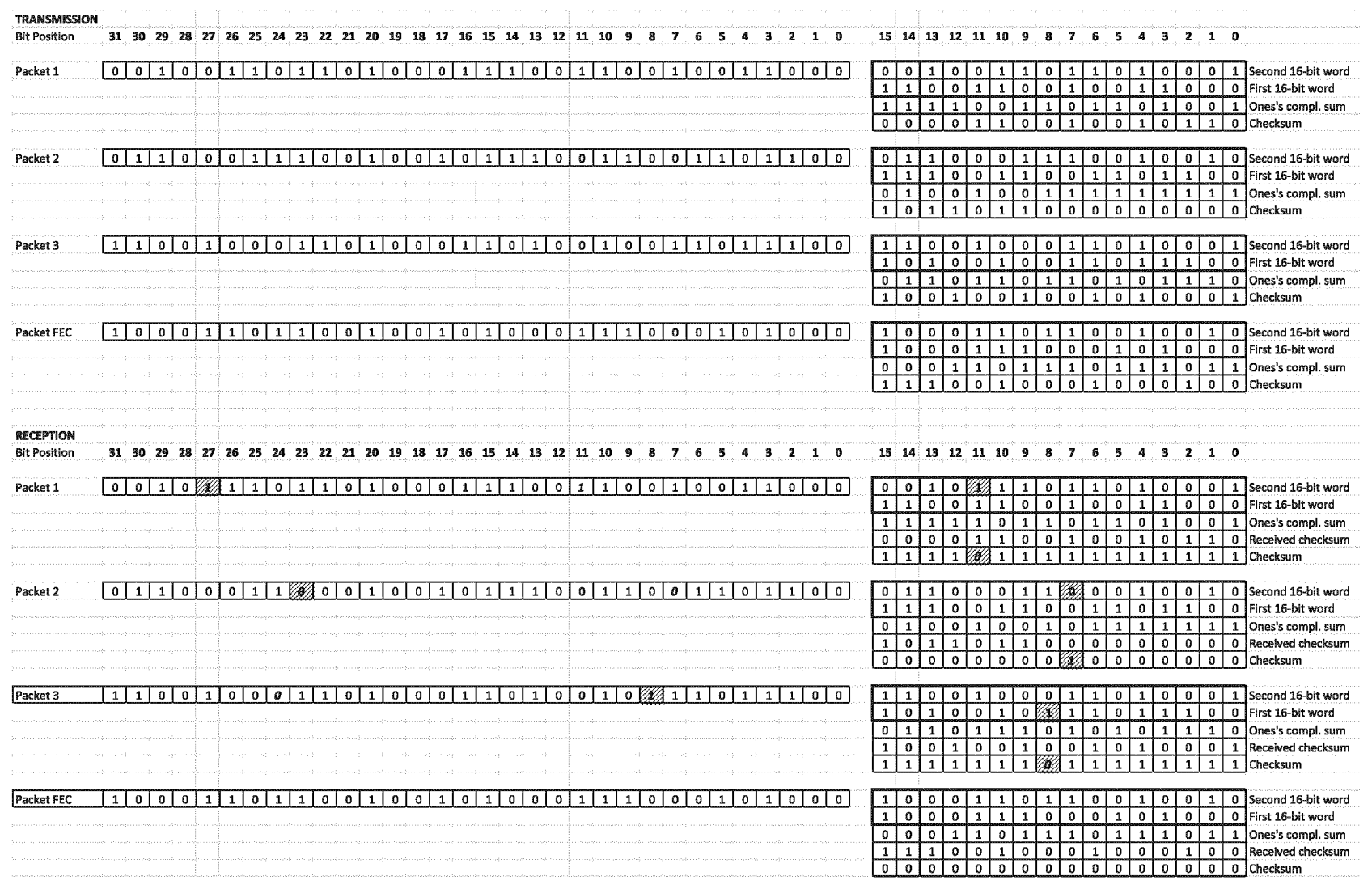

TRANSMISSION

| Bit Position | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| Packet 1 | 0 | 0 | 1 | 0 | 0 | 1 | 1 | 0 | 1 | 1 | 0 | 1 | 0 | 0 | 0 | 1 | 1 | 1 | 0 | 0 | 1 | 1 | 0 | 0 | 1 | 0 | 0 | 1 | 1 | 0 | 0 | 0 |
| Packet 2 | 0 | 1 | 1 | 0 | 0 | 0 | 1 | 1 | 1 | 0 | 0 | 1 | 0 | 0 | 1 | 0 | 1 | 1 | 1 | 0 | 0 | 1 | 1 | 0 | 0 | 1 | 1 | 0 | 1 | 1 | 0 | 0 |
| Packet 3 | 1 | 1 | 0 | 0 | 1 | 0 | 0 | 0 | 1 | 1 | 0 | 1 | 0 | 0 | 0 | 1 | 1 | 0 | 1 | 0 | 0 | 1 | 0 | 0 | 1 | 1 | 0 | 1 | 1 | 1 | 0 | 0 |
| Packet FEC | 1 | 0 | 0 | 0 | 1 | 1 | 0 | 1 | 1 | 0 | 0 | 1 | 0 | 0 | 1 | 0 | 1 | 0 | 0 | 0 | 1 | 1 | 1 | 0 | 0 | 0 | 1 | 0 | 1 | 0 | 0 | 0 |

| Packet | 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|---|
| Packet 1 | 0 | 0 | 1 | 0 | 0 | 1 | 1 | 0 | 1 | 1 | 0 | 1 | 0 | 0 | 0 | 1 | Second 16-bit word |
| | 1 | 1 | 0 | 0 | 1 | 1 | 0 | 0 | 1 | 0 | 0 | 1 | 1 | 0 | 0 | 0 | First 16-bit word |
| | 1 | 1 | 1 | 1 | 0 | 0 | 1 | 1 | 0 | 1 | 1 | 0 | 1 | 0 | 0 | 1 | Ones's compl. sum |
| | 0 | 0 | 0 | 0 | 1 | 1 | 0 | 0 | 1 | 0 | 0 | 1 | 0 | 1 | 1 | 0 | Checksum |
| Packet 2 | 0 | 1 | 1 | 0 | 0 | 0 | 1 | 1 | 1 | 0 | 0 | 1 | 0 | 0 | 1 | 0 | Second 16-bit word |
| | 1 | 1 | 1 | 0 | 0 | 1 | 1 | 0 | 0 | 1 | 1 | 0 | 1 | 1 | 0 | 0 | First 16-bit word |
| | 0 | 1 | 0 | 0 | 1 | 0 | 0 | 1 | 1 | 1 | 1 | 1 | 1 | 1 | 1 | 1 | Ones's compl. sum |
| | 1 | 0 | 1 | 1 | 0 | 1 | 1 | 0 | 0 | 0 | 0 | 0 | 0 | 0 | 0 | 0 | Checksum |
| Packet 3 | 1 | 1 | 0 | 0 | 1 | 0 | 0 | 0 | 1 | 1 | 0 | 1 | 0 | 0 | 0 | 1 | Second 16-bit word |
| | 1 | 0 | 1 | 0 | 0 | 1 | 0 | 0 | 1 | 1 | 0 | 1 | 1 | 1 | 0 | 0 | First 16-bit word |
| | 0 | 1 | 1 | 0 | 1 | 1 | 0 | 1 | 1 | 0 | 1 | 0 | 1 | 1 | 1 | 0 | Ones's compl. sum |
| | 1 | 0 | 0 | 1 | 0 | 0 | 1 | 0 | 0 | 1 | 0 | 1 | 0 | 0 | 0 | 1 | Checksum |
| Packet FEC | 1 | 0 | 0 | 0 | 1 | 1 | 0 | 1 | 1 | 0 | 0 | 1 | 0 | 0 | 1 | 0 | Second 16-bit word |
| | 1 | 0 | 0 | 0 | 1 | 1 | 1 | 0 | 0 | 0 | 1 | 0 | 1 | 0 | 0 | 0 | First 16-bit word |
| | 0 | 0 | 0 | 1 | 1 | 0 | 1 | 1 | 1 | 0 | 1 | 1 | 1 | 0 | 1 | 1 | Ones's compl. sum |
| | 1 | 1 | 1 | 0 | 0 | 1 | 0 | 0 | 0 | 1 | 0 | 0 | 0 | 1 | 0 | 0 | Checksum |

RECEPTION

| Bit Position | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| Packet 1 | 0 | 0 | 1 | 0 | *1* | 1 | 1 | 0 | 1 | 1 | 0 | 1 | 0 | 0 | 0 | 1 | 1 | 1 | 0 | 0 | *1* | 1 | 0 | 0 | 1 | 0 | 0 | 1 | 1 | 0 | 0 | 0 |
| Packet 2 | 0 | 1 | 1 | 0 | 0 | 0 | 1 | 1 | *0* | 0 | 0 | 1 | 0 | 0 | 1 | 0 | 1 | 1 | 1 | 0 | 0 | 1 | 1 | 0 | *0* | 1 | 1 | 0 | 1 | 1 | 0 | 0 |
| Packet 3 | 1 | 1 | 0 | 0 | 1 | 0 | 0 | *0* | 1 | 1 | 0 | 1 | 0 | 0 | 0 | 1 | 1 | 0 | 1 | 0 | 0 | 1 | 0 | *1* | 1 | 1 | 0 | 1 | 1 | 1 | 0 | 0 |
| Packet FEC | 1 | 0 | 0 | 0 | 1 | 1 | 0 | 1 | 1 | 0 | 0 | 1 | 0 | 0 | 1 | 0 | 1 | 0 | 0 | 0 | 1 | 1 | 1 | 0 | 0 | 0 | 1 | 0 | 1 | 0 | 0 | 0 |

| Packet | 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|---|
| Packet 1 | 0 | 0 | 1 | 0 | *1* | 1 | 1 | 0 | 1 | 1 | 0 | 1 | 0 | 0 | 0 | 1 | Second 16-bit word |
| | 1 | 1 | 0 | 0 | 1 | 1 | 0 | 0 | 1 | 0 | 0 | 1 | 1 | 0 | 0 | 0 | First 16-bit word |
| | 1 | 1 | 1 | 1 | 1 | 0 | 1 | 1 | 0 | 1 | 1 | 0 | 1 | 0 | 0 | 1 | Ones's compl. sum |
| | 0 | 0 | 0 | 0 | 1 | 1 | 0 | 0 | 1 | 0 | 0 | 1 | 0 | 1 | 1 | 0 | Received checksum |
| | 1 | 1 | 1 | 1 | *0* | 1 | 1 | 1 | 1 | 1 | 1 | 1 | 1 | 1 | 1 | 1 | Checksum |
| Packet 2 | 0 | 1 | 1 | 0 | 0 | 0 | 1 | 1 | *0* | 0 | 0 | 1 | 0 | 0 | 1 | 0 | Second 16-bit word |
| | 1 | 1 | 1 | 0 | 0 | 1 | 1 | 0 | 0 | 1 | 1 | 0 | 1 | 1 | 0 | 0 | First 16-bit word |
| | 0 | 1 | 0 | 0 | 1 | 0 | 0 | 1 | 0 | 1 | 1 | 1 | 1 | 1 | 1 | 1 | Ones's compl. sum |
| | 1 | 0 | 1 | 1 | 0 | 1 | 1 | 0 | 0 | 0 | 0 | 0 | 0 | 0 | 0 | 0 | Received checksum |
| | 0 | 0 | 0 | 0 | 0 | 0 | 0 | 0 | *1* | 0 | 0 | 0 | 0 | 0 | 0 | 0 | Checksum |
| Packet 3 | 1 | 1 | 0 | 0 | 1 | 0 | 0 | 0 | 1 | 1 | 0 | 1 | 0 | 0 | 0 | 1 | Second 16-bit word |
| | 1 | 0 | 1 | 0 | 0 | 1 | 0 | *1* | 1 | 1 | 0 | 1 | 1 | 1 | 0 | 0 | First 16-bit word |
| | 0 | 1 | 1 | 0 | 1 | 1 | 1 | 0 | 1 | 0 | 1 | 0 | 1 | 1 | 1 | 0 | Ones's compl. sum |
| | 1 | 0 | 0 | 1 | 0 | 0 | 1 | 0 | 0 | 1 | 0 | 1 | 0 | 0 | 0 | 1 | Received checksum |
| | 1 | 1 | 1 | 1 | 1 | 1 | 1 | *0* | 1 | 1 | 1 | 1 | 1 | 1 | 1 | 1 | Checksum |
| Packet FEC | 1 | 0 | 0 | 0 | 1 | 1 | 0 | 1 | 1 | 0 | 0 | 1 | 0 | 0 | 1 | 0 | Second 16-bit word |
| | 1 | 0 | 0 | 0 | 1 | 1 | 1 | 0 | 0 | 0 | 1 | 0 | 1 | 0 | 0 | 0 | First 16-bit word |
| | 0 | 0 | 0 | 1 | 1 | 0 | 1 | 1 | 1 | 0 | 1 | 1 | 1 | 0 | 1 | 1 | Ones's compl. sum |
| | 1 | 1 | 1 | 0 | 0 | 1 | 0 | 0 | 0 | 1 | 0 | 0 | 0 | 1 | 0 | 0 | Received checksum |
| | 0 | 0 | 0 | 0 | 0 | 0 | 0 | 0 | 0 | 0 | 0 | 0 | 0 | 0 | 0 | 0 | Checksum |

FIG. 7A

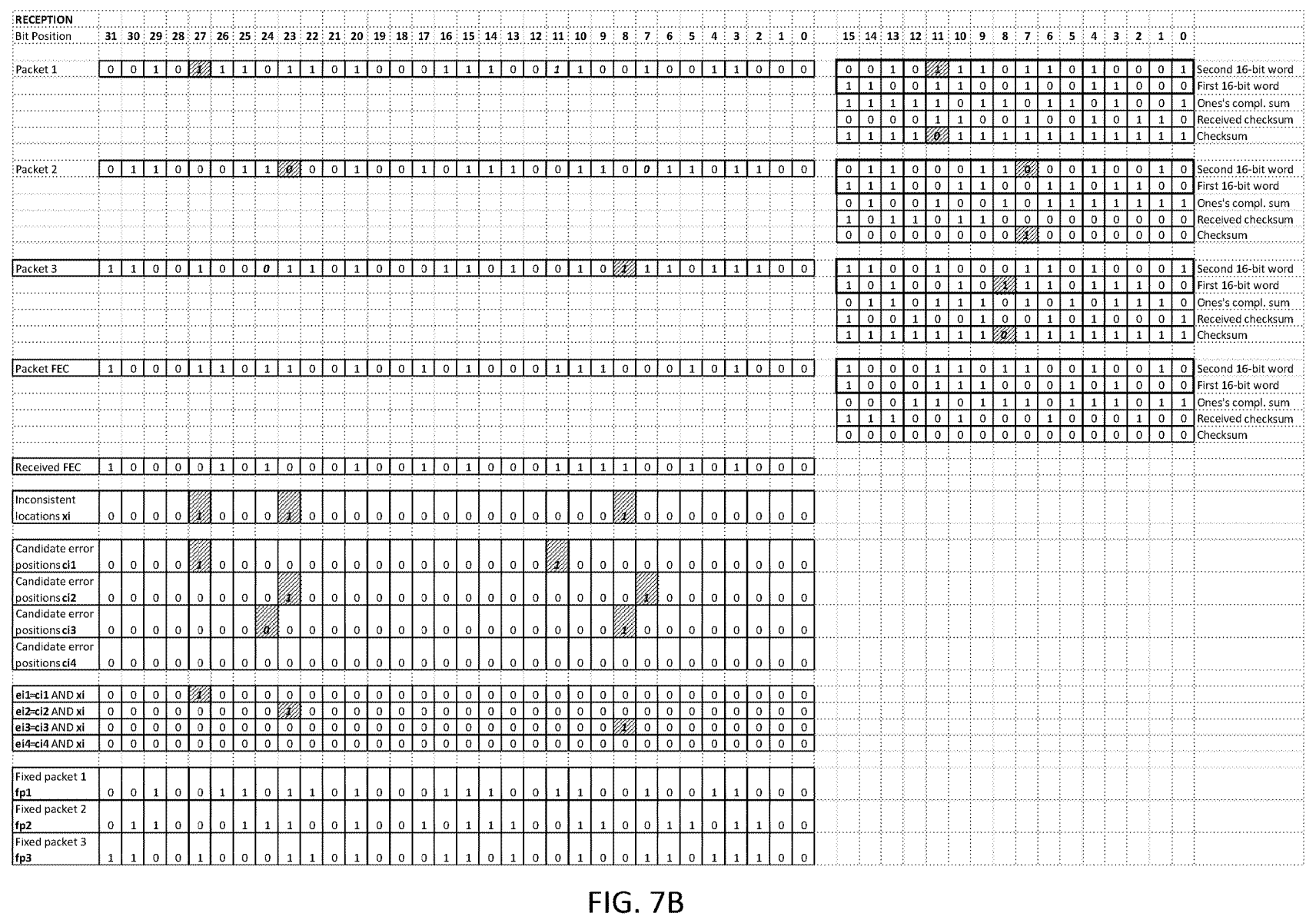

RECEPTION

| Bit Position | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| Packet 1 | 0 | 0 | 1 | 0 | 1 | 1 | 1 | 0 | 1 | 1 | 0 | 1 | 0 | 0 | 0 | 1 | 1 | 1 | 0 | 0 | 1 | 1 | 0 | 0 | 1 | 0 | 0 | 1 | 1 | 0 | 0 | 0 |
| Packet 2 | 0 | 1 | 1 | 0 | 0 | 0 | 1 | 1 | 0 | 0 | 0 | 1 | 0 | 0 | 1 | 0 | 1 | 1 | 1 | 0 | 0 | 1 | 1 | 0 | 0 | 1 | 1 | 0 | 1 | 1 | 0 | 0 |
| Packet 3 | 1 | 1 | 0 | 0 | 1 | 0 | 0 | 0 | 1 | 1 | 0 | 1 | 0 | 0 | 0 | 1 | 1 | 0 | 1 | 0 | 0 | 1 | 0 | 1 | 1 | 1 | 0 | 1 | 1 | 1 | 0 | 0 |
| Packet FEC | 1 | 0 | 0 | 0 | 1 | 1 | 0 | 1 | 1 | 0 | 0 | 1 | 0 | 0 | 1 | 0 | 1 | 0 | 0 | 0 | 1 | 1 | 1 | 0 | 0 | 0 | 1 | 0 | 1 | 0 | 0 | 0 |
| Received FEC | 1 | 0 | 0 | 0 | 0 | 1 | 0 | 1 | 0 | 0 | 0 | 1 | 0 | 0 | 1 | 0 | 1 | 0 | 0 | 0 | 1 | 1 | 1 | 1 | 0 | 0 | 1 | 0 | 1 | 0 | 0 | 0 |
| Inconsistent locations **xi** | 0 | 0 | 0 | 0 | 1 | 0 | 0 | 0 | 1 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| Candidate error positions **ci1** | 0 | 0 | 0 | 0 | 1 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 |
| Candidate error positions **ci2** | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 |
| Candidate error positions **ci3** | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| Candidate error positions **ci4** | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| **ei1=ci1** AND **xi** | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| **ei2=ci2** AND **xi** | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| **ei3=ci3** AND **xi** | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| **ei4=ci4** AND **xi** | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| Fixed packet 1 **fp1** | 0 | 0 | 1 | 0 | 0 | 1 | 1 | 0 | 1 | 1 | 0 | 1 | 0 | 0 | 0 | 1 | 1 | 1 | 0 | 0 | 1 | 1 | 0 | 0 | 1 | 0 | 0 | 1 | 1 | 0 | 0 | 0 |
| Fixed packet 2 **fp2** | 0 | 1 | 1 | 0 | 0 | 0 | 1 | 1 | 1 | 0 | 0 | 1 | 0 | 0 | 1 | 0 | 1 | 1 | 1 | 0 | 0 | 1 | 1 | 0 | 0 | 1 | 1 | 0 | 1 | 1 | 0 | 0 |
| Fixed packet 3 **fp3** | 1 | 1 | 0 | 0 | 1 | 0 | 0 | 0 | 1 | 1 | 0 | 1 | 0 | 0 | 0 | 1 | 1 | 0 | 1 | 0 | 0 | 1 | 0 | 0 | 1 | 1 | 0 | 1 | 1 | 1 | 0 | 0 |

| 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|
| 0 | 0 | 1 | 0 | 1 | 1 | 1 | 0 | 1 | 1 | 0 | 1 | 0 | 0 | 0 | 1 | Second 16-bit word |
| 1 | 1 | 0 | 0 | 1 | 1 | 0 | 0 | 1 | 0 | 0 | 1 | 1 | 0 | 0 | 0 | First 16-bit word |
| 1 | 1 | 1 | 1 | 1 | 0 | 1 | 1 | 0 | 1 | 1 | 0 | 1 | 0 | 0 | 1 | Ones's compl. sum |
| 0 | 0 | 0 | 0 | 1 | 1 | 0 | 0 | 1 | 0 | 0 | 1 | 0 | 1 | 1 | 0 | Received checksum |
| 1 | 1 | 1 | 1 | 0 | 1 | 1 | 1 | 1 | 1 | 1 | 1 | 1 | 1 | 1 | 1 | Checksum |
| 0 | 1 | 1 | 0 | 0 | 0 | 1 | 1 | 0 | 0 | 0 | 1 | 0 | 0 | 1 | 0 | Second 16-bit word |
| 1 | 1 | 1 | 0 | 0 | 1 | 1 | 0 | 0 | 1 | 1 | 0 | 1 | 1 | 0 | 0 | First 16-bit word |
| 0 | 1 | 0 | 0 | 1 | 0 | 0 | 1 | 0 | 1 | 1 | 1 | 1 | 1 | 1 | 1 | Ones's compl. sum |
| 1 | 0 | 1 | 1 | 0 | 1 | 1 | 0 | 0 | 0 | 0 | 0 | 0 | 0 | 0 | 0 | Received checksum |
| 0 | 0 | 0 | 0 | 0 | 0 | 0 | 0 | 1 | 0 | 0 | 0 | 0 | 0 | 0 | 0 | Checksum |
| 1 | 1 | 0 | 0 | 1 | 0 | 0 | 0 | 1 | 1 | 0 | 1 | 0 | 0 | 0 | 1 | Second 16-bit word |
| 1 | 0 | 1 | 0 | 0 | 1 | 0 | 1 | 1 | 1 | 0 | 1 | 1 | 1 | 0 | 0 | First 16-bit word |
| 0 | 1 | 1 | 0 | 1 | 1 | 1 | 0 | 1 | 0 | 1 | 0 | 1 | 1 | 1 | 0 | Ones's compl. sum |
| 1 | 0 | 0 | 1 | 0 | 0 | 1 | 0 | 0 | 1 | 0 | 1 | 0 | 0 | 0 | 1 | Received checksum |
| 1 | 1 | 1 | 1 | 1 | 1 | 1 | 0 | 1 | 1 | 1 | 1 | 1 | 1 | 1 | 1 | Checksum |
| 1 | 0 | 0 | 0 | 1 | 1 | 0 | 1 | 1 | 0 | 0 | 1 | 0 | 0 | 1 | 0 | Second 16-bit word |
| 1 | 0 | 0 | 0 | 1 | 1 | 1 | 0 | 0 | 0 | 1 | 0 | 1 | 0 | 0 | 0 | First 16-bit word |
| 0 | 0 | 0 | 1 | 1 | 0 | 1 | 1 | 1 | 0 | 1 | 1 | 1 | 0 | 1 | 1 | Ones's compl. sum |
| 1 | 1 | 1 | 0 | 0 | 1 | 0 | 0 | 0 | 1 | 0 | 0 | 0 | 1 | 0 | 0 | Received checksum |
| 0 | 0 | 0 | 0 | 0 | 0 | 0 | 0 | 0 | 0 | 0 | 0 | 0 | 0 | 0 | 0 | Checksum |

FIG. 7B

| TRANSMISSION | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| Bit Position | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
| | | | | | | | | | | | | | | | | | | | | | | | | | | | | | | | | |
| Packet 1 | 0 | 0 | 1 | 0 | 0 | 1 | 1 | 0 | 1 | 1 | 0 | 1 | 0 | 0 | 0 | 1 | 1 | 1 | 0 | 0 | 1 | 1 | 0 | 0 | 1 | 0 | 0 | 1 | 1 | 0 | 0 | 0 |

80A

| | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| | | | | | | | | | | | | | | | | |
| Second 16-bit word | 0 | 0 | 1 | 0 | 0 | 1 | 1 | 0 | 1 | 1 | 0 | 1 | 0 | 0 | 0 | 1 |
| First 16-bit word | 1 | 1 | 0 | 0 | 1 | 1 | 0 | 0 | 1 | 0 | 0 | 1 | 1 | 0 | 0 | 0 |
| Ones's compl. sum | 1 | 1 | 1 | 1 | 0 | 0 | 1 | 1 | 0 | 1 | 1 | 0 | 1 | 0 | 0 | 1 |
| Checksum | 0 | 0 | 0 | 0 | 1 | 1 | 0 | 0 | 1 | 0 | 0 | 1 | 0 | 1 | 1 | 0 |

80B
80C
82
84

PRIOR ART

FIG. 8A

| TRANSMISSION | | | | | | | | | | | | | | | | |
|---|---|---|---|---|---|---|---|---|---|---|---|---|---|---|---|---|
| Bit Position | 31 | 30 | 29 | 28 | 27 | 26 | 25 | 24 | 23 | 22 | 21 | 20 | 19 | 18 | 17 | 16 |
| Packet 1 | 0 | 0 | 1 | 0 | 0 | 1 | 1 | 0 | 1 | 1 | 0 | 1 | 0 | 0 | 0 | 1 |

| TRANSMISSION (cont.) | | | | | | | | | | | | | | | | |
|---|---|---|---|---|---|---|---|---|---|---|---|---|---|---|---|---|
| Bit Position | 15 | 14 | 13 | 12 | 11 | 10 | 9 | 8 | 7 | 6 | 5 | 4 | 3 | 2 | 1 | 0 |
| Packet 1 | 1 | 1 | 0 | 0 | 1 | 1 | 0 | 0 | 1 | 0 | 0 | 1 | 1 | 0 | 0 | 0 |

80A

| RECEPTION | | | | | | | | | | | | | | | | |
|---|---|---|---|---|---|---|---|---|---|---|---|---|---|---|---|---|
| Bit Position | 31 | 30 | 29 | 28 | 27 | 26 | 25 | 24 | 23 | 22 | 21 | 20 | 19 | 18 | 17 | 16 |
| Packet 1 | 0 | 0 | 1 | 0 | 1 | 1 | 1 | 0 | 1 | 1 | 0 | 1 | 0 | 0 | 0 | 1 |

| RECEPTION (cont.) | | | | | | | | | | | | | | | | |
|---|---|---|---|---|---|---|---|---|---|---|---|---|---|---|---|---|
| Bit Position | 15 | 14 | 13 | 12 | 11 | 10 | 9 | 8 | 7 | 6 | 5 | 4 | 3 | 2 | 1 | 0 |
| Packet 1 | 1 | 1 | 0 | 0 | 1 | 1 | 0 | 0 | 1 | 0 | 0 | 1 | 1 | 0 | 0 | 0 |

86A

96A

96B

| | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Second 16-bit word | 0 | 0 | 1 | 0 | 1 | 1 | 1 | 0 | 1 | 1 | 0 | 1 | 0 | 0 | 0 | 1 |
| First 16-bit word | 1 | 1 | 0 | 0 | 1 | 1 | 0 | 0 | 1 | 0 | 0 | 1 | 1 | 0 | 0 | 0 |
| Ones's compl. sum | 1 | 1 | 1 | 1 | 1 | 0 | 1 | 1 | 0 | 1 | 1 | 0 | 1 | 0 | 0 | 1 |
| Received checksum | 0 | 0 | 0 | 0 | 1 | 1 | 0 | 0 | 1 | 0 | 0 | 1 | 0 | 1 | 1 | 0 |
| Checksum | 1 | 1 | 1 | 1 | 0 | 1 | 1 | 1 | 1 | 1 | 1 | 1 | 1 | 1 | 1 | 1 |

86B 86C 88 90 92 94

PRIOR ART

| $w_{i,c}$ | $\hat{w}_{i,c}$ | Condition | $\hat{w}_{i,c} + \overline{w}_{i,c}$ | Carry | |
|---|---|---|---|---|---|
| 0 | 0 | no error | 1 | 0 | 812 |
| 0 | 1 | error (0 → 1) | 0 | 1 | 816 |
| 1 | 0 | error (1 → 0) | 0 | 0 | 818 |
| 1 | 1 | no error | 1 | 0 | 814 |

| BEE | Definition |
|---|---|
| BEE=1 | 1 bit in error |
| BEE=2 | 2 bits in error; same bit value, different columns |
| BEE=3 | 2 bits in error; same bit value, same column |
| BEE=4 | 2 bits in error; different bit values, different columns |
| BEE=5 | 2 bits in error; different bit values, same column |

FIG. 9B

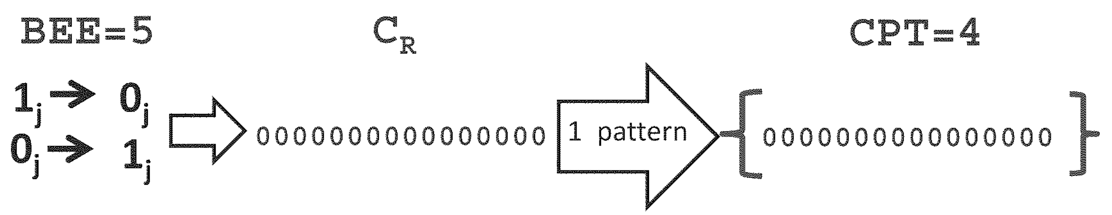
FIG. 14
1500
| CPT | Definition |
|---|---|
| CPT=1 | one bit 1 and fifteen bits 0 or vice versa |
| CPT=2.1 | two successive bits 1 and fourteen bits 0 or vice versa |
| CPT=2.2 | two non-successive bits 1 and fourteen bits 0 or vice versa |
| CPT=3 | three to thirteen consecutive bits 1 between zeros |
| CPT=4 | sixteen bits 0 |
FIG. 15A
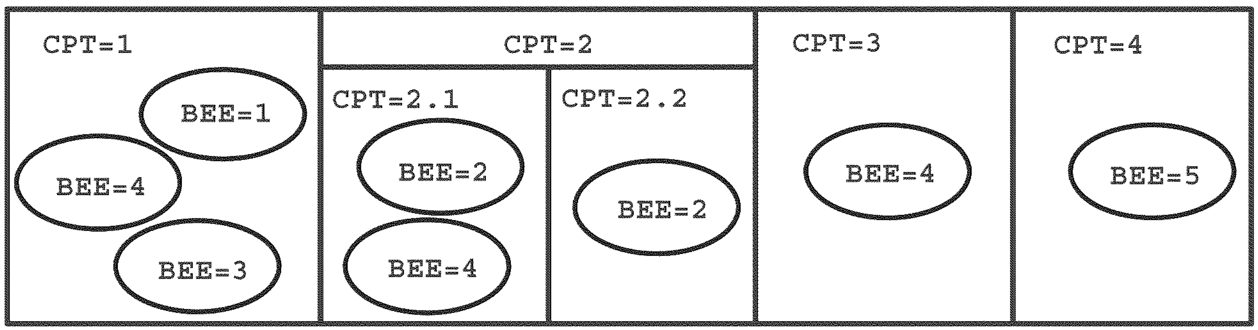
FIG. 15B

1700

| BEE | CPT=1 | CPT=2.1 | CPT=2.2 | CPT=3 | CPT=4 | |
|---|---|---|---|---|---|---|
| 1 | 1 | - | - | - | - | $\times P_1$ |
| 2 | 0 | $\frac{N}{16(N-1)}$ | $\frac{13N}{32(N-1)}$ | 0 | 0 | $\times P_2$ |
| 3 | $\frac{N-32}{32(N-1)}$ | 0 | 0 | 0 | 0 | |
| 4 | $\frac{N}{16(N-1)}$ | $\frac{N}{16(N-1)}$ | 0 | $\frac{11N}{32(N-1)}$ | 0 | |
| 5 | 0 | 0 | 0 | 0 | $\frac{N}{32(N-1)}$ | |

| BEE | CPT=1 | CPT=2.1 | CPT=2.2 | CPT=3 | CPT=4 | |
|---|---|---|---|---|---|---|
| 1 | 1 | - | - | - | - | $\times P_1$ |
| 2 | 0 | 0.063 | 0.406 | 0 | 0 | $\times P_2$ |
| 3 | 0.031 | 0 | 0 | 0 | 0 | |
| 4 | 0.063 | 0.063 | 0 | 0.344 | 0 | |
| 5 | 0 | 0 | 0 | 0 | 0.031 | |

| BEE | CPT=1 | CPT=2.1 | CPT=2.2 | CPT=3 | CPT=4 | |
|---|---|---|---|---|---|---|
| 1 | 1 | - | - | - | - | $\times P_1$ |
| 2 | 0 | 0.062 | 0.400 | 0 | 0 | $\times P_2$ |
| 3 | 0.028 | 0 | 0 | 0 | 0 | |
| 4 | 0.060 | 0.064 | 0 | 0.349 | 0 | |
| 5 | 0 | 0 | 0 | 0 | 0.036 | |

| Packet length | Average # of candidates by | | Eliminated candidates (%) |
|---|---|---|---|
| | List decoding | CFLD | |
| | One Bit Error | | |
| **272** | 272 | 9 | 97% |
| **880** | 880 | 28 | 97% |
| **1112** | 1112 | 35 | 97% |
| **2240** | 2240 | 70 | 97% |
| **5272** | 5272 | 165 | 97% |
| | Two Bits Error | | |
| **272** | 36856 | 142 | 99.6% |
| **880** | 386,760 | 1526 | 99.6% |
| **1112** | 617,716 | 2549 | 99.6% |
| **2240** | 2,507,680 | 9,531 | 99.6% |
| **5272** | 13,894,356 | 56,991 | 99.6% |

| Error location | Packet size (bits) | Number of candidates with valid... | | |
|---|---|---|---|---|
| | | checksum | syntax/ semantic | # of MBs/CUs |
| **H.264, *City*, QP=27 and 44 MBs per slice** | | | | |
| F35_S7_B2872 | 2952 | 87 | 4 | 1 |
| F53_S16_B4312 | 4384 | 134 | 54 | 52 |
| F35_S34_B2784 | 2856 | 96 | 1 | 1 |
| F52_S22_B3925 | 4000 | 126 | 3 | 1 |
| F35_S22_B823 | 3760 | 113 | 1 | 1 |
| F51_S32_B3475 | 3544 | 110 | 2 | 1 |
| F48_S13_B4675 | 4712 | 138 | 61 | 44 |
| F42_S23_B304 | 2160 | 66 | 1 | 1 |
| F52_S22_B3925 | 4000 | 126 | 3 | 1 |
| F41_S1_B1251 | 1360 | 51 | 19 | 3 |
| **HEVC, *BasketballDrive*, QP=22 and 30 CUs per slice** | | | | |
| F25_S8_B11190 | 18016 | 564 | 3 | 1 |
| F46_S10_B57355 | 58232 | 1815 | 51 | 2 |
| F40_S7_B33218 | 55328 | 1758 | 21 | 2 |
| F37_S7_B11757 | 19968 | 616 | 4 | 1 |
| F45_S2_B5339 | 9520 | 294 | 2 | 1 |
| F4_S3_B13211 | 28304 | 891 | 10 | 1 |
| F38_S12_B19672 | 25496 | 820 | 13 | 1 |
| F14_S11_B428 | 26152 | 815 | 365 | 1 |
| F38_S4_B4266 | 6680 | 221 | 1 | 1 |
| F13_S8_B10614 | 16192 | 517 | 7 | 1 |

| Sequence | QP | Average PSNR of reconstructed corrupted frame | | | | | |
|---|---|---|---|---|---|---|---|
| | | Intact | JM-FC | STBMA | HO-MLD | CFLD | |
| **City** (704×576) | 22 | 40.88 | 36.47 | 40.32 (+3.58) | 39.60 (+3.12) | 40.77 (+4.3) | 88% |
| | 27 | 36.63 | 34.38 | 36.43 (+2.05) | 35.81 (+1.43) | 36.6 (+2.21) | 84% |
| | 32 | 33.08 | 32.06 | 32.99 (+0.93) | 32.79 (+0.73) | 33.06 (+1) | 86% |
| | 37 | 30.05 | 29.54 | 29.99 (+0.45) | 29.95 (+0.41) | 30.01 (+0.46) | 78% |
| **Crew** (704×576) | 22 | 41.76 | 39.21 | 40.69 (+1.48) | 40.25 (+1.04) | 41.76 (+2.55) | 86% |
| | 27 | 38.52 | 37.25 | 38.07 (+0.82) | 37.69 (+0.72) | 38.51 (+1.27) | 84% |
| | 32 | 35.7 | 34.91 | 35.38 (+0.47) | 35.33 (+0.42) | 35.64 (+0.73) | 82% |
| | 37 | 32.99 | 32.58 | 32.82 (+0.25) | 32.83 (+0.25) | 32.96 (+0.39) | 80% |
| **Ice** (704×576) | 22 | 43.73 | 38.58 | 41.83 (+3.26) | 41.78 (+3.2) | 43.49 (+4.91) | 76% |
| | 27 | 41.45 | 37.25 | 39.69 (+2.43) | 39.75 (+2.5) | 41.31 (+4.06) | 90% |
| | 32 | 39 | 36.38 | 38.11 (+1.72) | 38.02 (+1.63) | 38.93 (+2.55) | 76% |
| | 37 | 36.43 | 34.55 | 35.94 (+1.39) | 35.91 (+1.36) | 36.39 (+1.84) | 78% |
| **Foreman** (352×288) | 22 | 41.34 | 37.41 | 39.31 (+1.9) | 39.21 (+1.8) | 41.06 (+3.65) | 64% |
| | 27 | 37.83 | 35.65 | 36.8 (+1.14) | 36.59 (+0.94) | 37.66 (+2.01) | 52% |
| | 32 | 34.68 | 33.61 | 34.14 (+0.53) | 34.14 (+0.53) | 34.57 (+0.96) | 74% |
| | 37 | 31.96 | 31.47 | 31.61 (+0.14) | 31.73 (+0.26) | 31.94 (+0.47) | 90% |
| **Opening ceremony** (720×480) | 22 | 39.32 | 38.26 | 38.55 (+0.29) | 38.8 (+0.54) | 39.32 (+1.06) | 88% |
| | 27 | 35.39 | 35.03 | 35.08 (+0.05) | 35.11 (+0.09) | 35.34 (+0.31) | 84% |
| | 32 | 31.39 | 31.2 | 31.24 (+0.04) | 31.26 (+0.06) | 31.39 (+0.18) | 94% |
| | 37 | 27.76 | 27.66 | 27.71 (+0.04) | 27.72 (+0.06) | 27.76 (+0.1) | 92% |
| **Whale show** (720×480) | 22 | 41 | 35.69 | 36.58 (+0.89) | 36.96 (+1.28) | 40.93 (+5.24) | 68% |
| | 27 | 36.37 | 33.54 | 34.22 (+0.68) | 34.42 (+0.88) | 36.34 (+2.8) | 72% |
| | 32 | 32.08 | 30.86 | 31.2 (+0.34) | 31.16 (+0.31) | 32.06 (+1.2) | 84% |
| | 37 | 28.36 | 27.89 | 27.99 (+0.1) | 27.97 (+0.08) | 28.33 (+0.44) | 76% |
| **Driving** (720×480) | 22 | 41 | 34 | 38.02 (+4.02) | 37.28 (+3.28) | 40.45 (+6.45) | 70% |
| | 27 | 37.05 | 32.72 | 35.7(+2.98) | 34.72 (+2) | 36.91 (+4.19) | 64% |
| | 32 | 33.3 | 31.03 | 32.76 (+1.72) | 32.17 (+1.14) | 33.19 (+2.16) | 82% |
| | 37 | 30.05 | 28.96 | 29.79 (+0.84) | 29.59 (+0.63) | 30 (+1.04) | 82% |
| **Walk** (720×576) | 22 | 43.29 | 30.27 | 34.66 (+4.39) | 33.79 (+3.51) | 42.48 (+12.21) | 76% |
| | 27 | 39.33 | 29.65 | 34.77 (+5.12) | 33.34 (+4.7) | 39.14 (+9.5) | 72% |
| | 32 | 35.56 | 29.33 | 33.52 (+4.19) | 32.65 (+3.32) | 35.23 (+5.9) | 82% |
| | 37 | 31.91 | 28.59 | 31.21 (+2.61) | 30.72 (+2.12) | 31.78 (+3.19) | 78% |
| **Average gain over JM-FC** | | | **0** | **+1.6** | **+1.39** | **+2.79** | **79%** |

| Sequence | QP | Average PSNR of reconstructed corrupted frame | | | |
| --- | --- | --- | --- | --- | --- |
| | | Intact | HM-FC | CFLD | |
| **BQTerrace** (1920×1080) | 22 | 38.89 | 35.16 | 35.76 (+0.6) | 58% |
| | 27 | 36.3 | 34.32 | 35.68 (+1.36) | 82% |
| | 32 | 33.76 | 32.37 | 33.66 (+1.29) | 92% |
| | 37 | 31.17 | 30.26 | 31.15 (+0.89) | 89% |
| **BasketballDrive** (1920×1080) | 22 | 39.89 | 32.53 | 38.49 (+5.95) | 84% |
| | 27 | 38.23 | 32.28 | 37.67 (+5.39) | 90% |
| | 32 | 36.7 | 31.81 | 36.47 (+4.66) | 96% |
| | 37 | 34.8 | 31.51 | 34.8 (3.29) | 100% |
| **Cactus** (1920×1080) | 22 | 39.20 | 36.82 | 37.89 (+1.07) | 76% |
| | 27 | 36.74 | 34.59 | 36.25 (+1.66) | 88% |
| | 32 | 34.65 | 33.56 | 34.59 (+1.03) | 98% |
| | 37 | 32.31 | 31.55 | 32.03 (+0.48) | 96% |
| **Kimono** (1920×1080) | 22 | 42.15 | 36.69 | 41.62 (+4.93) | 90% |
| | 27 | 40.04 | 36.10 | 39.81 (+3.71) | 96% |
| | 32 | 38.20 | 34.78 | 38.07 (+3.29) | 98% |
| | 37 | 35.30 | 33.40 | 35.30 (+1.9) | 98% |
| **ParkScene** (1920×1080) | 22 | 40.11 | 37.39 | 39.63 (+2.24) | 82% |
| | 27 | 37.33 | 35.42 | 37.19 (+1.77) | 96% |
| | 32 | 34.83 | 33.86 | 34.74 (+0.88) | 94% |
| | 37 | 32.17 | 31.58 | 32.17 (+0.59) | 100% |
| **Average gain over HM-FC** | | | **0** | **+2.35** | 91% |

| Sequence | QP | Average PSNR of reconstructed corrupted frame | | | |
|---|---|---|---|---|---|
| | | Intact | HM-FC | CFLD | |
| **BasketballDrill** (832×480) | 22 | 40.44 | 31.9 | 39.91 (+8.01) | 94% |
| | 27 | 37.41 | 30.84 | 37.06 (+6.22) | 94% |
| | 32 | 34.66 | 30.07 | 34.56 (+4.49) | 98% |
| | 37 | 32.11 | 29.21 | 32 (+2.8) | 98% |
| **BQMall** (832×480) | 22 | 39.84 | 31.04 | 39.16 (+8.12) | 92% |
| | 27 | 36.91 | 30.03 | 36.23 (+6.2) | 92% |
| | 32 | 33.86 | 29.69 | 33.48 (+3.79) | 94% |
| | 37 | 30.68 | 27.83 | 30.5 (+2.67) | 92% |
| **PartyScene** (832×480) | 22 | 38.14 | 32.57 | 35 (+2.43) | 72% |
| | 27 | 34.66 | 31.32 | 33.52 (+2.2) | 84% |
| | 32 | 31.07 | 29.38 | 30.98 (+1.6) | 96% |
| | 37 | 27.76 | 26.94 | 27.47 (+0.53) | 94% |
| **RaceHorses** (832×480) | 22 | 39.29 | 26.01 | 35.94 (+9.93) | 70% |
| | 27 | 36.21 | 25.48 | 35.16 (+9.68) | 90% |
| | 32 | 32.6 | 25.8 | 32.18 (+6.38) | 92% |
| | 37 | 29.44 | 24.98 | 29.32 (+4.34) | 96% |
| **Average gain over HM-FC** | | | **0** | **+4.97** | 91% |

FIG. 20D

CFLD method

Intact

FIG. 26B 2660 (bit 27) 2662 (bit 23) 2664 (bit 24) 2666 (bit 8)

| Ref. | DECODING Bit Position | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|---|
| 2650 | e1 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| | e2 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| | e3 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| | SUB-SYMBOLS (SS) | | | | | | | | | | | | | | | | | | | | | | | | | | | | | | | | |
| 2670 | SS w1 system 1 | 0 | 1 | 1 | 0 | | 0 | 1 | | | 0 | 0 | 1 | 0 | 0 | 1 | 0 | 1 | 1 | 1 | 0 | 0 | 1 | 1 | | 0 | 1 | 1 | 0 | 1 | 1 | 0 | 0 |
| | SS w2 system 1 | 1 | 1 | 0 | 0 | | 0 | 0 | | | 1 | 0 | 1 | 0 | 0 | 0 | 1 | 1 | 0 | 1 | 0 | 0 | 1 | 0 | | 1 | 1 | 0 | 1 | 1 | 1 | 0 | 0 |
| | SS w3 system 1 | 1 | 0 | 1 | 0 | | 0 | 1 | | | 1 | 0 | 0 | 0 | 0 | 1 | 1 | 0 | 1 | 0 | 0 | 0 | 0 | 1 | | 1 | 0 | 1 | 1 | 0 | 0 | 0 | 0 |
| 2672 | SS w2 system 2 | | | | | 1 | | | | | | | | | | | | | | | | | | | | | | | | | | | |
| | SS w3 system 2 | | | | | 1 | | | | | | | | | | | | | | | | | | | | | | | | | | | |
| 2674 | SS w1 system 3 | | | | | | | | | 1 | | | | | | | | | | | | | | | | | | | | | | | |
| | SS w3 system 3 | | | | | | | | | 0 | | | | | | | | | | | | | | | | | | | | | | | |
| 2676 | SS w1 system 4 | | | | | | | | 1 | | | | | | | | | | | | | | | | 0 | | | | | | | | |
| | SS w2 system 4 | | | | | | | | 0 | | | | | | | | | | | | | | | | 0 | | | | | | | | |
| | DECODED VAL. | | | | | | | | | | | | | | | | | | | | | | | | | | | | | | | | |
| 2680 | SS x1 system 1 | 0 | 1 | 1 | 0 | | 0 | 1 | | | 0 | 0 | 1 | 0 | 0 | 1 | 0 | 1 | 1 | 1 | 0 | 0 | 1 | 1 | | 0 | 1 | 1 | 0 | 1 | 1 | 0 | 0 |
| | SS x2 system 1 | 1 | 1 | 0 | 0 | | 0 | 0 | | | 1 | 0 | 1 | 0 | 0 | 0 | 1 | 1 | 0 | 1 | 0 | 0 | 1 | 0 | | 1 | 1 | 0 | 1 | 1 | 1 | 0 | 0 |
| 2682 | SS x1 system 2 | | | | | 0 | | | | | | | | | | | | | | | | | | | | | | | | | | | |
| | SS x2 system 2 | | | | | 1 | | | | | | | | | | | | | | | | | | | | | | | | | | | |
| 2684 | SS x1 system 3 | | | | | | | | | 1 | | | | | | | | | | | | | | | | | | | | | | | |
| | SS x2 system 3 | | | | | | | | | 1 | | | | | | | | | | | | | | | | | | | | | | | |
| 2686 | SS x1 system 4 | | | | | | | | 1 | | | | | | | | | | | | | | | | 0 | | | | | | | | |
| | SS x2 system 4 | | | | | | | | 0 | | | | | | | | | | | | | | | | 0 | | | | | | | | |
| 2688 | Decoded x1 | 0 | 1 | 1 | 0 | 0 | 0 | 1 | 1 | 1 | 0 | 0 | 1 | 0 | 0 | 1 | 0 | 1 | 1 | 1 | 0 | 0 | 1 | 1 | 0 | 0 | 1 | 1 | 0 | 1 | 1 | 0 | 0 |
| | Decodec x2 | 1 | 1 | 0 | 0 | 1 | 0 | 0 | 0 | 1 | 1 | 0 | 1 | 0 | 0 | 0 | 1 | 1 | 0 | 1 | 0 | 0 | 1 | 0 | 0 | 1 | 1 | 0 | 1 | 1 | 1 | 0 | 0 |
| 2690 | Dec. Error x1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| | Dec. Error x2 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

CHECKSUM-FILTERED DECODING, CHECKSUM-AIDED FORWARD ERROR CORRECTION OF DATA PACKETS, FORWARD ERROR CORRECTION OF DATA USING BIT ERASURE CHANNELS AND SUB-SYMBOL LEVEL DECODING FOR ERRONEOUS FOUNTAIN CODES

CROSS-REFERENCE TO RELATED APPLICATIONS

This application claims priority of U.S. provisional patent application No. 62/385,475 filed Sep. 9, 2016, U.S. provisional patent application No. 62/405,906 filed Oct. 8, 2016, U.S. provisional patent application No. 62/472,124 filed Mar. 16, 2017 and U.S. provisional patent application No. 62/519,133 filed Jun. 13, 2017 the contents of which are incorporated herein by reference.

TECHNICAL FIELD

The present relates to error correction and to decoding methods, devices and systems. More particularly, the present relates to error correction methods, devices and systems for real-time packet data transmission, to decoding methods, devices and systems for error correction of transmitted data and to decoding of fountain codes.

BACKGROUND

Video content is increasingly being transmitted over IP networks using protocols such as UDP and RTP over IP. Transmission errors are common in unreliable networks such as wireless networks used in mobile communications, satellite communications, Wi-Fi, microwave, etc. To detect the presence of errors during the transmission, checksums are commonly used. For instance, a checksum covers the IP header in the IP protocol while a checksum covers the header and the payload of UDP packets in the UDP protocol. In the prior art, when an error is detected, the corrupted packet is discarded. In some applications, where a bidirectional communication channel is available, the lost packet may be retransmitted. Alternatively, video error concealment methods may be applied, which consists of reconstructing missing parts of the video from information contained in nearby spatial locations and/or previous frames. In broadcast applications, retransmissions are not possible, making the transmitted content impossible to reconstruct at the receiver (once corrupted packets have been discarded). In such case, applications rely on error concealment. But the visual results are sometimes problematic when the content exhibits complex motion or transformation.

Forward error correction (FEC) methods have been proposed to render the video stream more robust to errors. Such methods include FEC methods as proposed in various prior references such as the "Internet Engineering Task Force (IETF)'s Request For Comments (RFC) 2733, 1999", the newer "RFC 5109, 2007" (which renders RFC 2733 obsolete), "Pro-MPEG Code of Practice #3 release 2, 2003" which is based on RFC 2733, and the recent SMPTE 2022-1 ("Forward Error Correction for Real-Time Video/Audio Transport Over IP Networks," in SMPTE ST 2022-1:2007, vol., no., pp. 1-15, May 24, 2007) as an improvement of RFC 2733 by extending some FEC headers. A good overview of the principles used in those references is presented by Westerlund in "Forward Error Correction in Real-time Video Streaming Applications", Master's thesis, Umeå University, Faculty of Science and Technology, Department of Computing Science, 80 pp, 2015. Systems using those methods transmit RTP packets using UDP over IP (i.e. RTP packets are encapsulated into UDP packets which in turn are encapsulated into IP packets).

The SMPTE 2022 standard has been deployed by broadcasters around the world. It supports compressed as well as uncompressed video, audio and data. Typical applications of that standard include: Long haul contribution and backhaul, facility infrastructure, program distribution, content exchange as described by Artel, in "Broadcaster's Guide to SMPTE 2022." AR207-000410-00_B, October 2014.

FIG. 1 illustrates how conventional FEC methods function in the context of these prior art references. Video packets are grouped into L×D packets 102 to which are associated L column FEC packets 104 and D row FEC packets 106. The row FEC packets 106 contain redundant information related to a specific row of packets 102 while column FEC packets 104 contain redundant information related to a specific column of packets 102. For instance, among other things, a binary XOR operation is performed over the packets 102 of a same row to generate the corresponding row FEC packet 106 and a binary XOR operation is performed over the packets 102 of a same column to generate the corresponding column FEC packet 104. XOR operations are performed on the packets' headers as well as payloads as described in the respective specifications. The packets identified as RTP packets 102 in the FIG. 1 refer to media packets which contain video content while the FEC packets (104 or 106) provide redundancy that permit to reconstruct damaged packets.

Note that some systems may use only column FEC 104 or row FEC 106 or may use different groupings of packets 102 to generate various FEC packets (104 or 106). Therefore, in more general terms, the FEC method uses a list of packets (for instance a row or a column) and generates a parity operation on the packets (e.g. a binary XOR) to create a redundant packet called FEC packet. Multiple lists of packets may be used to generate multiple FEC packets (one FEC packet per list). As mentioned, it is typical to compute the FECs using the media packets of a row or a column of packets or both as in the case of the broadcast video applications of interest. So, within each list Li of packets, the parity operation is computed (i.e. parity is computed) on all media packets of the list to generate an FEC packet which will be associated to the list. One packet can be damaged (or lost) in each list (either a media packet 102 or an FEC packet (104 or 106)). The damaged packets can be reconstructed by identifying a list of packets containing only one damaged packet, reconstruct that damaged packet and then repeat the process using other lists of packets to gradually reconstruct all the damaged packets. If there is no list of packets where there is a single damaged packet and damaged packets remain, then there is an 'irrecoverable packet loss' because one or more damaged packets cannot be repaired. In this situation, the FEC method fails to correct one or several erroneous packets in the group of L×D packets 102.

Lost or damaged packets can be recovered as long as they can be reconstructed directly or indirectly either through their FEC-protected rows or their FEC-protected columns. For instance, FIG. 2 presents a group of packets 102 having associated column FEC 104 and row FEC 106, some packets of the group of packets 102 are damaged packets 202, as concurrently presented in FIG. 1. FEC packet 206 identified as "Row FEC 2" permits to recover damaged packet 202 identified as "RTP L+2", which then permits to recover packet 204 identified as "RTP 2" using FEC packet 208 identified as "Col FEC 2", which then permits to recover packet 210 identified as "RTP 1" using FEC packet 212 identified as "Row FEC 1", and then packet 214 identified as "RTP L(D−1)+1" using FEC packet 216 identified as "Col FEC 1" or FEC packet 218 identified as "Row FEC D".

But in some cases, the recovery is not possible as shown in FIG. 3. In FIG. 3, there are two packets (300 and 302) having errors on the first row and two packets (300 and 304) having errors on the second column. Thus, damaged packets (300, 302 and 304) cannot be corrected.

However, as observed by several, discarding an entire packet because of a single error is a huge waste of information. Therefore, it would be desirable to exploit the information present in the damaged packets. The problem is that the checksum is only meant to indicate if the packet is in error or not; and how to exploit the information in the damaged packet is unknown.

Decoding Methods

Over recent years, digital video communications, especially delivering high quality content, have attracted considerable attention in a wide variety of application environments, such as mobile video streaming, video conferencing, telepresence video conferencing, etc. Restrictions on data storage, processing power, transmission cost, and communication speed make compression a mandatory step in the efficient processing of video streams. However, the high compression performance of current video coding standards (e.g., H.264, H.265 also known as high efficiency video coding (HEVC)) makes the compressed video streams extremely vulnerable to channel impairments. Even a single bit in error in variable-length code (VLC) may cause the decoder to lose its synchronization with the corresponding encoder due to an incorrect parsing of the codewords. Even worse, because of the motion compensated prediction technique employed in compression, an error can propagate from one frame to consecutive ones and lead to severe visual artifacts.

Various error control mechanisms have been proposed to overcome visual quality degradation caused by transmission errors. Retransmission is one of the basic mechanisms to provide reliable communication. But it is rarely used in real-time conversational or broadcasting/multicasting applications due to, respectively, the added delay or lack of feedback channel. Error-resilient schemes inject redundancies during source coding to make the streams more robust against transmission errors so that the decoder can better deal with the loss of information. But any error resilience method reduces coding efficiency or sacrifices bit-rate and is inefficient especially when there is no transmission error. Compared to the other mentioned approaches, error concealment schemes as a post-processing mechanism at the decoder side, will not require any additional bandwidth and will not introduce retransmission delays. Error concealment methods estimate lost areas by exploiting the inherent correlation between adjacent pixels. Spatial error concealment takes advantage of the smoothness property in spatially adjacent pixels to reconstruct erroneous pixels. Temporal error concealment, on the other hand, restores the missing areas (especially the motion information of lost blocks) by exploiting temporal redundancy between the neighboring frames. Spatiotemporal error concealment combines both methods. A state-of-the-art embodiment of this technique is proposed in Chen et al. (Y. Chen, Y. Hu, O. C. Au, H. Li, and C. W. Chen, "Video error concealment using spatio-temporal boundary matching and partial differential equation," *IEEE Trans. on Multimedia*, vol. 10, no. 1, pp. 2-15, 2008). Lost motion vectors (MVs) are recovered by a modified classic boundary matching algorithm referred as spatiotemporal boundary matching algorithm (STBMA) which minimizes a distortion function by considering both spatial and temporal smoothness properties of the neighboring macroblocks (MBs). Each recovered MV points to a MB in the reference frame and its pixel values are placed in lost MB. Partial differential equations are then used to smooth any discontinuity arising from the replaced MBs. Clearly, the performance of error concealment is reduced when lost areas have less correlation (spatial or temporal) with the surrounding correctly decoded areas especially when the lost areas are large.

Most error concealment approaches treat a corrupted packet the same way as a lost one, where the corrupted packets are ignored and the missing information is concealed. In practice, network congestion results in packet loss while wireless signal attenuation, fading, and the like result in corrupted packets. However, corrupted and lost packets have to be handled differently. It is recognized that partially damaged packets may contain valuable information that can be used to enhance the visual quality of the reconstructed video. This is the case when the error occurs at the end of the packet or when the residual bit error rate (after channel decoding) is low.

This has been exploited using two distinct approaches: joint source channel decoding (JSCD) and list decoding. According to Weidmann et al. (C. Weidmann, P. Kadlec, O. Nemethova, and A. Al Moghrabi, "Combined sequential decoding and error concealment of H.264 video," in Proc. IEEE 6th workshop on Multimedia Signal Processing, pp. 299-302, 2004), sequential decoding and soft information provided by the channel decoder is used for prediction of residual coefficients coded with context-adaptive variable-length coding (CAVLC) in the H.264 Extended profile. The additional information from error-free partition A, such as packet length in bits and number of MBs in slice, is applied as constraints to define a valid packet. A maximum a posteriori (MAP)-based JSCD approach has been employed for the decoding of MV and CAVLC of H.264. Moreover, JSCD combined with soft estimation techniques was adopted for correcting context-adaptive binary arithmetic coding (CABAC) bitstreams of H264 sequences under the assumption that each packet carries an entire picture. Generally, in list decoding approaches, multiple candidates of the damaged bitstream are generated by flipping bits in the corrupted received packet. Then, the candidates are ranked from the most likely to the least likely bitstream based on the soft information or reliability parameters of each bit. Each candidate is then checked for semantic and syntactic errors. Finally, the winning candidate is the first one that passes the decoder semantic verification. In Levine et al. (D. Levine, W. E. Lynch, and T. Le-Ngoc, "Iterative joint source-channel decoding of H.264 compressed video," in Proc. IEEE Int. Symp. on Circuits and Systems, pp. 1517-1520, 2007) and Nguyen et al. (N. Q. Nguyen, W. E. Lynch, and T. Le-Ngoc, "Iterative joint source-channel decoding for H.264 video transmission using virtual checking method at source decoder," in Proc. IEEE 23rd Can. Conf. on Electrical and Computer Engineering (CCECE), pp. 1-4, 2010), 300 likeliest candidates are generated based on the soft value of flipped bits. The slice candidate with the smallest sum of its soft values is identified at the most probable one. Moreover, in Nguyen et al., a virtual checking step is proposed to accelerate the semantic verification process of each candidate by considering the information of previous failed candidates. Farrugia et al. (R. A. Farrugia and C. J. Debono, "Robust decoder-based error control strategy for recovery of H.264/AVC video content," IET Communications, vol. 5, no. 13, pp. 1928-1938, 2011) adopted a list decoding strategy to derive the M most probable paths with the smallest hamming distance during the decoding of each symbol irrespective of their length. The bitstream that meets three constraints related to bitstream length, number of MBs in slice and successful syntactic/semantic verification is identified at the likeliest one. However, all these approaches suffer from a major drawback in that they offer a fairly large solution space for candidate packets leading to a decoding process with extremely high computational complexity. Indeed, a packet containing N bits has $2^N$ possible candidates. This issue alone restricts the use of these approaches in real-time applications. Recently, a significantly less complex list decoding approach has been proposed, amongst others, in Caron et al. (F. Caron and S. Coulombe, "Video error correction using soft-output and hard-output maximum likelihood decoding applied to an H.264 baseline profile," IEEE Trans. on Circuits and Systems for Video Technology, vol. 25, no. 7, pp. 1161-1174, 2015), where a soft/hard output maximum likelihood decoding (SO/HO-MLD) method is applied at the syntax element level instead of the whole slice level. The solution space is therefore limited to a set of valid codewords for each specific syntax element. Although the method performs well overall, any mistake in the decoding of a syntax element will propagate and reduce the performance.

Erroneous Fountain Codes

An erasure code is a FEC code with the capability to recover from information loss during transmission. When fountain code is used, the original data is divided into k source symbols, which are then transformed into a larger number of N encoded symbols such that the original data can be retrieved from a subset (of size larger or equal to k) of the N encoded symbols.

Fountain codes are a class of erasure codes with two attractive properties. First, a potentially limitless (or at least very large in practice) sequence of encoded symbols can be generated on the fly from a given set of k source symbols. Second, it is such that the original k source symbols can be recovered from any subset of the encoded symbols with high probability when the size n of that subset is equal or only slightly larger than k.

Fountain codes are a robust form of erasure codes, since only the number of received encoded symbols is required to determine the recovery probability. Fountain codes can therefore be used in the transmission of data packets over unreliable channels where k source symbols or packets need to be transmitted. The fountain code encoder will generate N encoded packets from those source packets and as long as k or slightly more than them are received (ideally with only k of them), it will be possible to recover the k original source packets from them with high confidence.

Practical realizations of fountain codes include Luby Transform (LT) codes ("M. Luby, "LT-codes," in Proceedings of the 43rd Annual IEEE Symposium on the Foundations of Computer Science (FOCS), pp. 271-280, 2002"), Rapid Tornado (Raptor) codes ("A. Shokrollahi, "Raptor Codes", IEEE Transactions on Information Theory, vol. 52, no. 6, pp. 2551-2567, June 2006") and online codes ("Petar Maymounkov: Online Codes. Technical Report TR2002-833, New York University (2002)"). A good overview of the principles used in fountain and Raptor codes can be found in "Amin Shokrollahi and Michael Luby (2011), "Raptor Codes", Foundations and Trends® in Communications and Information Theory: Vol. 6: No. 3-4, pp 213-322." Raptor codes are of practical importance and have been standardized by 3GPP in the MBMS specification (3GPP TS 26.346 V14.1.0, Technical Specification Group Services and System Aspects; Multimedia Broadcast/Multicast Service; Protocols and Codecs, December 2016). They are thus used in Multimedia Broadcast Multicast Services (MBMS) where an additional forward error correction (FEC) mechanism at the application layer (AL-FEC) based on Raptor codes for both streaming and file delivery services was introduced.

Being erasure codes, fountain codes are used in the context of erasure channels, where corrupted encoded symbols are discarded (i.e. considered as if they were never received). However, in practice, it is possible that the corrupted encoded symbols are available. For instance, it is possible that a data packet is received but contains one or several bits in error. We know that the packet contains bits in error (e.g. from the use of a checksum) but not the exact positions of those errors in the packet (otherwise we would be able to fix them). However, as observed by several, discarding an entire packet because of a single error is a huge waste of information. Therefore, it would be desirable to exploit the information present in the damaged packets.

SUMMARY

In one feature, according to one aspect, there is a computer-implemented method for correcting errors in a group of received packets. The group of received packets is organized in a list of packets having a redundant packet. The method includes determining an inconsistent bit indicator according to the packets of the list for a bit position. The method further includes determining a bit reliability indicator indicative of a potential bit error location corresponding to a packet of the list. The method also includes calculating the number of potential bit error locations for the bit position and identifying a correctable bit location at the potential bit error location according to the number.

When the number of number potential bit error locations for the bit position is equal to one, then the potential bit error location is identified as a correctable bit location and is corrected according to the inconsistent bit indicator.

The potential bit error location may be identified as a correctable bit location even when there is more than one packet of the list that is erroneous.

According to another aspect there is a computing device adapted to correct errors in a group of received packets, according to the method.

According to yet another aspect, there is a communication system having a receiver device that is adapted to correct errors in a group of received packets, according to the method.

In another feature, there is proposed a decoding approach which exploits the receiver side packet checksum to alleviate the large solution space problem of list decoding approaches and in some cases, to even enhance unique decoding approaches. There is shown that the checksum of corrupted packets exhibits specific bit patterns. The patterns are specifically categorized in the case of one and two bits in error but could also be categorized in the case of any other number of bits in error. An observation of these specific patterns permit to identify the potential error locations.

According to one embodiment, the identified potential error locations can further be used to remove non-valid candidate bitstreams in the list decoding approach. When there is one bit in error in the packet, the proposed checksum-filtered approach eliminates most (about 97% in typical video bitstreams) of the non-valid candidates. This way, the proposed approach considerably reduces the number of candidate bitstreams compared to prior art list decoding approaches and accordingly reduces the computational complexity. All remaining candidate bitstreams go through the video decoder for further processing. In one embodiment, the first bitstream that passes a syntactic/semantic verification test while having a correct number of blocks in slice is identified as a best candidate bitstream.

According to one embodiment, the method is applicable to H.264 and HEVC sequences.

According to one aspect there is a computer-implemented method for correcting an error in a received packet. The method is adapted to calculate a checksum value of the received packet, the checksum value corresponds to a predefined checksum pattern type (CPT). The method is also adapted to verify if the checksum value is indicative of at least one bit error in the received packet. The method is further adapted to identify the predefined CPT according to the checksum value and determine at least one bit error event (BEE) according to the predefined CPT for correcting an error in the received packet.

According to another aspect there is a computing device for decoding a received packet. The computing device has a processor and a memory coupled to the processor. The memory has computer readable instructions executable by the processor. Stored on the memory is a packet evaluation module and an error event determination module. The packet evaluation module is for calculating a checksum value of the received packet and determining an error in the received packet. The checksum value corresponds to a predefined checksum pattern type (CPT). The error event determination module has a checksum pattern type identification module adapted to identify the predefined CPT according to the checksum value and a bit error event determination module adapted to determine at least one bit error event (BEE) according to the predefined CPT.

According to yet another aspect, there is a communication system for transceiving packet data. The system has a transmitter device for transmitting an original packet data and a receiver device for receiving a received packet data corresponding to the original packet data. The receiver device has a packet evaluation module for calculating a checksum value of the received packet data and determining an error in the received packet data. The checksum value corresponds to a predefined checksum pattern type (CPT). The receiver device also has an error event determination module having a checksum pattern type identification module adapted to identify the predefined CPT according to the checksum value and a bit error event determination module adapted to determine at least one bit error event (BEE) according to the CPT.

In yet another feature, there is a method capable of exploiting the information in damaged encoded symbols (e.g. data packets). The method is based on the assumption that the bits that are potentially in error (or alternatively which bits have been received correctly) is known. Such information could be available through the use of a checksum such as the UDP checksum, which provides a list of potential bit error positions or locations as described in U.S. provisional patent application No. 62/385,475 and incorporated herein by reference, or through the use of soft information (e.g. log-likelihood ratios (LLR) available at the physical layer and providing an indication of the reliability of each received bit). Under this assumption, we can exploit the correctly received bits of damaged packets to improve the recovery of the original packets. Using the terms used in fountain coding, if it is known which of the encoded symbols' bits are potentially in error, those damaged encoded symbols (or more accurately the correctly received bits they contain) can be exploited to improve the recovery of the original source symbols in the fountain code decoding process.

The proposed method achieves this by recovering the source symbols using a bit level approach, or more accurately a sub-symbol level approach, rather than a symbol level approach, as done in current state-of-the-art methods. The recovery of each bit of the original source symbols may be achieved through the use of the bits of different encoded symbols (i.e. not the same encoded symbols are necessarily used in the recovery of different bit positions of the original source symbols; the required encoded symbols will depend on the bit position (or location) of interest). The proposed method increases the error correction rate of the conventional fountain codes, since conventional fountain codes operate at a coarser granularity than the proposed method. Indeed, the conventional fountain codes operate at a symbol level while the proposed method operates at a sub-symbol and even bit level. Moreover, corrupted encoded symbols are not discarded, permitting to exploit the reliable information they contain.

BRIEF DESCRIPTION OF THE DRAWINGS

Further features and advantages of the present invention will become apparent from the following detailed description, taken in combination with the appended drawings, in which:

FIG. 7A presents a list of packets at a transmission side and at a receiver side, each respectively having an associated checksum value and having an associated FEC packet value, according to one embodiment;

FIG. 7B presents the list of packets at the receiver side of FIG. 6A to which the checksum-aided FEC method of FIG. 5 has been applied using correlated information from the respectively associated checksum value and the associated FEC packet value, according to one embodiment;

FIG. 8A presents a prior art checksum calculation on a packet data to be transmitted, at a transmission side;

FIG. 8B presents a prior art checksum calculation on a received packet data having an error and corresponding to the transmitted packet data of FIG. 8A, at a receiver side;

FIG. 8D presents a table having values of $\hat{w}_{i,c}+\overline{w}_{i,c}$ for various error scenarios, according to one embodiment;

FIG. 9B presents a table listing the Bit Error Events (BEE) definitions for one and two bits in error, according to one embodiment;

FIG. 14 presents a BEE=5 event type having two different bits in the same column that are flipped, a single corresponding $C_R$ value pattern is grouped as CPT=4, according to one embodiment;

FIG. 15A presents a table presenting a summary of CPT definitions, according to one embodiment;

FIG. 15B presents a summary of observed CPTs and their corresponding BEEs for one and two bits in error, according to one embodiment;

FIG. 17A presents an array of probabilities for each combination of CPT type and BEE type by knowing the number of bits in error, according to one embodiment;

FIG. 17B presents an array of approximate probability values for large packet size data, according to the array of FIG. 17A, according to one embodiment;

FIG. 17C presents an array of empirical probability values for a "Crew" sequence data, QP=27 (Quantization Parameters), packet size=1432 bits, according to the array of FIG. 17A, according to one embodiment;

FIG. 19B presents an average number of candidates for different observed packet lengths;

FIG. 20A presents a candidate reduction at each step of the CFLD method for H.264 City sequence at QP=27, and HEVC Basketball Drive sequence at QP=22. The letters F,S,B in the first column are showing which frame, slice and bit are hit by an error;

FIG. 20B presents a comparison of the average PSNR of reconstructed corrupted frames for different methods in H.264 (the differences between each method and the JM-FC method appear in parentheses);

FIG. 20C presents a comparison of the average PSNR of reconstructed corrupted frames for different methods in HEVC class B sequences (the differences between the CFLD and HM-FC methods appear in parentheses);

FIG. 20D presents a comparison of the average PSNR of reconstructed corrupted frames for different methods in HEVC class C sequences (the differences between the CFLD and HM-FC methods appear in parentheses);

FIG. 26B presents a recovery process of source symbols from the corrupted received encoded symbols at a receiver side of FIG. 26A, according to one embodiment;

It will be noted that throughout the appended drawings, like features are identified by like reference numerals.

DETAILED DESCRIPTION

It has been discovered that there is a relationship between a computed checksum pattern type (CPT) and a bit error event (BEE) in UDP packets. Basically, the observed CPT (the observed pattern of zeros and ones in the computed checksum value) can be linked to the BEEs that caused that pattern and indicate if a single bit is in error or multiple bits are in error and also indicate the location of the error and the associated probability. For instance, a first checksum pattern type indicates a packet having a single bit "1" and fifteen bits "0". This can be caused by one bit in error, two bits in error with same bits flipped in the same column, or two bits in error with different bits in different columns. Certain events are significantly more likely than others to create some observed CPT. For instance, if a CPT=1 is observed, it is very likely that it was caused by a single error in a specific column, and this is even more likely as the bit error rate becomes lower. Similarly, if a CPT=2 (either CPT=2.1 or CPT=2.2) or a CPT=3 is observed, it is very likely that it was caused by two bits in error in different columns. A same analysis can be performed for higher numbers of bits in error in a packet (while still remaining small). Observed checksum patterns can therefore provide a list of potential BEEs (along with their probability of occurrence). More concretely, it provides potential (or candidate) error locations in the packet (its position in the stream). Further details with respect to this discovery are described at the end of the present section.

Figure 2:
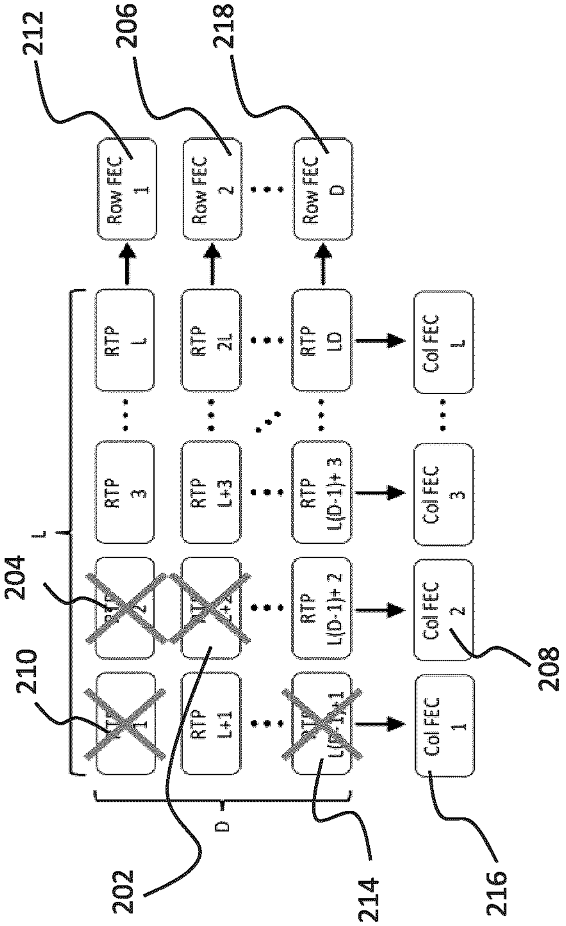
FIG. 2 presents a prior art FEC method applied to an array of RTP packets, some of the RTP packets having bit errors that can be corrected by the FEC method.
Figure 3:
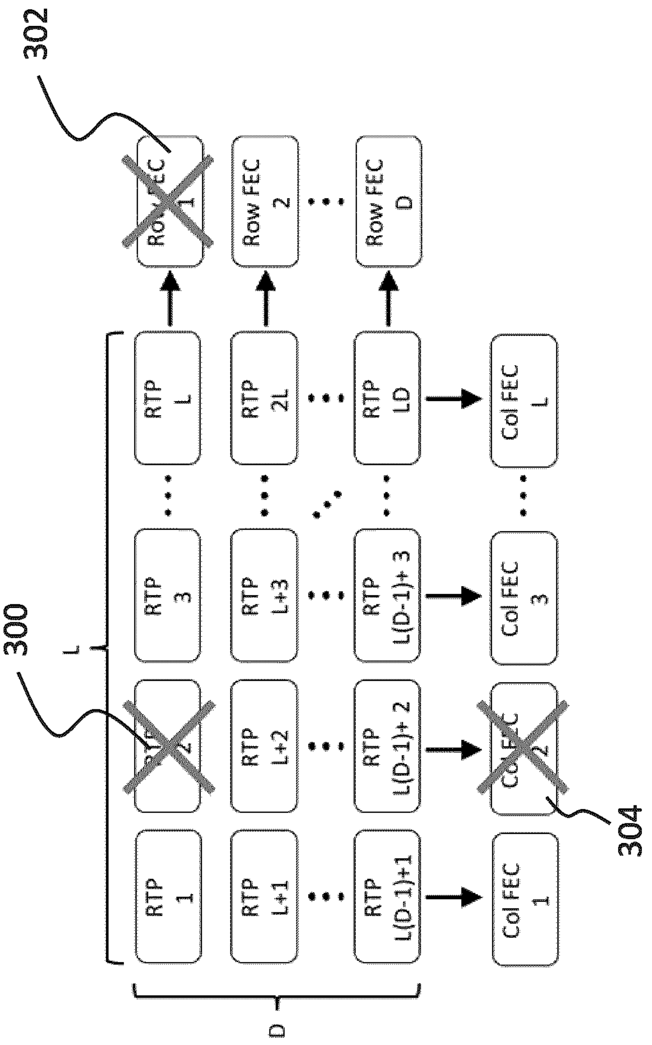
FIG. 3 presents a prior art FEC method applied to an array of RTP packets, some of the RTP packets having bit errors that cannot be corrected by the FEC method.

The proposed approach consists of using the information provided by the UDP checksum of a damaged packet when the redundancy provided by Forward Error Correction (FEC) is insufficient for correcting the damaged packet. More precisely, the checksum pattern provides potential bit error locations for the packet in error. The parity operation (XOR) performed in the FEC approach provides the exact bit location of the error (also called inconsistent bit locations) in the packet, but only for a list of packets of a whole row or a whole column in which every damaged packet can be a candidate having an error at that exact bit location (i.e. the bit locations where the XOR=1 indicate an error). The information from either one of the UDP checksum or the FEC approach does not always permit to identify the locations of the errors and correct them. For instance, in the case of the FEC, when there is a single packet in error in a row or in a column, the exact bit location of the error for the list of packets provides precise information to correct the packet, as shown in FIG. 2. However, when multiple packets are in error, as shown in FIG. 3, the FEC approach is insufficient to determine which one of the damaged packets needs to be corrected and correcting the packets is not possible. In the latter case, the FEC approach indicates that a specific bit location must be corrected but it is unknown for which of the damaged packets the correction needs to be performed.

In the case presented in FIG. 3 where the RTP packet 300 identified as "RTP 2", the FEC packet 304 identified as "COL FEC 2" and the FEC packet 302 identified as "ROW FEC 1" cannot be corrected by the FEC approach. However, when applying the UDP checksum information for each pair (in a same row or in a same column) of those packets (i.e. either on RTP packet 300 and FEC packet 302, or on RTP packet 300 and FEC packet 304) (and assuming that their checksums identify different potential bit locations) it becomes possible to identify which bit of each pair of damaged packet (300 and 302) or (300 and 304) needs to be corrected. Basically, there is performed an intersection of the information provided by the UDP checksum approach and FEC parity (XOR) operation approach. Indeed, the UDP checksum approach provides potential error locations for specific packets while the FEC parity operation approach provides specific error locations for a list of damaged packets. The proposed checksum aided FEC method can therefore correct many more packets than the conventional FEC method.

It should be understood that the term intersecting shall be interpreted as any method of determining refined possible bit error locations according to the potential inconsistent bit locations obtained from redundant packets and according to the potential error locations obtained from the checksum. Moreover, the redundant packets may, in some instances, provide specific inconsistent bit locations while it may provide only potential inconsistent bit locations. Whether they are specific or potential, those are referred to as inconsistent bit locations.

However, the checksum aided FEC method is not effective in every case; it will not always be able to correct every packet. For instance, if two packets are in error in the same FEC row and the UDP checksum of both packets indicate the same potential bit error location, it will not be possible to determine which packet to correct directly. However, the proposed method has a greater success rate when the FEC method is performed alone in an array fashion as presented in FIG. 1 using a high level of redundancy. The packets are thereby gradually corrected as in the case of the packet array of FIG. 2 which contains a significant number of damaged packets. It shall be recognized that any other packet arrangement having FEC-protected lists of packets in which every packet is present in more than one list is possible to be used with this method.

Figure 4:
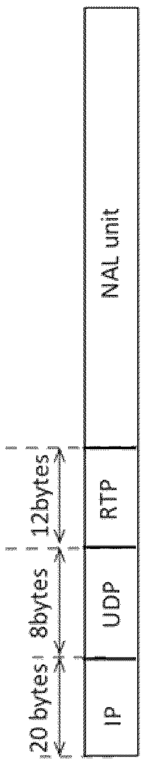
FIG. 4 presents a prior art packet having a UDP payload containing RTP packets that contains a video payload (NAL units)

The UDP checksum approach is applicable to the entire UDP packet and covers the UDP header as well as the UDP payload. Therefore, the method is also applicable to packets having a UDP payload containing RTP packets that contains video payload (NAL units) as shown in FIG. 4. More specifically, the UDP checksum method provides a list of columns in the RTP packet which are potentially in error. For ease of presentation, the following cases are simplified. For instance, the fact that FEC doesn't cover the UDP header since the UDP header is short and easy to correct is ignored, etc. It shall be recognized that the present applies to any type of packet for which a checksum can provide information concerning potential error locations in the context of FEC and that allows to intersect FEC information and checksum information to correct (repair) packets.

The proposed method increases the error correction rate of the conventional FEC, since conventional FEC operates at a coarser granularity than the proposed method. Indeed, the conventional FEC operates at the packet level while the proposed method operates at a bit level. Moreover, corrupted packets are not discarded.

According to one embodiment, the proposed method is applicable to relatively mild bit error conditions, since too many errors can create ambiguity among the possible error locations. Also, some error patterns may be undetectable and therefore, the video bit stream may need to be validated prior to display. If there is a single bit in error in each packet such ambiguity will be detected and the proposed method will recognize that it cannot correct the error (as in the case of FEC where it stops when it knows it can't correct the bit stream).

Direct Checksum-Aided FEC Recovery Method

In the following AND, OR, XOR refer to binary AND, OR and XOR operations respectively. In such binary arithmetic, a value of 0 corresponds to FALSE and a value of 1 corresponds to TRUE.

Figure 5A:
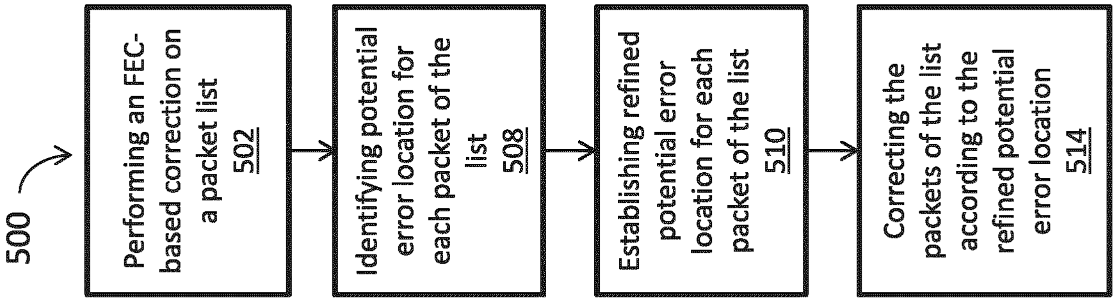
FIG. 5A presents a direct checksum-aided FEC method, according to one embodiment.
Figure 5B:
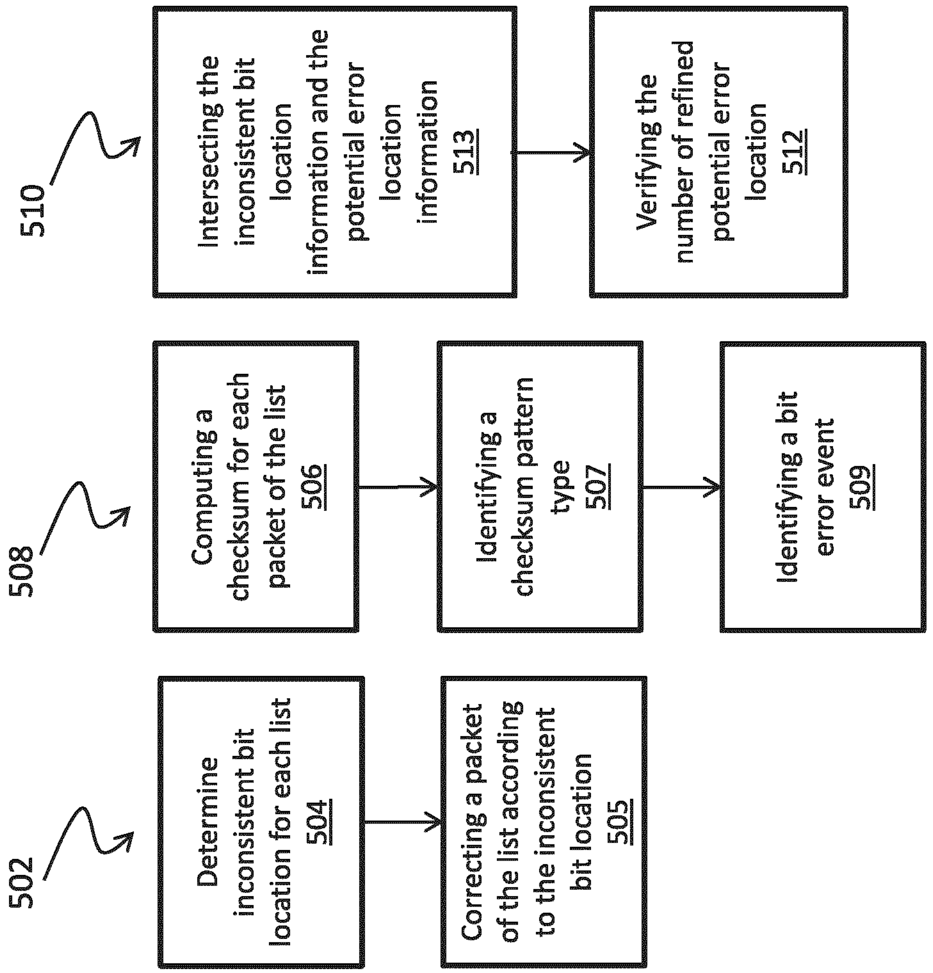
FIG. 5B presents sub-method for the direct checksum-aided FEC method of FIG. 5A, according to one embodiment.

According to one embodiment, the proposed checksum-aided FEC method 500 has the following steps, as concurrently presented in FIGS. 5A and 5B. A detailed explanation for each step is provided further on.

1. If within the correction limits of the FEC, perform FEC-based correction 502 (as presented in FIGS. 1 and 2). According to one embodiment of the method 500, this step is omitted.
2. If there is an 'irrecoverable packet loss' case, then:
   a. Set the counter of corrected (repaired) bits to zero, i.e. NbFixed=0.
   b. For every i-th FEC-protected list $L_i$:
      i. Compute $x_i=(p_{i1}$ XOR $p_{i2}$ XOR . . . XOR $p_{i\ Ni})$ to determine inconsistent bit locations for each list 504, where $p_{ij}$ is the packet constituted of bits ($p_{ij}$ is a vector of bits) associated with the j-th packet of the i-th list $L_i$. Note that the $x_i$ is an inconsistent bit indicator and indicates if the parity at each bit position is correct or not.
      ii. For each j-th packet $p_{ij}$ of the i-th FEC-protected list $L_i$ do:
         1. Compute a checksum mask $c_{ij}$ 506 in order to identify the potential error locations 508 according to the checksum value. The checksum mask $c_{ij}$ 506 is adapted to identify potentially unreliable bit positions of the packet $p_{ij}$ and is indicative of a potential error location. Alternatively, soft information such as log likelihood ratios (LLR) are used to identify unreliable bit positions and is indicative of a potential error location. Threshold values are predetermined and applied to the LLR in order to identify the potentially unreliable bit positions of the packet $p_{ij}$. It shall be recognized that identifying potentially unreliable bit positions can also include or be replaced by identifying potentially reliable bit positions and that potentially reliable bit positions can be indicative of a potential error location. LLR and checksum information can also be combined to determine potential error locations.
         2. Compute the mask $e_{ij}=(x_i$ AND $c_{ij})$ to establish refined potential error locations for each packet $p_{ij}$ 510.
      iii. Compute the number of refined potential errors among the packets for each bit position of the packets in order to determine if an error can be fixed 512. The number of potential errors is computed among the packets for each bit position k, as $w_i(k)=\mathrm{sum}_j e_{ij}(k)=(e_{i1}(k)+e_{i2}(k)+\ .\ .\ .\ +e_{iNi}(k))$, where $e_{ij}(k)$ is the k-th bit of vector $e_{ij}$. An error can be fixed at position k if $w_i(k)=1$. Indeed, if $w_i(k)>1$ then there are not two or more refined potential errors for that location which creates ambiguity and prevents correcting the error(s) at that location. Thus, when $w_i(k)=1$, then a correctable bit location is identified. A correctable bit location k for list $L_i$ is defined as a location where there is at most one candidate error at that location (i.e. potential error location) for the list, i.e. $sum_j c_{ij}(k)=1$. Since $w_i(k)=0$ if $x_i=0$, and $w_i(k)=sum_j c_{ij}(k)$ if $x_i=1$, then $w_i(k)=1$ implicates that $sum_i c_{ij}(k)=1$ and that there is a correctable bit location at k.

iv. If there are errors that can be fixed (correctable errors) (i.e. there are bit positions k where $w_i(k)=1$)

1. For each packet $p_{ij}$ of the list $L_i$, if $e_{ij}$ is not zero, do:

a. Correct the packet 514:

i. For each bit position k where $w_i(k)=1$, Perform $p_{ij}(k)=(p_{ij}(k)$ XOR $e_{ij}(k))$. If there is a $e_{ij}(k)=1$ for which $w_i(k)=1$ then a bit has been fixed and NbFixed=NbFixed+1 is set. Note that it is possible to perform the XOR operation $p_{ij}(k)=(p_{ij}(k)$ XOR 1) only on bit positions for which $e_{ij}(k)=1$.

b. Update the algorithm's data based on the corrected packet:

i. Compute the new checksum of packet $p_{ij}$ and its new $c_{ij}$ (if the same media packet is used in multiple lists, several $p_{ij}$ and $c_{ij}$ values would need to be updated)

ii. Compute the new parity mask $x_i$ for the list $L_i$ (if the same media packet is used in multiple lists, several $x_i$ values would need to be updated).

iii. Compute the new mask $e_{ij}=(x_i$ AND $c_{ij})$ (if the same media packet is used in multiple lists, several $e_{ij}$ values would need to be updated).

c. If NbFixed>=1 and there remain damaged packets, go back to the first of all, Step 2.a (NbFixed=0), and redo the process with the updated data.

d. If there remain damaged packets, then the method was not successful or not completely successful (although it may have corrected more packets than FEC alone). A more sophisticated method may be required.

In Step 1, there is an attempt to perform FEC-based correction 502. This process will correct an erroneous packet of each FEC-protected list $L_i$ only when one packet of the FEC-protected list $L_i$ is erroneous. This process is performed repeatedly on every list until all packets are corrected or until there is no more correction possible. The latter case will occur when at least one FEC-protected list contains more than one erroneous packet (i.e. at least two erroneous packets) and there is no other packet that can be corrected on any other FEC-protected list; a situation called 'irrecoverable packet loss'.

Step 2.b.i) For every FEC-protected list $L_i$ of packets $p_{ij}$, the inconsistent bit locations are identified by performing the parity operation (XOR) on all packets $p_{ij}$ of that list. Note that each list $L_i$ comprises a number $N_{i-1}$ of media packets and its associated parity packet (i.e. the FEC packet) denoted $p_{i\,Ni}$. This result for the list $L_i$ is called: "the parity mask $x_i$". We compute $x_i=(p_{i1}$ XOR $p_{i2}$ XOR . . . XOR $p_{i\,Ni})$. In the mask $x_i$ (a vector of bits), a bit value of 1 indicates an inconsistent bit location where there has been an error (in theory, a 1 represents an odd number of errors, and 0 an even number of errors, but we assume the BER is so low that there are 0 or 1 error in each location). Note that this mask (binary vector) is specific to each FEC-protected list $L_i$ (typically a row or a column of the array).

Step 2.b.ii.1) For every packet $p_{ij}$ of the list $L_i$, generate the potential error locations (from the candidate bit columns and bit values according to the UDP checksum). There is generated a checksum mask $c_{ij}$ where each value of 1 in the mask indicates such potential error location (0 means that there is no error at that location). Note that because of the checksum structure, a possible bit error provides multiple potential locations (because of the modulo 16) while $x_i$ provides specific error locations. Packets that are not damaged will have a mask $c_{ij}$ that is nil (all zeros). Note that this mask is specific to each packet $p_{ij}$. Note also that the potential error locations are determined by the observed checksum CPT and packet bit values as detailed further below.

Step 2.b.ii.2) For each packet $p_{ij}$ of the list $L_i$, compute the mask $e_{ij}=(x_i$ AND $c_{ij})$ (for implementation purposes, this can be computed only for damaged packets since $e_{ij}$ will be zero for intact packets). The mask $e_{ij}$ represents the refined possible bit error locations of the packet j of list $L_i$ and is obtained by intersecting the information from the inconsistent bit locations obtained by the parity operation and the potential error locations obtained from the checksum.

Step 2.b.iii) If for a list $L_i$, there is more than one refined possible bit error location for a specific bit position among all the packets, then the packets of that list cannot be repaired at this bit position (i.e. if $sum_j e_{ij}(k)>1$ for a value of k, the packets can't be repaired at that position k). Indeed, in that case, it is unknown which packet to fix at that bit position and such an ambiguous situation prevents error(s) to be fixed at that bit position. However, if $sum_j\ e_{ij}(k)=1$, then the k-th bit of the j-th packet $p_{ij}$ for which $e_{ij}(k)=1$ can be repaired by flipping that k-th bit. Basically, the fixed bit becomes $p_{ij}(k)=(p_{ij}(k)$ XOR $e_{ij}(k))$ as described in step 2.b.iv.

Step 2.b.iv.1) After having validated that there are errors that can be fixed (i.e. $w_i(k)=1$ for at least one value of k in list Li), each packet $p_{ij}$ of the list $L_i$, for which $e_{ij}$ is not zero (i.e. for which there is a bit to repair), is corrected by performing $p_{ij}(k)=(p_{ij}(k)$ XOR $e_{ij}(k))$ for each position k for which $w_i(k)=1$. Actually, the operation effectively corrects a bit only if $e_{ij}(k)=1$ at that position, in which case a counter of fixed bits, NbFixed, is incremented. The process is followed by a recomputation of the algorithm's data considering the repaired packet, i.e. computing its new checksum, $c_{ij}$, $x_i$ and $e_{ij}$. Since the same packet can be used in multiple lists, the recomputation of these values may be required over several lists. This recomputation of the data after the correction of each packet allows to assure that the information about remaining locations to correct are in sync with the packet content as they are gradually repaired.

Step 2.b.iv.1.c) The number of fixed bits at each complete execution of Step 2.b is verified. Indeed, after considering every FEC-protected list $L_i$, if the number of fixed packets is non-zero, then there is a progression towards packet correction and the correction process is pursued if there are remaining packets that have not been corrected as shown in Step 2.c. Otherwise, if the number of fixed bits is zero, the method has not been able to completely correct the packets (or the method has not at all corrected the packets, if in the first execution of Step 2.b nothing was corrected) and the method terminates at Step 2.d. In essence, as shown in Step 2.c Step 2.d, the process is restarted for every FEC-protected list $L_i$ of packets until all the packets have been repaired or until there is no packet that can be repaired anymore.

Note that there are other ways to implement the proposed algorithm without departing from the proposed checksum aided FEC method. For instance, the lists can be evaluated in a predetermined order, such as by starting with the lists having the smallest amount of errors. Moreover, in the below MATLAB implementation, for simplicity, some of the above-mentioned steps are calculated differently even though it might increase computational complexity. But the results, in terms of corrected bits, are the same.

Exhaustive Checksum-Aided FEC Recovery Method

In the following, AND, OR, XOR refer to binary AND, OR and XOR operations respectively. In such binary arithmetic, a value of 0 corresponds to FALSE and a value of 1 corresponds to TRUE.

Figure 1:
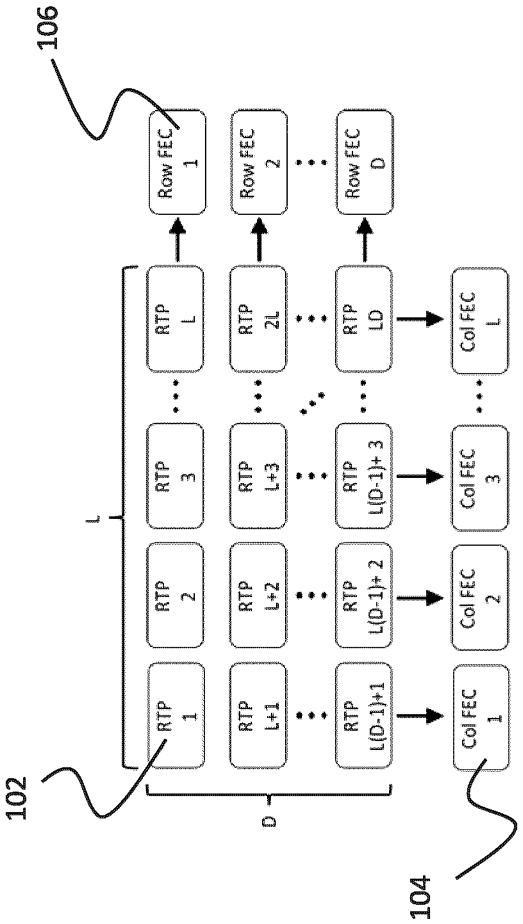
FIG. 1 presents a prior art Forward Error Correction (FEC) method applied to an array of RTP packets.
Figure 5C:
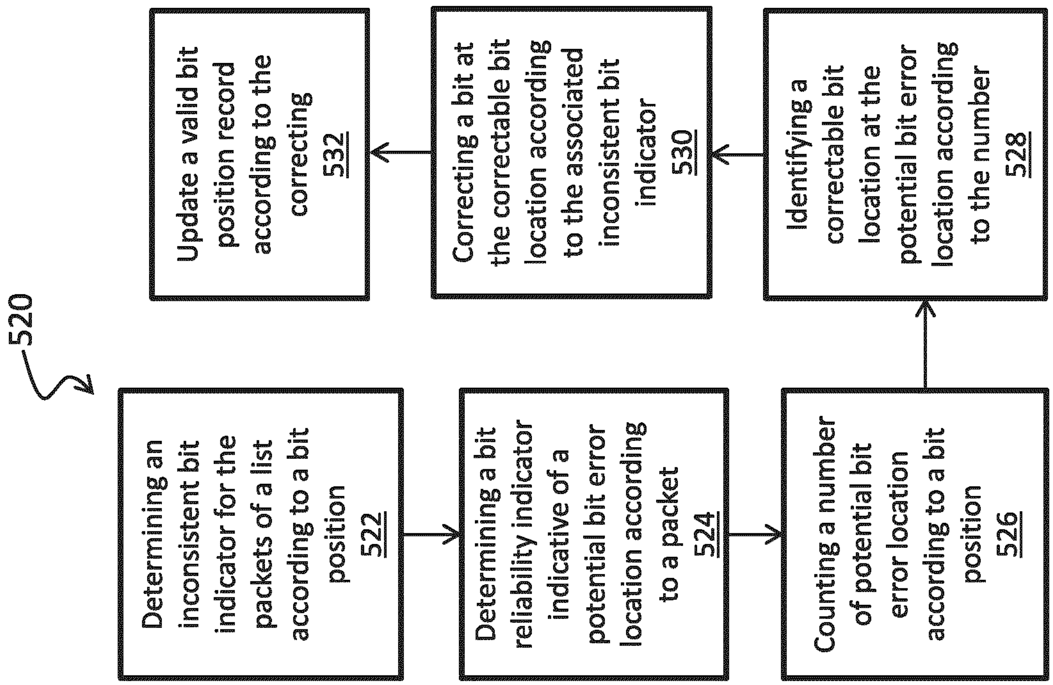
FIG. 5C presents an exhaustive checksum-aided FEC method, according to another embodiment.
Figure 5D:
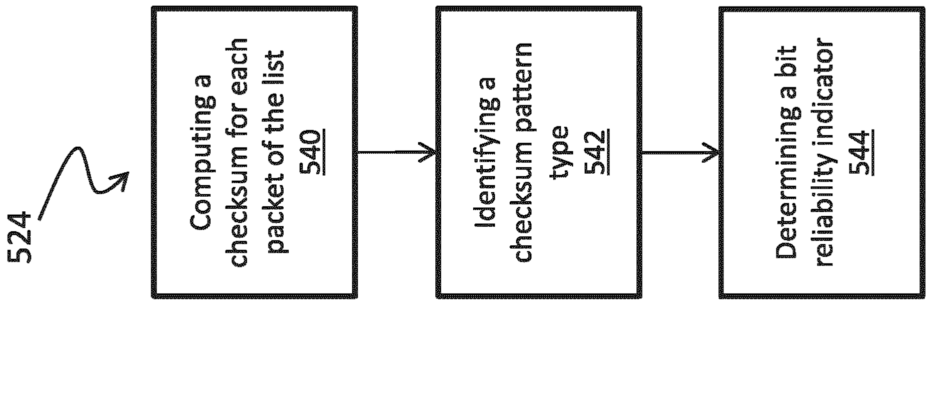
FIG. 5D presents a method of determining a reliable bit indicator for the exhaustive checksum-aided FEC method of FIG. 5C, according to one embodiment.

Presented in FIGS. 5C and 5D is an exhaustive checksum-aided FEC recovery method 520, according to one embodiment. The FEC recovery method as is usually performed at the packet level and presented in Prior art FIGS. 1 and 2 is applied for each individual bit position of a list of packets. In the exhaustive recovery method 520, every bit position is considered as a group of one-bit packets having the bits of each packet of the group at the given bit position (i.e. all the bits at a certain position k among all packets form a distinct FEC matrix, which can be processed independently). An FEC-protected list contains the bits of various packets but for a given bit position rather that for whole packets. Once a bit is corrected in a packet, its checksum is recomputed and potentially unreliable versus reliable bit positions are re-determined. This process is repeated iteratively over all bit positions until all bits of each packet are recovered or that no more bits can be corrected. This exhaustive method 520 thus considers a bit erasure channel and applies FEC recovery process at each position while the traditional method considers a packet erasure channel and operates on whole of packets. The method 520 iteratively considers all bit positions and requires keeping track of the bits that have been corrected in order to identify the corrected bits as reliable bits and reduce potential ambiguous results provided by the checksum as well as reducing the number of erroneous bits in a list, thus permitting to correct more errors. Since this method 520 does not only directly identify problematic bit positions as detailed in the method 500, but also identifies non-problematic bit position and removes the uncertainty regarding their unreliability, in some cases a greater correction rate may be achieved. The algorithm is as follows:

1. If within the correction limits of the FEC, perform FEC-based correction 502. According to one embodiment of the method 520, this step is omitted.
2. If there is an 'irrecoverable packet loss' case, then:
   a. For every i-th FEC-protected list Li:
      i. For each j-th packet $p_{ij}$ of the i-th FEC-protected list $L_i$ do:
         1. Compute a checksum mask $c_{ij}$ 540 in order to determine a bit reliability indicator and identify the potential error locations 524 according to the checksum value (i.e. reliable versus unreliable bit positions are determined). Alternatively, soft information such as log likelihood ratios (LLR) is used to identify unreliable bit positions and is indicative of a potential error location 524. Threshold values are predetermined and applied to the LLR in order to identify the potentially unreliable bit positions of the packet $p_{ij}$. It shall be recognized that identifying potentially unreliable bit positions can also include or be replaced by identifying potentially reliable bit positions and that potentially reliable bit positions can be indicative of a potential error location. LLR and checksum information can also be combined to determine potential error locations.
   b. Set the counter of corrected (repaired) bits to zero, i.e. NbFixed=0.
   c. For every i-th FEC-protected list Li:
      ii. For every bit position k of the packets within Li:
         a. If there is a single bit 526 at position k that is potentially in error among all the packets within $L_i$ (i.e. a correctable bit location is identified 528) then:
            i. Supposing this potentially erroneous bit occurred in the r-th packet of the list $L_i$, determine this bit value 530 as:
               1. $x_{ik}=(p_{i1k}\text{ XOR }p_{i2k}\text{ XOR }\ldots\text{ XOR }p_{i\,Nik})$. $x_{i1k}$ is the k-th bit of $x_i$ and is indicative of an inconsistent bit location 522. Note that the bit at position k of the r-th packet of list $L_i$ (i.e. at $p_{irk}$) is a correctable bit location since it can be determined if it is correct or not. The $x_{i1k}$ is an inconsistent bit indicator and it indicates if the parity for this position is correct or not, in which case it can only be because of a wrong value of $p_{irk}$).
               2. If x=1 then:
               a. $p_{irk}=p_{irk}$ XOR 1 (i.e. the bit value is flipped)
               b. Recompute the checksum of $p_{ir}$, and re-determine the potentially erroneous and reliable bits of that packet. (this doesn't apply if the LLR is used, in which case the bit $p_{irk}$ is set as reliable)
               c. Update the checksum mask $c_{ir}$, based on the checksum information and bits of the packet that are known to be accurate from the FEC recovery process 532 (including this one at position k). Update also the checksum mask for repetition of that packet in other FEC-protected lists.
               3. Else:
               a. Update the checksum mask $c_{ir}$, based on the fact that its k-th bit is known to be accurate 532 (this doesn't apply if the LLR is used, in which case the bit $p_{irk}$ is set as reliable). Update also the checksum mask for repetition of that packet in other FEC-protected lists.
   d. If NbFixed>=1 and there remain damaged packets, go back to the first of all, Step 2.b (NbFixed=0), and redo the process with the updated data.
   e. If there remain damaged packets, then the method was not successful or not completely successful (although it may have corrected more packets than packet level FEC alone). A more sophisticated method may be required.

Note that, as in the direct method 500, the exhaustive method 520 first identifies potential error locations indicative of reliable and unreliable bit locations 524. Then, correctable bit locations are identified 528 according to the potential error locations 526. The bit values at the correctable bit locations are modified according to their associated inconsistent bit indicator 530. According to one embodiment, when a bit value at the identified potential error location is accurate and is not modified, the accuracy of the bit is taken note of 532 in order to help the decoding of other bits.

It shall be recognized that the order in which the steps of the direct method 500 or exhaustive method 520 are executed can vary without affecting the general concept of the methods (500 and 520). For instance, in the direct method 500, inconsistent bit indicators are first determined 504, then potential error locations are determined 508, followed by the identification of correctable bit locations 510. Bit values are modified at correctable bit locations according to their associated inconsistent bit indicator 514.

Note that, the exhaustive method 520 may be less systematic and less computationally efficient in comparison with the direct method 500, however it may provide an improved recovery performance. Indeed, while the direct method 500 only considers bits that require a correction, the exhaustive method 520 further identifies the bits that are accurate and that do not require a correction and could thereby allow correcting more errors by reducing or limiting the number of potential errors. According to one embodiment, the direct method 500 is applied and if it is unsuccessful at correcting all the errors, the exhaustive method 520 is applied in order to increase the error correction success rate.

According to one embodiment, the direct method 500 or the exhaustive method 520 is repeatedly applied starting with more aggressive requirements on what constitute reliable bits and followed with less aggressive requirements if the method 500 or 520 fails in the previous attempt. For instance, bits can be identified as reliable if their absolute LLR values are above a certain threshold. That threshold can be reduced iteratively in order to reduce the aggressiveness of the requirement until a predetermined minimum threshold.

It shall be recognized that any other method or combination of methods adapted to determine a bit error location or a potential bit error location other than using a checksum or using soft information (such as LLR) is possible without departing from the scope of the present methods 500 and 520. For example, the transmission of packets may be segmented at the physical layer and reliable segments may be known. In such case, the bits of reliable segments would be identified as reliable.

Direct Method

Presented in FIG. 5A is the checksum aided FEC method 500, according to one embodiment. The method 500 includes performing an FEC-based correction on a packet list 502 and if an error remains in at least one packet of the list, the method further includes identifying potential error positions for each packet of the list 508 and establishing refined potential error locations for each packet of the list 510 according to the performed FEC-based correction 502 and according to the identified potential error positions 508. The method 500 further corrects the packets of the list according to the refined potential error locations 514.

In FIG. 5B there is indicated that performing an FEC-based correction on the packet list 502 includes determining inconsistent bit locations for the packet list 504 and if possible correcting the packets of the list 505 according to the determined inconsistent bit locations.

FIG. 5B also indicates that identifying potential error positions for each packet of the list 508 includes computing a checksum for each packet of the list 506, identifying a checksum pattern type 507 according to the computed checksum and determining a bit error event 509 according to the identified checksum pattern type.

FIG. 5B further indicates that establishing refined potential error locations for each packet of the list 510 includes intersecting the inconsistent bit locations information and potential error locations information 513 to determine the refined potential error locations and verifying the number of refined potential error locations 512. If the number of refined potential errors for a bit position is acceptable, the bits of the packets of the list at that bit position can be corrected according to the refined potential error locations 514.

Exhaustive Method

Presented in FIG. 5C is an exhaustive checksum-aided FEC recovery method 520, according to one embodiment. The method 520 is adapted to be applied on a group of received packets that is organized in a list of packets, the list of packets having a redundant packet. The method 520 includes determining an inconsistent bit indicator for the packets for a bit position 522 and determining a reliability indicator indicative of a potential bit error location for a packet 524. Then the method 520 is adapted to count the number of potential bit error locations for the given bit position amongst all packets 526. A correctable bit location at the potential bit error location is identified 528 depending on the calculated number. The correctable bit location is identified if the number of potential error location for the given bit position is one amongst all packets. In such a case, the method 520 further includes correcting a bit at the correctable bit location according to the associated inconsistent bit indicator 530. It shall be understood that the inconsistent bit indicator may be determined 522 later on in the method such as right before correcting a bit 530. It shall further be understood that the inconsistent bit indicator 522 may not be required if a correctable bit location is not identifiable 528. The method further includes updating a record of valid bit position 532 according to the corrected bit 530. It shall be recognized that although updating the record of valid bit position 532 may be beneficial to increase the recovery success rate and the efficiency of the method 520, this last step 532 is optional.

According to one embodiment, as presented in FIG. 5C and more specifically in FIG. 5D, the bit reliability indicator is determined 524 by computing a checksum for each packet of the list 540, identifying a checksum pattern type 542 according to the computed checksum and determining a bit error event or a bit reliability indicator 544 according to the identified checksum pattern type. It shall however be recognized that there are other suitable methods of determining the bit reliability indicator such as according to an LLR value, without departing from the scope of the present method 520.

Direct Method

Figure 6A:
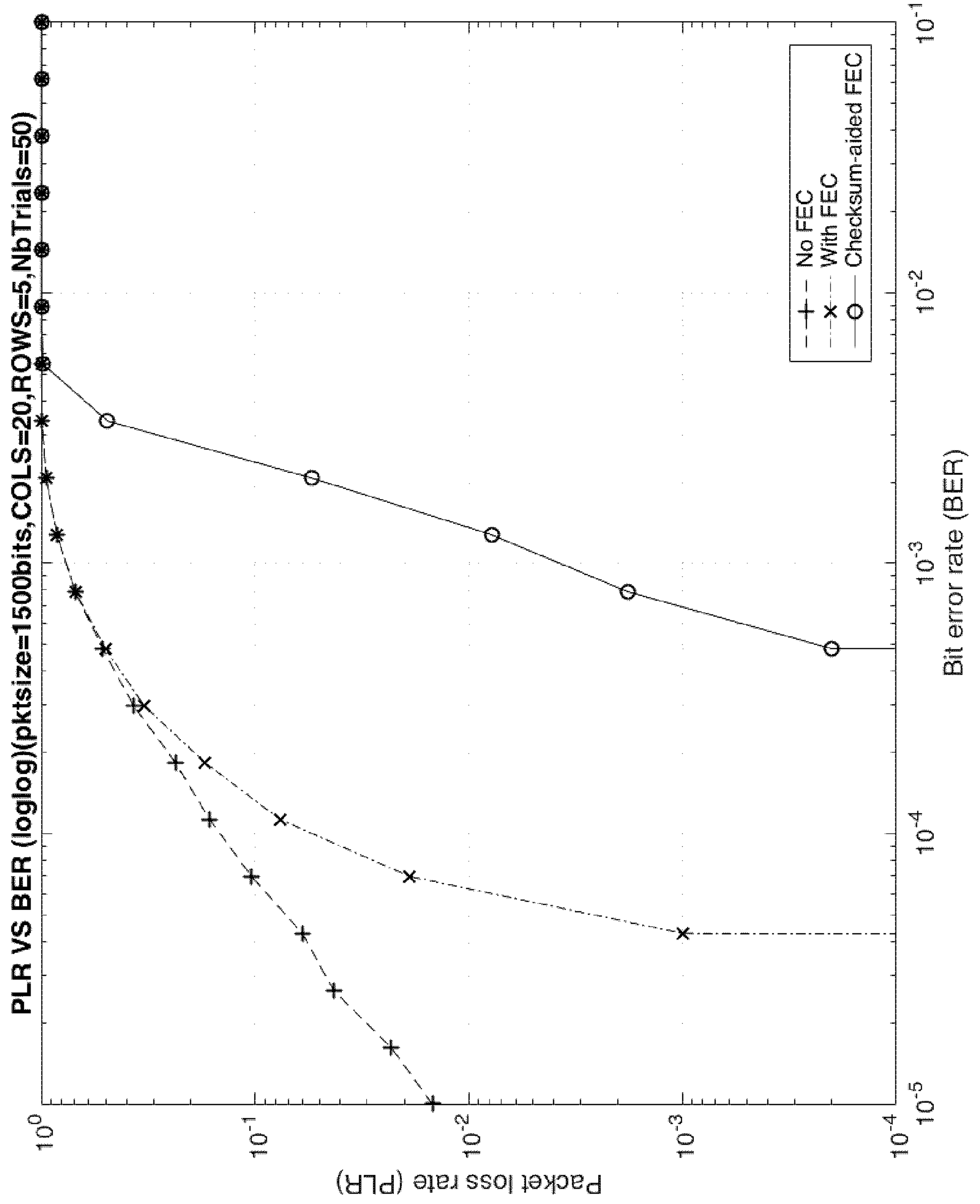
FIG. 6A presents a graph of a packet loss rate (PLR) as a function of a bit error rate (BER) for a COLS=20, ROWS=S configuration with packet sizes of 1500 bits on a log-log scale, in order to compare state-of-the-art methods with the direct method of FIG. 5A, according to one embodiment.
Figure 6B:
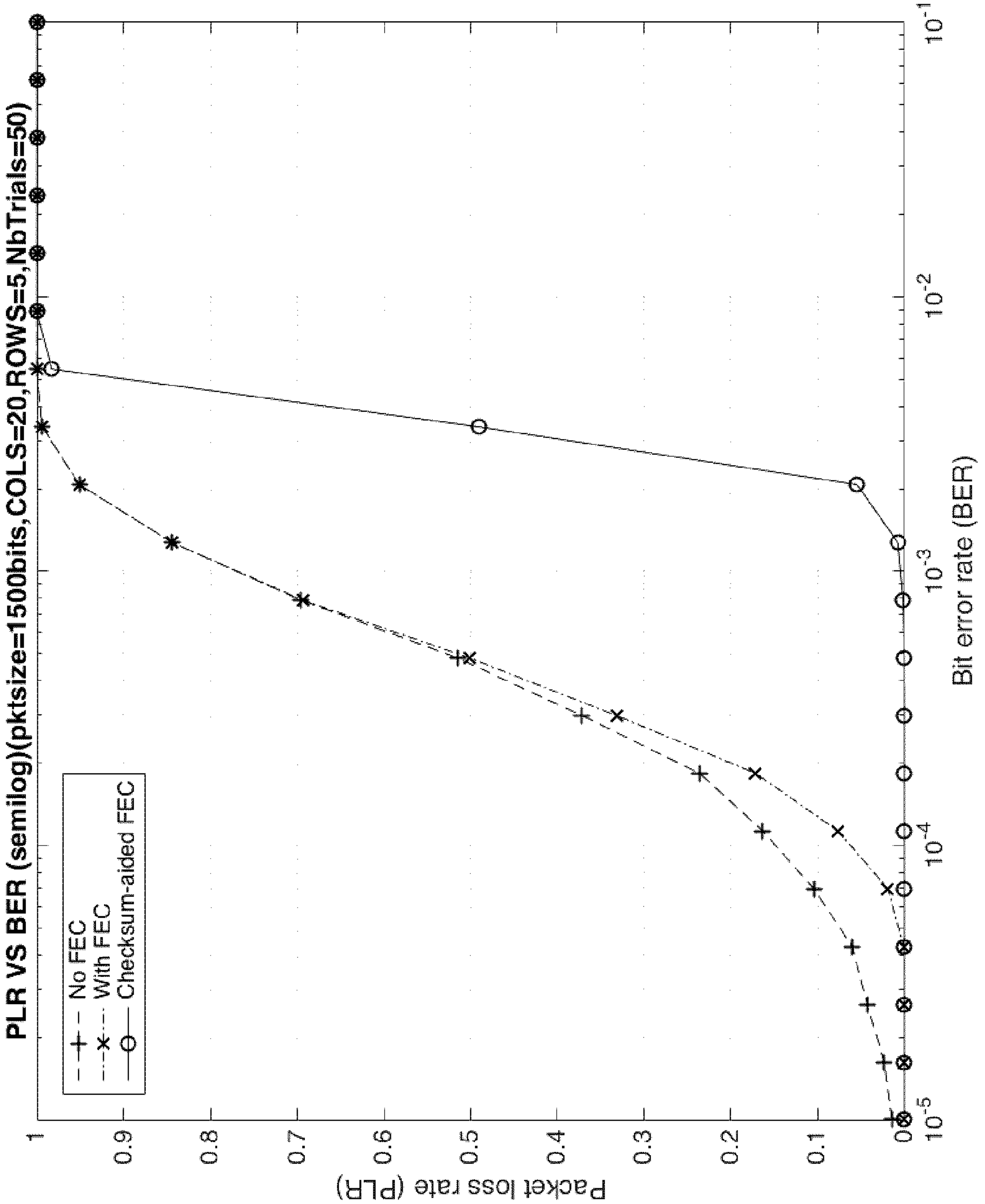
FIG. 6B presents a graph of a packet loss rate (PLR) as a function of a bit error rate (BER) for a COLS=20, ROWS=S configuration with packet sizes of 1500 bits on a semi-log scale, in order to compare state-of-the-art methods with the direct method of FIG. 5A, according to one embodiment.
Figure 6C:
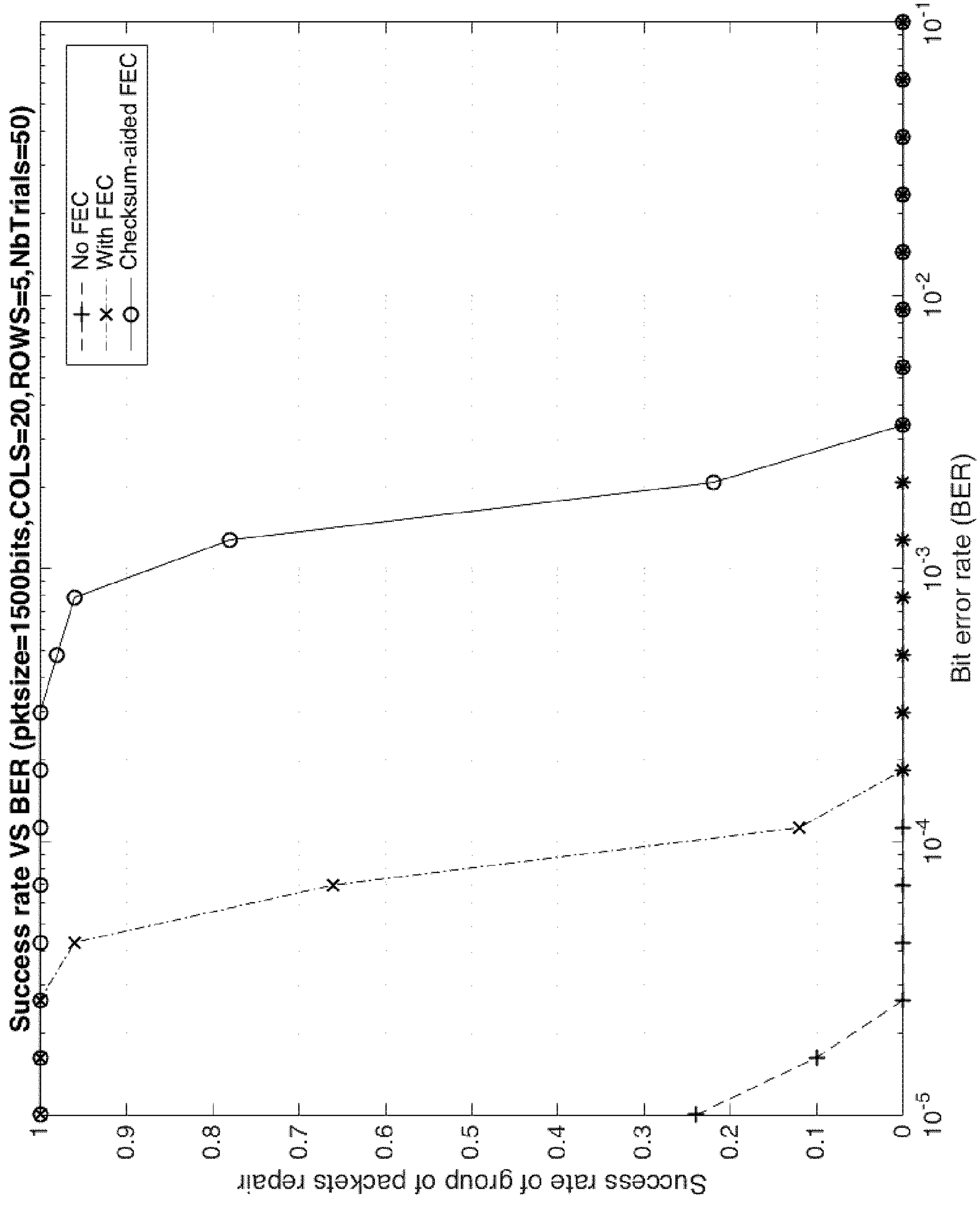
FIG. 6C presents a graph of a success rate of group of packets repair as a function of a bit error rate (BER) for a COLS=20, ROWS=S configuration with packet sizes of 1500 bits on a semi-log scale, in order to compare state-of-the-art methods with the direct method of FIG. 5A, according to one embodiment.

Presented in FIGS. 6A, and 6B are graphs indicating Packet Loss Rates (PLR) according to various Bit Error Rates (BER) for a given packet size, and a given number of FEC columns and rows based on a given number of trials for one embodiment. For instance, FIG. 6A presents a graph of the packet loss rate (PLR) as a function of the bit error rate (BER) for a COLS=20, ROWS=5 configuration with packet sizes of 1500 bits on a log-log scale for state-of-the-art methods and the proposed method 500. Specifically, we can observe the PLR without FEC, with FEC and with the proposed method 500. FIG. 6B presents the same information on a semi-log scale. FIG. 6C presents a graph of the success rate of group of packets repair as a function of the bit error rate (BER) for the same configuration and methods. We can observe that although the performance of the FEC method provided by the prior art is significantly better than the non-FEC method, the proposed checksum-aided FEC method 500 clearly outperforms the FEC method. We can observe for instance in FIG. 6B, that while the FEC method experiences packet loss rate of 70% (around a BER of $8\times10^{-4}$); the direct proposed checksum-aided FEC method 500 provides a packet loss rate that is nearly zero. We can observe in all the simulated cases that the proposed checksum-aided FEC method 500 provides a packet loss rate nearly zero at bit error rates causing the other methods to experience significant packet loss rates.

Exhaustive Method

Figure 6D:
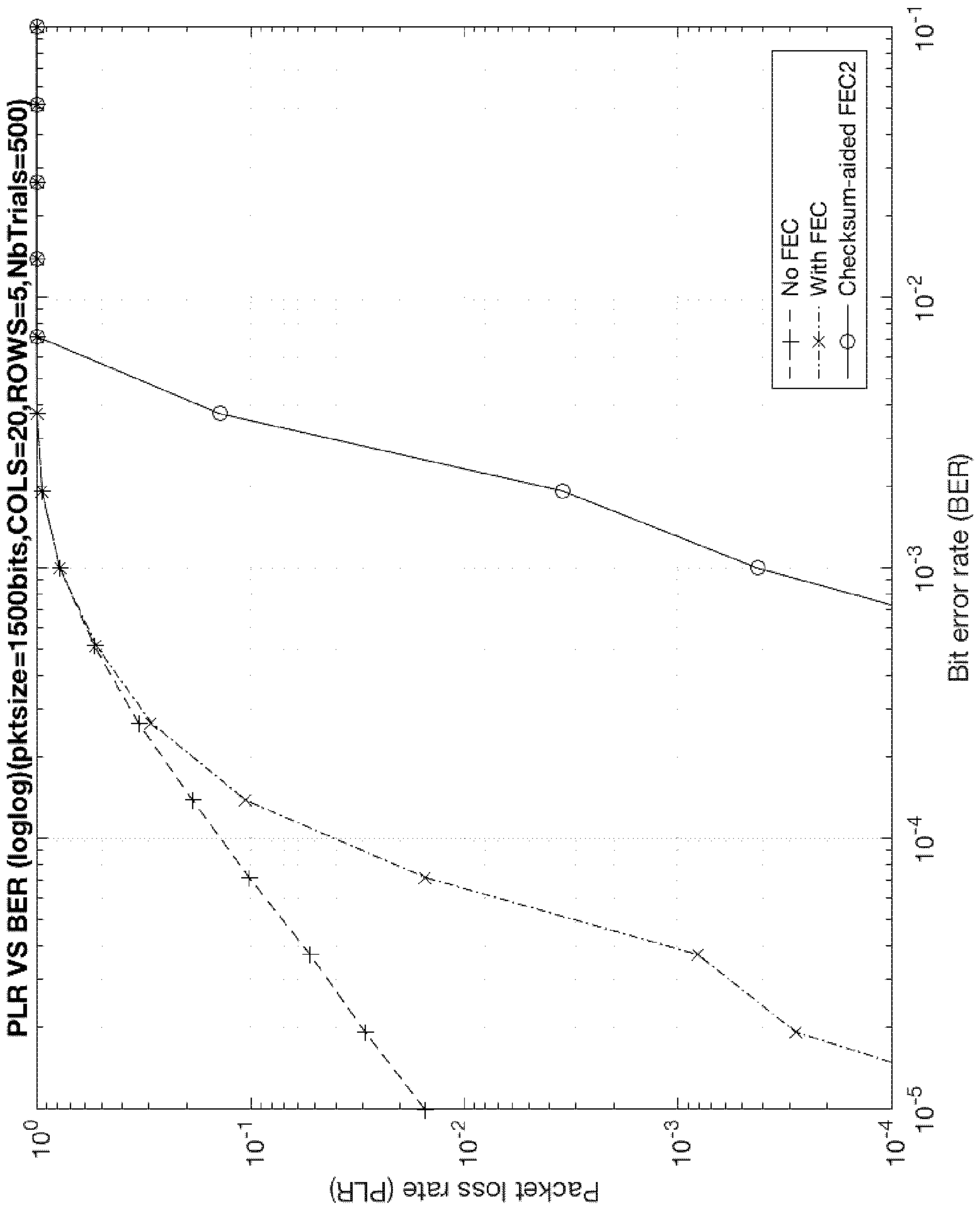
FIG. 6D presents a graph of a packet loss rate (PLR) as a function of a bit error rate (BER) for a COLS=20, ROWS=5 configuration with packet sizes of 1500 bits on a log-log scale, in order to compare state-of-the-art methods with the exhaustive method of FIG. 5C, according to another embodiment.
Figure 6E:
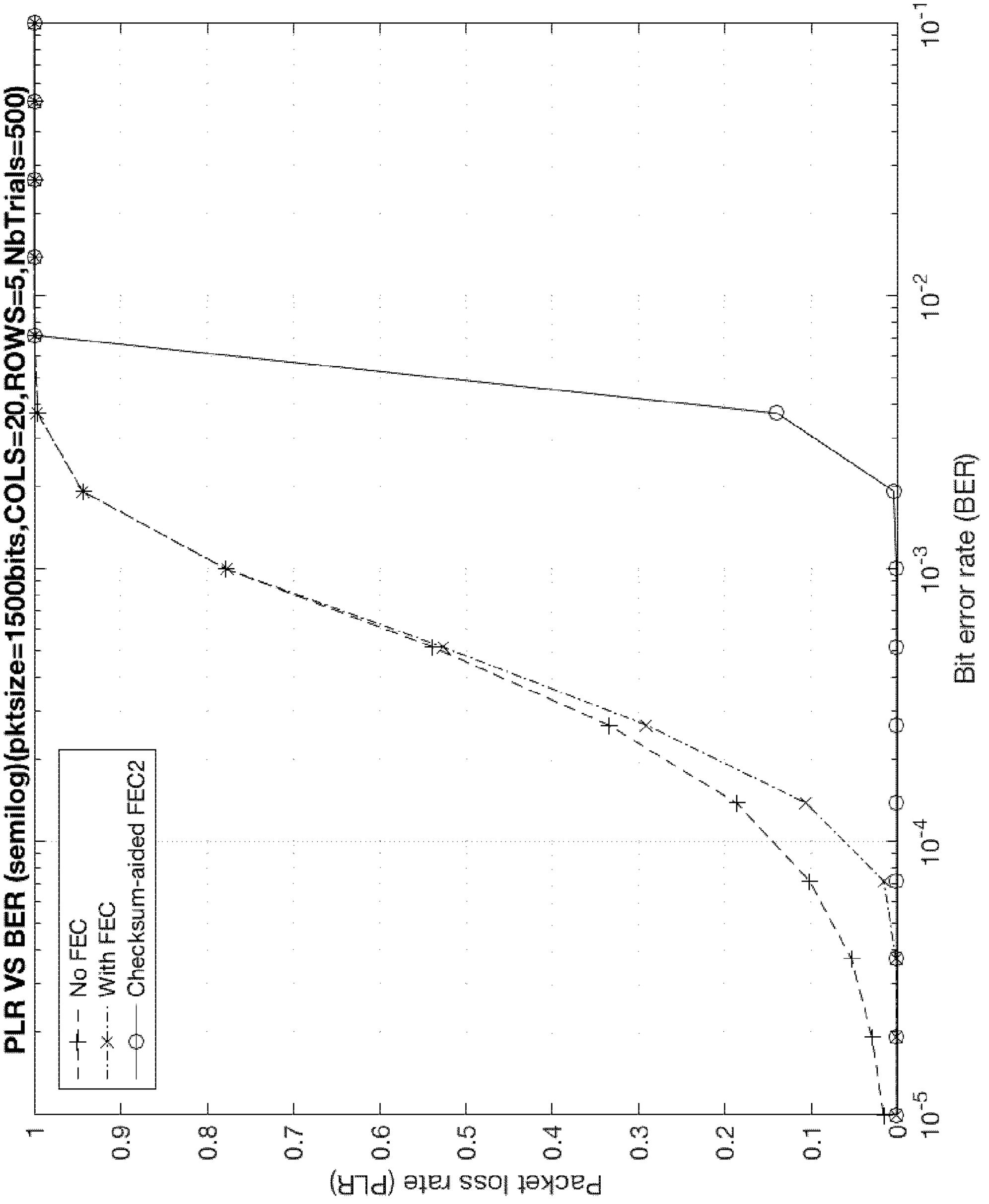
FIG. 6E presents a graph of a packet loss rate (PLR) as a function of a bit error rate (BER) for a COLS=20, ROWS=S configuration with packet sizes of 1500 bits on a semi-log scale, in order to compare state-of-the-art methods with the exhaustive method of FIG. 5C, according to another embodiment.
Figure 6F:
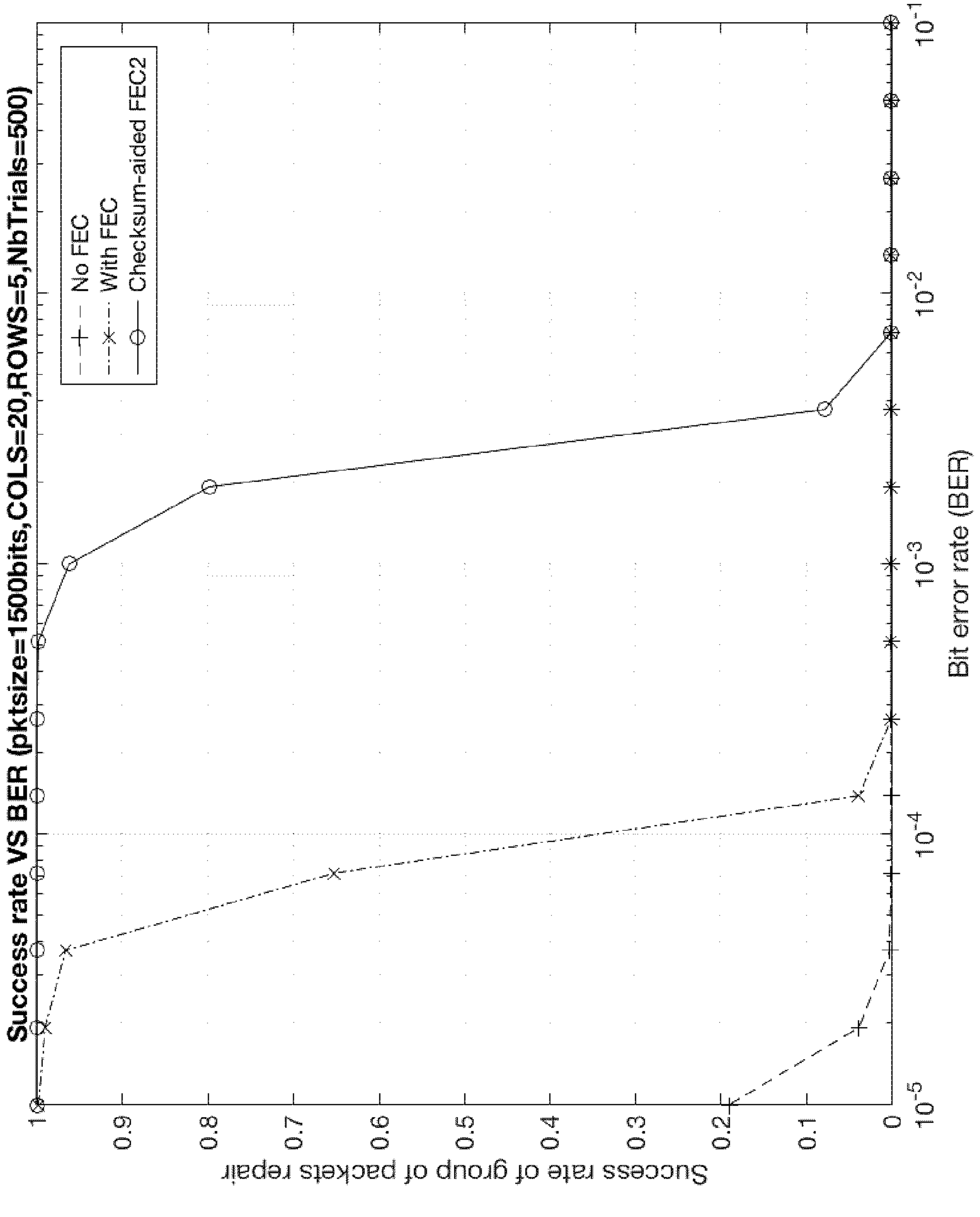
FIG. 6F presents a graph of a success rate of group of packets repair as a function of a bit error rate (BER) for a COLS=20, ROWS=S configuration with packet sizes of 1500 bits on a semi-log scale, in order to compare state-of-the-art methods with the exhaustive method of FIG. 5C, according to another embodiment.

Presented in FIGS. 6D and 6E are graphs indicating Packet Loss Rates (PLR) according to various Bit Error Rates (BER) for a given packet size, and a given number of FEC columns and rows based on a given number of trials for a second embodiment. For instance, FIG. 6D presents a graph of the packet loss rate (PLR) as a function of the bit error rate (BER) for a COLS=20, ROWS=5 configuration with packet sizes of 1500 bits on a log-log scale for state-of-the-art methods and the proposed exhaustive method 520. Specifically, we can observe the PLR without FEC, with FEC and with the proposed method. FIG. 6E presents the same information on a semi-log scale. FIG. 6F presents a graph of the success rate of group of packets repair as a function of the bit error rate (BER) for the same configuration and methods. We can observe that although the performance of the FEC method provided by the prior art is significantly better than the non-FEC method, the proposed checksum-aided FEC method 520 clearly outperforms the FEC method. We can observe for instance in FIG. 6E, that while the FEC method experiences packet loss rate of 70% (around a BER of $8\times10^{-4}$); the proposed checksum-aided FEC method 520 provides a packet loss rate that is nearly zero. We can observe in all the simulated cases that the proposed checksum-aided FEC method 520 provides a packet loss rate nearly zero at bit error rates causing the other methods to experience significant packet loss rates.

Direct Method

An example of how the information from the UDP checksum and the FEC parity are used in the proposed method 500 to correct the errors is shown in FIGS. 7A and 7B.

Presented in FIG. 7A are three packets at the transmission side, an associated checksum has been calculated by dividing each packet in words of 16 bits. A FEC packet corresponding to the list of three packets is also calculated on the transmission side using the conventional FEC approach. The three packets and corresponding FEC packet are transmitted to a receiver.

Note that the Internet Checksum is the one's complement of the one's complement sum of all the 16-bit words in the computation data. Furthermore, during the calculation of the checksum at the transmission side, the value of the checksum in the checksum field is set to all zeros in binary, and after the calculation of the checksum, it is replaced by the computed one for transmission. The validation process at the receiver side is performed using the same algorithm except that the received checksum field value is used in the computation of the received UDP checksum rather than zeros. Presented in FIG. 7A, the received data corresponding to the transmitted data is divided into two chunks of 16-bit words. A ones' complement sum over the two words is performed and a received checksum which normally should equate to the transmitted checksum is added to the one's complement sum in order to establish a checksum value at the receiver side. Received data is valid if the recomputed checksum (after a final one's complement on the result) at the receiver side is all zero, otherwise the data is considered corrupted.

As presented in FIG. 7B, at the reception the UDP checksum error correction method indicates, according to an observed computed checksum pattern type (CPT) and an associated probable bit error event (BEE), that "packet 1" has at least one error at potential bit locations 11 or 27, "packet 2" has at least one error at potential bit locations 7 or 23, "packet 3" has at least one error at potential bit locations 8 or 24, redundant "packet FEC" does not have any error.

Further presented in FIG. 7B, the "received FEC" provides information with respect to inconsistent locations with respect to at least one of the three packets of the list. The indicated inconsistent locations are at bit locations 27, 23 and 8. Those locations are definitive (i.e. not potential) however it is not possible to determine with only this received FEC in which one of the three packets a bit is in error at the indicated definitive locations.

However, as further presented in FIG. 7B, by using the potential error bit locations associated to each packet provided by the UDP checksum method and intersecting that information with the definitive bit error locations provided by the FEC packet, the method is adapted to determine with certainty that "Packet 1" has an error at bit location 27, "Packet 2" has an error at bit location 23 and "Packet 3" has an error at bit location 8.

Exhaustive Method

Figure 7C:
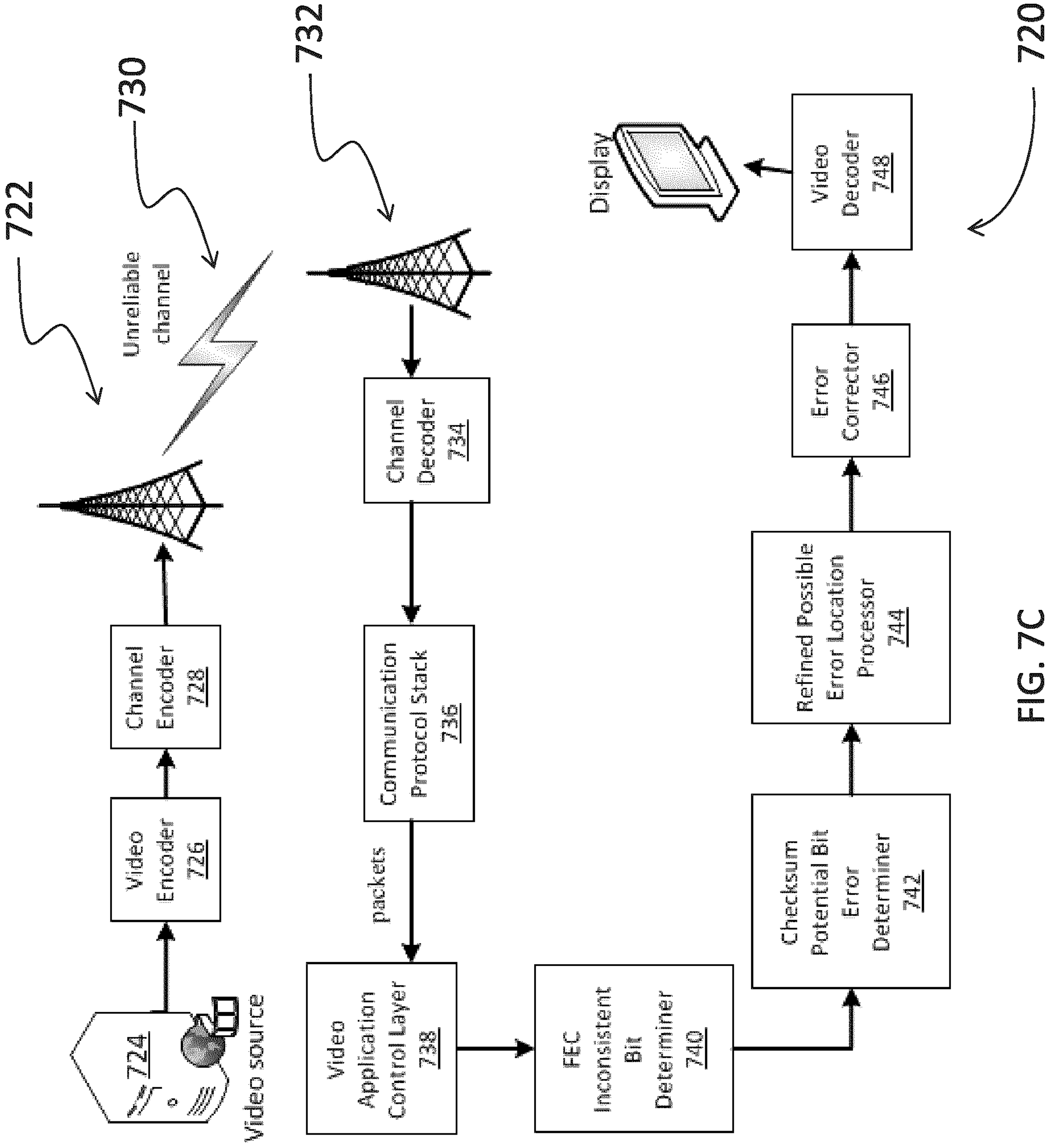
FIG. 7C presents a communication network having a Checksum-Aided FEC error corrector, according to one embodiment.
Figure 7D:
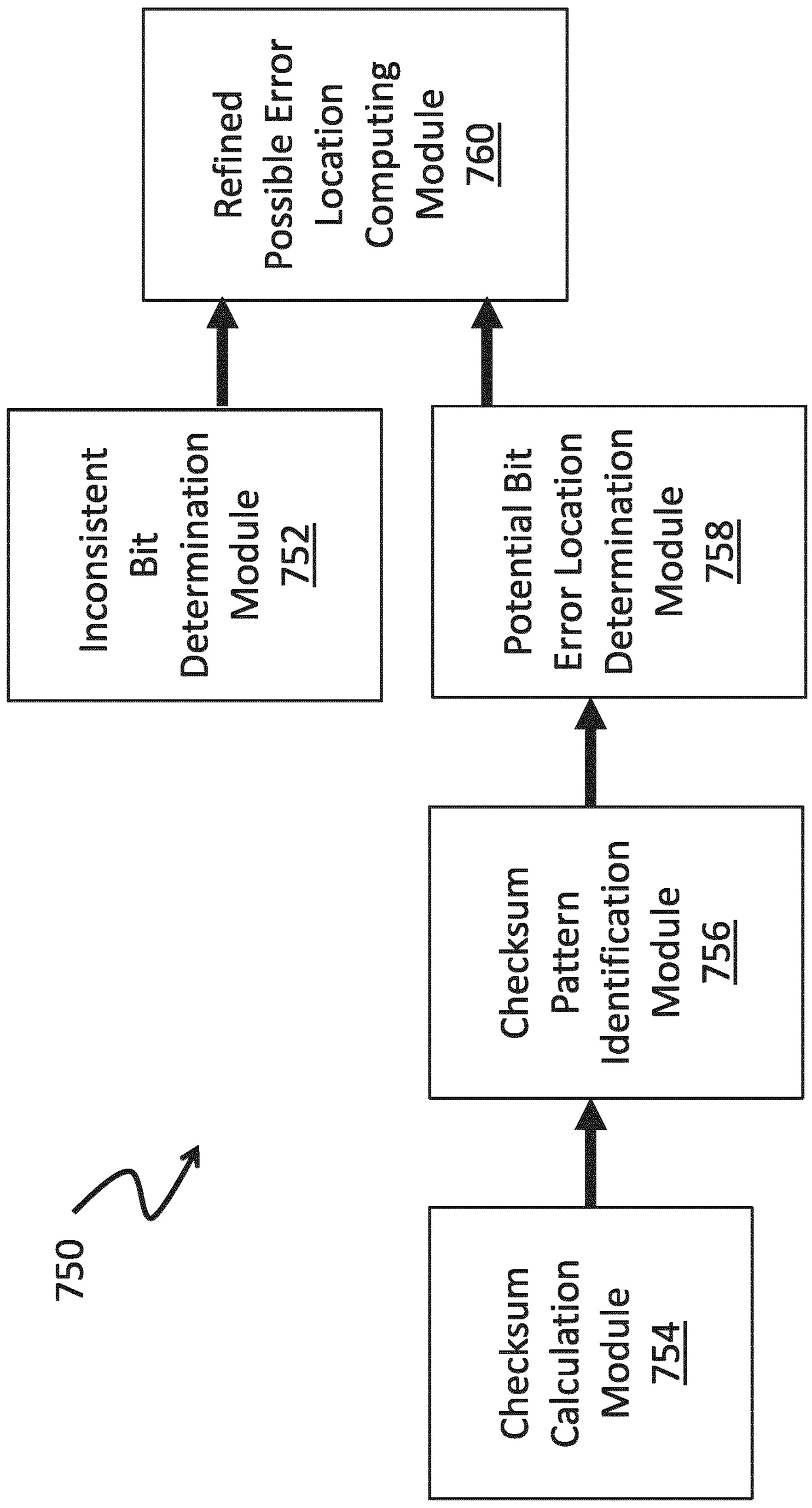
FIG. 7D presents a block diagram of an error locator in a receiver having Checksum-Aided FEC modules, according to one embodiment.
Figure 7E:
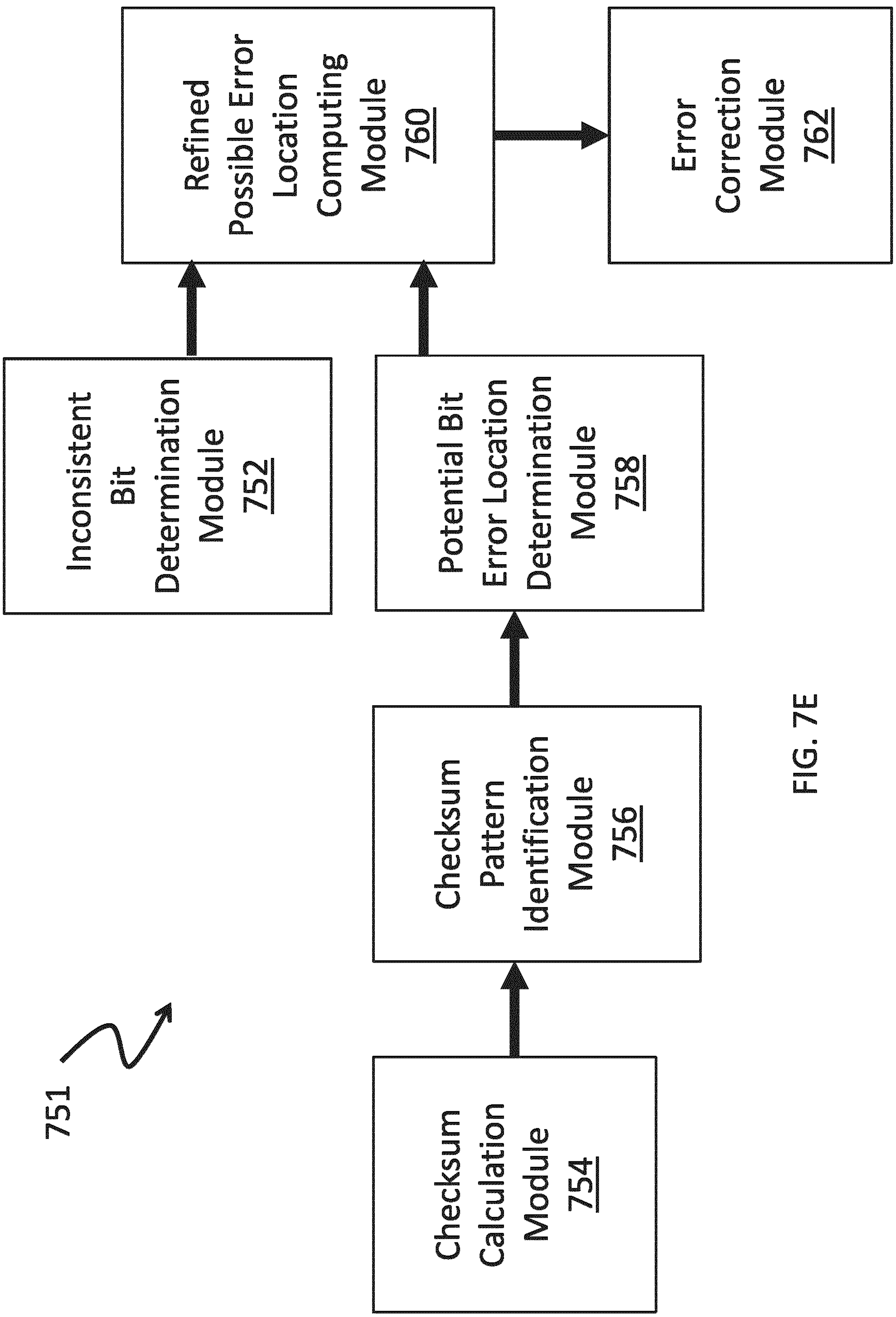
FIG. 7E presents a block diagram of an error corrector in a receiver having Checksum-Aided FEC modules, according to another embodiment.
Figure 7F:
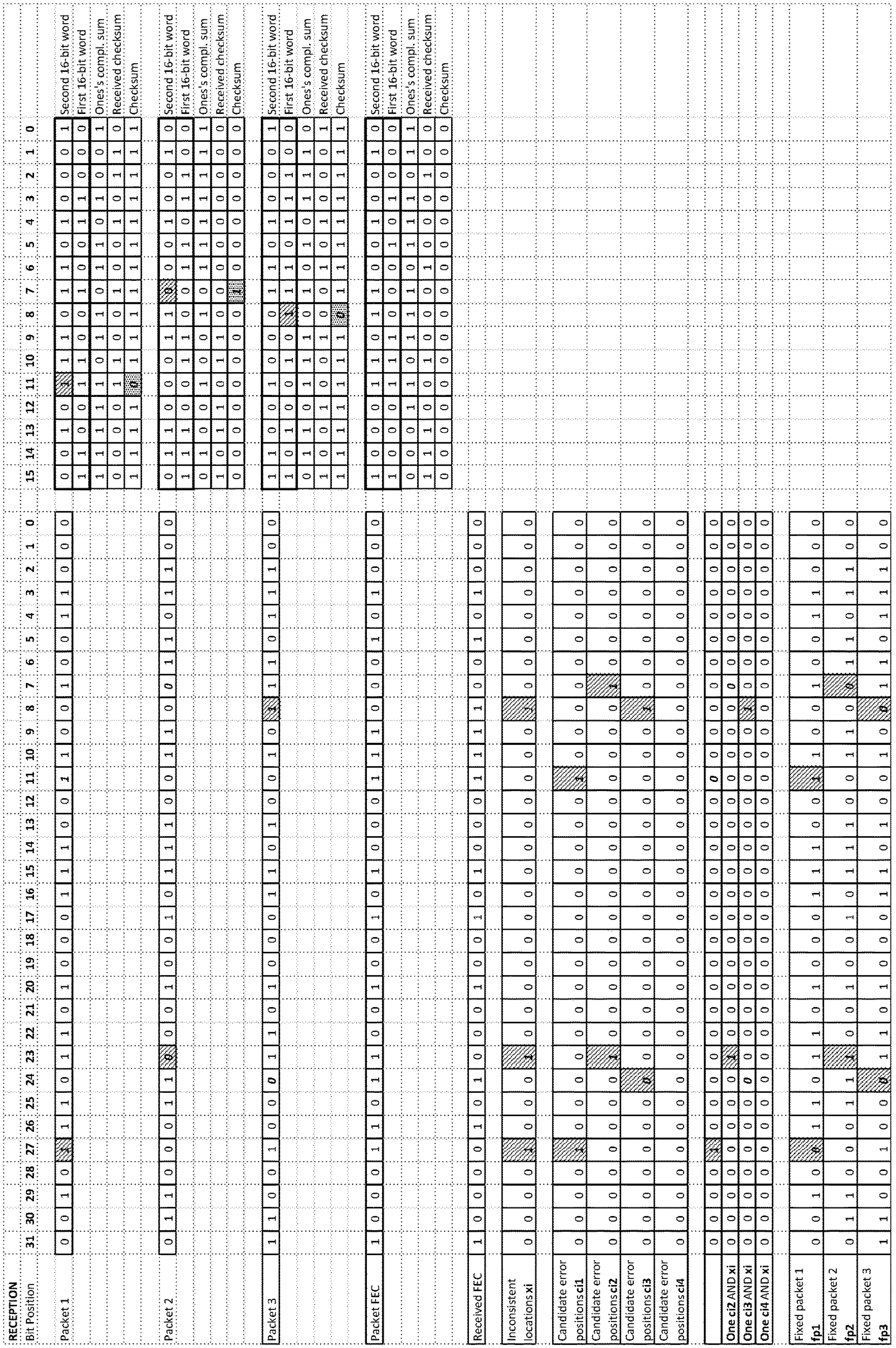
FIG. 7F presents the list of packets at the receiver side of FIG. 6A to which the checksum-aided FEC method of FIG. 5C has been applied using correlated information from the respectively associated checksum value and the associated FEC packet value, according to another embodiment.

An example of how the information from the UDP checksum and the FEC parity are used in the method 520 to correct the errors is shown in FIG. 7F. FIG. 7F presents the packets received at a receiver side following a transmission of the packets on the transmission side of FIG. 7A.

As presented in FIG. 7F, at the reception the UDP checksum error correction method indicates, according to an observed computed checksum pattern type (CPT) and an associated probable bit error event (BEE), that "packet 1" has at least one error at potential bit locations 11 or 27, "packet 2" has at least one error at potential bit locations 7 or 23, "packet 3" has at least one error at potential bit locations 8 or 24, redundant "packet FEC" does not have any error.

Further presented in FIG. 7F is the "received FEC" that is computed at the receiver according to Packets 1, 2 and 3 and "packet FEC". The "received FEC" provides information with respect to an inconsistent bit for at least one of those four packets constituting a FEC-protected list of packets, as indicated by the inconsistent bit indicator. A parity operation is performed between the received packets (packets 1, 2, and 3 here) and the "packet FEC" to determine the "received FEC" which is an inconsistent bit indicator. The inconsistent bit indicator indicates that at least one of the packets may has an erroneous bit at bit positions: 27, 23 and 8. Those locations are definitive (i.e. not potential) however it is not possible to determine with only this received FEC in which one of the three packets and the "packet FEC" a bit is in error at the indicated bit positions. Note that a value of 1 at a given position of the inconsistent bit indicator indicates that there is an odd number of errors at that position (thus at least one error at that position) and a value of 0 means that there is zero or an even number of errors at that position.

Further presented in FIG. 7F is the "candidate error position" or potential bit error location determined according to the packet and associated CPT. For "packet 1", the potential bit error locations ci1 are at bit positions 11 and 27. For "packet 2", the potential bit error locations ci2 are at bit positions 7 and 23. For "packet 3", the potential bit error locations ci3 are at bit positions 8 and 24. For "packet FEC", there are no potential bit error locations ci4. As can be noticed for every bit position, there is at most one candidate bit position. If at a given bit position there is only one potential bit error location amongst all packets, that potential bit error location at the associated packet is identified as a correctable bit location. In order to determine the bit value at that correctable bit location, an intersection of the inconsistent bit indicator and potential bit error location is performed. That is, if the inconsistent bit indicator has a positive value (i.e. “1”) at the bit position of the potential bit error location then the bit value at that location is flipped or modified for the associated packet.

For instance, at bit position 7 there is only one potential bit error location amongst all packets, only “packet 2” has a potential error location at bit position 7. However, a parity operation (i.e. XOR) performed between all the bits at position 7 based on all three packets and the “packet FEC” (yielding “received FEC”) results as an inconsistent bit indicator that equals “0” (we see that bit value at position 7 of “received FEC” equals “0”) indicating that the received value at bit position 7 for “packet 2” is after all correct and does not require a modification.

In another instance, at bit position 8 there is only one potential bit error location amongst all packets, only “packet 3” has a potential error location at bit position 8. A parity operation (i.e. XOR) performed between all the bits at position 8 based on all three received packets and “packet FEC” (yielding “received FEC”) results as an inconsistent bit indicator that equals “1” (we see that bit value at position 8 of “received FEC” equals “1”) indicating that the received value at bit position 8 for “packet 3” is incorrect and must be flipped from “0” to “1”.

By using the potential error bit locations associated to each packet provided by the UDP checksum method and intersecting that information with the inconsistent bit indicator provided by the “received FEC” packet, the method 520 is adapted to determine on a bit basis and with certainty that “Packet 1” has an error at bit location 27, “Packet 2” has an error at bit location 23 and “Packet 3” has an error at bit location 8.

It shall be understood that for better results this method could be used in combination with error concealment methods or even other error correction methods such as a list decoding approach. Since in some cases this method alone may not be sufficient to correct all the errors of a transceived packet.

Although the proposed method will provide improvements over existing methods, especially in mild error conditions, there are instances where it may not be able to fully repair video packets (i.e. make them identical to their originally transmitted version) and in those cases one could always resort to additional processing steps or apply error concealment. In all cases, whether using this method or this method with additional steps, the resulting video packet's payload should be validated (i.e. check that it is syntactically valid and decodable), and if the validation is unsuccessful an error concealment method or any other known packet recovery methods shall be resorted to. As additional validation, it could be verified that the reconstructed packet fits well spatiotemporally in the video sequence using a measure of blocking artifacts at block edges such as the one proposed in L. Trudeau, S. Coulombe, S. Pigeon “Pixel Domain Referenceless Visual Degradation Detection and Error Concealment for Mobile Video,” in the 2011 IEEE International Conference on Image Processing (ICIP 2011), pp. 2229-2232, September 2011. Such extra validation is especially beneficial in the case of non-fragile payloads. Fragile payloads are those in which changing a bit will very likely make them invalid, such as those generated using context adaptive binary arithmetic coding (CABAC) as in H.264 main profile and HEVC. If an erroneous fragile payload is modified and becomes valid (by changing one or few bits), that modified version is likely to correspond to the original uncorrupted payload. Therefore, if the modified payload is valid, it is very likely that it is without error (and therefore validating that the payload is syntactically valid is often sufficient). But in standards generating non-fragile payloads, such as H.264 using context adaptive variable length coding (CAVLC), although an invalid payload indicates that the payload is erroneous, a valid payload is not necessarily without error. In such case, other validation such as the mentioned one based on a spatiotemporal pixel-domain measure is beneficial.

Challenging situations requiring special attention include the case where the received checksum is erroneous. Those situations are described with respect to the direct method 500 but the same can be applied to the exhaustive method 520 as well. Indeed, although the received checksum is quite small in size compared to typical video payloads (16 bits versus several hundreds or thousands of bits), making much more probable that the payload is hit by errors rather than the received checksum, the received checksum may be damaged as well (i.e. most damaged packets will have erroneous corrupted payloads rather than erroneous checksums). The problem is that a corrupted received checksum will provide misleading information related to the potential error positions and even indicate that the payload is erroneous while it is not. To protect against this possibility in the case of fragile payloads, when the received checksum indicates an error, it should be ignored if the payload is syntactically valid and therefore decodable (revealing that only the received checksum was erroneous and that the payload is without error). In summary, as an initial processing step in the case of fragile payloads, it should be validated if the payload of a damaged packet is syntactically valid (decodable without error) and, if it is the case, the computed checksum value should be ignored and it shall be considered that the packet was received without error. As mentioned, this step will be beneficial when used with standards generating fragile payloads but additional validation may be desirable for non-fragile payloads.

Another way to approach the erroneous checksum problem is if soft information is available (e.g. log-likelihood ratios (LLR) available at the physical layer and providing an indication of the reliability of each received bit). In this situation, a threshold on absolute LLR values can be set to determine if the bit values of the checksum are all reliable. If they are all reliable, then we do not have to worry about the checksum being erroneous and the checksum is determined to be reliable. In fact, if soft information is available, it would be possible to combine soft information and checksum information into a better and more accurate method. Among the potential error positions indicated by the checksum, the bit positions corresponding to high enough absolute LLR values are removed from the list of potential error positions and are determined as being accurate, according to a predetermined absolute LLR threshold value. The predetermined absolute LLR threshold value is established according to a reliable bit confidence level that is sufficient or high enough. Another issue is that UDP packets for which the UDP checksum reveals an erroneous packet are normally discarded in the protocol stack and are not delivered to the application layer. However, since the proposed method is a decoder side solution, the method can be easily deployed in existing communication systems as it requires few changes to the protocol stack. The protocol stack would simply need to enable erroneous packets to be delivered to the application layer. This is similar to UDP-Lite protocol (L. A. Larzon, M. Degermark, S. Pink, L. E. Jonsson, and G. Fairhurst, “The lightweight user datagram protocol (UDP-Lite).” IETF, RFC 3828). Moreover, it would also be possible to better protect the UDP checksum information during the transmission in order to reduce the chances of receiving an erroneous UDP checksum.

Another challenging situation that could arise is when both the payload and the received checksum of a media packet are in error. In the proposed method, what would often happen in that case, for an FEC-protected list $L_i$, is that such packet would be tagged as erroneous (because not valid syntactically), but the combined possible error locations for that packet (i.e. $e_{ij}=(x_i \text{ AND } c_{ij})$) would be zero, indicating that there is nothing to repair in that packet. Indeed, the computed checksum would often indicate a candidate erroneous position that is not compatible with the inconsistent bit locations. In this case, other packets of that FEC-protected list $L_i$ (those that we know how to repair) should be repaired and the normal process with the other lists should be continued. Eventually, all packets of a list $L_i$ (where j could be equal to i) will have been corrected except an erroneous packet for which the erroneous locations will be provided by the remaining inconsistent bit locations indicated by a certain $x_i$. The repaired packet will, of course, have to be validated by verifying that the repaired payload is syntactically valid. As mentioned, it can also be validated if the reconstructed packet fits well spatiotemporally in the video.

Also, it is possible to resort to list decoding making various assumptions on the possible received checksum error positions and payload error that are compatible with the information provided by the headers, received checksums, calculated checksums, inconsistent locations and payloads. More specifically, there is considered candidate repaired packets that do not have too many bits altered (in the payload, received checksum and other parts) compared to their received counterparts, and which lead to a computed checksum of zero and to a payload that is syntactically valid (and possibly that fits well spatiotemporally in the video sequence, especially for fragile payloads). Note that the repair process of packets should always begin by repairing the headers (without considering the received checksum). Indeed, some field of the UDP/RTP headers are fixed during the transmission (e.g. Source/Destination Port Num in UDP header) and some other parts are easily predictable (e.g. Sequence Number in RTP header) because of the redundant information in the headers, making them easy to repair.

It should be understood that many variations and improvements of the proposed method to increase its robustness to various specific cases, such as those proposed in the previous paragraphs, could be made without departing from the scope of the present method.

Note that potential error locations as indicated by the CPT depend not only on the bit position (more specifically the modulo 16 of the position) in the packet but also on the packet bit value at that position. For instance, if the checksum pattern type is associated with a bit value of 0 that was flipped to 1 in column 5 of the checksum, the potential error locations will be constituted of positions in the packet for which the modulo of the position is 5 and for which the bit value is 1. Therefore, if two packets in a list $L_i$ are in error and contain different bit values at an inconsistent bit location, then it is easy to determine in which packet the bit is in error at that bit location.

On the other hand, if two packets in a list $L_i$ are in error and contain the same bit values at an inconsistent bit location, then it is not possible to determine in which packet the bit is in error at that bit location. In this case, other bits that can be corrected at other inconsistent bit locations in the list $L_i$ are corrected and another list $L_i$ is processed (later the list $L_i$ may be processed again, once more information is gathered by correcting packets of other lists). Such case occurs when, for an inconsistent bit position, there exists more than one potential error location among all packets. Otherwise the erroneous packet and the error location can be clearly identified for that inconsistent bit position.

It shall be recognized that although the above embodiments have been described using a video payload, the checksum-aided FEC method is also applicable to encrypted video payloads. Moreover, the method is also applicable to any other kind of payload content such as images, audio or any kind of data or combination thereof even though in the described context, RTP packets are normally used for multimedia audiovisual content. Indeed, the proposed method permits to correct errors regardless of the payload content.

According to one embodiment, the proposed checksum-aided FEC method is complemented with list decoding. In list decoding, different bit streams candidates are tried out and there is retained only the candidates for which the decoded information is valid, the syntax is valid (do not make the decoder crash or report an error), and meet certain conditions (such as decoded number of blocks is valid based on the context). Thereby, the ambiguities are resolved by trying various possible streams and retain those that are actually decodable, valid and contextually reasonable. Moreover, adding list decoding to the checksum-aided FEC method would also permit to make the method functional in higher bit error conditions by considering more complex bit error patterns, such as having several bits in error in a same packet or having errors at the same location but for several packets.

The method can also be applied to other types of media content, such as audio, where corrupted packets are likely to cause decoding problems or inconsistencies, i.e. a high proportion of the corrupted packets will either be non-decodable or not meet some expected condition (such as the expected number of blocks in video). Moreover, the method can be applied to various types of encrypted multimedia data, such as encrypted voice data, encrypted image data, or encrypted video data. In this case, the method is applicable in combination with a decryption method. As a result, the candidate bit stream determined by the present method shall be decryptable and decodable.

It shall be recognized that the method is applicable to various types of encoded video data such as video data encoded with H.264 and HEVC, as well as those encoded with VP8, VP9 or VP10.

In addition, it shall be recognized that the method can use various checksum information such as IP, UDP, TCP checksums to identify potential error locations within a header (e.g. IP, UDP, TCP, RTP) and/or a payload (e.g. audio, video, image). Note that focus is applied on the correction of the payload of a packet. However, the same ideas apply to the correction of the header even though repairing headers is much simpler than repairing the payload since in most video applications many header parameter values can easily be predicted.

Also, it shall be recognized that although in the method the FEC approach was described using the XOR parity operator any other kind of parity operator could be applied without departing for the scope of the present method. The proposed method applies to the context of video broadcasting using FEC such as Pro-MPEG, RFC 2733, RFC 5109, SMPTE 2022-1, etc.

Also, it shall be recognized that although the embodiments are described using FEC the described checksum method could be applied with any other error correction method using redundant packets where the redundancy mechanism permits to identify the damaged bit positions among a group or list of packets.

Moreover, depending on the number of errors and error dispersion amongst the various packets, it is possible for the method to entirely correct the received packets and eliminate all bit errors that were introduced following the transmission of the packets. Indeed, this method is adapted to produce the same packets as those that were initially transmitted.

Direct Method

It shall be recognized that the method 500 can be implemented by a computing device having modules adapted to execute the various steps of the method 500 of FIG. 5A.

It shall further be recognized that the method 500 can be implemented by a receiver device of a communication system.

A MATLAB source code for simulating the method 500, according to one embodiment, is presented in referenced U.S. provisional patent application No. 62/405,906.

Exhaustive Method

Figure 7G:
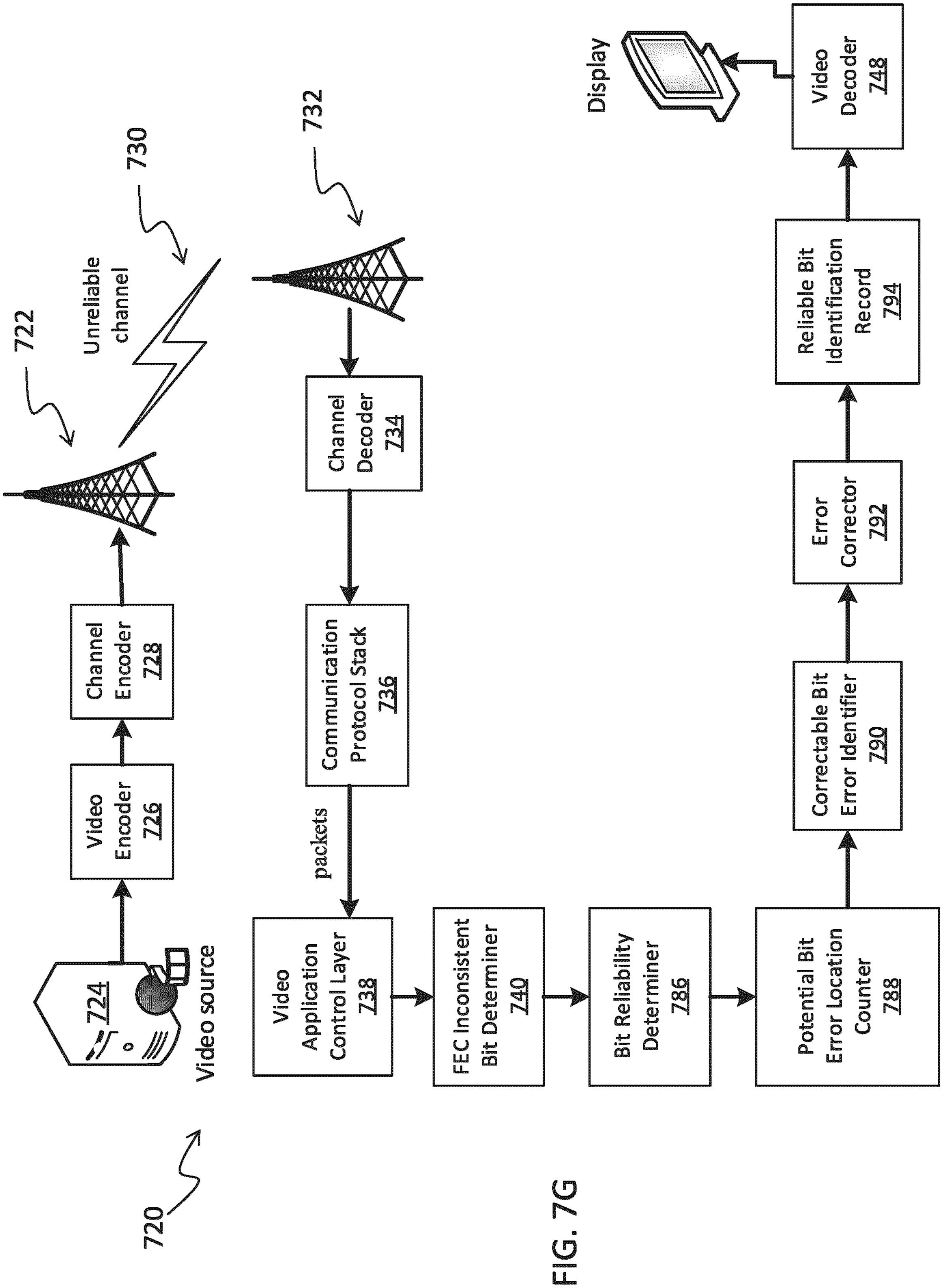
FIG. 7G presents a communication system having a receiver that is adapted to apply the method of FIG. 5C, according to one embodiment.
Figure 7H:
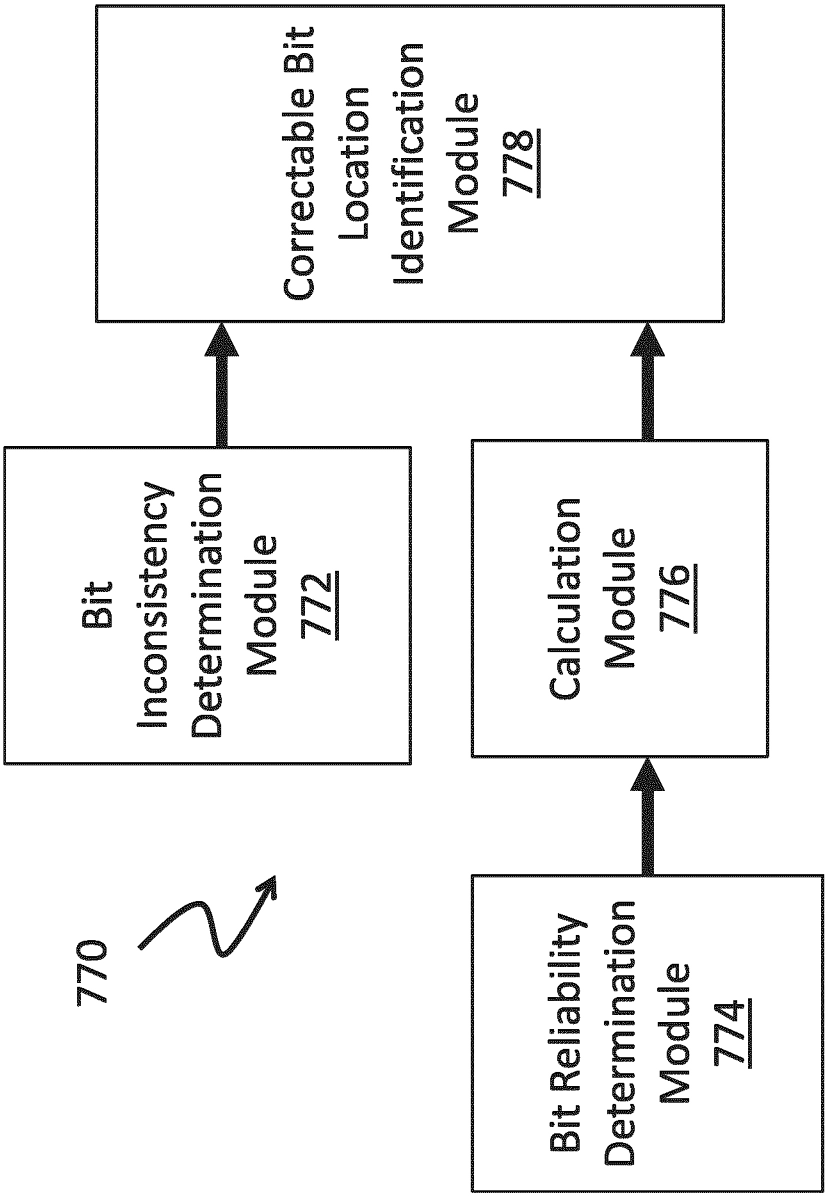
FIG. 7H presents a block diagram of an error locator in a receiver adapted to apply the method of FIG. 5C, according to one embodiment.
Figure 7I:
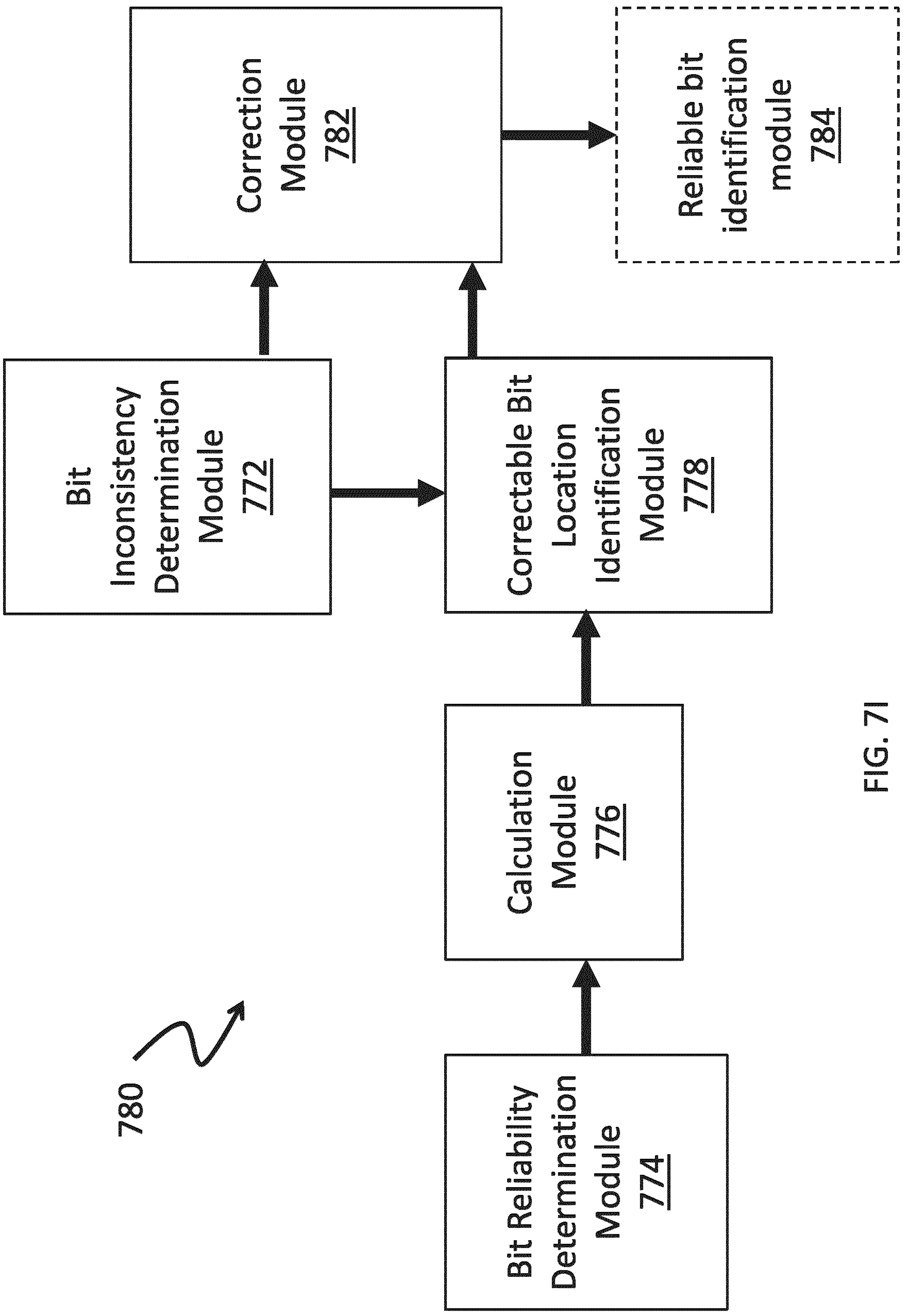
FIG. 7I presents a block diagram of an error corrector in a receiver adapted to apply the method of FIG. 5C, according to one embodiment.

It shall be recognized that the method 520 can be implemented by a computing device having modules adapted to execute the various steps of the method 520 of FIG. 5C, as concurrently presented in FIGS. 7H and 7I.

It shall further be recognized that the method 520 can be implemented by a receiver device of a communication system, as concurrently presented in FIG. 7G.

A MATLAB source code for simulating the exhaustive method 520, according to one embodiment, is presented in referenced U.S. provisional patent application No. 62/519,133.

Communication System Applying the Direct Method

FIG. 7C presents a video communication system 720 according to one embodiment. At a transmission side 722, a video data is generated by a video source 724 and is encoded (compressed) by a video encoder 726. A channel encoder 728 encodes the encoded (compressed) video, in order to transmit the video data over a communication network 730 as a group of packets forming a list of packets or array of packets, each list of packets of the array having one redundant packet. At a receiver side 732, a transmitted list of packets or array of packets is received and is first decoded by a channel decoder 734, then a communication protocol stack 736 generates corresponding data packets for processing by a Video Application Control Layer 738 that produces either VCL (Video Coding Layer) packets or non-VCL packets. If there is an irrevocable packet loss case using FEC. Those packets are analyzed as a list of packets by a FEC Inconsistent Bit Determiner 740 to determine inconsistent bits in the packets of the list. A Checksum Potential Bit Error Determiner 742 calculates a checksum value and determines potential bit error locations according to the checksum value for each damaged packet of the list. A Refined Possible Error Locations Processor 744 determines possible error locations in each damaged packet of the list according to the inconsistent bits and the potential bit error locations. An Error Corrector 746 corrects the errors of damaged packets according to the possible error locations for further decoding by a video decoder 748, in order to display an accurate image that corresponds to the transmitted video data.

Error Locator in a Receiver Applying the Direct Method

FIG. 7D presents modules of checksum-aided FEC error locator 750 in a receiver, according to one embodiment. The error locator 750 has an Inconsistent Bit Determination Module 752 to determine inconsistent bit locations in the received packets of the list. The error locator 750 also has a Checksum Calculation Module 754 for calculating a checksum value of each damaged packet, a Checksum Pattern Identification Module 756 for identifying a checksum pattern type according to the checksum value and a Potential Bit Error Determination Module 758 for determining potential bit error locations according to the checksum pattern type. The error locator 750 further has a Refined Possible Error Locations Computing Module 760 adapted to intersect information provided by the inconsistent bit locations and information provided by the potential bit error locations, in order to determine a refined set of possible error locations.

Error Corrector in a Receiver Applying the Direct Method

FIG. 7E presents modules of checksum-aided FEC error corrector 751 in a receiver, according to one embodiment. The error corrector 751 has an Inconsistent Bit Determination Module 752 to determine inconsistent bit locations in the received packets of the list. The error corrector 751 also has a Checksum Calculation Module 754 for calculating a checksum value of each damaged packet, a Checksum Pattern Identification Module 756 for identifying a checksum pattern type according to the checksum value and a Potential Bit Error Determination Module 758 for determining potential bit error locations according to the checksum pattern type. The error corrector 751 further has a Refined Possible Error Locations Computing Module 760 adapted to intersect information provided by the inconsistent bit locations and information provided by the potential bit error locations, in order to determine a refined set of possible error locations for the Error Correction Module 762. The Error Correction Module 762 is adapted to correct damaged packets of the list according to the refined set of possible error locations.

It shall be recognized that the error locator 750 and the error corrector 751 can be executed by a computing device. The computing device may be a general-purpose computer but could also be an embedded system, an integrated circuit such as a Field-Programmable Gate Array (FPGA) or any combination thereof.

Communication System Applying the Exhaustive Method

FIG. 7G presents a video communication system 720 according to one embodiment. At a transmission side 722, a video data is generated by a video source 724 and is encoded (compressed) by a video encoder 726. A channel encoder 728 encodes the encoded (compressed) video, in order to transmit the video data over a communication network 730 as a group of packets forming a list of packets or array of packets, each list of packets of the array having one redundant packet. At a receiver side 732, a transmitted list of packets or array of packets is received and is first decoded by a channel decoder 734, then a communication protocol stack 736 generates corresponding data packets for processing by a Video Application Control Layer 738 that produces either VCL (Video Coding Layer) packets or non-VCL packets. If there is an irrevocable packet loss case using FEC, those packets are analyzed as a list of packets by a FEC Inconsistent Bit Determiner 740 to determine an inconsistent bit indicator for each bit position. A Bit Reliability Determiner 786 determines a reliability indicator for identifying potential bit error locations in a packet. A Potential Bit Error Location Calculator or Counter 788 is adapted to count the number of potential bit error locations that are present at a given bit position amongst all packets of the list. A Correctable Bit Error Identifier 790 is adapted to identify a bit position of a packet as being an erroneous bit according to the associated number of potential bit error locations and according to the inconsistent bit indicator associated to the bit position of the potential bit error location. An Error Corrector 792 corrects the identified erroneous bit according to the inconsistent bit indicator. A Reliable Bit Identification Record 794 is updated in order to identify the corrected bit as being reliable for further decoding by a video decoder 748 or for a next FEC-decoding iteration, in order to display an accurate image that corresponds to the transmitted video data. It shall be recognized that the Reliable Bit Identification Record 794 may as well keep track of the bits that are identified as reliable according to the reliability indicator (ex.: CPT or LLR value) without departing from the scope of the Reliable Bit Identification Record 794.

Error Locator in a Receiver Applying the Exhaustive Method

FIG. 7H presents modules of an FEC error locator 770 of a receiver, according to one embodiment. The error locator 770 has a Bit Inconsistency Determination Module 772 to determine inconsistent bit indicators for each bit position according to the received packets of the list. The error locator 770 also has a Bit Reliability Determination Module 774 adapted to determine a reliability indicator for identifying potential error locations in a packet. The error locator 770 also has a calculation module 776 adapted to count the number of potential error locations at a given bit position according to the received packets. A correctable bit location identification module 778 identifies a correctable bit location according to the number of potential error locations at a given bit position and the associated inconsistent bit indicator.

Error Corrector in a Receiver Applying the Exhaustive Method

FIG. 7I presents modules of an FEC error corrector 780 in a receiver, according to one embodiment. The error corrector 780 has a Bit Inconsistency Determination Module 772 to determine inconsistent bit indicators for each bit position according to the received packets of the list. The error corrector 780 also has a Bit Reliability Determination Module 774 adapted to determine a reliability indicator for identifying potential error locations in a packet. The error corrector 780 also has a calculation module 776 adapted to count the number of potential error locations at a given bit position. A correctable bit location determination module 778 identifies a correctable bit location according to the number of potential error locations at a given bit position and the associated inconsistent bit indicator. A correction module 782 corrects the bit value corresponding to the correctable bit location of a packet according to the associated inconsistent bit indicator. A reliable bit identification module 784 keeps track of the corrected bits of a packet and identifies them as correct bit positions for further processing. It shall be recognized that the reliable bit identification module 784 may as well keep track of the bits that are identified as reliable according to the reliability indicator (ex.: CPT or LLR value) without departing from the scope of the reliable bit identification module 784. It shall further be recognized that the reliable bit identification module 784 is optional and can be omitted without departing from the scope of the present Error corrector 780.

It shall further be recognized that the error locator 770 and the error corrector 780 can be executed by a computing device. The computing device may be a general-purpose computer but could also be an embedded system, an integrated circuit such as a Field-Programmable Gate Array (FPGA) or any combination thereof.

Internet Checksum Calculation and Properties

Internet Checksum is used by different standard protocols (internet protocol (IP), transmission control protocol (TCP) and user datagram protocol UDP) to provide error detection. The Internet checksum is a fixed-length tag added to a message at the transmission side and enables the receiver to verify the integrity of the delivered message by re-computing the tag and comparing it with a known tag that was sent.

Although the following principles are applicable to other checksum algorithms, focus is applied on the UDP Internet Checksum.

Internet Checksum Definition and Mathematical Properties

The Internet checksum is a 16-bit field within the protocol header and is defined as ones' complement of the ones' complement sum of all the 16-bit words in the computation data. More specifically, FIG. 8A presents how the Internet checksum is calculated on a packet data at the transmission side. First, data 80A is divided into chunks of 16-bit words 80B and 80C and if necessary, the data is padded with a zero byte at the end to make it a multiple of 16 bits. Then, there is performed a ones' complement sum 82 over all the words 80B and 80C. If an overflow occurs during any sum, the ones' complement sum operation involves an "end-around carry". The end-around carry scheme routes carry-out signal of the most significant bit (MSB) position $c_n$ to the least significant bit (LSB) position where it is used as a carry-in signal $c_0$. Lastly, all the bits of the one's complement sum 82 are flipped to establish the checksum value 84 for transmission.

Note that the Internet Checksum is the one's complement of the one's complement sum of all the 16-bit words in the computation data. Furthermore, during the calculation of the checksum at the transmission side, the value of the checksum in the checksum field is set to all zeros in binary, and after the calculation of the checksum, it is replaced by the computed one 84 for transmission. The validation process at the receiver side is performed using the same algorithm except that the received checksum field value is used in the computation of the received UDP checksum rather than zeros. Presented in FIG. 8B, the received data 86A corresponding to the transmitted data 80A is divided into two chunks of 16-bit words 86B and 86C. A ones' complement sum 88 over the two words (16B and 16C) is performed and a received checksum 90 which normally should equate to the transmitted checksum 84 is added to the one's complement sum 88 in order to establish a checksum value 92 at the receiver side. Received data is valid if the recomputed checksum 92 (after a final one's complement on the result) at the receiver side is all zero, otherwise the data is considered corrupted. In the transmission of the packet data 80A, the checksum value 92 indicates an error 94 at least in one of the two words at bit eleven which corresponds to an error either at bit eleven or at bit twenty-seven of the received data 86A, as shown by candidate error positions 96A and 96B.

Mathematically, the set of 16-bit values, represented here in hexadecimal for convenience, V={0000, 0001, . . . , FFFF} and the one's complement sum operation (denoted as "+") together form an Abelian group (i.e. commutative group).

UDP Checksum Definition and Calculation

Figure 8C:
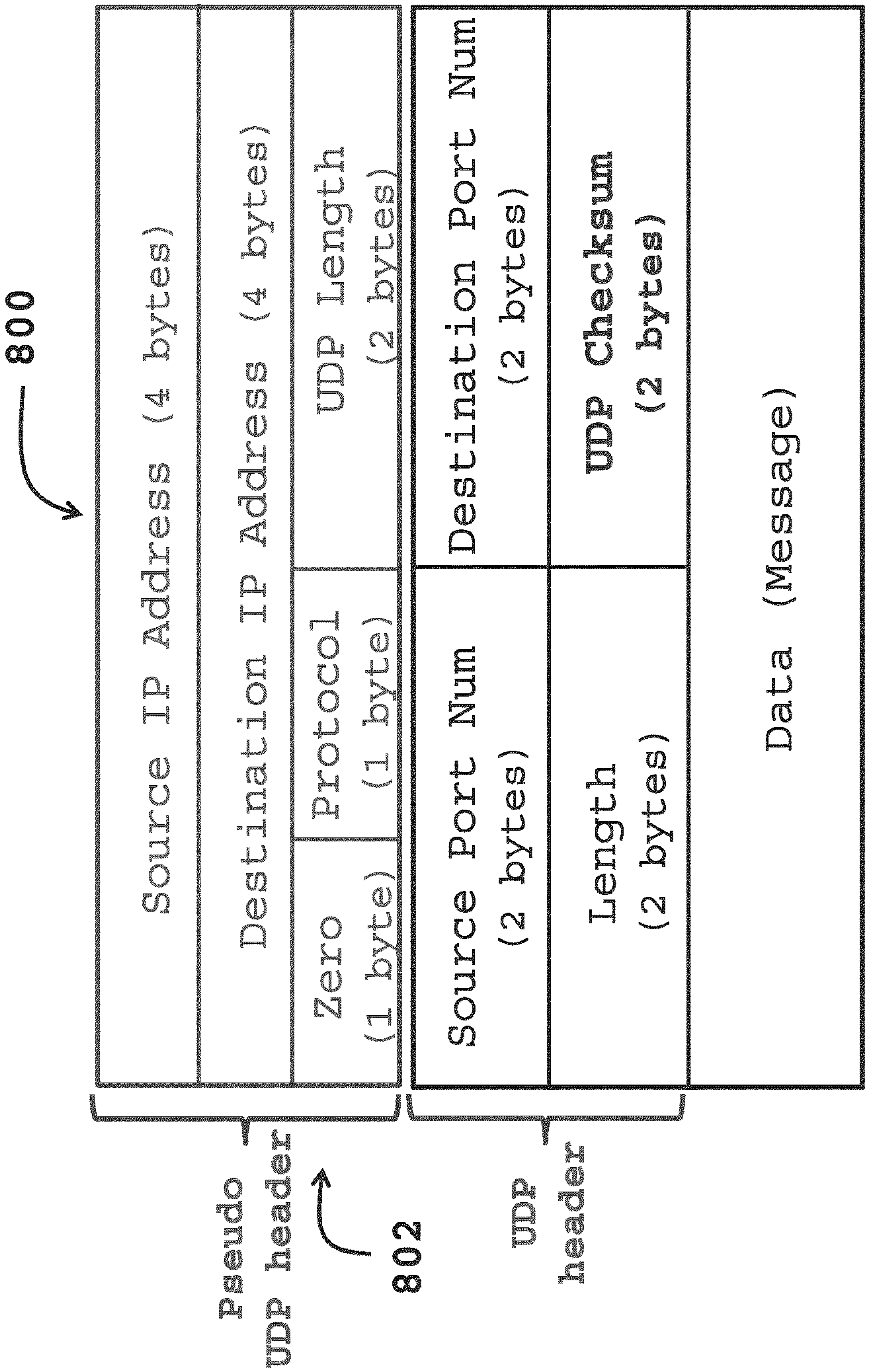
FIG. 8C presents a conventional prior art UDP datagram and pseudo header.

The UDP checksum is a 16-bit field in the UDP header and is ones' complement of the ones' complement sum of pseudo UDP header and the actual UDP datagram (contains UDP header and data message) as it is well-defined in RFC 768 (J. Postel and U. D. Protocol, "RFC 768," User datagram protocol, pp. 1-3, 1980). FIG. 8C shows a UDP datagram 800 and its 12-bytes prefix as pseudo UDP header 802. The pseudo UDP header 802 contains the source and destination IP addresses, the protocol, and the UDP length. This information initially comes from the IP header. The UDP checksum calculation is calculated over all the segments of the UDP datagram 800.

As with the Internet Checksum, the checksum field of the UDP header should also be initialized to zero before the calculation and then set to the calculated one prior to transmission. Since the UDP checksum is optional, a zero transmitted checksum value means that it was disabled. If the computed checksum is zero it should be transmitted as all ones (FFFF). Note that the calculated checksum for a real packet can never be FFFF (i.e. the sum prior to the final ones' complement can never be zero) unless all the words in the packet are zeros.

Let's assume the UDP packet has a length of N bits (including padding) which is made up of m=N/16 16-bit words.

$\{W_0, W_2, \ldots, W_{cs}, \ldots, W_{m-1}\}$ where $W_{cs}$ is the checksum value in checksum field. The i-th word is defined as:

$W_i = \Sigma_{c=0}^{15}(w_{i,c} \times 2^c);\ w_{i,c} \in \{0,1\}$

Its inverse is:

$\overline{W}_i = \Sigma_{c=0}^{15}(\overline{w}_{i,c} \times 2^c);\ \overline{w}_{i,c} \in \{0,1\}$ where $\overline{w}_{i,c}$ represents the inverse of $w_{i,c}$, i.e. $\overline{w}_{i,c}=1$ when $w_{i,c}=0$, and $\overline{w}_{i,c}=0$ otherwise. The transmission side's checksum (CT) can be expressed as shown in Eq. (1):

$$C_T = \overline{\sum_{l=0}^{m-1} W_l} = \overline{\sum_{l=0,l\neq cs}^{m-1} W_l} = \overline{\sum_{l=0,l\neq cs}^{m-1} \sum_{c=0}^{15} (w_{l,c} \times 2^c)} \tag{1}$$

The same process is performed at the receiver side to calculate the receiver side's checksum (CR) except that instead of using zero in the checksum field ($W_{cs}$=0000), the value of received checksum ($\hat{W}_{cs}=\hat{C}_T$) must be used during the calculation of the CR as shown in Eq. (2):

$$C_R = \overline{\sum_{l=0,l\neq cs}^{m-1} \hat{W}_l + \hat{C}_T} = \overline{\sum_{l=0,l\neq cs}^{m-1} \hat{W}_l + C_T} = \overline{\sum_{l=0,l\neq cs}^{m-1} \hat{W}_l + \overline{\sum_{l=0,l\neq cs}^{m-1} W_l}} = \overline{\sum_{l=0,l\neq cs}^{m-1} \hat{W}_l + \overline{W}_l} \tag{2}$$

where the received version of W and $C_T$ is denoted as $\hat{W}$ and $\hat{C}_T$ respectively and assuming that the 16-bit checksum word is intact ($\hat{C}_T=C_T$). The receiver verifies the packet by re-calculating the checksum. If the CR is zero, that means the received packet was intact. This is because the value of CT, which is the inverse of one's complement sum of all words, is included in CR's computation. Therefore at the reception when it is added to one's complement sum of all words, the identity element FFFF is obtained. And after performing the final ones' complement operation, the final checksum value of a correctly received packet must be zero. It is understandable from Eq. (2) that if there is no error, which means $\hat{W}_i=W_i$, the CR value will be zero:

$$C_R = \overline{\sum_{i=0,i\neq cs}^{m-1} \left(\hat{W}_i + \overline{W}_i\right)} = \overline{\sum_{i=0,i\neq cs}^{m-1} (W_i + \overline{W}_i)} = \overline{FFFF} = 0000$$

$C_R$ from Eq. (2) can be expanded to:

$$C_R = \overline{\sum_{i=0 i\neq cs}^{m-1} \left(\hat{W}_i + \overline{W}_i\right)} = \overline{\sum_{i=0 i\neq cs}^{m-1} \sum_{c=0}^{15} (\hat{w}_{i,c} + \overline{w}_{i,c}) \times 2^c} \tag{3}$$

An important property of the above ones' complement sum with end around carry expression is as follows (where "mod" means modulo):

$$(\hat{w}_{i,c} + \overline{w}_{i,c}) \times 2^c = \begin{cases} 2^c, & \text{if no error in bit } c \text{ of word } i \\ \overline{w}_{i,c} \times 2^{(c+1) mod (16)}, & \text{if error in bit } c \text{ of word } i \end{cases} \tag{4}$$

From table 810 of FIG. 8D, where a "0→1" represents a 0 flipped to 1 (and where a "1→0" represents the opposite), there is shown at rows 812 and 814 that when there is no error in bit c of word i, $\hat{w}_{i,c}+\overline{W}_{i,c}=1$ and considering the final ones' complement operator in the $C_R$ definition (see Eq. (3)), the $C_R$ value turns to zero (not shown). When an error occurs, as shown in rows 816 and 818, $\hat{w}_{i,c}+\overline{w}_{i,c}=0$. However, if $w_{i,c}=0$ a carry is generated, as shown by the row 816. Such carry will propagate, generating zeros along the way, up to the location of the next error, where a one will be inserted. If there is no other error, the $C_R$ value will be zero except for the position of the error, where the carry will finally stop. On the other hand, if there is an error but no carry, the $C_R$ value in the column of the error will be one while the rest of the bits will be zero. Notice that the final ones' complement operator will flip all the bits in these two error cases but the error location is nevertheless traceable.

Figure 9A:
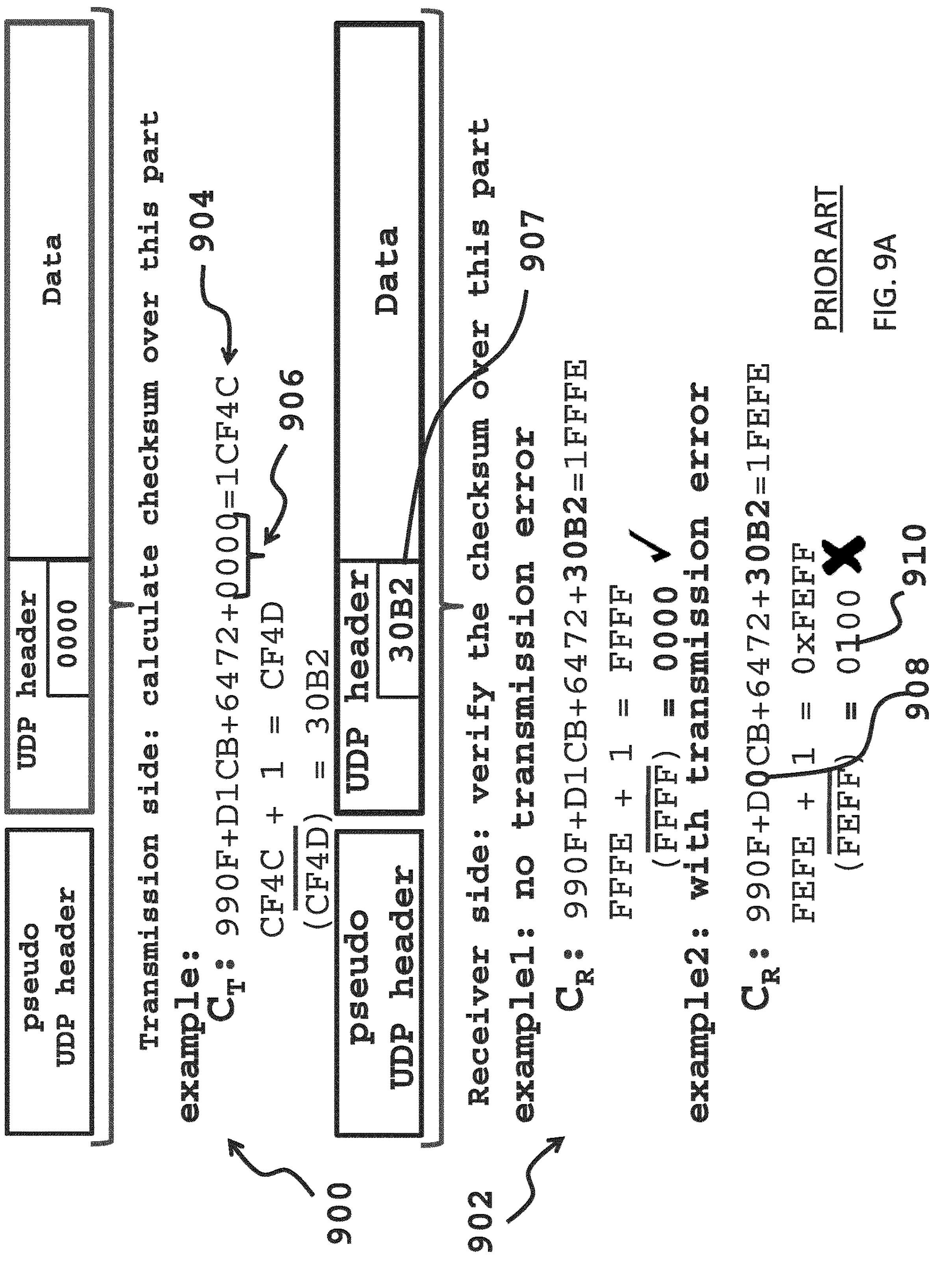
FIG. 9A presents a conventional UDP checksum calculation.

FIG. 9A presents a checksum calculation at the transmission side 900 and its validation procedure at the receiver side 902, according to one embodiment. In this embodiment, the entire packet content is considered as four words represented in hexadecimal 904. As it is shown, during the calculation of the checksum, first the value of the checksum in the checksum field 906 is set to zero and then the calculated result (ex.: "30B2") is stored in the UDP header 907. At the receiver side, if the computed $C_R$ value is all zero that means the packet was received correctly, as depicted in the first example ("example 1"), otherwise it is corrupted. The second example ("example 2") shows the effect of a single flipped bit 908 on the $C_R$ value. In the example, a single bit is flipped in column eight of the second word changing it from "D1CB" to "D0CB" (the column positions in the word are numbered from right to left). As it is seen, there is only one non-zero bit 910 in the $C_R$ value which is in the column eight. In other words, the $C_R$ value signals that a bit in column eight of a word was flipped. Moreover, according to the row 818 in FIG. 8D, it can be recognized that a "1" was flipped to a "0". This simple example demonstrates an advantage to utilize the UDP checksum in an error correction approach.

Exploiting Checksum for Error Correction

As it was shown in the example of FIG. 9A, the $C_R$ value can indicate the position of the flipped bits in modulo 16. So the number of candidates depends on the number of words in the whole packet and, from the table 810 of FIG. 8D, the type of the modified bit (i.e. if a "1" was modified or if a "0" was modified). The goal of this section is to study the $C_R$ values in different error situations to show how it will change. This will help determine the potential error locations based on observed $C_R$ values. The $C_R$ values are calculated according to different Bit Error Events (BEEs) then the $C_R$ values are grouped into different checksum pattern types (CPTs) based on their similarity patterns. A probability of each observed CPT is evaluated to find the most probable BEE causing it.

Different types of BEE will create different bit patterns of checksum and in the following, five different types of BEEs are considered each representing one or two bits in error. This is reasonable since, in practice, the residual error after channel decoding, is normally low. In FIG. 9B, there is a table 912 showing the definition of each BEE type considered.

In each BEE type two different bit modification cases are considered: a bit 1 changed (flipped) to 0 in column j of a word which is denoted by $1_j \rightarrow 0_j$ and a bit "0" changed to "1" in column j which is denoted by $0_j \rightarrow 1_j$. The $C_R$ values are calculated for each case of bit modification.

Figure 10:
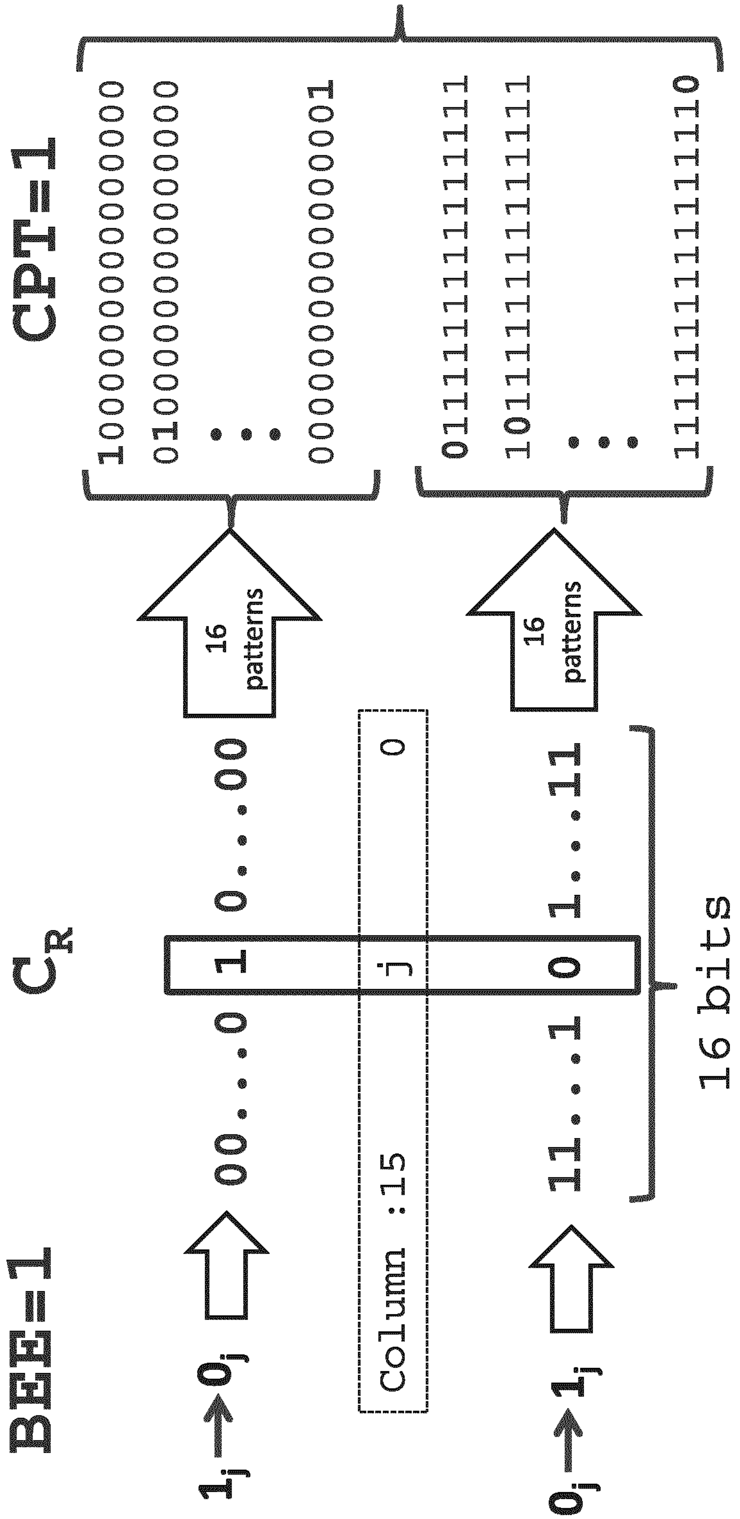
FIG. 10 presents a BEE=1 event type having only one erroneous bit in the packet, corresponding 32 patterns of $C_R$ (Checksum at receiver) values are grouped as CPT=1 (Checksum Pattern Type), according to one embodiment.

BEE=1: In this event type, there is only one erroneous bit in the packet. If $1_j \rightarrow 0_j$, as shown by row 818 of FIG. 8D, $\hat{w}_{i,j}+\overline{w}_{i,j}=0$ for column j, and $\hat{w}_{i,c}+\overline{w}=1$, c≠j for the other columns. Then the $C_R$ value (by considering final ones' complement in Eq. (4)), will have one bit "1" in column j and "0" for the others. For the case of $0_j \rightarrow 1_j$, as shown by row 816 of FIG. 8D, $\hat{w}_{1,j}+\overline{w}_{i,j}=0$ for column j with an extra carry and the other columns are "1". But that extra carry will affect column (j+1)mod(16) and change its value to "0" and generate a carry which will be added to column (j+2)mod (16). This carry propagation will continue and change all the bits "1" to "0" along the way, up to column j where it will stop and change its value from "0" to "1". That means there will be a "1" in column j while the other columns will be "0". Therefore, the $C_R$ value, which is the inverse of ones' complement sum, will have one "0" in column j and "1" for the other columns. As it can be seen from FIG. 10, the $C_R$ values for these two cases are the inverse of each other. Depending on the error column, which can be one of the 16 columns, the $C_R$ value can have different patterns. All the 16 patterns of the $C_R$ value in case of flipping $1_j \rightarrow 0_j$ in addition to the 16-bit patterns of the $C_R$ value in case of flipping $0_j \rightarrow 1_j$ are grouped as CPT=1. CPT=1 is the set of all $C_R$ patterns that have fifteen bits "0" and only one bit "1" or conversely.

So, when a single error has occurred (i.e. BEE=1 has occurred) and there is observed a $C_R$ value belonging to CPT=1, the error column is indicated by the location of the bit which is different from the others in the $C_R$ value. Furthermore, different patterns of the $C_R$ value when $1_j \rightarrow 0_j$ (fifteen bits 0) and when $0_j \rightarrow 1_j$ (fifteen bits 1), indicate if a bit "1" or a bit "0" was flipped in column j, thereby further reducing the number of candidate error locations in the packet.

In the case of two bits in error, four different BEEs are possible. Two erroneous bits can be in the same column or different columns and also the two flipped bits can be the same (both "0" or both "1") or different (one "0" and the other "1"). All these BEEs and their corresponding generated $C_R$ value and CPT are calculated and defined in the following.

Figure 11:
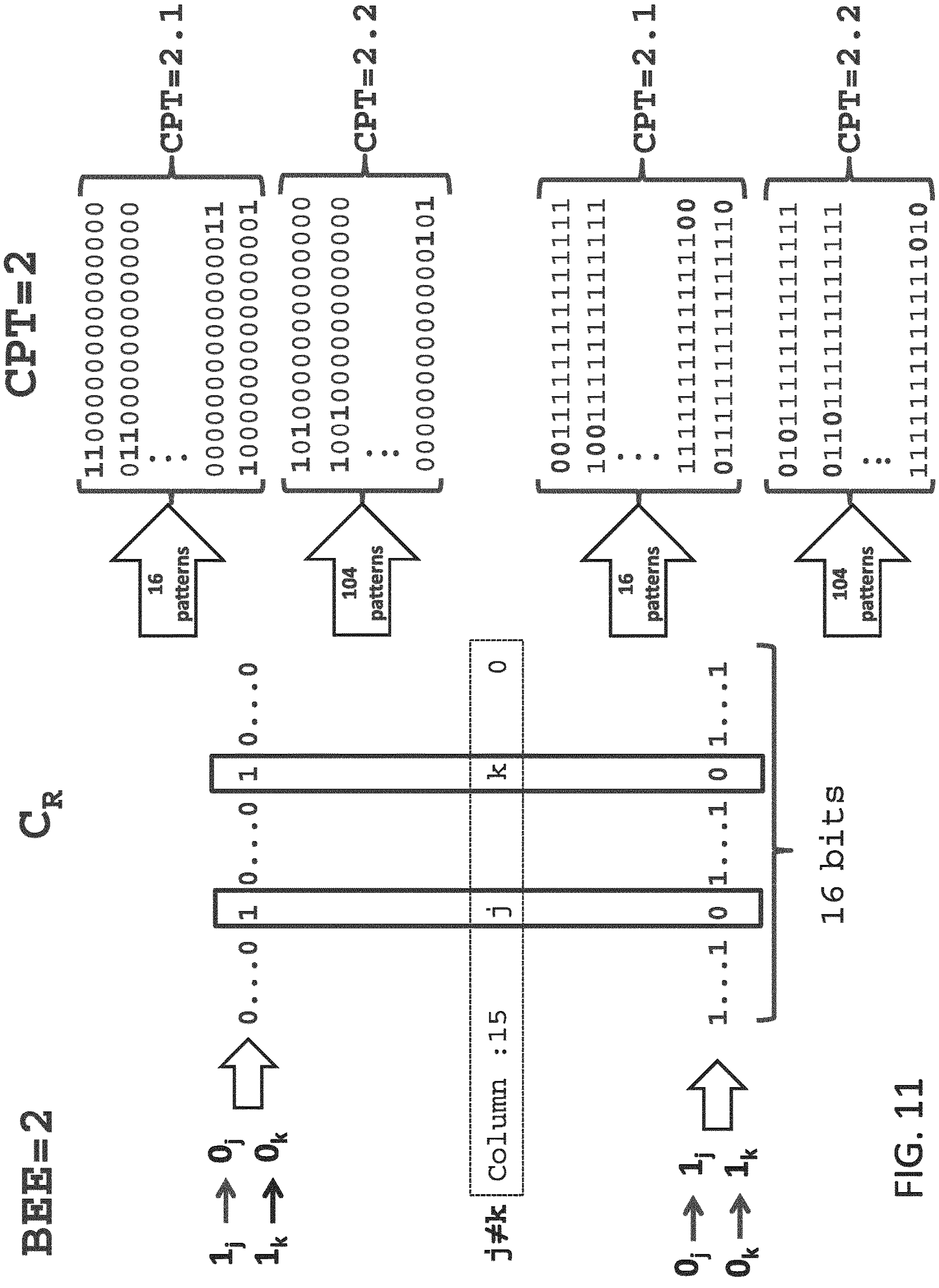
FIG. 11 presents a BEE=2 event type having two same bits in different columns that are flipped, corresponding 240 patterns of $C_R$ values are grouped as CPT=2 (further divided into CPT=2.1 and CPT=2.2), according to one embodiment.

BEE=2: In this event type, two same bits in different columns are flipped. If $1_j \rightarrow 0_j$ and $1_k \rightarrow 0_k$, which j≠k, $\hat{w}_{i,c}+\overline{w}_{i,c}=0$ for c=j, k, and for the other columns $\hat{w}_{i,c}+\overline{w}_{i,c}=1$. So, the corresponding $C_R$ will have bits 1 in column j and k and bits 0 in other columns. For the case of $0_j \rightarrow 1_j$ and $0_k \rightarrow 1_k$, which j≠k, $\hat{w}_{i,c}+\overline{w}_{i,c}=0$; c=j, k plus two extra carries in columns k and j. As explained for BEE=1, an extra carry in column k will propagate and generate zeros along the way (from column (k+1)mod(16) up to column (j−1)mod(16)) and it will stop at column j by changing its value from "0" to "1". The extra carry in column j also propagates and it will stop at column k and change its value to 1. Finally, there should be two "1" in columns j and k and zeros for the others. In this case, the $C_R$ value will have bits "0" in column j and k and "1" in other columns. Depending on which two columns of the words are hit by errors (2 out of 16 columns), the positions of the two bits "1" in the $C_R$ pattern will change. FIG. 11 presents all $C_R$ patterns with fourteen bits "0" and two bits "1" (plus their inverse), those $C_R$ patterns are grouped as CPT=2. The CPT=2 is divided into two sub-groups, CPT=2.1 and CPT=2.2, because CPT=2.1 is also observed in BEE=4.

Figure 12:
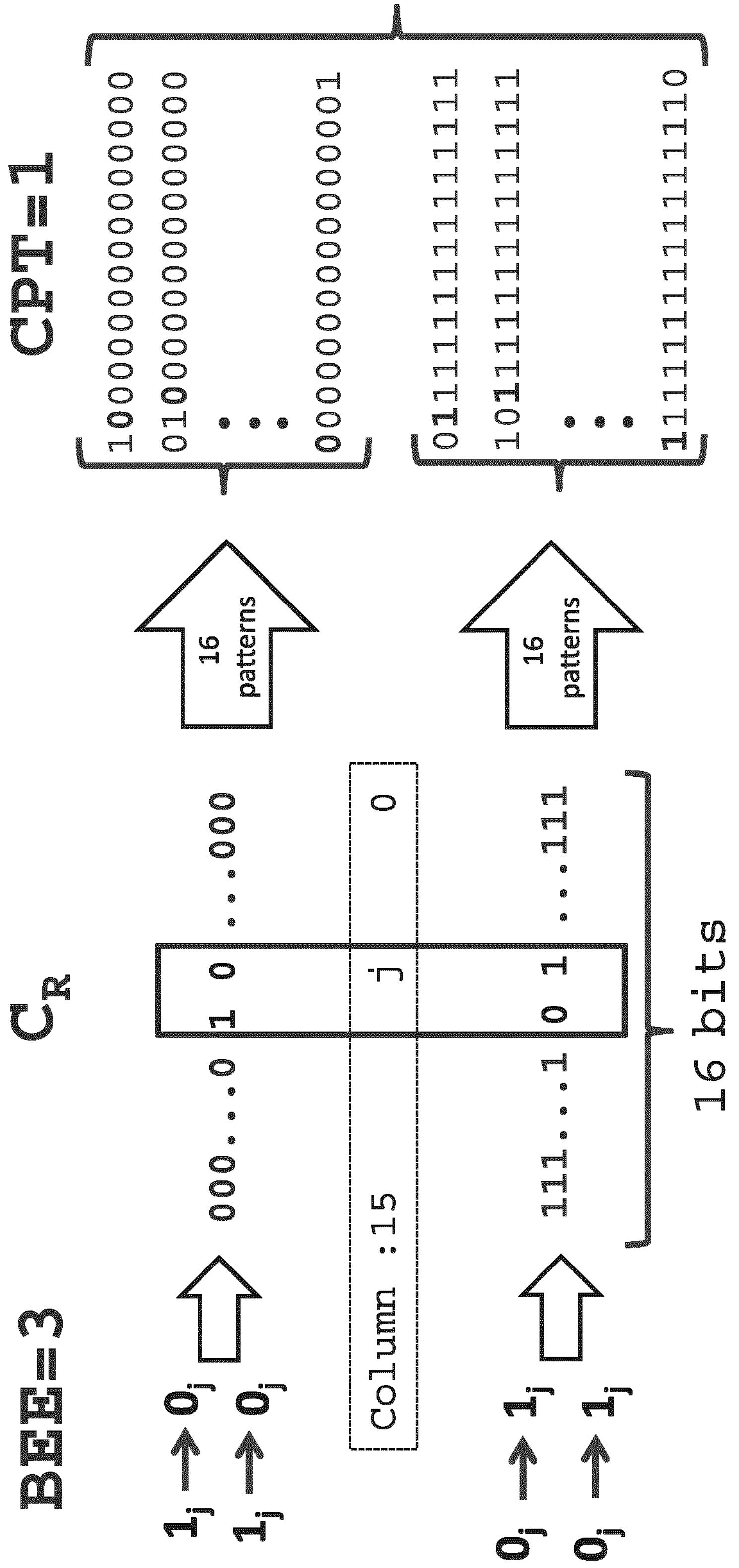
FIG. 12 presents a BEE=3 event type having two same bits in the same column that are flipped, corresponding 32 patterns of $C_R$ values are grouped as CPT=1, according to one embodiment.

BEE=3: In this event type, two same bits in the same column are flipped. As shown in FIG. 12, this BEE generates the same pattern as BEE=1 which is CPT=1. As mentioned, when there is no error $\hat{w}_{i,c}+\overline{w}_{i,c}=1$ for all 16 columns. When two $0_j \rightarrow 1_j$, then two extra "1"s are obtained in column j and this will generate an additional carry. Then column (j+1) mod(16) will receive the extra carry and its value will change to "0" with an additional carry. In fact, such carry will propagate and change all "1" along the way to "0", up to a column with a "0" value. Since the value of column (j+1)mod(16) is now "0", the carry propagation will stop there and change its value to "1". Therefore all columns should be "0" except column (j+1)mod(16). In this case, the $C_R$ value will have a bit "0" in column (j+1)mod(16) and a bit "1" in other columns. In the other case, when two $1_j \rightarrow 0_j$, a missing carry which should have been generated by column j and therefore column (j+1)mod(16) will contain a bit "0" instead of a bit "1". The $C_R$ value will have a bit "1" in column (j+1)mod(16) and bits "0" in other columns. Like the other BEEs, the calculated $C_R$ values of the two cases are the inverse of each other (see FIG. 12).

BEE=4: In this event type, two different bits in different columns are flipped. Basically if $1_j \rightarrow 0_j$ and $0_k \rightarrow 1_k$, then $\hat{w}_{i,j}+\overline{w}_{i,j}=0$ and $\hat{w}_{i,k}+\overline{w}_{i,k}=0$ with carry=1, while for the other columns $\hat{w}_{i,c}+\overline{w}_{i,c}=1$. The generated carry at column k will propagate and change all bits "1" to "0" along the way up to the next "0" value which is at column j then it will stop by changing column j's value into "1". So, all the bits between columns k and j excluding j become "0" while the others remain "1". In this case the $C_R$ value will have |j−k|mod(16) bits "1" between column k and j (including k but excluding j) and bits "0" in the other columns Depending on which two columns are hit, the $C_R$ value can have different patterns. If the two columns are next to each other in modulo 16, i.e. |j−k|mod(16)=1, the $C_R$ pattern has only a single "1" and fifteen "0" s, this pattern is the same as CPT=1. But when |j−k|mod(16)=2, the generated pattern of the $C_R$ value, which has two bits "1", is the same as CPT=2.1. In the other cases, when 3≤|j−k|mod(16)≤13, where there is between three and thirteen bits "1" between column k and j, the $C_R$ values are grouped as CPT=3 (see FIG. 13).

BEE=5: In this event type, two different bits in the same column are flipped. When $0_j \rightarrow 1_j$ and $1_j \rightarrow 0_j$, the first modification will add an extra "1" in column j while the second one will remove a "1" at the same column. So they will cancel each other's effect and column j's value will not change. Therefore $\hat{w}_{i,j}+\overline{w}_{i,j}=1$ for all columns and consequently the $C_R$ value will be zero, which is grouped as CPT=4 in FIG. 14. In this case, the observed pattern of the $C_R$ value is exactly the same as the intact one. If by any information from the other layers, it is known that the received packet is corrupted, observing such a pattern indicates that BEE=5 has happened. Only general information about the possible locations of the errors is available. It is known that the two erroneous bits are in the same column and that they are different bits. However, the column that is hit by the error is unknown.

It shall be recognized that the same process is applicable to describe the behavior of three bits in error. Some of the defined BEEs for three bits in error will map to existing CPTs and additional CPTs will be observed. However, in the applications of interest, the probability of having more than two bits in error is much lower than the probability of having one or two bits in error.

Table 1500 of FIG. 15A summarizes the definition of each CPT for one and two bits in error. The computation the $C_R$ value for a received corrupted packet leads to one of the defined CPTs in the table 1500. Based on the CPT value, it is possible to determine the corresponding BEEs as shown in FIG. 15B. For each BEE, the $C_R$ value pattern will indicate the error columns and the type of modified bits (1→0 or 0→1). For instance, if the calculated $C_R$ is "0000 0000 0010 0000" which has one bit "1" in column 5 and belongs to CPT=1 as defined in FIG. 15A. This pattern can be generated by BEE=1, BEE=3 or BEE=4 as shown in FIG. 15B. Based on each BEE, the $C_R$ value pattern will have a different meaning. In the case of the BEE=1, the $C_R$ pattern indicates that there is a one bit error which is $1_5 \rightarrow 0_5$. Then all the bits "0" in column 5 are the error candidates in this case. In the case of the BEE=3, the $C_R$ value pattern indicates that there are two bits in error and both are in the same column such as $1_4 \rightarrow 0_4$, as presented in FIG. 12. In this case, the number of candidates is 2-combination of the number of zeros in column 4. In the case of the BEE=4, the $C_R$ value pattern indicates that there are two bits in error in a different column such as $1_6 \rightarrow 0_6$ and $0_5 \rightarrow 1_5$, as presented in FIG. 13. Therefore, it is possible to have more than one BEE for an observed CPT. However, the probability of occurrence of each of these possible BEEs may differ and it would be useful to establish the probability of each to determine which one is more likely to have occurred.

Probability of BEEs Given Observed CPTs

As it can be seen from FIG. 15B, several BEEs can cause an observed CPT. For instance, if the observed pattern for the $C_R$ belongs to the patterns in CPT=1, then one of the three BEEs (BEE=1, BEE=3 and BEE=4) are possible to be the cause. It is possible to mathematically show which one of those possible BEEs are more likely when the residual bit error rate (after channel decoding) and the packet length are known. The probability of each BEE based on the observed CPT, which is defined as Pr(BEE=i|CPT=j) can be determined. To compute this probability, the conditional probability and the law of total probability described by Pfeiffer (P. E. Pfeiffer, Concepts of Probability Theory: Second Revised Edition. Dover Publications Inc., 2013), as shown in Eq. (5), are used.

$$Pr(BEE=i\mid CPT=j)=\frac{Pr(BEE=i,\,CPT=j)}{Pr(CPT=j)}==\frac{1}{Pr(CPT=j)}\times\left\{\sum_{k=0}^{N}[Pr(BEE=i,\,CPT=j\mid nbErr=k)\times Pr(nbErr=k)\right\}\tag{5}$$

The probability of having k bits error in a packet length of N bits and channel residual bit error rate (ρ) can be expressed as:

$$Pr(nbErr=k)=\rho^k\times(1-\rho)^{N-k}\tag{6}$$

Assuming that ρ is very small (e.g. $\rho\le10^{-5}$), Pr(nbErr=k) fork larger than 2, even for large packet sizes (N≤2500 bytes), will be so small that the terms of the summation for k>2 can be ignored. Accordingly, Eq. (5) can be approximated with Eq. (7):

$$Pr(BEE=i\mid CPT=j)\approx\frac{1}{Pr(CPT=j)}\times\sum_{k=0}^{2}[Pr(BEE=i,\,CPT=j\mid nbErr=k)\times\rho^k\times(1-\rho)^{N-k}]\tag{7}$$

By using the chain rule as described by Pfeiffer, the first probability in the previous equation can be expressed as:

$$Pr(BEE=i,\,CPT=j\mid nbErr=k)=Pr(BEE=i\mid nbErr=k)\times Pr(CPT=j\mid BEE=i\cap nbErr=k)\tag{8}$$

The above two probabilities will be calculated as follows:

Probability of each BEE given the number of bits in error, Pr(BEE=i|nbErr=k)

Figure 16:
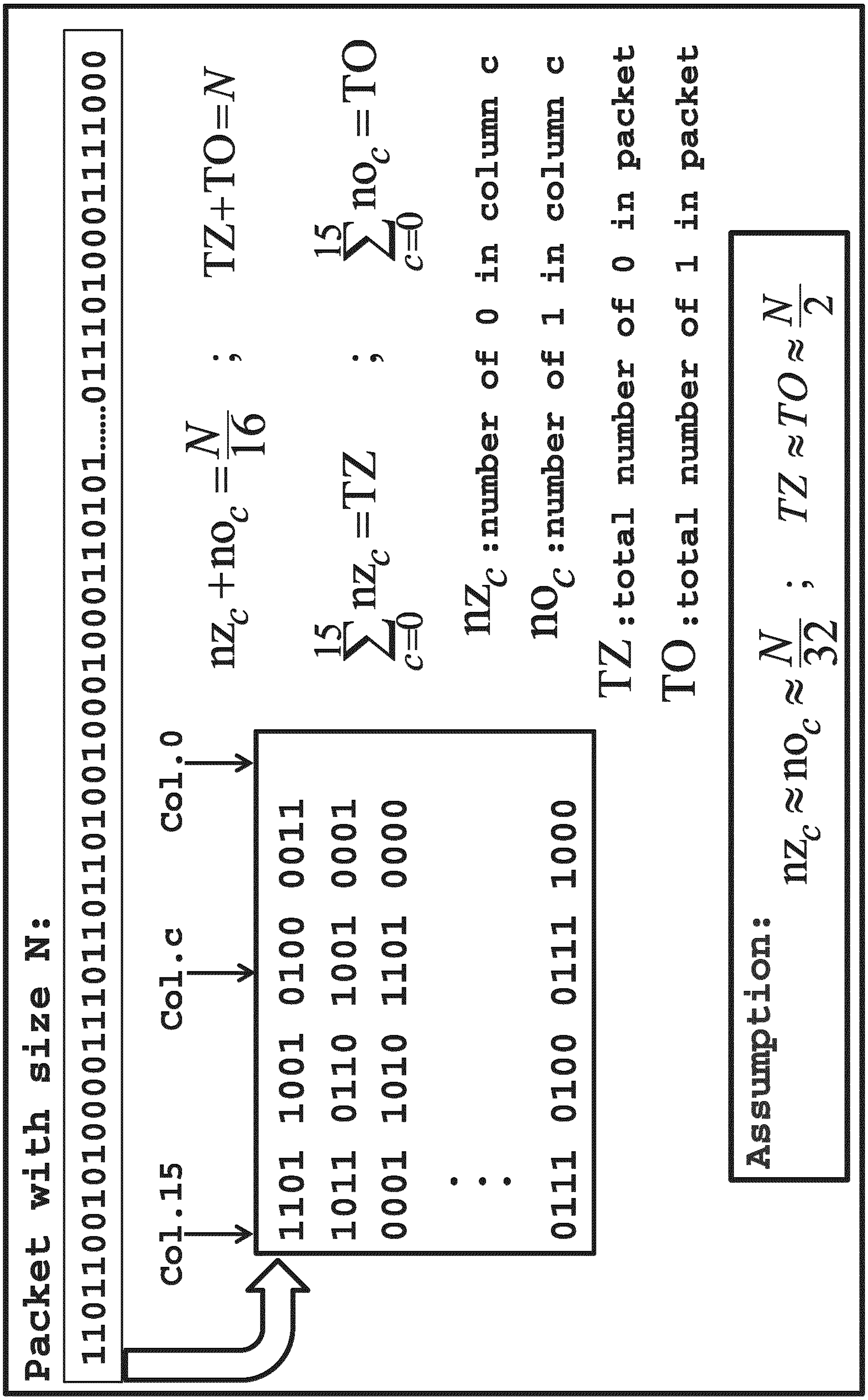
FIG. 16 presents a packet division into 16 bits.

Assuming a packet with length of N bits, the packet is divided into words of sixteen bits, as shown in FIG. 16. For simplicity, the packet size is considered a multiple of 16 bits. Let $nz_c$ and $no_c$ represent the number of bits 0 and 1 in column c, respectively. In the following expressions, the probability of each BEE given the number of bits in error is calculated for the case of one and two bits in error (k=1, 2).

By definition of BEE=1:

$$Pr(\text{BEE}=1\mid nb\text{Err}=1)=1 \text{ and } Pr(\text{BEE}=1\mid nb\text{Err}=2)=0$$

By definition, all the BEEs from 2 to 5 are for two bits in error, so these BEEs cannot occur when the number of bits in error is one. But they have different values when two bits are in error based on the number of bits 0 and 1 in each column. The probability value of each can be calculated by the definition of each BEE in FIG. 9B table 912. The equations reflect the number of combinations of taking two bits, same or different, in the same or different columns. Assuming $nz_c=no_c$ which means the number of bits 0 and 1 in each column are the same, then the expression can, however, be simplified as shown below.

$$Pr(BEE=i\mid nbErr=1)=0;\quad i\in\{2,3,4,5\}$$

$$Pr(BEE=2\mid nbErr=2)=\frac{\frac{1}{2}\times\sum_{c=0}^{15}\binom{nz_c}{1}\binom{TZ-nz_c}{1}+\frac{1}{2}\times\sum_{c=0}^{15}\binom{no_c}{1}\binom{TO-no_c}{1}}{\binom{N}{2}}\approx\frac{15}{32}\times\frac{N}{N-1}$$

$$Pr(BEE=3\mid nbErr=2)=\frac{\sum_{c=0}^{15}\binom{nz_c}{2}+\sum_{c=0}^{15}\binom{no_c}{2}}{\binom{N}{2}}\approx\frac{1}{32}\times\frac{N-32}{N-1}$$

-continued $$Pr(BEE=4\mid nbErr=2)=$$

$$\frac{\frac{1}{2}\times\sum_{c=0}^{15}\binom{nz_c}{1}\binom{TO-no_c}{1}+\frac{1}{2}\sum_{c=0}^{1}\binom{no_c}{1}\binom{TZ-nz_c}{1}}{\binom{N}{2}}\approx\frac{15}{32}\times\frac{N}{N-1}$$

$$Pr(BEE=5\mid nbErr=2)=\frac{\sum_{c=0}^{15}\binom{nz_c}{1}\binom{no_c}{1}}{\binom{N}{2}}\approx\frac{1}{32}\times\frac{N}{N-1}$$

Probability of each CPT given the BEE and the number of bits in error, Pr(CPT=j| BEE=i ∩nbErr=k)

Here, the second probability of Eq. (8) will be examined. From the definition of BEE and CPT, it is clear that when there is one bit in error, the following is obtained:

$$Pr(CPT=j\mid BEE=1\cap nbErr=1)=\begin{cases}1, & j=1\\ 0, & j\in\{2.1, 2.2, 3, 4)\end{cases}$$

and for the case of two bits in error, the following is obtained:

$$Pr(CPT=j\mid BEE=2\cap nbErr=2)=\begin{cases}16/120, & j=2.1\\ 104/120, & j=2.2\\ 0, & j\in\{1, 3, 4\}\end{cases}$$

$$Pr(CPT=j\mid BEE=3\cap nbErr=2)=\begin{cases}1, & j=1\\ 0, & j\in\{2.1, 2.2, 3, 4\}\end{cases}$$

$$Pr(CPT=j\mid BEE=5\cap nbErr=2)=\begin{cases}1, & j=4\\ 0, & j\in\{1, 2.1, 2.2, 3\}\end{cases}$$

Figure 13:
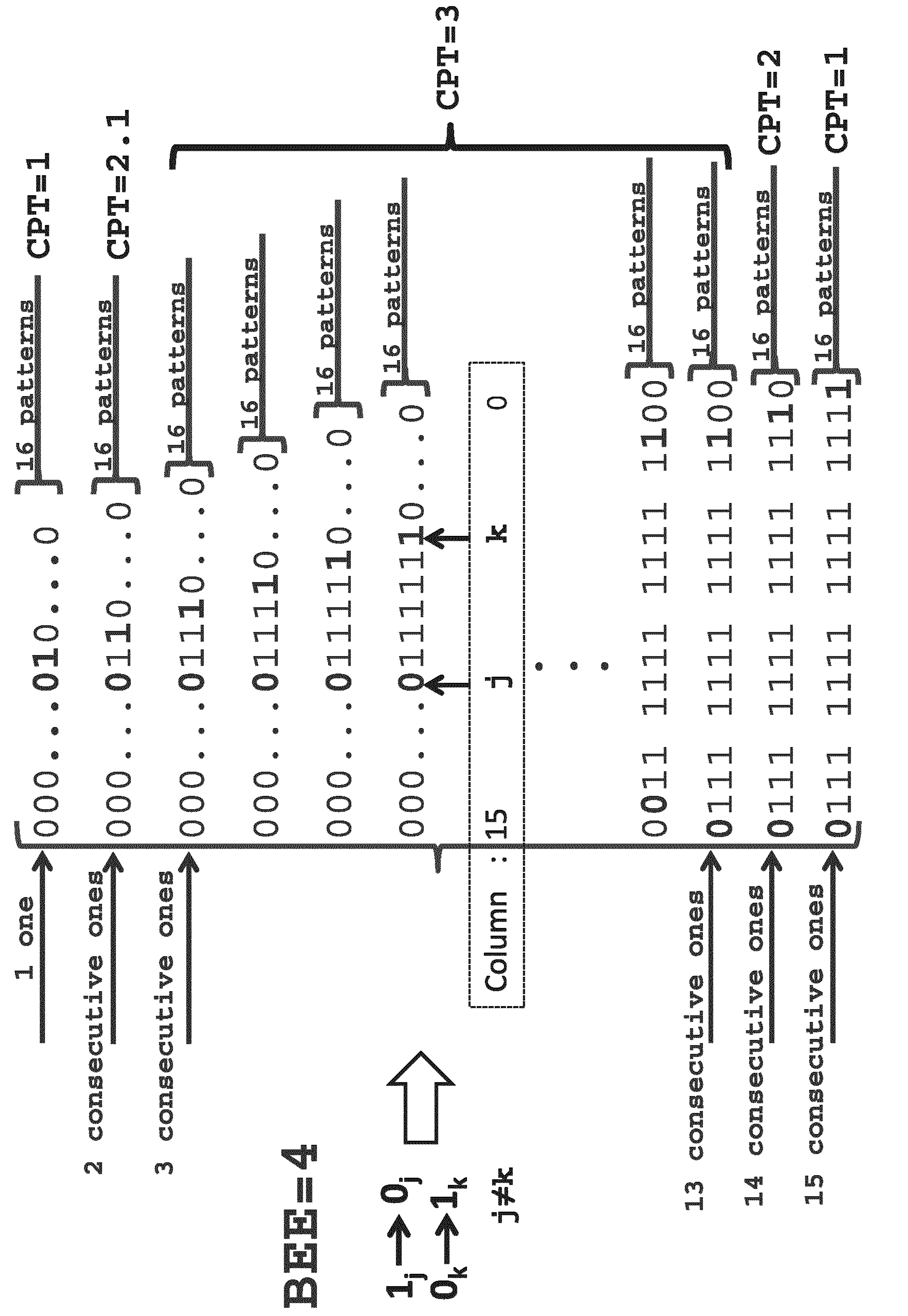
FIG. 13 presents a BEE=4 event type having two different bits in different columns that are flipped, corresponding 240 patterns of $C_R$ values are grouped as either CPT=1, CPT=2.1 or CPT=3, according to one embodiment.

BEE=4 comprises 240 different patterns as shown in FIG. 13, from which 32 belong to CPT=1. Hence, the probability of having CPT=1 given BEE=4 is: 32/240. Similarly, the probability values for the other cases can be computed and the following results are obtained:

$$Pr(CPT=j\mid BEE=4\cap nbErr=2)=\begin{cases}\frac{32}{240}, & j=1\\ \frac{32}{240}, & j=2.1\\ \frac{176}{240}, & j=3\\ 0, & j=\{22, 4\}\end{cases}$$

By substituting the probability values of the previous into Eq. (8), the desired Pr(BEE=i, CPT=j|nbErr=k) as shown in table 1700 of FIG. 17A, is obtained. The approximated values for large packet sizes are also presented in table 1702 of FIG. 17B. Note that $P_1$ and $P_2$ are elements of Eq. (7) computed from:

$$P_k\rho^k(1-\rho)^{N-k}$$

As shown in both tables (1700 and 1702), when the first row (BEE=1) of the value in the table (1700 or 1702) is multiplied by probability value of $P_1$ and the other rows (BEE=2 to 5) by probability value of $P_2$, the probability value of Pr(BEE=i|CPT=j)Pr(CPT=j) is obtained. It would be straightforward to normalize the later probabilities within each Pr(CPT=j) to obtain Pr(BEE=i|CPT=j), but this is not required since in an error correction scheme, it is the relative probabilities among the various BEEs which are of interest.

When comparing the two probability values $P_1$ and $P_2$, and the values in table 1702, it can be deduced that the probability of having more than two bits in error is dramatically less than one bit in error for a small p value. The table 1702 also illustrates that when CPT=1 is observed, it is much more likely to have BEE=1, and it is possible to have BEE=4 or BEE=3 but with very low probability (about 10/p times smaller). When there are two bits in error, and CPT=2.2, CPT=3 or CPT=4 is observed, the BEE is clearly identified as BEE=2, BEE=4 and BEE=5 respectively. When a CPT=2.1 is observed, it is equally probable to have BEE=2 than to have BEE=4, but this is a rare event compared to CPT=2.2 and CPT=3 which represent 75% of the cases (probability of 0.75) when two bits are in error.

Figure 17D:
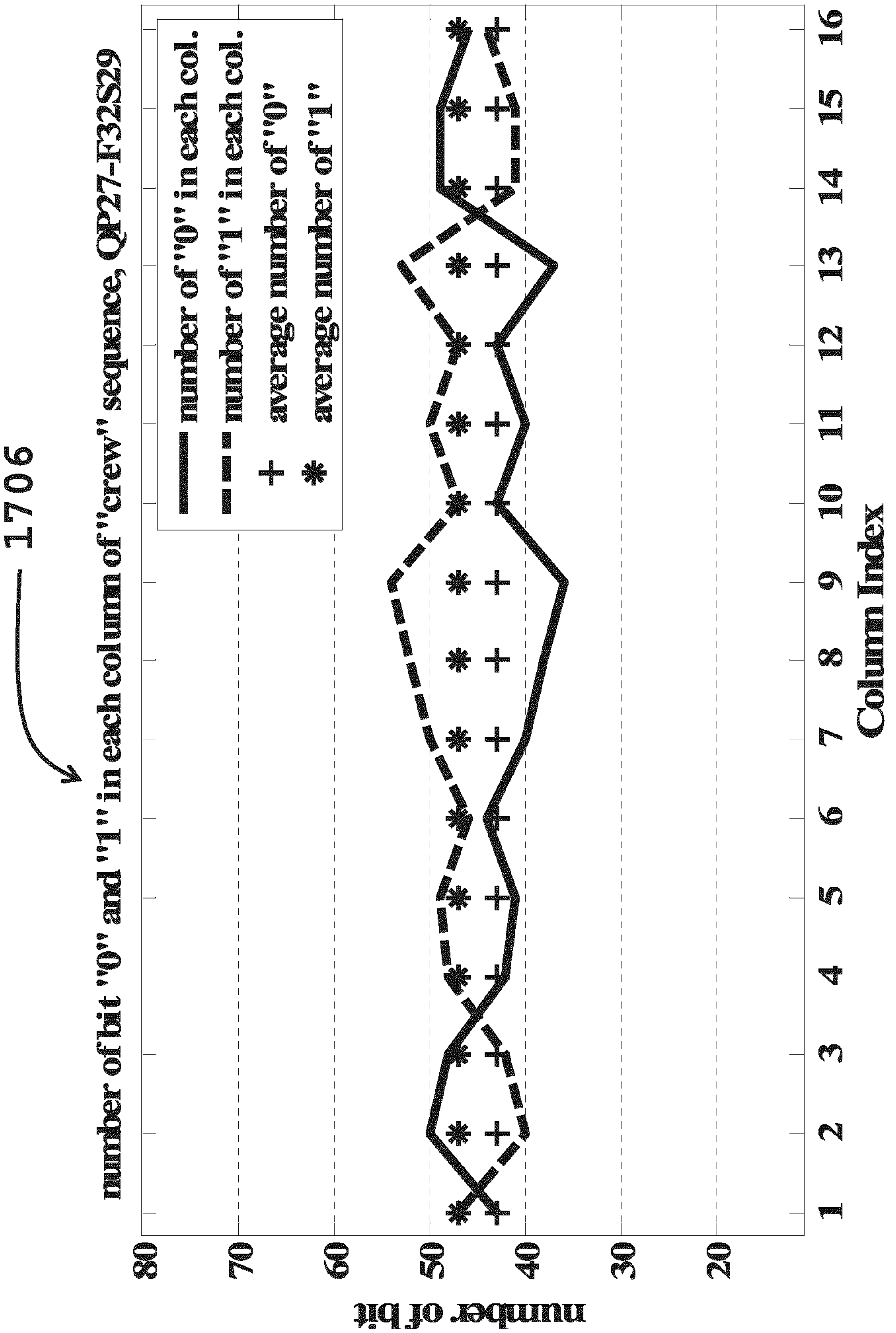
FIG. 17D presents the number of bits 0 and 1 in each column of slice 29 of frame 32 of Crew sequence data with QP=27, packet size=1432 bits.

The probability values of table 1702 were verified by conducting a simulation on different sequences with different packet sizes. In each bit stream, one or two bits were randomly flipped and the simulation was repeated 10,000 times to estimate the empirical probability value of Pr(BEE=i, CPT=j| nbErr=k). Table 1704 of FIG. 17C presents an example of the simulation results for a given sequence of data specifically known as the "crew" sequence data. As can be noticed, the simulation results are similar to the predicted values in table 1702 of FIG. 17B. Graph 1706 of FIG. 17D shows the distribution of bits "0" and "1" in each column of the simulated packet in the table 1704 of FIG. 17C. These results demonstrate that the assumption of having an equal number of bits "0" and "1" in each column is a reasonable assumption and, if on average they are the same, the result will perfectly match the theoretical results. Similar results have been obtained on other sequences with different quantization parameters (QPs).

Proposed CFLD Video Error Correction Approach

The proposed CFLD video error correction approach uses the UDP header checksum value to decrease the number of possible candidates for list decoding approaches. The checksum value allows to find the possible locations of the erroneous bits in the bitstream based on the possible column(s) where they occurred and the erroneous value in cause (a "0" or a "1").

Figure 18A:
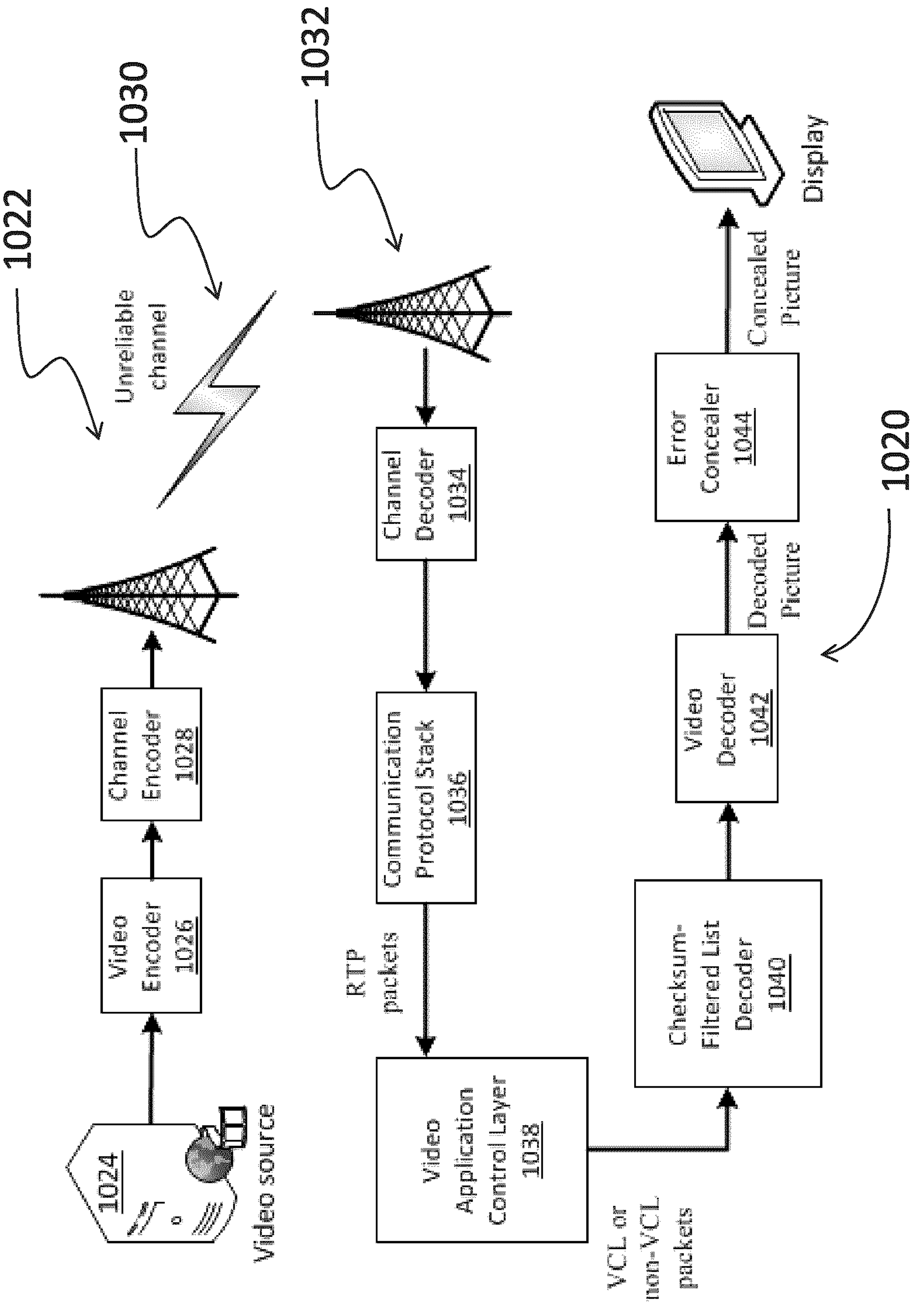
FIG. 18A presents a communication network having a Checksum-Filtered List Decoder, according to one embodiment.

FIG. 18A presents a video communication network 1020 according to one embodiment. At a transmission side 1022, a video data is generated by a video source 1024 and is encoded (compressed) by a video encoder 1026. A channel encoder 1028 encodes the encoded (compressed) video, in order to transmit the video data over a communication network 1030. At a receiver side 1032, a transmitted data is received and is first decoded by a channel decoder 1034, then a communication protocol stack 1036 generates corresponding RTP (Real-time Transport Protocol) data packets for processing by a Video Application Control Layer 1038 that produces either VCL (Video Coding Layer) packets or non-VCL packets. Those packets are analyzed by a CFLD (Checksum Filtered List Decoder) 1040 that is adapted to identify possible locations of erroneous bits according to a calculated checksum value of the packet and determine possible candidates for further decoding by a video decoder 1042 and if necessary error concealment by an error concealer 1044 in order to display an accurate image that corresponds to the transmitted video data.

Figure 18B:
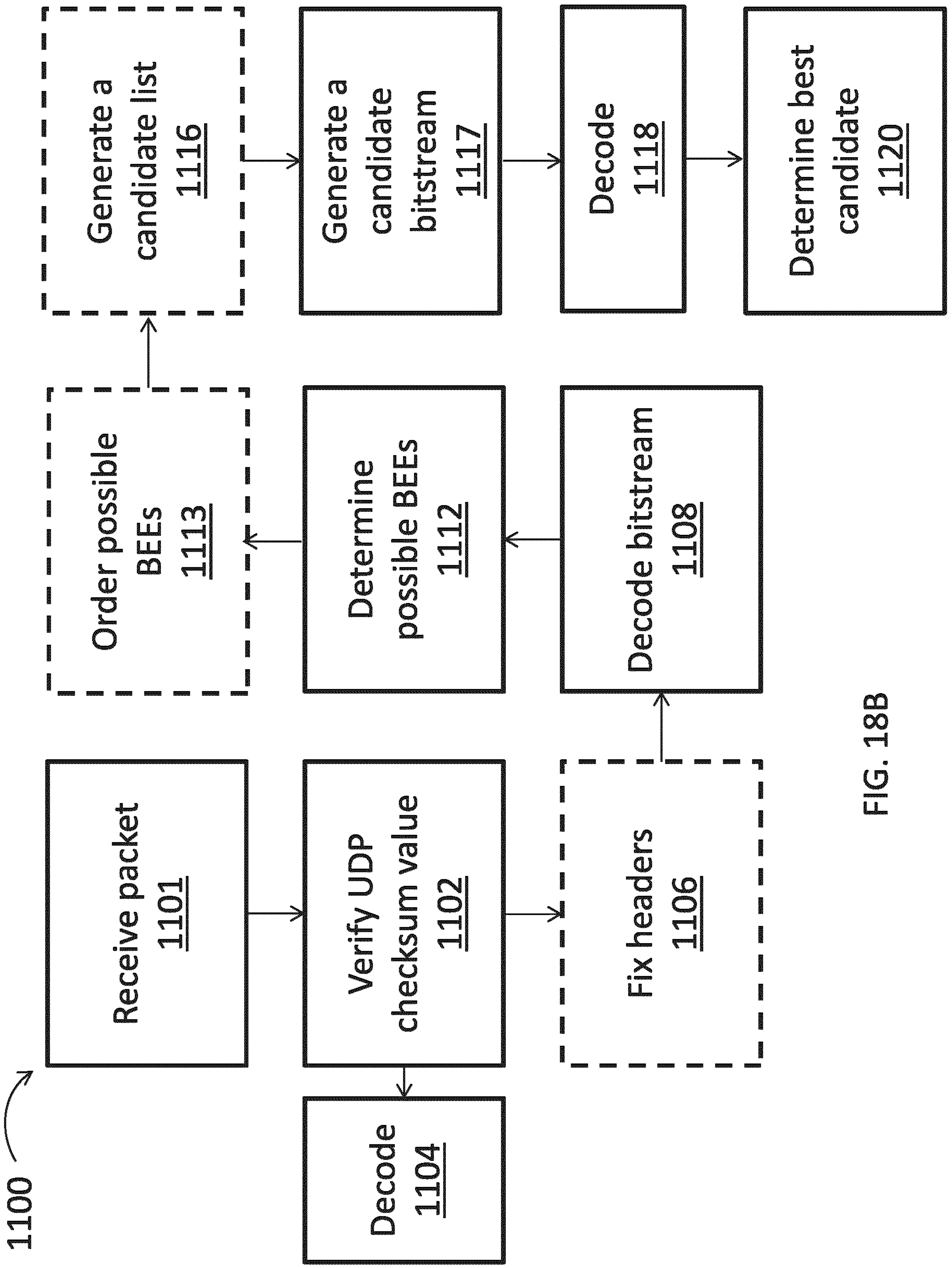
FIG. 18B presents a block diagram of a Checksum-Filtered List Decoding (CFLD) method, according to one embodiment.
Figure 18C:
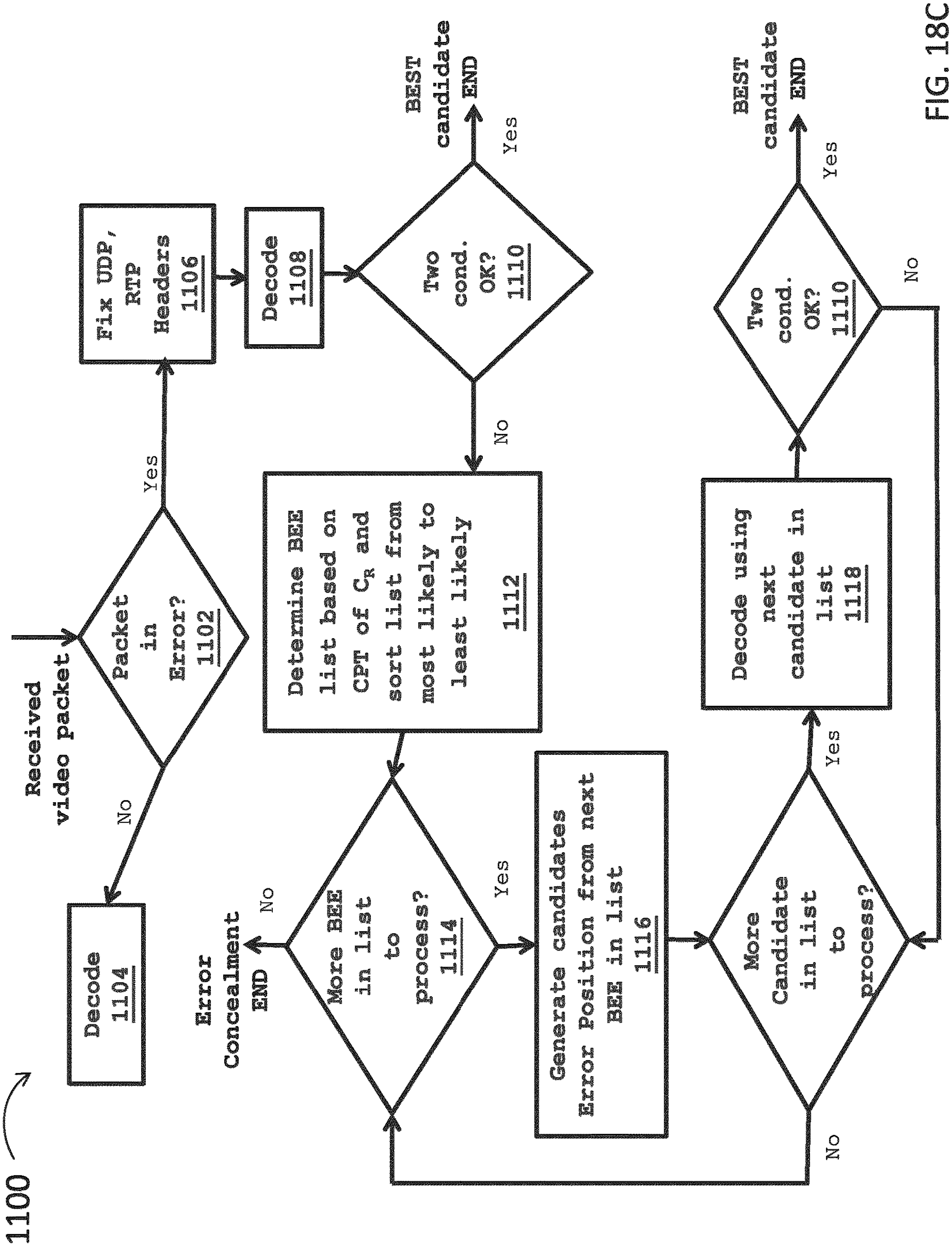
FIG. 18C presents a flow chart of a CFLD method, according to one embodiment.
Figure 18D:
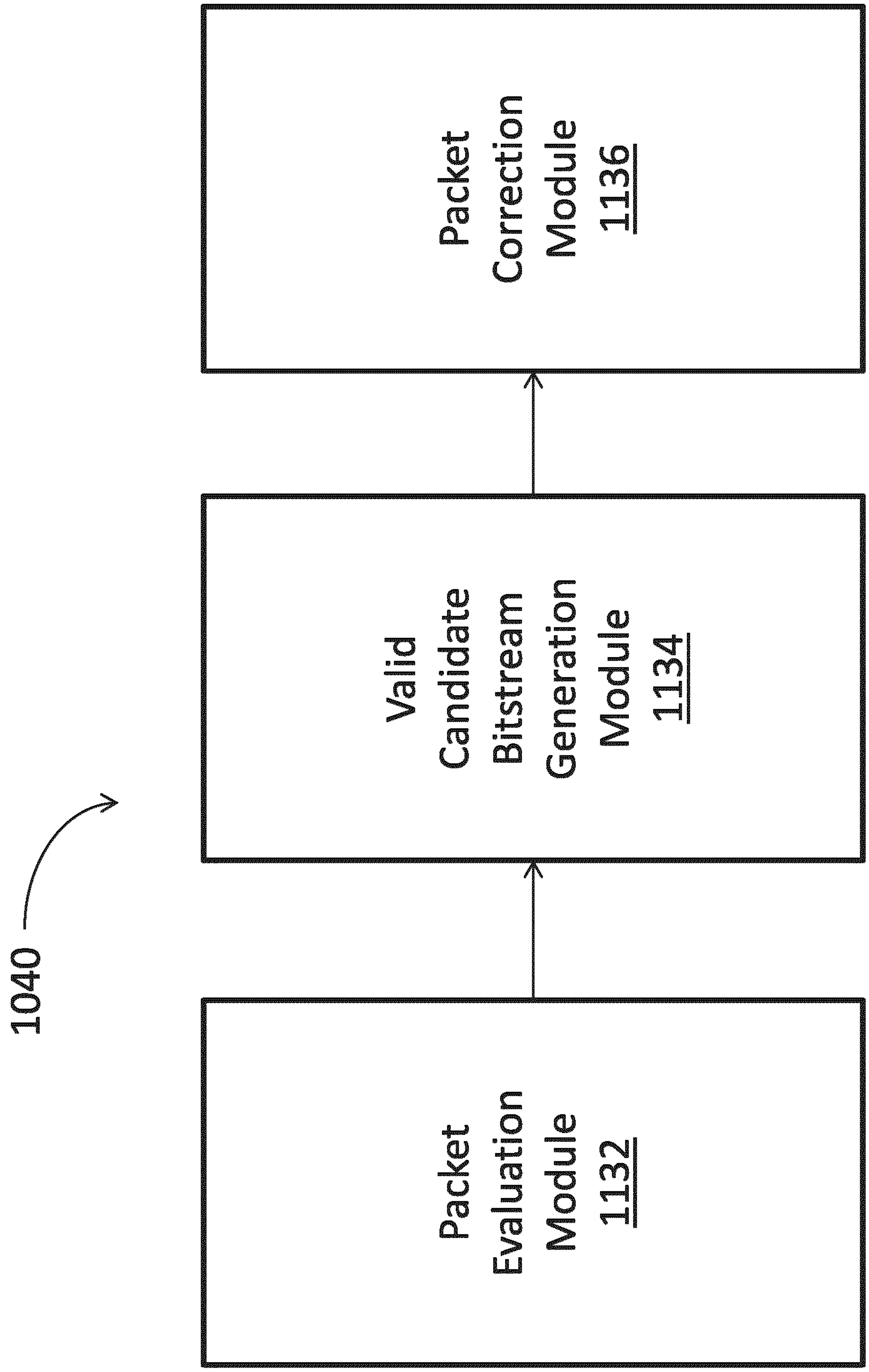
FIGS. 18D to 18G present a block diagram of a receiver having a CFLD module, according to one embodiment.

According to one aspect and as presented in FIG. 18D, the CFLD 1040 has a Packet Evaluation Module 1132, a Valid Candidate Bitstream Generation Module 1134 and a Packet Correction Module 1136. The Packet Evaluation Module 1132 is adapted to verify if the received packet has an error. The Valid Candidate Bitstream Generation Module 1134 is adapted to generate at least one candidate bistream when an error in the payload of the received packet is detected. The Packet Correction Module 1136 is adapted to replace the received packet by the at least one candidate bitstream.

Figure 18E:
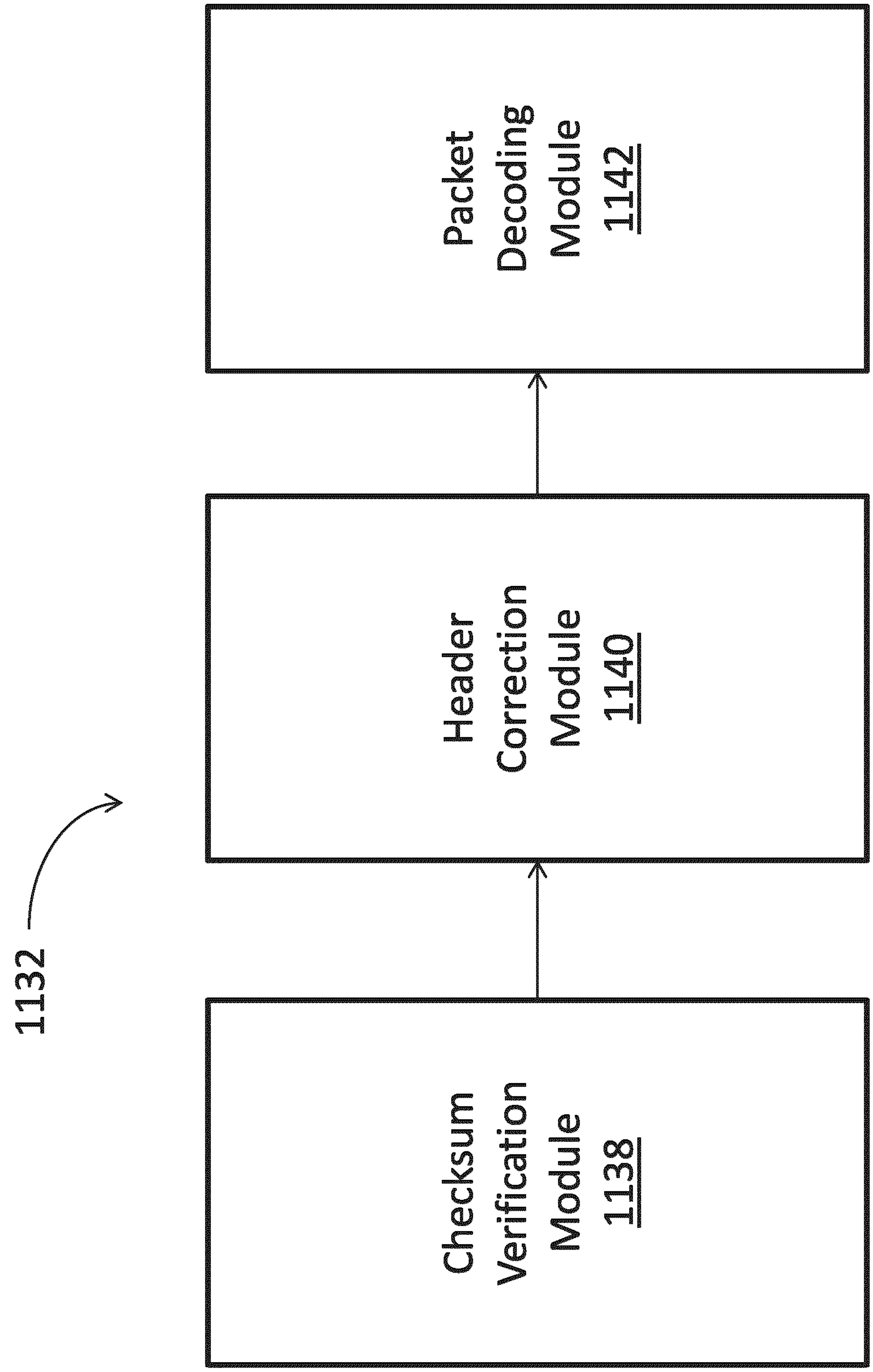

Presented in FIG. 18E, the packet evaluation module 1132 has a Checksum Verification Module 1138, a Header Correction Module 1140 and a Packet Decoding Module 1142. The Checksum Verification Module 1138 is adapted to calculate a corresponding checksum for the received packet. The Header Correction Module 1140 is adapted, if necessary, to correct a header of the received packet. The Packet Decoding Module 1142 is adapted to preliminarily decode the received packet in order to verify if the received packet with corrected header is decodable.

Figure 18F:
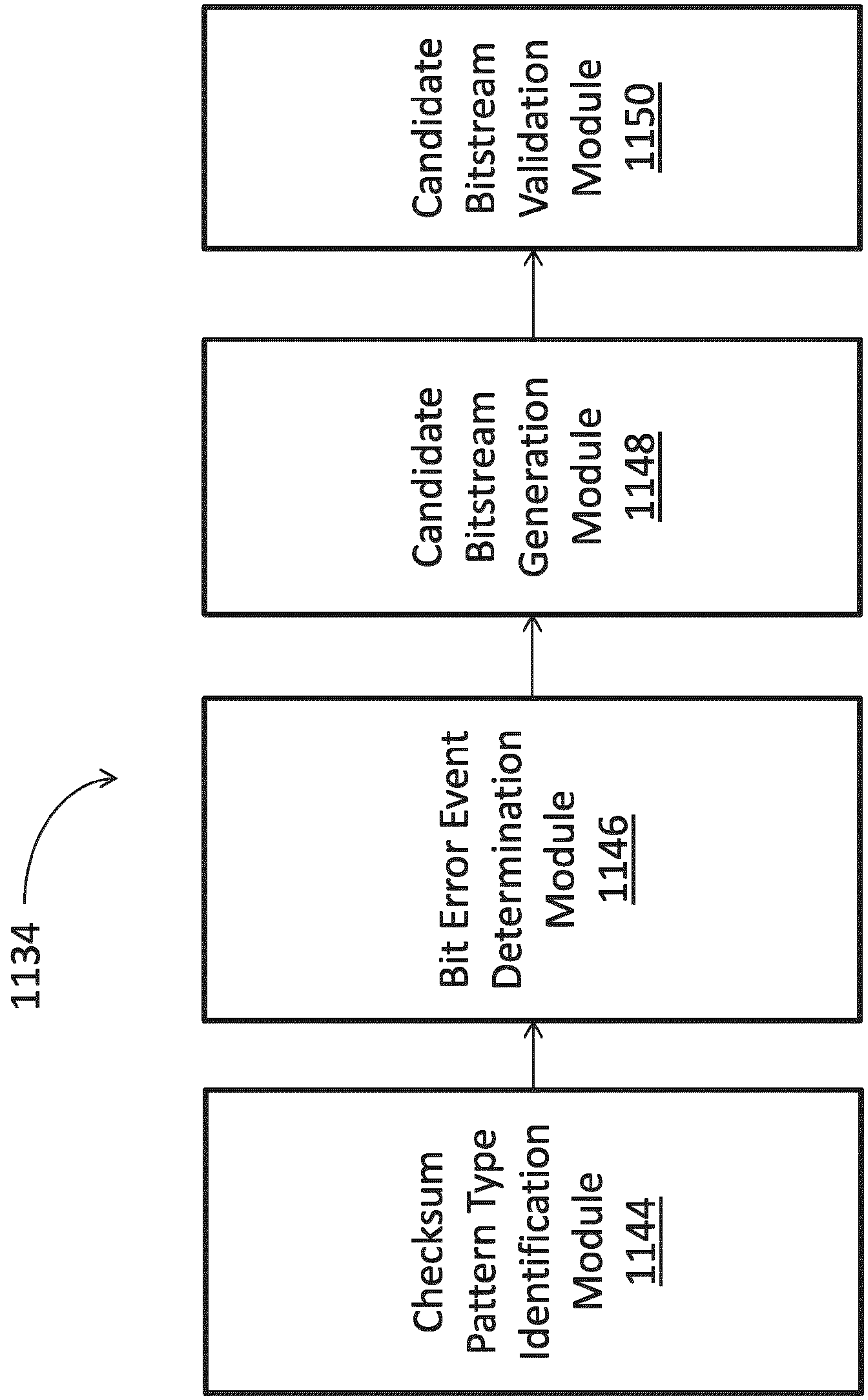

Presented in FIG. 18F, the Valid Candidate Bitstream Generation Module 1134 has a Checksum Pattern Type Identification Module 1144, a Bit Error Event Determination Module 1146, a Candidate Bitstream Generation Module 1148 and a Candidate Bitstream Validation Module 1150. The Checksum Pattern Type Identification Module 1144 is adapted to identify a CPT according to the calculated checksum value. The Bit Error Event Determination Module 1146 is adapted to determine at least one BEE according to the CPT. The Candidate Bitstream Generation Module 1148 is adapted to generate a candidate bitstream according to the at least one BEE. The Candidate Bitstream Validation Module 1150 is adapted to verify if the generated candidate bitstream is decodable.

Figure 18G:
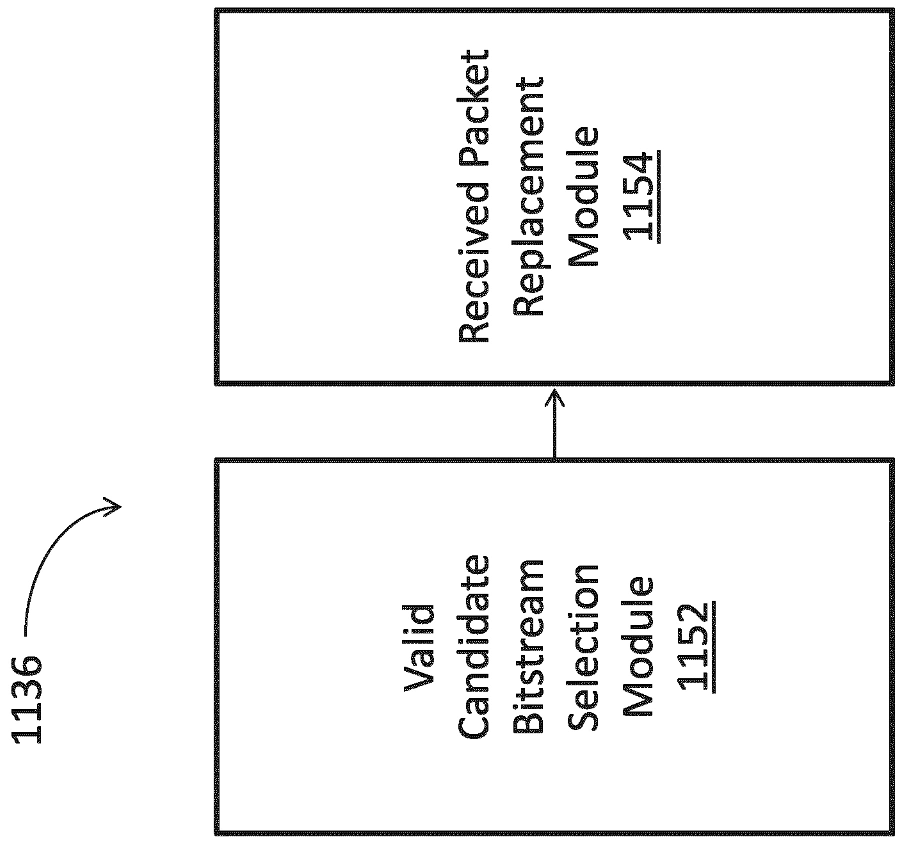

Presented in FIG. 18G, the Packet Correction Module 1136 has a Valid Candidate Bitstream Selection Module 1152 and a Received Packet Replacement Module 1154. The Valid Candidate Bitstream Selection Module 1152 is adapted to select one valid candidate bitstream from a list of valid candidate bitstreams, according to at least one predetermined condition. The Received Packet Replacement Module 1154 is adapted to replace the received packet by the selected candidate bitstream.

According to yet another aspect, there is a computing device having a Field-Programmable Gate Array (FPGA) or any suitable hardware configured to verify if the received packet has an error, generate at least one candidate bitstream when an error in the payload of the received packet is detected and replace the received packet by the at least one candidate bitstream. In order to verify if the received packet has an error, the FPGA is adapted to calculate a corresponding checksum for the received packet, if necessary correct a header of the received packet and preliminarily decode the received packet to verify if the received packet with corrected header is decodable. In order to generate the at least one candidate bitstream, the FPGA is adapted to identify a CPT according to the calculated checksum value and determine at least one BEE according to the CPT. The FPGA is further adapted to generate a candidate bitstream according to the at least one BEE and verify if the generated candidate bitstream is decodable.

Figure 19A:
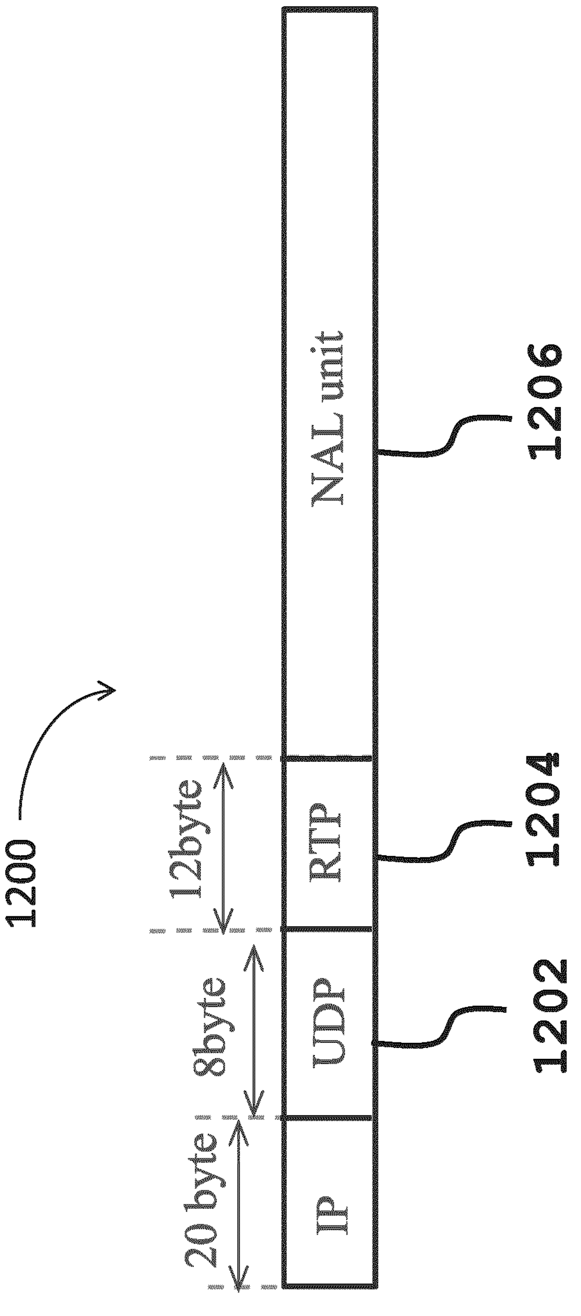
FIG. 19A presents a conventional UDP encapsulation.

According to yet another aspect, there is presented in FIGS. 18B and 18C the general schematic of a proposed method 1100. When a packet is received 1101, the UDP checksum value is verified 1102, if it is intact it will directly go to the video decoder 1104 otherwise it will go through an error correction process. FIG. 19A shows a conventional UDP encapsulation 1200. The size of a UDP header 1202 is eight bytes and the real-time transport protocol (RTP) header 1204 has twelve bytes in length. Since the $C_R$ value is calculated over all these bits, it is desirable to identify if there is an error which is indicated by the $C_R$ value, whether it is coming from the headers (1202 or 1204) or the video data (i.e. the payload) such as Network Abstraction Layer unit (NAL unit) 1206. Therefore, the first step of the correction process is to fix the headers. Some field of the UDP/RTP headers are fixed during the transmission (e.g. Source/Destination Port Num in UDP header) and some other parts are easily predictable (e.g. Sequence Number in RTP header) because of the redundant information in the headers.

Returning to FIGS. 18B and 18C, the next step after fixing all the headers 1106 is to decode the sequence of bitstream 1108. During the decoding 1108, sequences having header errors are filtered out according to two conditions 1110: 1) the sequence should be decodable, and 2) the number of blocks in the corrupted slices should be correct. If the two conditions are satisfied, it can be assumed that the sequence has errors somewhere in the headers (1202 or 1204) and that the video payload 1206 is correct, therefore further processing by the correction method 1100 is unnecessary, as concurrently presented in FIG. 19A. For certainty, it shall be understood that a block relates to a unit of coding. For instance, the block can be a macroblock (MB) in the case of H.264 and a coding unit (CU) in the case of HEVC.

It is assumed that the number of blocks in the packet is known. This is the case in several systems where the number of MBs or large coding units (LCUs) in a packet is constant or can be deduced from the information within other packets (for instance the first MB in slice syntax element in H.264). During simulations, it was observed that because of the high compression properties of the encoding process, the coded bitstreams were very sensitive to errors and, in many cases, even a one bit error can desynchronize the whole packet. This desynchronization creates non-valid syntax or semantic errors in the decoding process. This property is used to differentiate between the decodable and non-decodable bitstreams. A decodable bitstream has syntactically/semantically valid codewords. Since it has been observed that decodable bitstreams can nevertheless still be fairly damaged, the number of MBs in the case of H.264 sequences or LCUs in the case of HEVC sequences further eliminates corrupted candidates.

Further presented in FIGS. 18B and 19A, if the sequence does not satisfy at least one of the two conditions 1110, it is assumed that the errors are located somewhere in the video payload 1206. The sequence or packet should therefore be further processed by the method 1100 as follows:

According to one embodiment as presented in FIGS. 18B and 18C, based on the observed CPT value of the $C_R$ value, all the possible BEEs are determined 1112 and ordered 1113 from most likely to least likely according to the results of the table 1002 of FIG. 10B.

It shall be recognized that in some cases, the ordering 1113 of the possible BEEs can be omitted without departing from the scope of the present method 1100.

However, if there is no BEE in the list 1114, further processing of the sequence is terminated and an error concealment technique could be applied to the sequence.

If there is at least one BEE in the list 1114, starting with the most probable BEE, a candidate list is generated 1116. The candidate list includes the possible error locations based on the observed CPT and provides the candidate column(s)

and the type of flipped bits in cause (1→0 or 0→1). For each possible error location, a candidate bitstream is generated 1117.

Each candidate bitstream is decoded 1118 by the video decoder until one is found that satisfies the two conditions 1110 (i.e. the sequence is decodable; and the number of MBs in the case of H.264 sequence or the number of LCUs in the case of HEVC is correct) and thereby a best candidate bitstream is determined 1120.

If none of the possible error locations meet these two conditions 1110, another candidate list is generated 1116 with the next most probable BEE.

It shall however be recognized that the candidate bitstream can be directly generated 1117 starting with the most probable BEE and based on the observed CPT without generating a candidate list in advance and readily decode 1118 the candidate bitstream. If the candidate bitstream does not meet the two conditions 1110, another candidate bitstream can be generated 1117.

Moreover, it shall be recognized that only a single candidate list can be generated based only according to the most probable BEE and based on the observed CPT. If none of the candidate bitstreams meet the decoder's two conditions 1110 a conventional error concealment technique can be applied.

The method 1100 finds the first candidate bitstream that satisfies the two conditions 1110 starting with the most probable BEE. When there is no probable BEE or none of the candidate bitstreams meet the decoder's two conditions 1110, the approach falls back to an error concealment technique.

It shall be recognized that, rather than determining a best candidate 1120 based on the first candidate bitstream that satisfies the two conditions 1110, the method 1100 can determine the best candidate 1120 by selecting the best candidate from a group of suitable candidates according to a predetermined criteria, each of the group of suitable candidates satisfying the two conditions 1110.

It shall also be recognized that soft information, when available, can be used to rank the candidates as is currently done in existing list decoding methods. For instance, the candidates can be ranked based on their soft information (from most probable to least probable) and the method 1100 can be used to find the first candidate bitstream that satisfies the two conditions 1110 starting with the most probable one. Indeed, the candidate bitstream that satisfies the two conditions 1110 can be obtained by selecting one candidate according to its probability rank and flipping the bits of the selected candidate according to their level of reliability, such as by starting to flip the least reliable bits first (e.g. change the bits of lowest absolute LLR values first).

Using the checksum value in the error correction process provides a notable reduction in the number of candidates to be considered by the decoder. The receiver side's checksum value can help to determine the possible or potential location of errors. Re-flipping bits in those candidate locations will make the $C_R$ value be zero. The total number of candidates depends on the packet size and the number of errors in the packet. Generally, in list decoding approaches, for a packet containing N bits there are N possible candidate bitstreams for the case of one bit in error, whereas our CFLD approach will consider only N/32 candidates, which represents about 3% of those considered by conventional list decoding approaches. This is because the $C_R$ value provides extra information about the column of the error and the type of flipped bit. Since the packet is divided into words of 16 bits, there are N/16 bits in each column and, assuming that half of the bits in each column are "0"s and half of them are "1"s, then the total number of candidates will be N/32. This means that in case of one bit in error, there is about a 97% reduction in the number of candidates compared with other list decoding approaches. This reduction can be even higher when the number of bits in error is increased. For instance, in the case of two bits in error about 99.6% of non-valid candidates can be eliminated by considering $C_R$ in the CFLD approach. Table 1210 of FIG. 19B presents the average number of candidates for different packet lengths in case of one and two bits in error.

Although the method is applied to H.264 and HEVC encoded sequences, it shall be recognized that this method can also be applicable to other types of encoded sequences of video data such as those encoded with VP8, VP9 or VP10 or other type of data such as audio data.

Moreover, it shall also be recognized that although the described embodiments refer to the UDP protocol, the method is adaptable to any other type of protocol using a checksum validation method that calculates a checksum value corresponding to a predefined CPT by which at least one BEE can be determined such as the TCP protocol without departing from the scope of the present.

It shall be recognized that the determining possible BEEs 1112 of FIG. 18B can be adapted to identify potential error locations in the header or in a combined header and payload bitstream. Indeed, determining possible BEEs 1112 could also be used to identify potential error locations in IP headers using the IP checksum, in order to correct the IP headers. Similarly to the UDP/RTP headers, some IP header fields are fixed during the transmission (e.g. Version and Destination IP Address) and some other portions of the header are easily predictable (or some values can be eliminated) according to a known context (e.g. Protocol) because of the redundant information in the headers. In general, the method exploits the checksum information (e.g. IP, UDP, TCP checksums) to identify potential error locations within a header (e.g. IP, UDP, TCP, RTP) and/or a payload (e.g. audio, video, image). Then additional information is used in complement to these potential error locations to identify the actual error locations (or the most likely error locations). In the case of headers, fixed or predictable field values permit to identify where in the headers the error(s) actually occurred (or is most likely to have occurred) and correct it (them). In the case of multimedia payloads (audio, video, images), list decoding (i.e. trying to decode possible bitstreams) and selecting one candidate bitstream that is decodable without any error (or the best one according to a certain criterion, if many are decodable) provides appreciable results. However, in the case of TCP, the information of two erroneous TCP packets, an initially transmitted and its retransmitted version, can be combined to yield a fully corrected packet that can be used for unique decoding when the potential error locations for each packet differ. Indeed, the packet can be reconstructed by retaining, from each packet, the bit values that are not located on the potential error locations. The method can be applied to more TCP packets and several errors.

In particular, the method can also be applied to other types of media content, such as audio, where corrupted packets are likely to cause decoding problems or inconsistencies, i.e. a high proportion of the corrupted packets will either be non-decodable or not meet some expected condition (such as the expected number of blocks in video). Moreover, the method can be applied to various types of encrypted multimedia data, such as encrypted voice data, encrypted image data, or encrypted video data. In this case, the method is applicable in combination with a decryption method. As a result, the candidate bitstream determined by the present method shall be decryptable and decodable.

The method 1100 also applies to other checksum mechanisms where the presence of an error in the packet leads to identifiable or observable patterns that can determine candidate error locations in the packet. Those candidate error locations can be followed by a list decoding approach to determine the candidate corrected packets that lead to decodable media data. The candidate corrected packets of decodable media data which optionally meet some other constraint are retained. For instance, rather than being selected arbitrarily, the candidate corrected packets are ranked using some likeliness measure to determine a best corrected packet. Amongst others, the likeliness measure may be related to border matching in video or audio feature continuity in audio.

The method 1100 for correcting errors in a received (erroneous) packet in the context of this invention should be understood as a process of modifying the received packet to make it usable by an application (i.e. repairing important fields in a header and/or making it syntactically valid and decodable for multimedia (payload) content such as video). Although in the majority of cases, the present method allows to entirely correct the received packet, it shall be understood that in some cases the corrected received packet is only partially corrected. Decoding of the partially corrected received packet is still possible since the partially corrected received packet has, amongst others, a valid syntax. Actually, in most cases, the partially corrected packet has a high level of fidelity with the originally transmitted packet (e.g. they have a high level of visual similarity in the case of video).

Experimental Results

Simulation results for the proposed approach is presented hereon. Sequences with only one bit in error is considered since for small values of residual bit error rate (e.g. $\rho=10^{-6}$) the probability of having two or more bits in error is extremely low. The performance of the proposed approach in comparison with other state-of-the-art approaches will be shown. In the simulations, it is assumed that the checksum is intact and that the error is in the video payload. This is reasonable for video packets of 10000 bits since there is only 1 chance over 625 (i.e. 10000/16) that the checksum is hit instead of the video payload. Furthermore, decoding the packet is first attempted, after making sure the headers are correct. Therefore, if the error was really in the checksum, it will not cause a problem in the method 1100 of FIG. 18B.

Simulation Setup

The experiments are carried out using H.264 Baseline profile because it is typically used in conversational services and mobile applications and HEVC Low Delay P Main profile. The simulation used the Joint Model (JM) software, version 18.5 for H.264 and HEVC Test Model (HM) software, version 15 for HEVC.

The first 60 frames of NTSC (720×480) sequences (Driving, Opening-ceremony, Whale-show), 4CIF (704×576) sequences (City, Crew, Ice), CIF (352×288) sequence (Foreman) and PAL (720×576) sequence (Walk) are coded with JM18.5. The sequences are coded in IPPP . . . format (Intra refresh rate of 30 frames) at a frame rate of 30 Hz. Each slice contains a single row of MBs and are encapsulated into RTP packets. Four different approaches are then used to handle the corrupted sequences: (i) error concealment by JM frame copy (FC) concealment, (ii) state-of-the-art error concealment STBMA, error correction using HO-MLD, and the proposed CFLD method 1100 of FIG. 18C. The first 30 frames are kept intact to allow the MLD approach to gather video statistics.

We also carry out the simulation on HEVC sequences. The first 50 frames of five class B (1920×1080) sequences (BasketballDrive, BQTerrace, Cactus, Kimono and ParkScene) and four class C (832×480) sequences (BasketballDrill, BQMall, PartyScene and RaceHorses) are coded by HM. The slicing mode is chosen to fix number of coding units (CUs) in a slice. One row of 64×64 CUs is considered per slice. In this case, the corrupted packets are handled by (i) implemented FC concealment in HM and (ii) the CFLD approach.

All the sequences are encoded with different quantization parameter (QP) values, namely 22, 27, 32, and 37 (a high QP value indicates a high compression and therefore lower quality, a low QP value indicates low compression and therefore higher quality). For each QP value, a single frame is randomly selected for error. Then, a uniform error distribution is applied on the bits of each packet with a p value varying from approximately $10^{-7}$ for small QP values and $10^{-6}$ for large QP values to obtain one bit in error.

Simulation Results

In FIG. 20A, there is a table 1301 that shows the candidate reduction at each step of the proposed approach for H.264 and HEVC sequences. As it can be observed, with the proposed CFLD method 1100 of FIG. 18C, the checksum helps to eliminate around 97% of the candidates. Then, as a complementary step, the two conditions are successively applied on candidates' bitstreams. The last two columns in the table present how efficient the two conditions are to exclude non-valid candidates. There are some cases where, at the end of the process, there is more than one candidate. We observed that this happens less frequently in HEVC where sequences are coded using Context-Adaptive Binary Arithmetic Coding (CABAC) compared to H.264 CAVLC sequences. The use of CABAC is probably the reason explaining why HEVC is much more sensitive to errors (easier to desynchronize) than H.264. It is expectable that H.264 Main profile, using CABAC, would be more sensitive to errors than the Baseline profile and therefore lead to the elimination of more candidates.

For performance evaluation, there was calculated the peak signal-to-noise ratio (PSNR) of reconstructed corrupted frames using various approaches to compare their visual quality. FIG. 20B presents a table 1300 showing the average PSNR values for different error handling approaches on H.264 and FIGS. 20C and 20D present tables 1302 and 1304 showing the average PSNR values for different error handling approaches on HEVC class B and class C sequences. The last column in the tables 1300, 1302 and 1304 show the percentage of times the CFLD method 1100 was able to correct the error (i.e. when the PSNR of the reconstructed bitstream is exactly the same as the intact one). The simulation was repeated 100 times for each sequence for different QP values (high QP meaning high compression-low quality—and low QP meaning low compression-high quality). The results on H.264 sequences indicate that the proposed approach outperforms H.264's Joint Model Frame Copy (JM-FC) ("H.264/AVC JM Reference Software." version 18.5, [Online]. Available: http://iphome.hhi.de/suehring/tml/), Spatio-Temporal Boundary Matching Algorithm (STBMA) (Y. Chen, Y. Hu, 0. C. Au, H. Li, and C. W. Chen, "Video error concealment using spatio-temporal boundary matching and partial differential equation," IEEE Trans. on Multimedia, vol. 10, no. 1, pp. 2-15, 2008) and Maximum Likelihood Decoding with hard information (HO-MLD) (F.

Figure 20E:
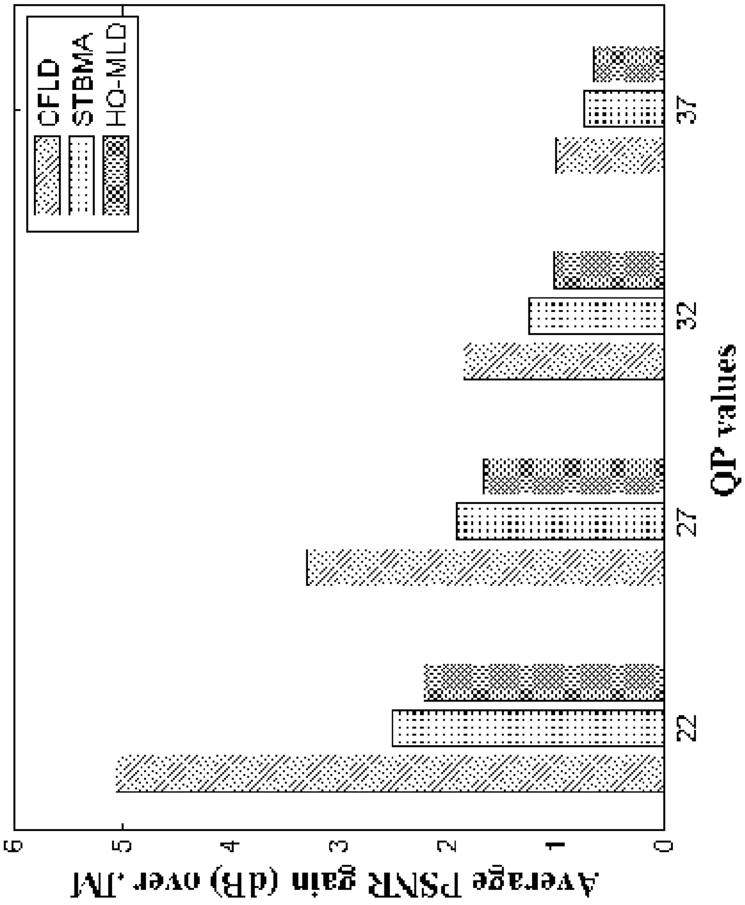
FIG. 20E presents an average PSNR gains of HO-MLD, STBMA and CFLD methods over JM for different QP values of H.264 sequences.

Caron and S. Coulombe, "Video error correction using soft-output and hard-output maximum likelihood decoding applied to an H.264 baseline profile," IEEE Trans. on Circuits and Systems for Video Technology, vol. 25, no. 7, pp. 1161-1174, 2015) in all cases. FIG. 20E shows the average PSNR gain of each approach at different QP values. It can be observed that the proposed approach provides significant PSNR gain over JM for all four QP values. For instance, it is more than 5 dB better than JM-FC at QP=22. On average in the case of H.264, considering all QPs, the CFLD approach was able to correct the bitstream 79% of the time. Also, as shown in the table 1300, the CFLD method 1100 offers a 2.79 dB gain over JM-FC and 1.19 dB and 1.41 dB gains over STBMA and HO-MLD respectively. In the case of HEVC as shown in tables 1302 and 1304, the proposed approach corrects the corrupted bitstream 91% of the time and it offers 2.35 dB and 4.97 dB gains over HM-FC in class B and C sequences respectively.

Figure 21A:
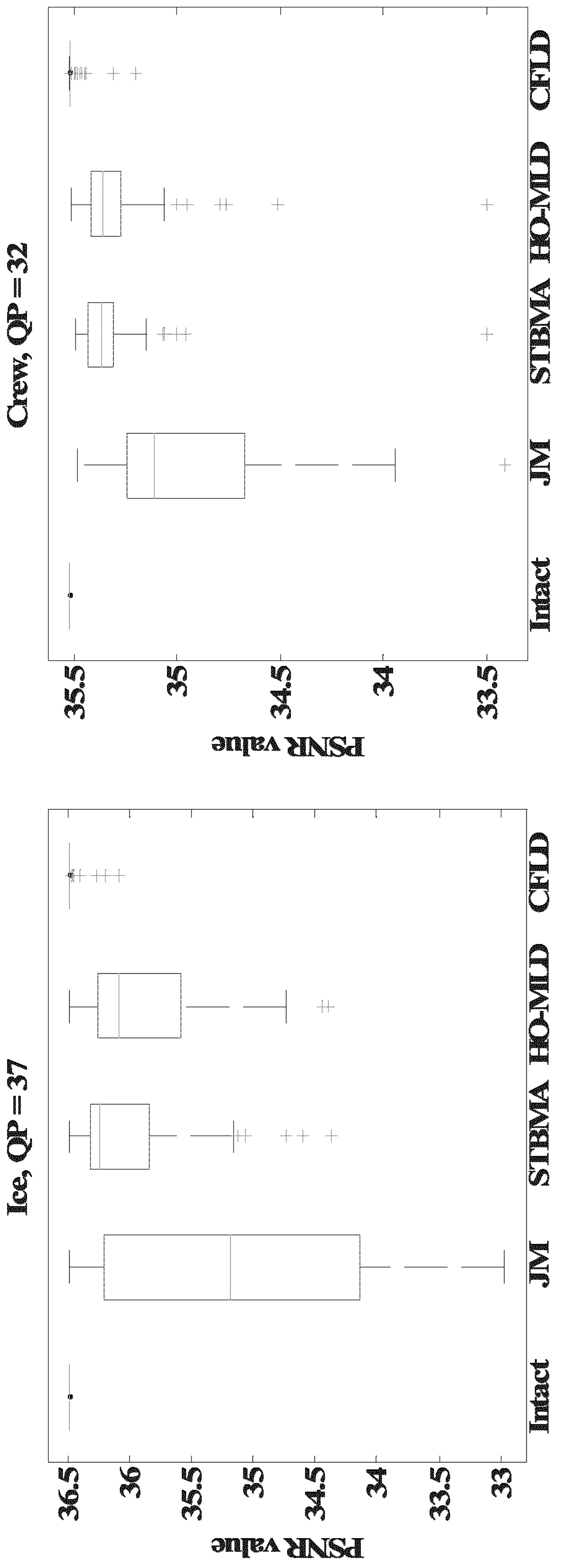
FIGS. 21A and 21B present a PSNR distribution of 100 run on frame 45 of H.264 sequences. The percentage of correcting bitstream for each is as follows: Ice 91%, Crew 76%, Foreman 61% and City 80%.
Figure 21B:
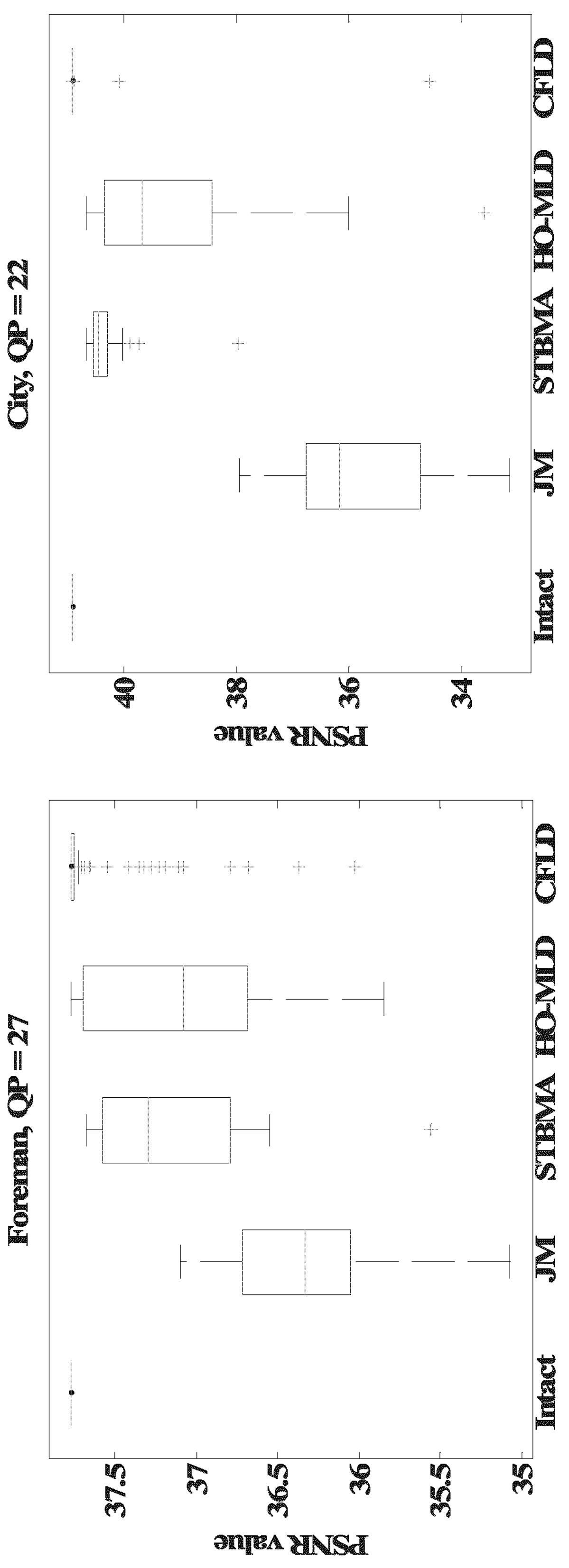

As mentioned, in the proposed system, we select the first candidate which satisfies the two conditions but is not always the best one, i.e. the one with a corrected bitstream. Some of those first valid candidates have very low PSNR values, which impact negatively the average PSNR values shown in tables 1300, 1302 and 1304 of FIGS. 20B, 20C and 20D. Looking at the box plot of FIGS. 21A and 21B, it can be noticed that more than 80% of the time, the proposed approach can correct the bitstream and the PSNR of the reconstructed frame is the same as the intact one. This increases the visual quality of the corrupted frame and prevents the propagation of errors to subsequent frames due to the predictive coding. In fact, the PSNR difference of a few decibels on reconstructed the corrupted frame increases to several dBs on subsequent frames due to this drift. But most cases which have very low PSNR, as can be seen in FIGS. 21A and 21B, can be eliminated by adding an additional pixel-domain step in our system (such as boundary matching or border checking). Indeed, instead of selecting the first candidate which satisfies the two conditions, we could rank all candidates satisfying the two conditions using a yet to be defined pixel-domain likeliness measure or other likeliness measure based on the decoded information (e.g. motion vectors). For instance, for all the candidates satisfying the two conditions, we could use a pixel-domain metric such as the one based on the sum of distributed motion-compensated blockiness (SDMCB) to rank them. We thus could select the candidate having the highest likeliness (e.g. lowest SDMCB value). Thereby, we could select the candidate satisfying the two conditions having the highest likeliness.

Figure 22:
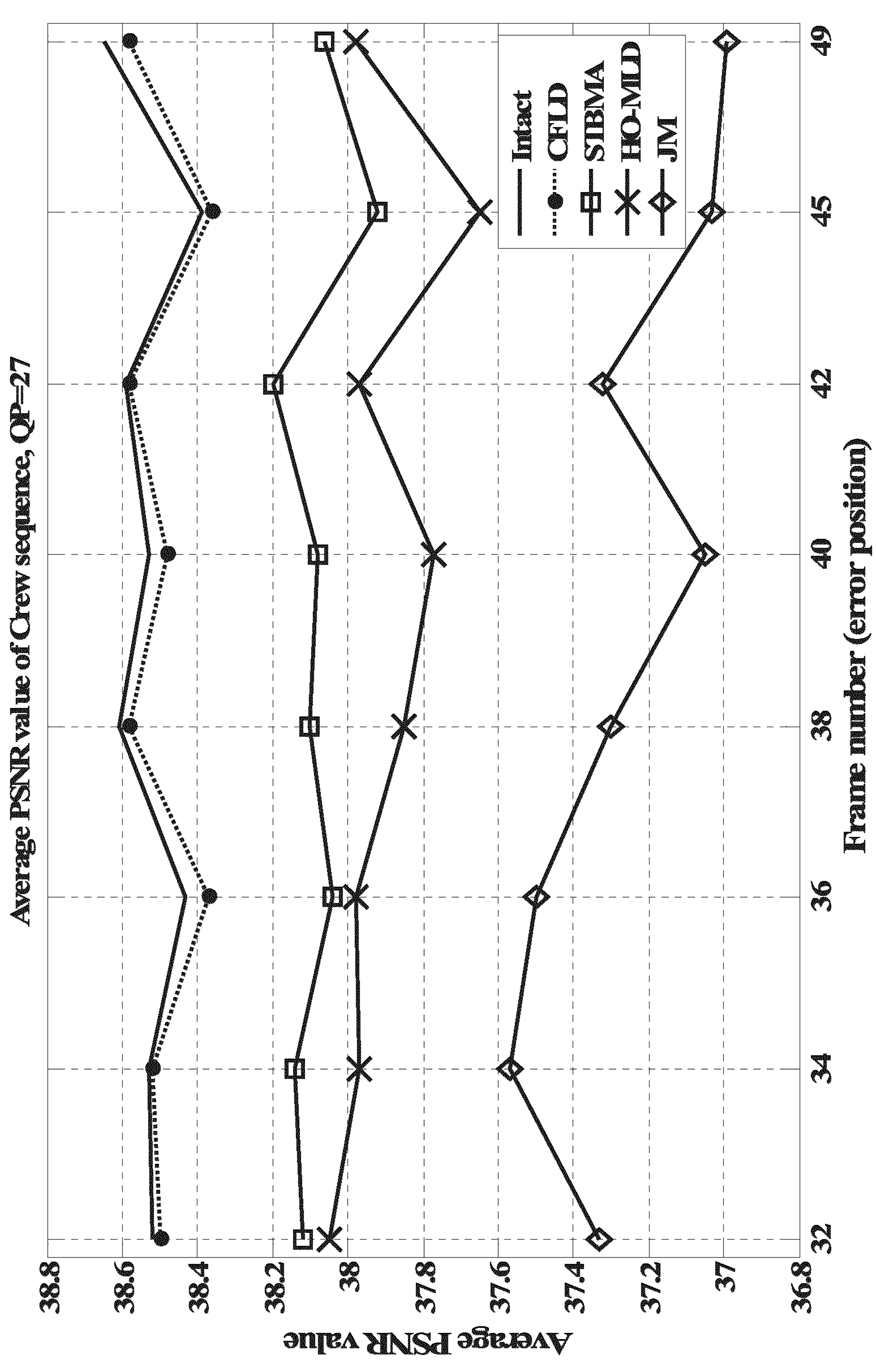
FIG. 22 presents an average PSNR for H.264 "Crew" sequence at QP=27 on different frames.

FIG. 22 presents average PSNR value for H.264 "Crew" sequence at QP=27 and on different frames. Each point on the figure is an average PSNR of 100 random errors. In this figure, it can be clearly noticed that the average PSNR value of the proposed approach (no matter which frame was hit by error) is the closest PSNR value to the intact one. The results show that a higher PSNR is observed with the proposed method 1100 of FIG. 18B.

Figure 23A:
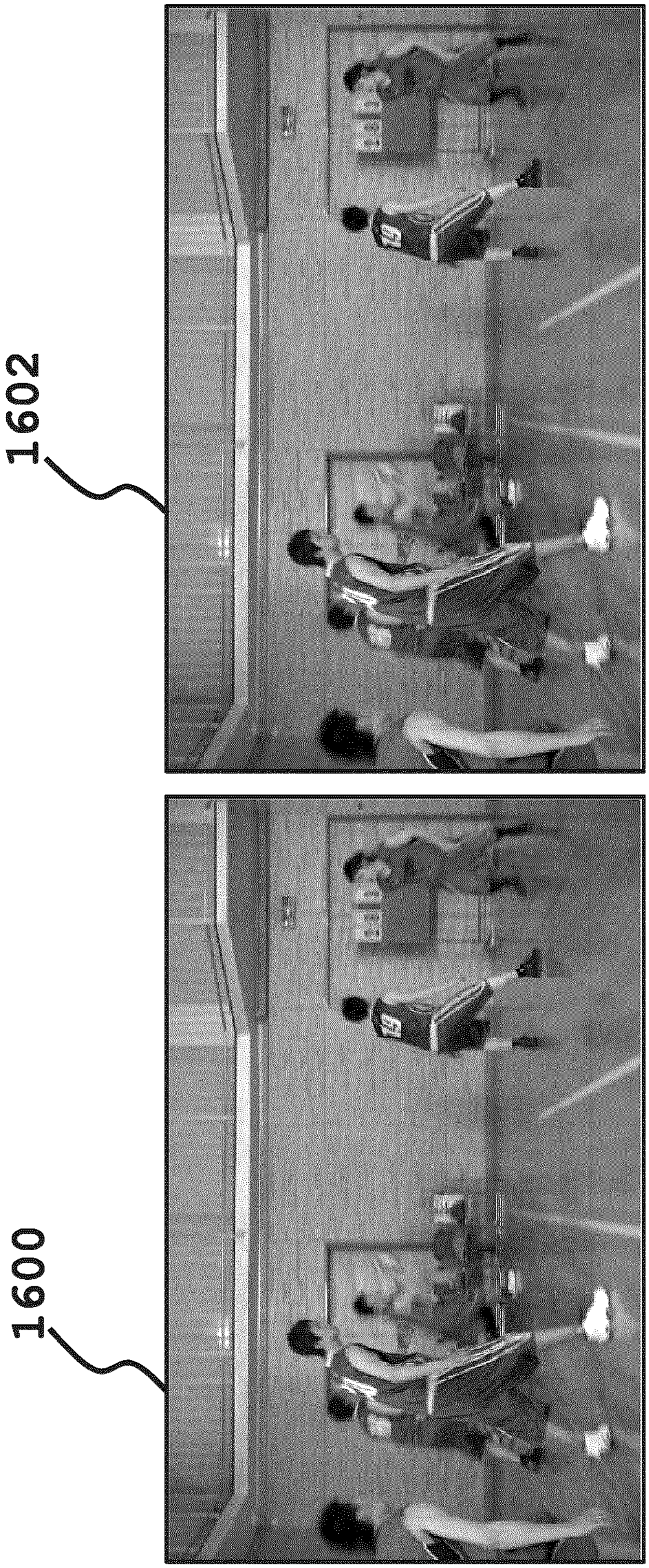
FIG. 23A presents a visual comparison of an intact frame with a reconstructed frame of an HEVC "BasketballDrive" sequence at QP=22 by the method of FIG. 18C, according to one embodiment.
Figure 23B:
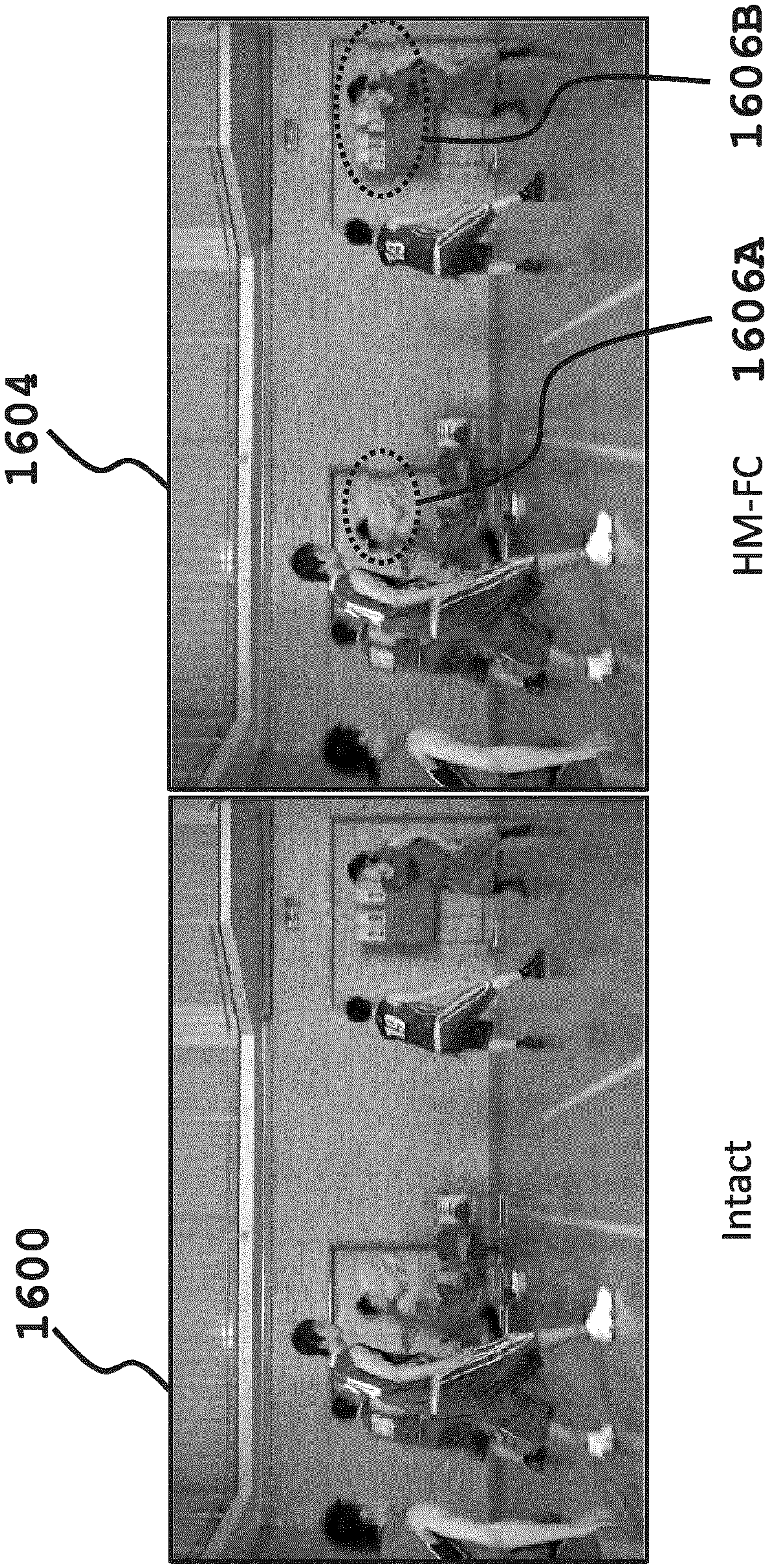
FIG. 23B presents a visual comparison of the intact frame of FIG. 27A with a reconstructed frame of an HEVC "BasketballDrive" sequence at QP=22 by a conventional method.

FIGS. 23A and 23B present a visual comparison of a reconstructed frame by different methods. The original frame or intact frame 1600 is the 37-th frame of the "BasketballDrive" sequence at QP=22. In FIG. 23A, next to the original frame 1600 is a CFLD reconstructed frame 1602 by the proposed method 1100. In FIG. 23B, next to the original frame 1600 is a HM-FC reconstructed frame 1604. The reconstructed frames (1602 and 1604) are reconstructed following a corruption in the original frame 1600, the original frame 1600 is corrupted by flipping one bit in frame 37, slice 7 and bit 11757—the packet containing 19968 bits. As concurrently presented in FIG. 18B, the proposed method 1100 has a step of generating a candidate list 1116, this step provides six-hundred-sixteen (616) candidates. Of those six-hundred-sixteen candidates, four (4) candidates are decodable and only one of them has the right number of CU. The PSNR value of the intact frame 1600 and of the CFLD reconstructed frame 1602 are the same, 39.25 Db. However, the PSNR value of the HM-FC reconstructed frame 1604 is 30.68 dB. FIG. 23B presents a comparison of the original frame 1600 with the HM-FC reconstructed frame 1604, damaged areas 1606A and 1606B in the HM-FC reconstructed frame 1604 are indeed visually noticeable. This comparison further confirms the robustness and superiority of the proposed method 1100.

From the results of all figures and tables, it can be inferred that the proposed approach can effectively remove non-valid candidates, and in more than 80% of the cases in H.264 to 90% of the cases in HEVC, the sequence can be corrected. This is valuable not only for the corrupted frame, but for the following ones, as fewer visible drifting effects will be caused.

Fountain Encoding

For a given set $x_1, \ldots, x_k$ of source symbols, a fountain encoder produces a potentially limitless (or at least very large) stream of encoded symbols $y_1, y_2, \ldots$ In fountain codes, a symbol refers to a bit or a sequence of bits, but in the context of the present application, a symbol refers to a sequence of bits (e.g. a data packet). For instance, a symbol may be a video packet. Suppose that the receiver collects N=k+o encoded symbols $y_1, y_2, \ldots, y_N$. Each of these symbols is a uniform random linear combination of the source symbols. Here the overhead is o, which is often expressed as the percentage 100·o/k. The source symbol size, denoted T, is measured in bytes.

In fountain codes, such as Luby Transform (LT) codes, Raptor codes, etc., the relationship between the source and the collected encoded symbols is described by a matrix, $A \in F_2^{N\times k}$, as $$\begin{pmatrix} a_{11} & \ldots & a_{1k} \\ \vdots & \ddots & \vdots \\ a_{N1} & \ldots & a_{Nk} \end{pmatrix} \cdot \begin{pmatrix} x_1 \\ \vdots \\ x_k \end{pmatrix} = A \cdot \begin{pmatrix} x_1 \\ \vdots \\ x_k \end{pmatrix} = \begin{pmatrix} y_1 \\ \vdots \\ y_N \end{pmatrix}$$

where N>=k, and $F_2$ (also denoted GF(2)) is the Galois field of two elements (the smallest finite field). This matrix A is chosen from the set of binary N×k matrices under some additional constraints or characteristics related to the codes they implement, such as LT codes or Raptor codes. Recovery of the source symbols is possible if and only if the rank of A is k. Each row $(a_{i1}, \ldots, a_{ik})$ of the matrix A generates an output (or encoded) $y_i$ from the source symbols according to:

$$y_i \oplus_{j=1}^{k} a_{ij} x_j$$

where ⊕ is a bitwise XOR operator and $a_{ij}x_j$ is computed using a binary AND operator between $a_{ij}$ and $x_j$. This process is referred to as encoding, and the vector $(a_{i1}, \ldots, a_{ik})$ is called the mask corresponding to the encoded symbol $y_i$. Note that in operation, the transmitted encoded symbols need to be accompanied by information allowing the receiver to recover the mask of each of these encoded symbols. This is accomplished by transmitting Encoding Symbol ID's (ESI's) along with the encoded symbols. In the standardized Raptor code, an ESI is a 16-bit integer.

Conventional Communication System and Method

Figure 24A:
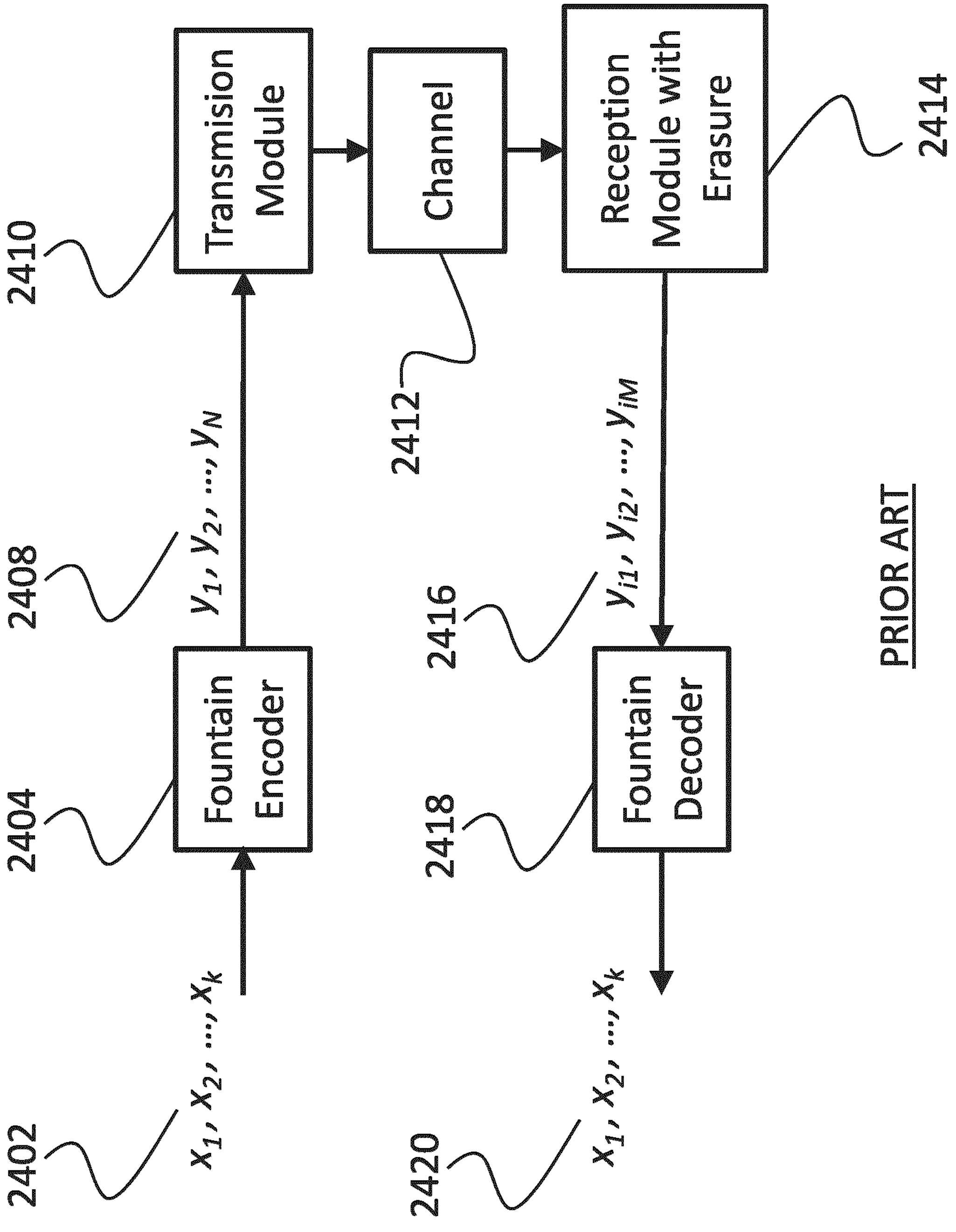
FIG. 24A presents a prior art communication system block diagram for fountain codes.

Normally, in the context of erasure codes such as fountain codes, when a symbol is received with the slightest bit error, it is discarded and other received symbols are relied on to recover the source symbols. Such prior art communication system is illustrated in FIG. 24A. A set of k source symbols 2402 are encoded using a fountain encoder 2404 to produce N>k encoded symbols 2408. The encoded symbols 2408 are transmitted using a transmission module 2410 through a channel 2412. The encoded symbols are received using a reception module with erasure 2414 which discards any received encoded symbol 2408 that has been corrupted during the transmission over the channel 2412. The reception module with erasure 2414 outputs a set of M<=N received encoded symbols 2416. The received encoded symbols 2416 is a subset of the encoded symbols 2408 that have been received without error (note that the received encoded symbols 2416 would include all the encoded symbols 2408 that were transmitted, if none were corrupted during transmission). The set of received encoded symbols 2416 is decoded by the fountain decoder in order to recover the set of k source symbols 2402 as a set of k decoded symbols 2420. The set of k decoded symbols 2420 is identical to the set of k source symbols 2402 only if the set of M received encoded symbols 2416 contains sufficient elements (if M>=k) and if those elements are appropriate, otherwise the recovery of the source symbols 2402 is not possible.

Proposed Communication System and Method

Figure 24B:
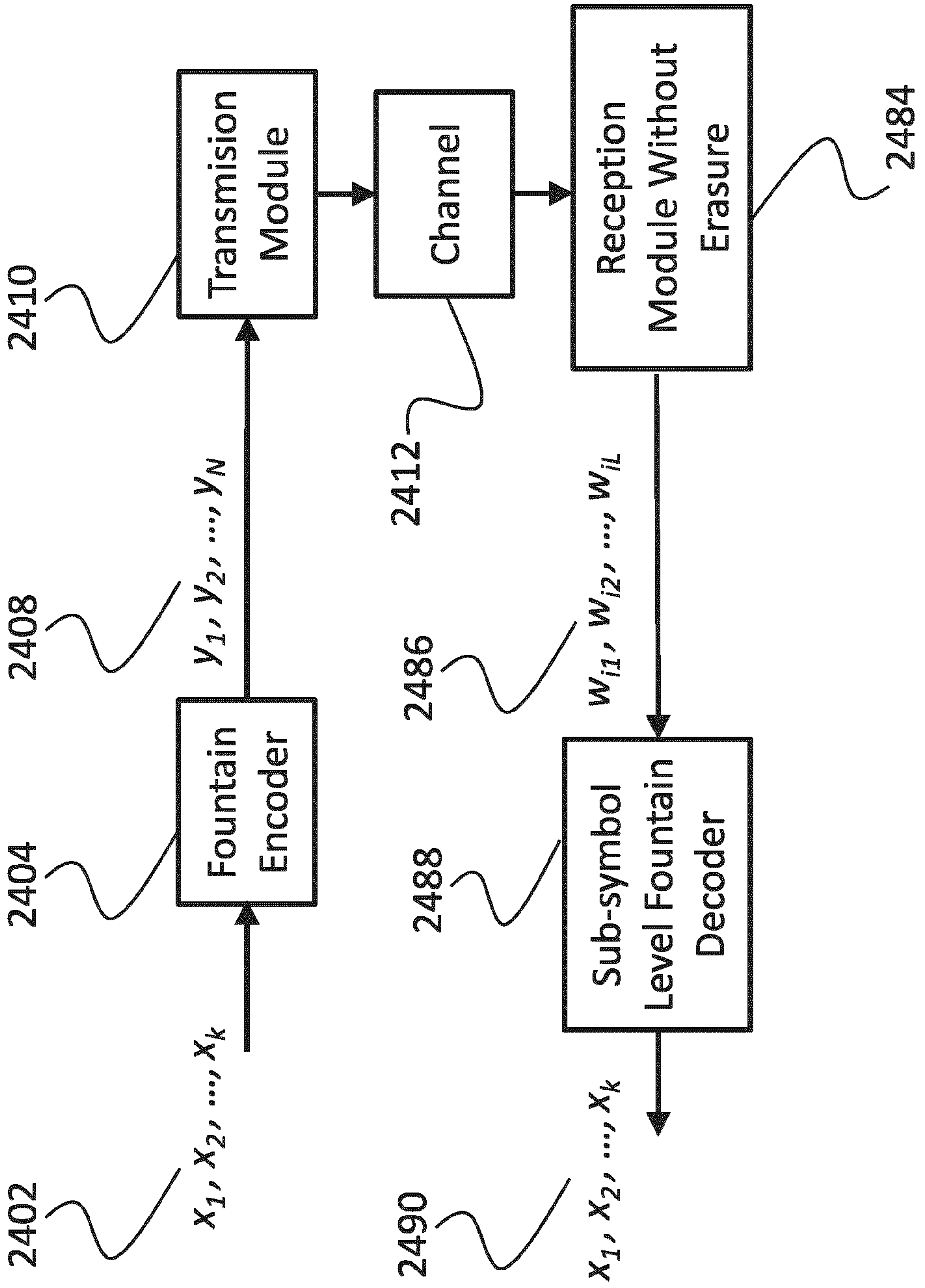
FIG. 24B presents a communication system block diagram for fountain codes, according to one embodiment.

Conventional fountain codes perform bit wise XOR operators independently on each bit of the encoded symbols to recover the source symbols. In the proposed method and system as presented in FIG. 24B, fountain codes decoding is applied at a bit level (or sub-symbol level) rather than at a symbol level in order to improve the decoding robustness. In order to increase decoding robustness, the received encoded symbols 2408 that have been corrupted during the transmission over the channel are not discarded (at least not all of them). As further presented in FIG. 24B, the Reception module without erasure 2484 does not systematically discard every symbol that has been corrupted during the transmission. According to one embodiment, none of the received symbol is discarded. In an alternate embodiment, some received symbols are ignored or discarded. Moreover, in some cases some symbols may not be received by the Reception module 2484, due to various transmission problems. Therefore, the Reception module without erasure 2484 outputs a set of L<=N received encoded symbols 2486 which is the same or a subset of the encoded symbols 2408 that have been received. Notice that some encoded symbols 2486 might however be corrupted (i.e. each of the w, corresponds to a $y_n$ but with possibly some bit errors). The set of received encoded symbols 2486 is decoded by the proposed Sub-symbol level fountain decoder 2488 to recover the set of k source symbols 2402 as a set of k decoded symbols 2490. The set of k decoded symbols 2490 are identical to the set of k source symbols 2402.

The proposed sub-symbol level fountain decoder can outperform a conventional encoder because it operates at a bit level or more generally at a sub-symbol level. For instance, consider two symbols $y_m$ and $y_p$ which are known to have been transmitted and received with errors (but not discarded). Furthermore, let us suppose that there is some indication on the potential positions of the bit errors in those two symbols. In a conventional fountain code decoding method as presented in FIG. 24A, the two erroneous symbols are discarded and only the N−2 received symbols are processed. If N−2<k, then it will not be possible to decode the source symbols. However, as presented in FIG. 24B, if the potential errors of these two symbols do not intersect, then for each bit position of the source symbols 2402, there is the bit information of at least N−1 received symbols 2486. In fact, at a bit position corresponding to none of the potential error positions indicated by either of the erroneous packets, there still is N received symbols available to recover the bits of the source symbols at that position. At a bit position corresponding to potential error positions of either one of the erroneous packets (but not both), there is the bit information of N−1 received symbols available to recover the bits of the source symbols at that position. At a bit position corresponding to potential error positions belonging to both of the erroneous packets at the same time, there is the bit information of N−2 received symbols available to recover the bits of the source symbols at that position. In general, if for a given bit position i there are $R_i$ received symbols 2486 for which the bit value is potentially in error at that position then there is the bit information of $N_i=N-R_i$ received symbols available to recover the bits of the source symbols at that position. The proposed method exploits the fact that $R_i$ is normally significantly smaller than the number of damaged packets denoted D. Indeed, operating at the symbol level would permit the use of N−D encoded symbols to recover the source symbols. In contrast, operating at the bit level would permit the use of $N-R_i$ bits (at the bit position i) of encoded symbols to recover each bit at that position i of the source symbols. When $R_i<D$, the advantage of operating at the bit level could be significant since then $N-R_i>N-D$ and therefore the bits at bit position i are recovered using more bits from the encoded symbols than operating at the symbol level. Note that, by definition, $R_i<=D$ and therefore, in the worst case, operating at the bit level produces the same decoding capability as operating at the symbol level. Note that bit positions other than those potentially in error are considered reliable.

Figure 26A:
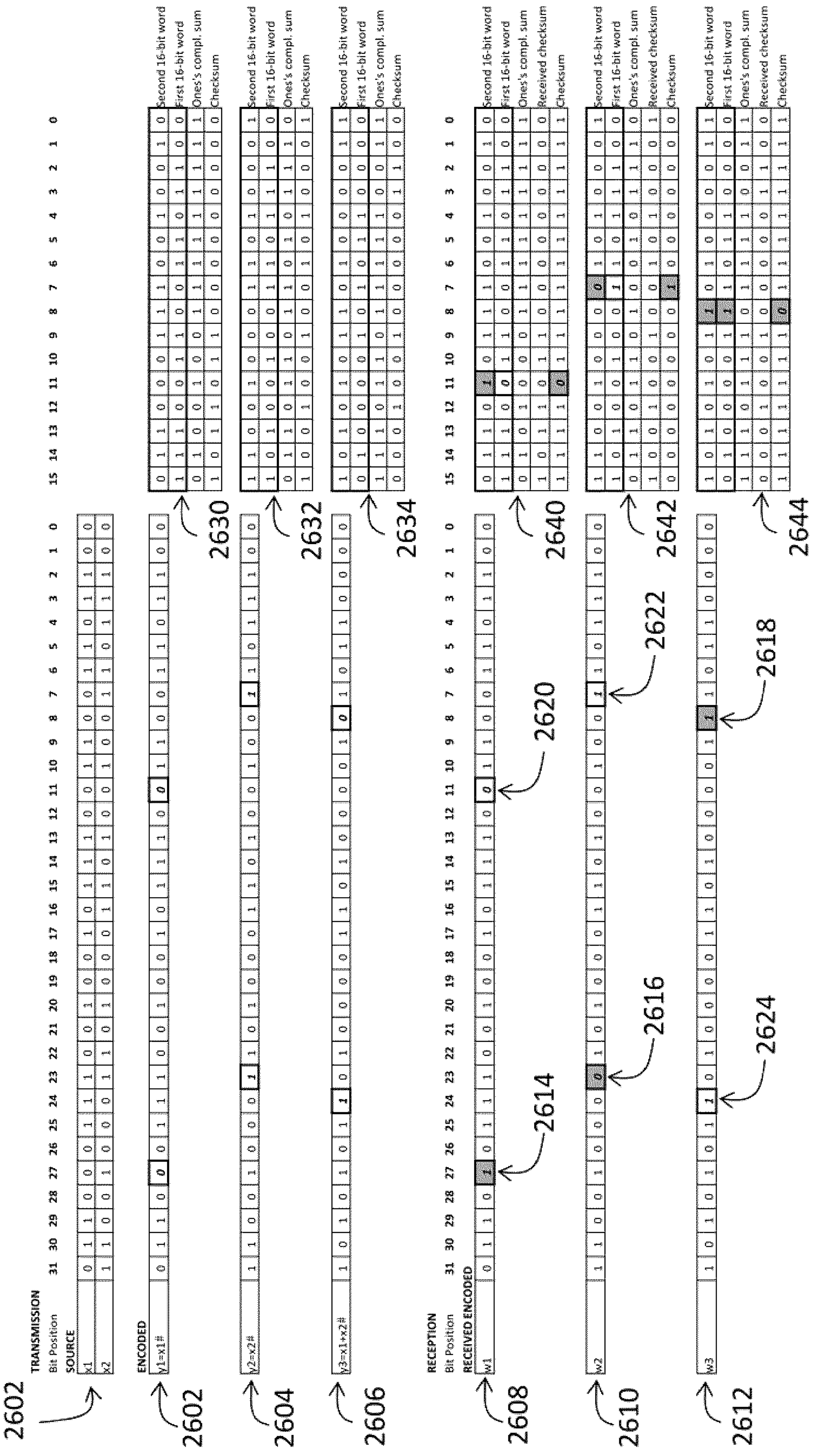
FIG. 26A presents a list of source symbols and encoded symbols at a transmission side and a list of corrupted received encoded symbols at a receiver side, the encoded symbols and received encoded symbols each respectively having an associated checksum value, according to one embodiment.

FIGS. 26A and 26B presents an application of the approach, according to one embodiment. There is source symbols $x_1$ and $x_2$ 2602 having each 32 bits (k=2). The source symbols are encoded to produce encoded symbols $y_1=x_1$, $y_2=x_2$ and $y_3=x_1+x_2$ (2602, 2604 and 2606). The encoded symbols are all corrupted during transmission. The prior art Reception module with Erasure 2414 of FIG. 24A would discard all received encoded symbols and consequently the recovery of the source symbols would be impossible. However, the proposed system of FIG. 24B would accept the received encoded symbols $w_1$, $w_2$, and $w_3$ (2608, 2610 and 2612), that are respectively erroneous versions of $y_1$, $y_2$, and $y_3$ (2602, 2604 and 2606). Namely, the bit number 27 of $w_1$, the bit number 23 of $w_2$ and the bit number 8 of $w_3$ are corrupted, shown respectively in FIG. 26A as elements 2614, 2616 and 2618. Since those erroneous bit positions are different, and since the decoding can be performed at a bit level, it is possible to decode any bit position of the two source symbols with the intact bits (non-erroneous) of two encoded symbols at the same position. Specifically, it is possible to decode bit number 27 of the source symbols using bit number 27 of $w_2$ and $w_3$ (2610 and 2612), decode bit number 23 of the source symbols using bit number 23 of $w_1$ and $w_3$ (2608 and 2612), and decode bit number 8 of the source symbols using bit number 8 of $w_1$ and $w_2$ (2608 and 2610). The other bits of the source symbols can be decoded using the bits at the same position of any two of the received encoded symbols among $w_1$, $w_2$, and $w_3$.

In the following, the proposed method is further formalized. As previously explained, let $x_1, \ldots, x_k$ be the k source symbols and $y_1, y_2, \ldots, y_N$ be the N encoded symbols using fountain coding that are to be transmitted, where N=k+o. Let $w_1, w_2, \ldots, w_N$ be the N received encoded symbols which may have been subject to bit errors during transmission. Let $e_r$ be a binary number indicative of the potential bit error positions associated with the received encoded symbol $w_r$. The i-th bit of $e_r$, denoted $e_r(i)$, is set to 0 when the bit at that position ($w_r(i)$) is known to be correct, and set to 1 when it may be in error (i.e. unreliable). When an encoded symbol $w_r$ is received without error then $w_r=y_r$ and $e_r=0$. We assume that it is known if a received encoded symbol is erroneous or not by the use of mechanisms such as checksums (e.g. UDP checksum). We also assume that mechanisms are available to identify potential bit error positions for each erroneously received encoded symbol. As mentioned, such information is often available through the use of UDP checksum. A careful analysis of the UDP checksum provides a list of potential bit error positions, alternatively soft information such as log-likelihood ratios (LLR) can provide an indication of the reliability of each received bit (a threshold on absolute LLR values can be set to determine which absolute LLR value intervals are associated with reliable and non-reliable bits). Therefore, it is assumed that for every received encoded symbol $w_r$, the associated potential bit error positions (and the reliable bit positions) are known and represented using $e_r$.

Here are a few additional notations that can be useful in the description of the bit level decoding method. Let $N_i=N-\Sigma_{r=1}^{N}e_r(i)$, where $e_r(i)$ is the i-th bit of $e_r$ (assuming that the bits are numbered from the least significant bit to the most significant bit of $e_r$). $N_i$ represents the number of bits, at bit position i, from the N encoded symbols that can be used to recover the bits of the source symbols at that bit position. As previously explained, the conventional fountain code recovery process operates at a symbol level and the complete symbol level system of linear equations between received encoded symbols and source symbols is as follows.

$$A \cdot \begin{pmatrix} x_1 \\ \vdots \\ x_k \end{pmatrix} = \begin{pmatrix} y_1 \\ \vdots \\ y_N \end{pmatrix}$$

In the proposed method, since for each bit position of the source symbols to recover there is a specific (possibly different) set of reliably received encoded symbols for that bit position, the method uses a specific (possibly different) set of linear equations to recover the source bits at each bit position. In other words, for each bit position of the source symbols to recover, there is a specific set of linear equations to solve according to the reliably received encoded symbols at that bit position (i.e. the received encoded symbols for which their bit value at that position is reliable). For the recovery of the bits of source symbols at position i, a bit level system of linear equations is used. The following is a corresponding complete bit level system of linear equations:

$$A \cdot \begin{pmatrix} x_1(i) \\ \vdots \\ x_k(i) \end{pmatrix} = \begin{pmatrix} y_1(i) \\ \vdots \\ y_N(i) \end{pmatrix}$$

where $x_r(i)$ represents the bit at position i (also referred as the i-th bit) of the source symbol $x_r$. Siminarly, $y_r(i)$ represents the bit at position i of the encoded symbol $y_r$.

Furthermore, the received encoded symbols having an unreliable (potentially in error) bit value at position i are removed (i.e. remove the received encoded symbols r for which $e_r(i)=1$) since the situation is the same as if we had not received those encoded symbols considering that bit position. For the same reason, the rows of matrix A corresponding to those same received encoded symbols having an unreliable bit value at position i are removed. This leads to the following system of linear equations, which is referred to as the reduced bit level system of linear equations:

$$E(i) \cdot A \cdot \begin{pmatrix} x_1(i) \\ \vdots \\ x_k(i) \end{pmatrix} = E(i) \cdot \begin{pmatrix} y_1(i) \\ \vdots \\ y_N(i) \end{pmatrix}$$

where E(i) is a binary matrix of size $N_i$×N which allows to ensure that the rows of the complete bit level system of linear equations correspond to received encoded symbols having a reliable (known to be correct) bit value at position i. Therefore, matrix E(i) contains exactly one (a single) non-zero value in each row and contains at most one non-zero value in each column (those columns correspond to received encoded symbols having a reliable bit value at position i). The matrix contains a total of $N_i$ non-zero values and is of rank $N_i$. It can be observed that for each bit position i, the reduced bit level system of linear equations needs to be solved. A solution exists if the rank of A'(i)=E(i)·A is k. Note that the size of the matrix A'(i)=E(i)·A is $N_i$×k for each i. Therefore, the system can only be solved for bit position i if $N_i$>=k (necessary condition).

It might be tempting to conclude that the full recovery of the source symbols will not be possible if $N_i$<k for any i value. However, this is not necessarily the case since the full recovery of the source symbols for bit position i can lead to the conclusion that a bit of a received encoded symbol at position j, initially suspected as potentially in error, is reliable after all. For instance, consider the case where the reduced bit level system of linear equations can be solved for bit position i. The solution can be reapplied to the complete bit level system of linear equations to generate the bit value at position i of all encoded symbols. This is done by pre-multiplying the vector of source symbols' bits corresponding to position i by matrix A in the complete bit level system of linear equations to obtain the vector of all source symbols' bits corresponding to position i. The system can therefore obtain the actual bit values at position i of all encoded symbols, namely those that were considered unreliable. If those bits differ from those of the received encoded symbols, the system can determine that they were in error and can repair them. Depending on the application, repairing those bits may lead to the conclusion that some received symbols have now been fully repaired (e.g. the new checksum indicates that the packet is now intact). This would permit to update (and reduce) the set of possible bit error positions and increase for some bit positions j the value of $N_j$, improving the decoding robustness or making it possible (e.g. if $N_j$ was smaller than k initially and such corrections make it equal or larger). Another situation that may occur is that the system has reduced so much the set of potential bit error positions of a received encoded symbol during the proposed recovery process that there remains only a single potential error position. In such situation, it would be possible to modify that bit value and validate with a checksum that the received encoded symbol (or packet) has been fully repaired (or conclude that it is the source of error if the received encoded symbol was deemed erroneous and it is the only remaining bit error candidate).

The previous observation is applicable when the correction of bits at a certain bit position can affect the hypothesis on the reliability of bits at other positions, i.e. which bits are potentially in error (as is the case when a checksum is used on received encoded symbols). However, when this is not the case, as in the case where LLR values are independently used to determine the potential bit error positions, it is adequate to conclude that the full recovery of the source symbols will not be possible, if $N_i$<k for any i. If this is the case, the recovery process can abort without further computation. So, depending on the application, it may be useful to check if it is at all theoretically possible to recover all the bits of the source symbols.

Figure 24C:
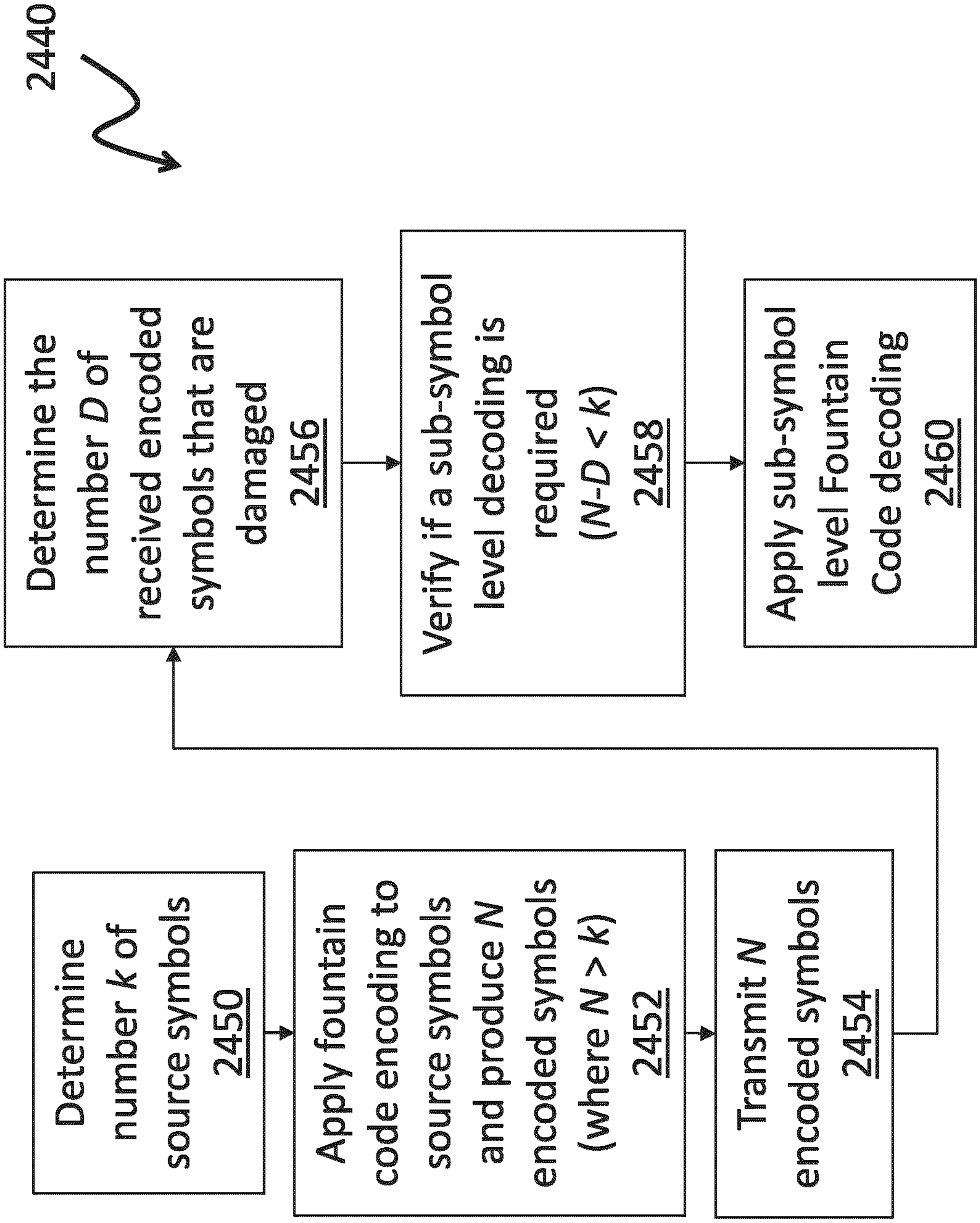
FIG. 24C presents a method of transmitting symbols that are encoded with fountain code, according to one embodiment.

According to one embodiment as presented in FIG. 24C, there is a method of transmitting source symbols 2440 using fountain coding. The method 2440 determines the number of k source symbols 2450 and applies fountain code encoding 2452 to the source symbols in order to produce N encoded symbols where N>k. The N encoded symbols are transmitted 2454 over a communication network. At a receiver, the method 2440 determines the number D of received encoded symbols that are damaged 2456 and verifies 2458 if a sub-symbol level decoding is required. A sub-symbol level decoding is required if N−D<k, in such case the method 2440 applies a sub-symbol level Fountain code decoding method 2460.

Figure 24D:
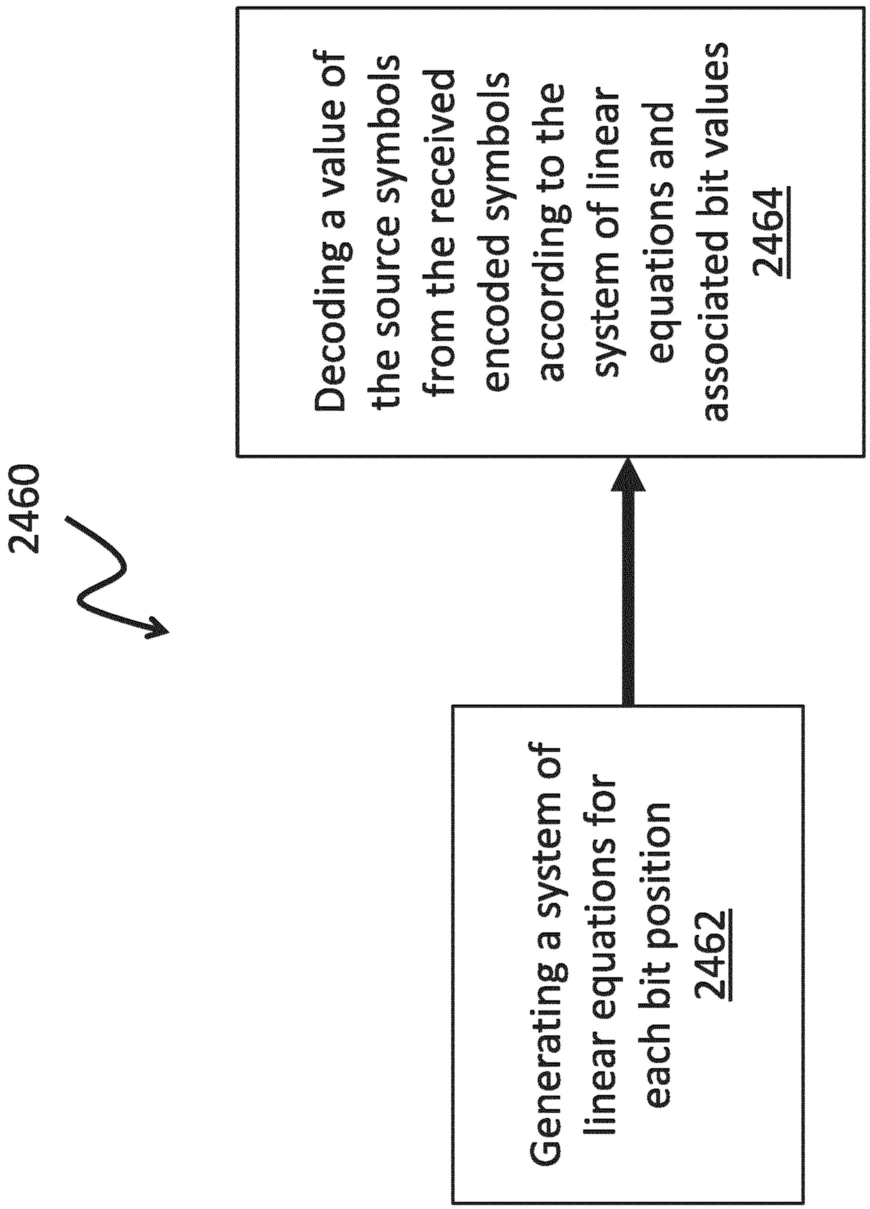
FIG. 24D presents a method of decoding a value of source symbols according to systems of linear equations, in the method of transmitting of FIG. 24C, according to one embodiment.

FIG. 24D further presents the sub-symbol level Fountain code decoding method 2460, according to one embodiment. The sub-symbol level decoding method 2460 generates a system of linear equations for each bit position 2462 according to reliable bit values of the received encoded symbols at a corresponding bit position and according to the associated Encoding Symbol Identifier (ESI). Note that the received encoded symbols each have an associated ESI. The method 2460 further decodes the received encoded symbols 2464 according to at least two systems of linear equations and associated bit values in order to recover a value of the source symbols.

Figure 24E:
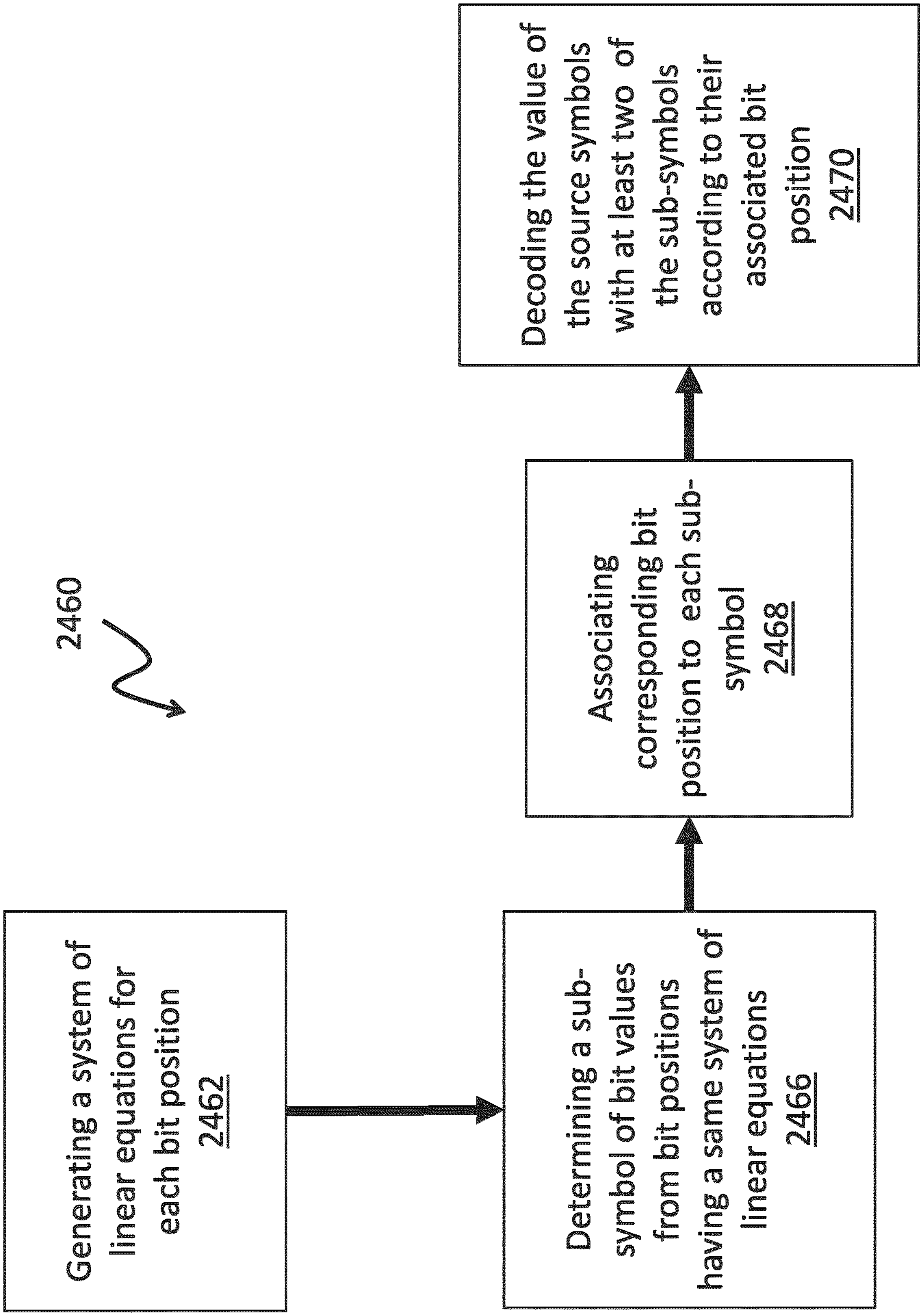
FIG. 24E presents a method of decoding a value of source symbols at a sub-symbol level, in the method of transmitting of FIG. 24C, according to one embodiment.

According to yet another embodiment as presented in FIG. 24E, the sub-symbol level decoding method 2460 generates a system of linear equations for each bit position 2462 according to reliable bit values of the received encoded symbols at a corresponding bit position and according to the associated Encoding Symbol Identifier (ESI). The method 2460 then determines a sub-symbol of bit values 2466 from bit positions having a same system of linear equations and if necessary associates corresponding bit positions to each sub-symbol 2468. The method 2460 further decodes a value of the source symbols from at least two sub-symbols 2470 according to their associated bit position.

Figure 25A:
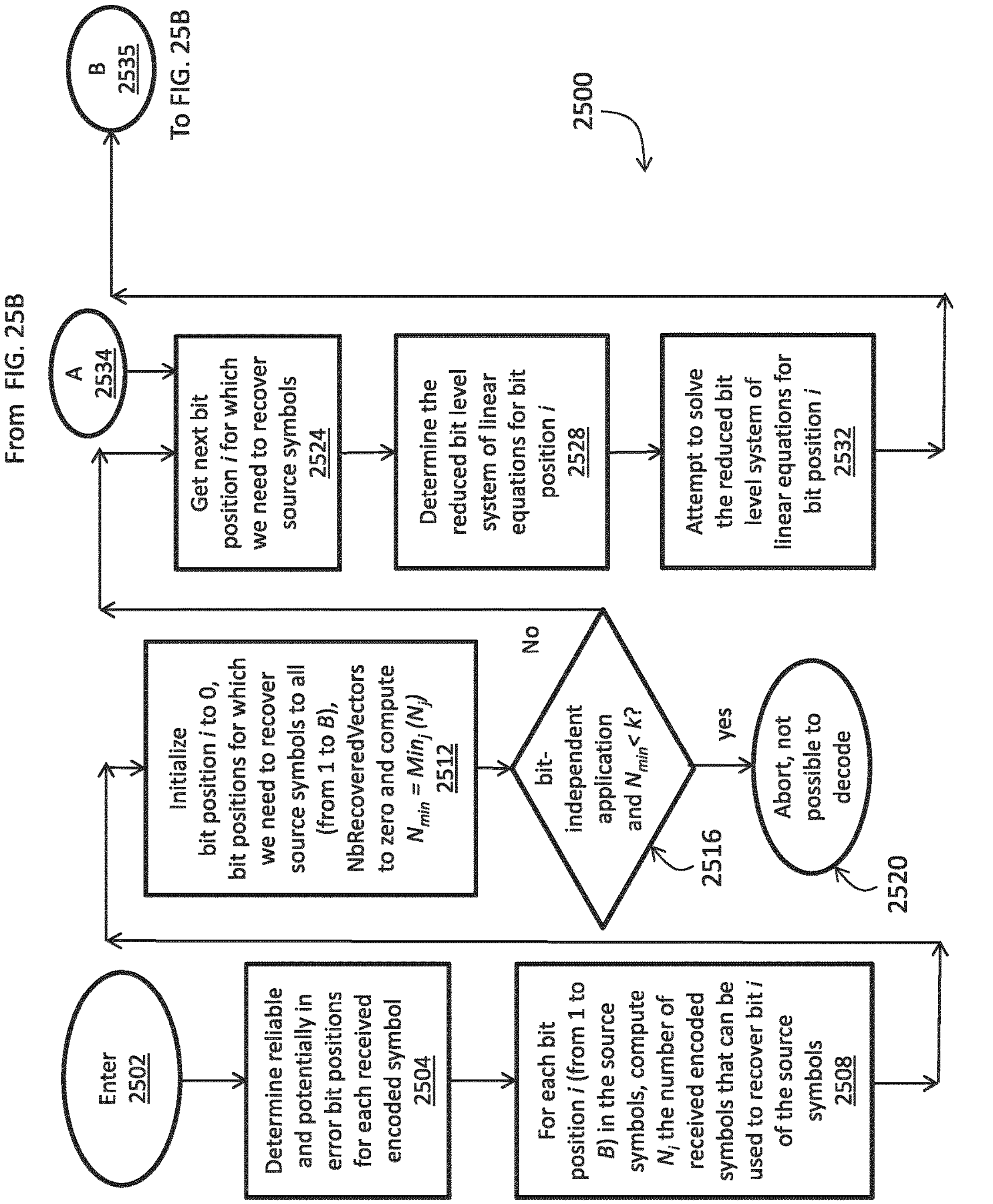
FIGS. 25A and 25B present a bit level decoding method for fountain codes, according to one embodiment.
Figure 25B:
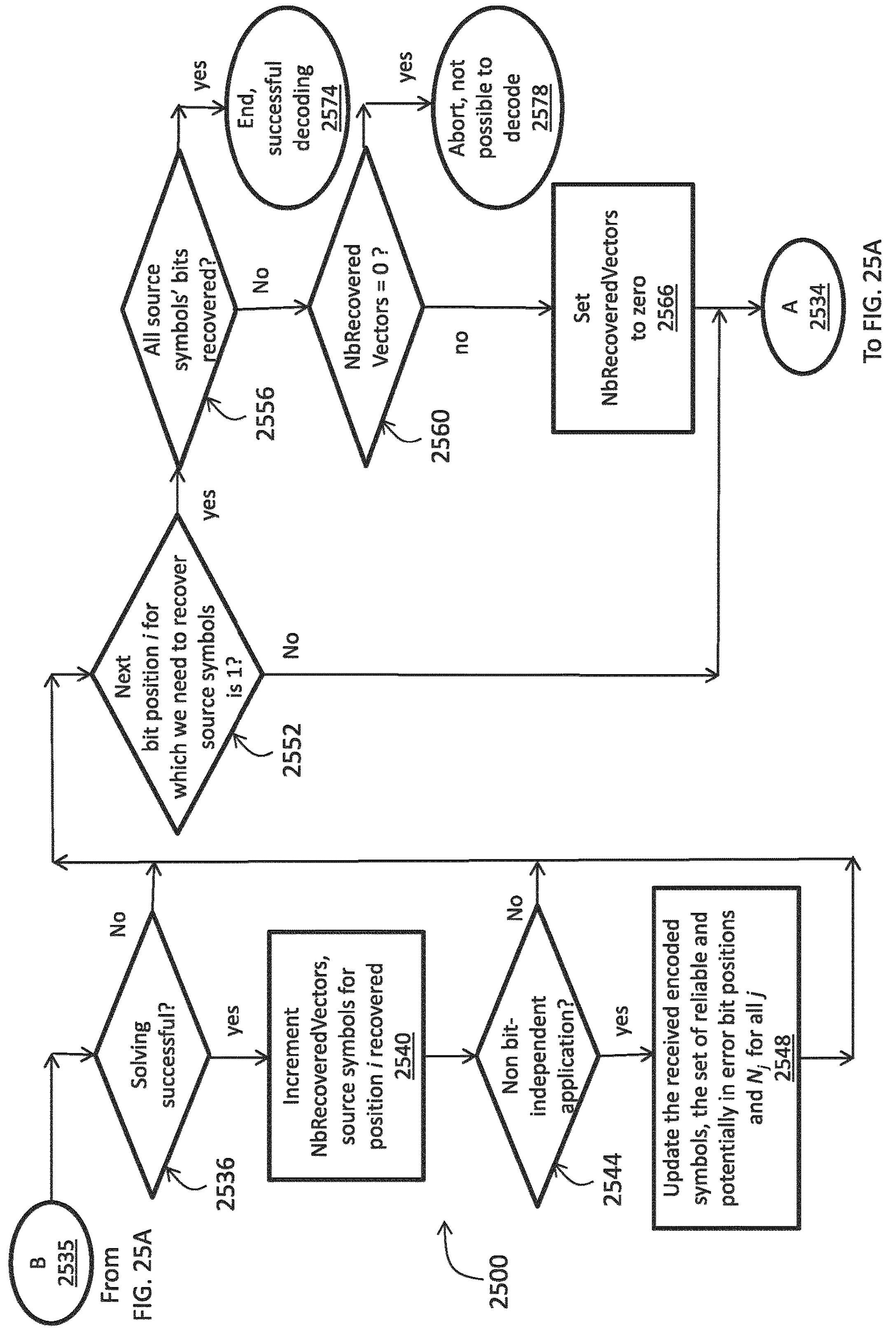

The reliable bit values of the received encoded symbols could be determined according to various methods. One method adapted to determine the reliable bit values identifies potential bit error positions and the remaining bit positions are considered by the method as having reliable bit values. The proposed decoding process is as follows. First, if the number of correctly received encoded symbols is sufficient, i.e. if N−D>=k, then attempt to recover source symbols using conventional syntax level decoding methods. If the number of correctly received encoded symbols is insufficient or if the recovery process fails (because the rank of the matrix having on its rows the ESIs of the correctly received encoded symbols is lower than k), then proceed with the bit level decoding method 2500 as illustrated in FIGS. 25A and 25B (where the entry point is step 2502) and as follows:

1) Step 2504. For each received encoded symbol $w_r$, with r=1 to N (where N represents the number of received encoded symbols, which may be intact or erroneous), there is determined the potential bit error positions.

According to one embodiment, step 2504 is as follows:

a. Determine $e_r$, the binary number indicative of the potential bit error positions associated with the received encoded symbol $w_r$. It shall be recognized that the binary number $e_r$ is also indicative of the bit positions where bit values are reliable since the bit positions that are not potentially in error are considered reliable. The i-th bit of $e_r$ is set to 0 when the bit at that position is known to be correct (i.e. reliable), and set to 1 when it is potentially in error, as illustrated by bit error vectors 2650 of FIG. 26B. As mentioned, the potential bit error positions can be determined by the UDP checksum pattern as well as the specific bit values of the received encoded symbol. Alternatively, the LLR can be used to determine which positions are reliable.

2) Step 2508. For each bit position i from 1 to B (where B=8*T is the number of bits in the source symbols), compute $N_i=N-\text{sum}_r\ e_r(i)$, the number of received encoded symbols that can be used to recover bit i of the source symbols.

3) Step 2512. Initialize the variables. First, set NbRecoveredVectors=0. At this point, all the bits of the source symbols must be recovered since none has been recovered yet. Compute $N_{min}$ the minimum of all value $N_i$, i.e. $N_{min}=\text{Min}_j N_j$.

4) Step 2516. If the application is such that the correction of bits at a certain bit position cannot affect the hypothesis on the reliability of bits at other positions (called a bit-independent application), then abort the recovery process if $N_{min}$ is less than k (i.e. abort if $N_{min}$<k). Therefore, in step 2516, it is verified if $N_{min}$<k. If the result is true then there is no possible solution to decode the symbol and the process is aborted at step 2520. Otherwise, the method 2500 proceeds to step 2524.

5) For each bit position i from 1 to B for which the source symbols must be recovered, i.e. vector $(x_1(i), \ldots, x_k(i))$, determine the reduced bit level system of linear equations 2528 and attempt to solve the reduced bit level system of linear equations 2532.

According to one embodiment, step 2524 (and also step 2552) is a loop where bit positions are iterated among the bit positions to recover (in a circular manner so that after position B is reached, position 1 is processed). In step 2524, the current bit position i is incremented until it corresponds to a position for which a bit needs to be recovered (no increment needed if i already corresponds to such desired position). In step 2552, the bit position i is incremented by 1 and if it is larger than B, it is reset to 1.

According to one embodiment, determining the reduced bit level system of linear equations for bit position i 2528 is achieved by computing E(i), a binary matrix of size $N_i$xN which ensures that the rows of the complete bit level system of linear equations corresponds to received encoded symbols having reliable (known to be correct) bit values at position i. The E(i) allows to exclude the received encoded symbols having a potential error at bit position i from the set of received encoded symbols and allows to adjust the system of linear equations accordingly.

According to one embodiment, attempting to solve the reduced bit level system of linear equations 2532 is applied for each specific value of i, in order to recover the values of $x_r(i)$ for every r value (i.e. recover the vector $(x_1(i), \ldots, x_k(i))$ called the vector of source symbols' bit values at position i). For this, the following is solved:
6)

$$E(i) \cdot A \cdot \begin{pmatrix} x_1(i) \\ \vdots \\ x_k(i) \end{pmatrix} = E(i) \cdot \begin{pmatrix} y_1(i) \\ \vdots \\ y_N(i) \end{pmatrix}$$

Note that this is the decoding step in which the source symbols' values are recovered at the specific bit position i using the remaining received encoded symbols after excluding those having a potential error at bit position i and adjusting the system of linear equations accordingly as provided by step 2528). Conceptually, it requires to inverse the matrix A, which is not attractive computationally. The decoding can be performed using various strategies described in the literature including belief-propagation decoding, Gaussian elimination, inactivation decoding, decoding by means of a schedule, etc. The decoding methods that work at a symbol level should normally work at a bit level.

According to one embodiment of the method 2500, if the decoding or solving the reduced bit level system of linear equations 2532 is not successful or not possible, then move to step 2552. Otherwise, if the decoding or solving the reduced bit level system of linear equations 2532 is successful (possible) (i.e. rank of E (i)·A is k or other decoding algorithm is successful), then increment the NbRecoveredVectors (step 2540).

According to one embodiment, incrementing the NbRecoveredVectors by 1 (step 2540) implies that the bits of the source symbols at the current bit position have been recovered.

The method 2500 further includes verifying if the application is such that the correction of bits at the current bit position can affect the hypothesis on the reliability of bits at other positions, i.e. it is a non bit-independent application. If true, then move to step 2548 which updates the received encoded symbols, the set of possible bit error positions and $N_j$ for all j. This is done by performing the following additional steps (after which step 2548 moves to step 2552):
1. Use the complete bit level system of linear equations to generate the bits at position i for all encoded symbols (especially those for which the bits at position i were unreliable), i.e. compute the $y_r(i)$ for every r value:

$$\begin{pmatrix} y_1(i) \\ \vdots \\ y_N(i) \end{pmatrix} = A \cdot \begin{pmatrix} x_1(i) \\ \vdots \\ x_k(i) \end{pmatrix}$$

b. 2. If some bits differ from those of the received encoded symbols, locally repair them using those computed encoded symbols' bits, i.e. if $y_r(i)$ is not equal to $w_r(i)$ for a certain r, then set $w_r(i)=y_r(i)$.
c. 3. For those locally repaired received encoded symbols, update the set of reliable bit positions and potentially in error bit positions, i.e. recompute $e_r$ taking into consideration the local repair performed in the previous step. For instance, the checksum (UDP checksum) needs to be recomputed with the updated $w_r$ value and this will lead to a new set of potential bit error positions. In some situations, some received symbols will be fully repaired (e.g. the new checksum indicates that the packet is now intact). If that is the case, the value of $e_r$ will become $e_r=0$ for every fully repaired received encoded symbol.
d. 4. If some values of $e_r$ changed for any value of r, then update the values of $N_j$ for all j using $N_j=N-\text{sum}_r e_r(j)$.

5) Step 2552. In this step, the bit position i is incremented by 1 and if it is larger than B, the bit position is reset to 1. If the value of i is not 1, then there is processing of the next bit position for which recovery of source symbols is required (step 2524). Otherwise, it is verified if the source symbols' bit values have been recovered for each position i from 1 to B (step 2556). If the source symbols' bit values have been recovered for each bit position, the decoding is ended successfully (step 2574). Indeed, each vector contributes to the i-th bit of the source symbols (the problem is constructed in such a way that $x_r(i)$ represents the i-th bit of $x_r$). Otherwise, it is verified if the number of recovered vectors is zero (step 2560).

6) Step 2560. In this step, it is verified if the number of recovered vectors is zero (i.e. if NbRecoveredVectors=0), which would indicate that the decoding process failed as the method 2500 iterates over all the bit positions for which source symbols need to be recovered and none where decodable. If it is verified that NbRecoveredVectors=0, then the decoding process is aborted (step 2578). Otherwise, if it is verified that NbRecoveredVectors>0, then the NbRecoveredVectors is set back to 0 (step 2566).

7) Step 2566. Set NbRecoveredVectors=0 and move to step 2524.

FIG. 26A presents a list of source symbols and encoded symbols at a transmission side and a list of corrupted received encoded symbols at a receiver side, the encoded symbols and received encoded symbols each respectively having an associated checksum value, according to one embodiment;

FIG. 26B presents a recovery process of source symbols from the corrupted received encoded symbols at a receiver side of FIG. 26A, according to one embodiment;

More details on how the potential bit error positions are identified when the UDP checksum is used and how the decoding process is executed are further explained using lists presented in FIGS. 26A and 26B. A 32 bits encoded symbol $y_1$ 2602 is detailed on the right hand side of FIG. 26A in a 16 bits word representation 2630. The first line contains the second 16-bit word (most significant bits) of that encoded symbol 2602, the second line contains its first 16-bit word (least significant bits), the third line its one's complement sum and the fourth line its UDP checksum (i.e. its checksum computed in a similar manner as the UDP checksum). Similar details are provided for symbols $y_2$ 2604 and $y_3$ 2606 by 16 bits word representations (2632 and 2634) respectively. Furthermore, the 32 bits received encoded symbol $w_1$ 2608 is detailed on the right hand side of FIG. 26A in a 16 bits word representation 2640. The first line contains the second 16-bit word of that received encoded symbol 2608, the second line contains its first 16-bit word, the third line its one's complement sum, the fourth line received UDP checksum, and the fifth line its computed UDP checksum. Similar details are provided for symbols $w_2$ 2610 and $w_3$ 2612 by 16 bits word representations (2642 and 2644) respectively. The computed UDP checksum pattern of $w_1$ 2608 indicates in 16 bits word representation 2640 potential errors on bit positions 11 in modulo 16 having a value of 1. The positions corresponding to bit positions 11 in modulo 16 for $w_1$ 2608 are shown by element 2614 (position 27) and element 2620 (position 11), however only the bit at position 27 has a value of 1 and is considered a potential bit error position. The computed UDP checksum pattern of $w_2$ 2610 indicates in 2642 potential errors on bit positions 7 in modulo 16 having a value of 0. The positions corresponding to bit positions 7 in modulo 16 for $w_2$ 310 are shown by element 316 (position 23) and element 2622 (position 7), however only the bit at position 23 has a value of 0 and is considered a potential bit error position. The computed UDP checksum pattern of $w_3$ 2612 indicates in 16 bits word representation 2644 potential errors on bit positions 8 in modulo 16 having a value of 1. The positions corresponding to bit positions 8 in modulo 16 for $w_3$ 2612 are shown by element 2624 (position 24) and element 2618 (position 8), and both bits have a value of 1 and are therefore considered potential bit error positions.

The potential bit error position could be determined according to a checksum such as the UDP checksum, which provides a list of potential bit error positions or locations as described in U.S. provisional patent application No. 62/385,475 and incorporated herein by reference. Moreover, the potential bit error position could be determined according to the use of soft information such as log-likelihood ratios (LLR) available at the physical layer and providing an indication of the reliability of each received bit.

Now in FIG. 26B, $e_r$, the binary numbers indicative of the potential bit error positions associated with the received encoded symbol $w_r$ are computed for r=1, 2, 3 (each $e_r$ has the same number of bits as the symbols, i.e. B=32 bits here). From the potential bit error positions determined previously, $e_1$'s bits will be zero except at bit position 27 (where a 1 is placed) (element 2660), $e_2$'s bits will be zero except at bit position 23 (where a 1 is placed) (element 2662), and $e_2$'s bits will be zero except at bit positions 24 and 8 (where 1s are placed) (elements 2664 and 2666). This situation leads to 4 distinct reduced bit level system of linear equations 2670, 2672, 2674 and 2676. The system of linear equation 2670 uses all received signals $w_1$, $w_2$, $w_3$ and recovers all the bits of the source symbols except those of the potential bit error positions as indicated by $e_r$ where r=1, 2, 3, i.e. all bits except those at positions 8, 23, 24, and 27 as shown by recovered system 2680. The system of linear equation 2672 uses received signals $w_2$, $w_3$ and recovers the bits of the source symbols for which $w_1$ has a potential bit error at those bit positions, i.e. it recovers the bits at position 27 as shown by decoded system 2682. The system of linear equation 2674 uses received signals $w_1$, $w_3$ and recovers the bits of the source symbols for which $w_2$ has a potential bit error at those bit positions, i.e. it recovers the bits at position 23 as shown by decoded system 2684. The system of linear equation 2676 uses received signals $w_1$, $w_2$ and recovers the bits of the source symbols for which $w_3$ has a potential bit error at those bit positions, i.e. it recovers the bits at positions 8 and 24 as shown by decoded system 2686. The decoded source symbols 2688 are obtained by combining (taking into account their positions) all the decoded bits by the specific systems (2680, 2682, 2684 and 2686). By performing a bitwise XOR between the decoded source symbols 2688 and the initial source symbols 2602 it can be verified that the initial source symbols 2602 have been entirely recovered since 0 is obtained everywhere in verification list 2690.

Although in FIGS. 26A and 26B the UDP checksum was used to identify the potential bit error positions, a similar process can be used when the potential bit error positions are known from other means such as the LLRs. The difference with LLR is that the potential bit error positions are independent instead of following a modulo 16 structure.

Figure 27A:
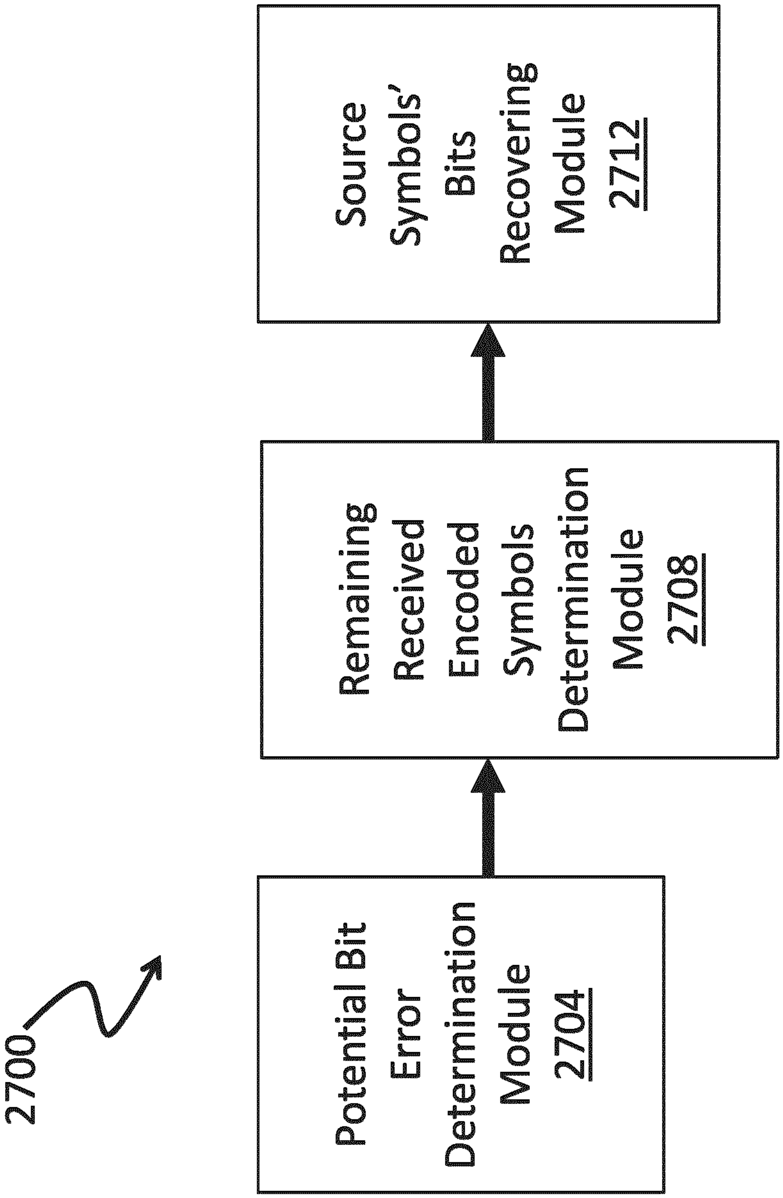
FIG. 27A presents a block diagram of a bit level decoding system for fountain codes, according to one embodiment.

FIG. 27A presents modules of checksum-aided bit level decoding system for fountain codes 2700, according to one embodiment. The checksum-aided bit level decoding system for fountain codes 2700 has a Potential bit error determination module 2704 to determine the potential bit error locations and to determine the reliable bit locations in the received encoded symbols, a Remaining received encoded symbols determination module 2708 to determine the remaining received encoded symbols that can be used for recovering the source symbols' values at a specific bit position by excluding the received encoded symbols having a potential bit error at that bit position from the set of received encoded symbols, and a Source symbols' bits recovering module 2712 to recover source symbols' values at a specific bit position using the remaining received encoded symbols at that specific bit position and their associated ESIs (which define the system of linear equations).

There are some additional issues to consider. First, a reliable received ESI is desirable in order to ensure a successful decoding process. Therefore, it is important to ensure that the ESI of a corrupted received encoded symbol is intact. The strategy to ensure this depends on how ESI and the encoded symbols are transmitted. Ideally, ESI is transported using reliable means or using correcting codes. However, it is customary to transport ESI along with the encoded symbols, in the same packet, without additional protection. If soft information is available, ESI integrity can be ensured by the degree of reliability of the ESI bits (e.g. LLR within some ranges of certainty). If the UDP checksum is considered, it can be used to identify the bit(s) of the ESI that may be corrupted (unreliable) and attempt to decode considering various possible alternatives of the ESI values (by flipping one or various combinations of these unreliable bits). Then, based on the application context, validation of the recovered information will need to be performed. In video applications, this validation can be performed by a video decoder or an enhanced video decoder (e.g. if the stream decodes without crashing, if the decoded syntax elements is statistically reasonable, if the information fits well spatio-temporally with the rest of the video sequence, etc.). Therefore, the decoding for various possible ESI alternative values is tried, and the ESI that provides the only or most coherent content, from an application-dependant validation process, is retained. If several received encoded symbols' packets are corrupted, trying all the combinations of possible ESI values becomes a combinatory problem for which the results need to be validated and the best one selected. It is a good idea to first decode assuming that the ESI values are intact since, for small bit error rates and large corrupted packet sizes (large enough values of T), the probability that the ESI is corrupted is rather small since it represents a small portion of the packet. When N>k, it may prove useful to ignore packets for which the UDP checksum pattern indicates a higher number of errors or which have smaller packets sizes, while still ensuring that N'>=k packets are retained. This will reduce the probability of using a corrupted ESI and reduce the size of the previously mentioned combinatory problem (and thus the computational complexity).

It is important to note that it is possible to have a corrupted packet for which it can be quite sure that the ESI is intact in the context of Raptor codes and UDP transmission. Indeed, Raptor codes' ESI format A is described in "Internet Engineering Task Force (IETF)'s Request For Comments (RFC) 6681, 2012" and use 16 bits. It is known that the analysis of the UDP checksum under mild error conditions provides a list of potential error positions based on the bit position as well as its value in the packet. For instance, the UDP checksum may indicate that all bit values of 1 in bit positions which are equal to p in modulo 16 are potentially in error. Therefore, the ESI bit that corresponds to a position equal to p in modulo 16 will be considered potentially in error only if its value is 1. Otherwise, that bit will be considered reliable and the whole ESI will be considered reliable. In applications where it is not possible to validate the decoded data, a possibility is to keep only the corrupted packets for which the ESI appears quite reliable (e.g. mild error conditions and UDP not indicating that an error is in the ESI). It would also be possible to protect more the ESI information during the transmission.

A similar situation may occur when the received checksum is erroneous. Indeed, although the received checksum may be small in size compared to the encoded symbols, making much more probable that the symbol is hit by errors rather than the received checksum, the received checksum may be damaged as well. The problem is that a corrupted received checksum will provide misleading information related to the potential error positions and even indicate that the payload is erroneous while it is not. To protect against this possibility, two hypotheses can be considered: 1) that the data is damaged and not the checksum, 2) that the checksum is damaged and not the data, and proceed with decoding for each hypothesis. Further validation (either generic as in the paragraph below or application-specific) can reveal which hypothesis was correct. It would also be possible to further protect the UDP checksum information during the transmission.

A validation, for any application, can be performed as follows. First, generate all the encoded symbols corresponding to the received encoded symbols that have not been used for decoding. This is done by using the decoded source symbols and the ESI values (from which the matrix A is constructed) using the complete symbol level system of linear equations. Then the corresponding received encoded symbols are replaced by those generated encoded symbols in the received packets and new UDP checksums are computed. If any of the UDP checksums indicates an error, then the process failed. Otherwise, it was successful. Of course, this validation is only applicable to encoded symbols for which the ESI is reliable.

Another issue is computational complexity. Since the decoding process uses a bit level approach requires solving a system of linear equations (or at least apply a decoding process) for each bit rather than for the full symbols, computational complexity might become an issue. But there are ways to reduce this complexity. First, the recovery of several bit positions of the source symbols might depend on the bits of the same received encoded symbols. In that case, the decoding of those bits can be performed jointly. For instance, if the recovery of bit positions i and r of the source symbols both depend on the bits of the same received encoded symbols t, u, v. Then both attempt to solve a system of linear equations with the same transfer matrix A' expressed as:

$$\begin{pmatrix} y_t(i) \\ y_u(i) \\ y_v(i) \end{pmatrix} = A' \cdot \begin{pmatrix} x_1(i) \\ \vdots \\ x_k(i) \end{pmatrix} \text{ and } \begin{pmatrix} y_t(r) \\ y_u(r) \\ y_v(r) \end{pmatrix} = A' \cdot \begin{pmatrix} x_1(r) \\ \vdots \\ x_k(r) \end{pmatrix}$$

In that case, it would be more efficient computationally to solve the problem (i.e. decode) jointly and only once. For instance, the received encoded (output) symbols' bits corresponding to the same system of linear equations could be concatenated into new output symbols (only bits that belong to the same output symbol are concatenated) and solve the problem of finding the new source symbols using matrix A' and the new output symbols. Then the bits of the resulting new source symbols can be copied to the appropriate source symbols' bits. In general, the proposed method would collect all the bits of the source/encoded symbols corresponding to the same decoding problem (e.g. system of linear equations) and create sub-symbols from them and solve the problem once. The proposed method, could also operate at the sub-symbol level rather than at the bit level. In most cases, the proposed method operating at the sub-symbol level could be considered more efficient. However, for clarity purposes, the embodiments of the system and methods have been described by considering an operation at the bit level. Regardless of what fountain codes is used, the same decoding process that would occur at the symbol level could be applied at the sub-symbol level by considering the bits of the source/encoded sub-symbols that involve the same encoded symbols. For every set of sub-symbols involving a different set of same encoded symbols, the decoding process is applied. The approach can thus use existing decoding methods. However, it first needs to identify the various sets of sub-symbols that involve a different set of same encoded symbols, form received encoded sub-symbols from the bits of the received encoded symbols that involve the same encoded symbols, decode, and then copy the bits of the decoded source sub-symbols at the right bits of the source symbols.

To further reduce the complexity, it is possible to share the same system of linear equations between multiple source symbols' bits and therefore form larger sub-symbols. This is possible, when the bits of several source symbols depend on the same k (or larger than k) encoded (output) symbols, i.e. the set of encoded (output) symbols on which they all depend (the intersection of their sets of encoded (output) symbols) is equal or larger than k. We call any such arrangement of bits (or set of positions of bits), an 'adequate sub-symbol'. If the system of linear equations can be solved, this will lead to reductions in computational complexity. Otherwise, other arrangements of bits will be required to obtain different system of linear equations leading to a solution. It shall be understood that operating at the bit level is one embodiment of the sub-symbol level approach.

Figure 27B:
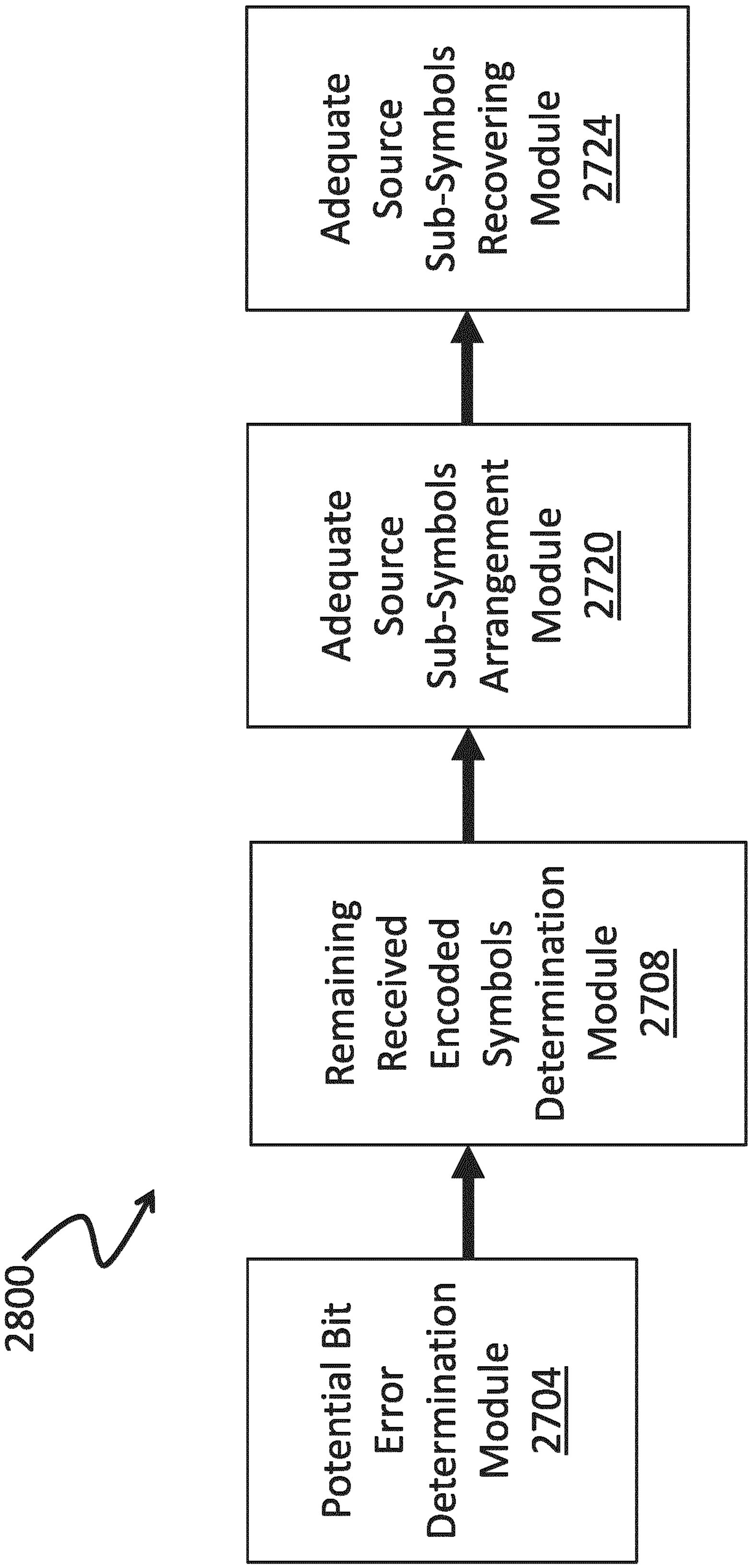
FIG. 27B presents a block diagram of a sub-symbol level decoding system for fountain codes, according to another embodiment.

FIG. 27B presents modules of checksum-aided sub-symbol level decoding system for fountain codes 2800, according to another embodiment. The checksum-aided sub-symbol level decoding system for fountain codes 2800 has the Potential bit error determination module 2704 and the Remaining received encoded symbols determination module 2708. In addition, the decoding system 2800 has an Adequate source sub-symbols arrangement module 2720 to combine the bits of several source symbols into an 'adequate sub-symbol', and an Adequate source sub-symbols recovering module 2724 to recover the adequate sub-symbols' using the associated received encoded symbols and their associated ESIs (which define the system of linear equations associated with that 'adequate sub-symbol').

So far, the conditions to fully recover all the source symbols have been discussed. However, there are cases where this is not possible. In the conventional symbol level decoding, full recovery is possible only when the rank of the matrix having on its rows the ESIs of the correctly received encoded symbols is equal to k. Similar to the bit level decoding approach, we could write a reduced symbol level system of linear equations:

$$E\cdot A\cdot\begin{pmatrix}x_1\\ \vdots\\ x_k\end{pmatrix}=E\cdot\begin{pmatrix}y_1\\ \vdots\\ y_N\end{pmatrix}$$

where E is a binary matrix which role is keeping the rows of the complete symbol level system of linear equations corresponding to correctly received encoded symbols. Therefore, matrix E contains exactly one single non-zero value in each row and contains at most one non-zero value in each column. Full recovery of the source symbols is possible when the rank of A'=E·A is equal to k. Otherwise, the number of source symbols that can be fully recovered is rank(E·A). In a bit level approach, better performance can be obtained. Indeed, such approach leads to systems of linear equations for which the matrices are of rank(E(i)·A) such that rank(E(i)·A)≥rank(E·A) for all bit position i. Therefore, for each bit position, there is a possibility to recover the bit of more source symbols when operating at the bit level rather than at the symbol level. Therefore, the bit level approach, even when it cannot recover all the source symbols, can recover more source symbols than the symbol level approach. This result applies also to the sub-symbol level approach.

The superiority of the proposed method comes from two properties. First, since $N_i$=N−$R_i$>=N−D for all i, a higher probability of reconstructing the symbols at the bit level (and sub-symbol level) than at the symbol level is possible as there may be more received encoded symbols that can be used in the recovery. The second property depends on how the reliability of bits is established. In some cases, such as in the use of UDP checksum, repairing a bit at a certain position may lead to the conclusion that other bits of the same packet at other positions are now intact and may help further the correction process by providing access to more encoded symbols' bits for the recovery of subsequent bits or even the access to fully repaired encoded symbol and this is not possible when operating at the symbol level.

Another issue is that UDP packets for which the UDP checksum reveals an erroneous packet are normally discarded in the protocol stack. However, since the proposed method is a decoder side solution, it is easy to deploy in existing communication systems as it requires few changes to the protocol stack enabling erroneous packets to be delivered to the application layer. This is similar to UDP-Lite protocol (L. A. Larzon, M. Degermark, S. Pink, L. E. Jonsson, and G. Fairhurst, "The lightweight user datagram protocol (UDP-Lite)." IETF, RFC 3828).

Figure 28A:
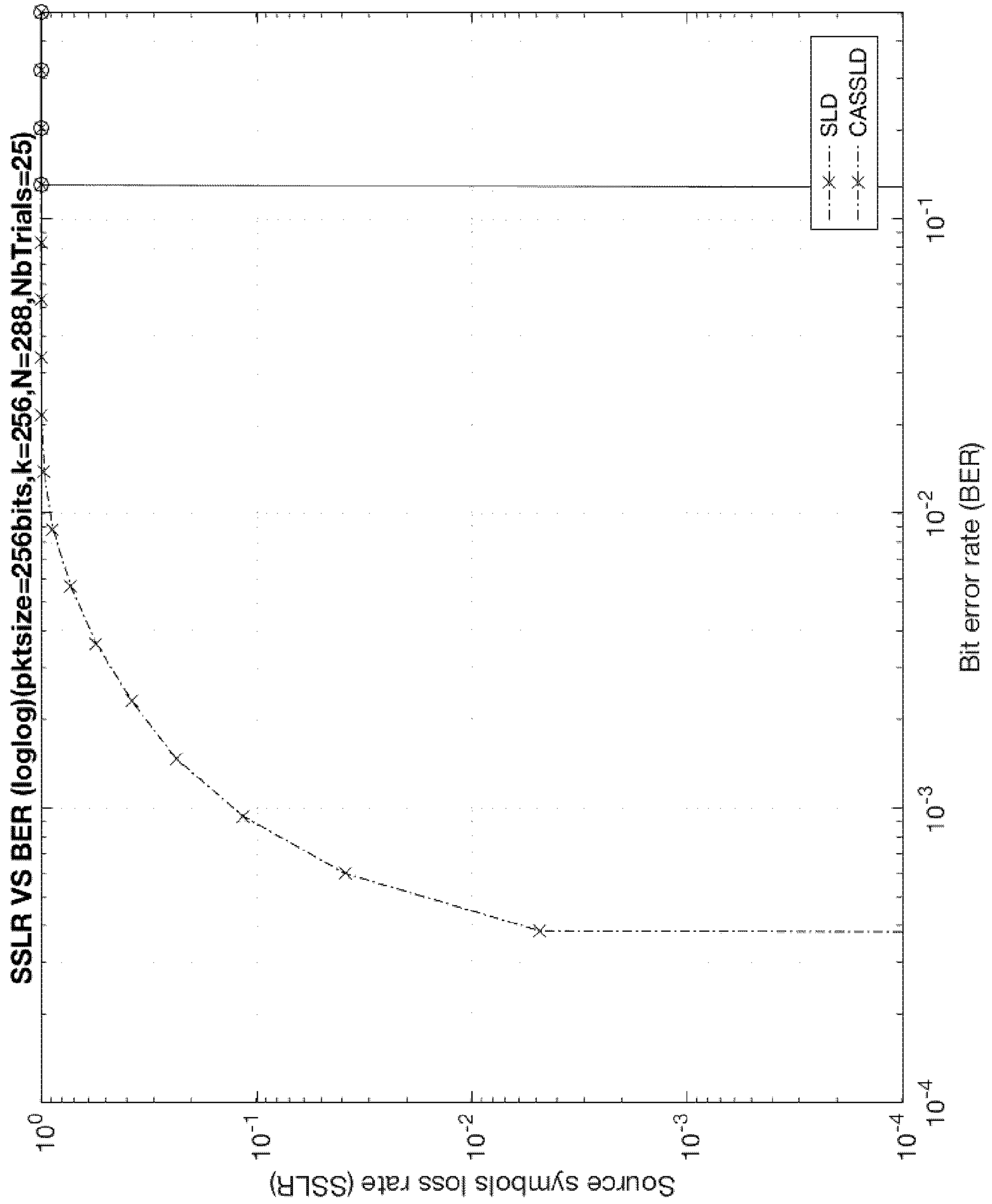
FIG. 28A presents a graph of a source symbol loss rate (SSLR) as a function of a bit error rate (BER) for a T=256 bits, k=256, N=288 configuration on a log-log scale, in order to compare state-of-the-art methods with the method of FIGS. 25A and 25B using the system of FIG. 27A, according to one embodiment.
Figure 28B:
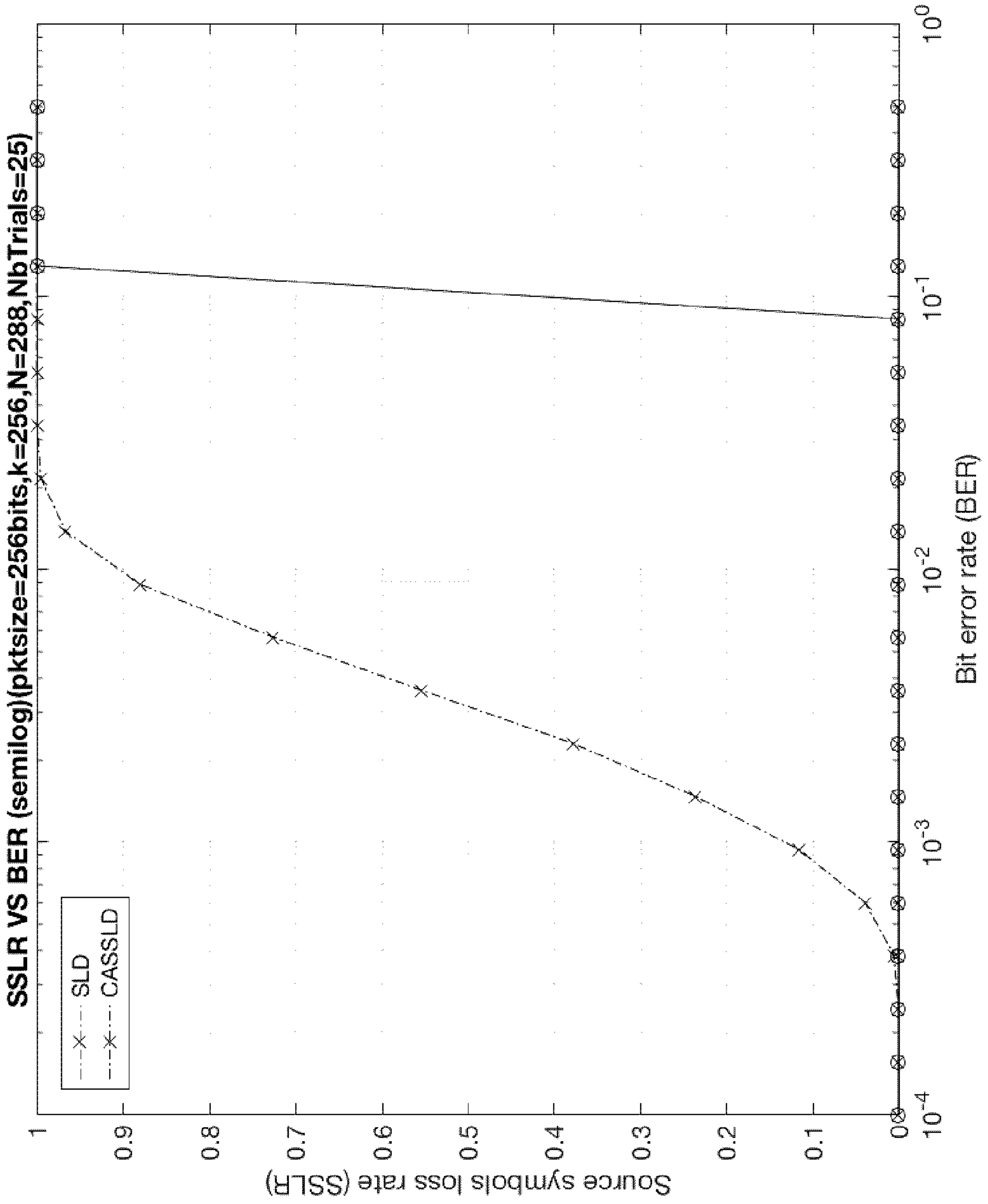
FIG. 28B presents a graph of a source symbol loss rate (SSLR) as a function of a bit error rate (BER) for a T=256 bits, k=256, N=288 configuration on a semi-log scale, in order to compare state-of-the-art methods with the method of FIGS. 25A and 25B using the system of FIG. 27A, according to one embodiment.
Figure 28C:
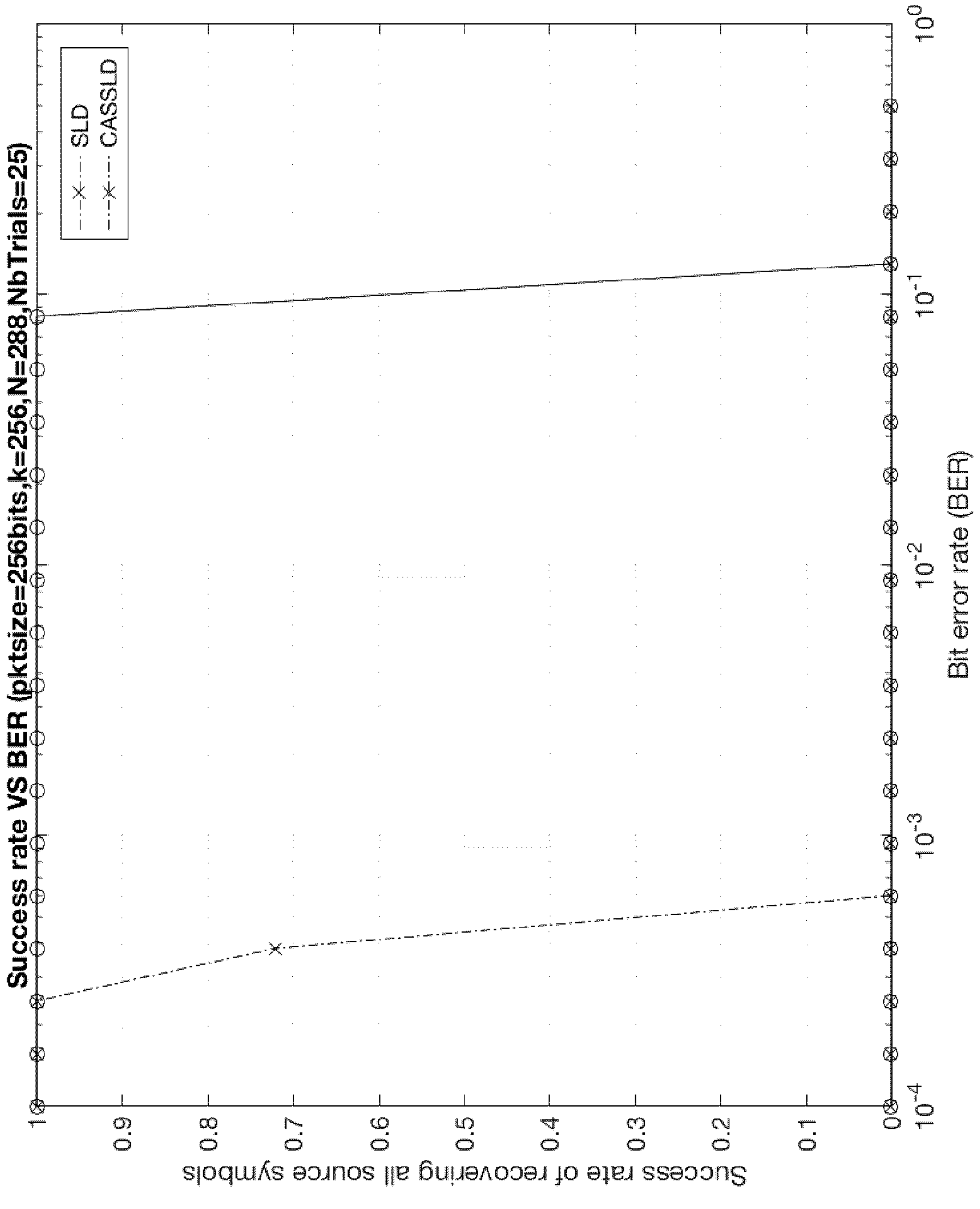
FIG. 28C presents a graph of a success rate of recovering all source symbols (i.e. success rate of recovering each group of k source symbols from the associated received encoded symbols) as a function of a bit error rate (BER) for a T=256 bits, k=256, N=288 configuration on a semi-log scale, in order to compare state-of-the-art methods with the method of FIGS. 25A and 25B using the system of FIG. 27A, according to one embodiment.

Presented in FIGS. 28A and 28B are graphs indicating source symbol loss rate (SSLR) according to various Bit Error Rates (BER) for a given symbol size T, given number of source symbols k and given number of encoded symbols N based on a given number of trials. For instance, FIG. 28A presents a graph of source symbol loss rate (SSLR) as a function of the bit error rate (BER) for a T=256 bits, k=256, N=288 configuration on a log-log scale for state-of-the-art methods and the proposed method. Specifically, we can observe the SSLR with symbol level approach with the proposed method. FIG. 28B presents the same information on a semi-log scale. FIG. 28C presents a graph of the success rate of recovering all source symbols (i.e. success rate of recovering each group of k source symbols from the associated received encoded symbols) as a function of a bit error rate (BER) for the same configuration and methods. It can be observed that the proposed bit level decoding method clearly outperforms the symbol level method. We can observe for instance in FIG. 28B, that while the symbol level method experiences SSLR of 90% (around a BER of $10^{-2}$); the proposed checksum-aided bit level method provides an SSLR that is zero. We can observe in the simulated cases that the proposed checksum-aided bit level method provides an SSLR that is nearly zero at bit error rates causing the other method to experience significant packet loss rates.

It shall be recognized that the decoding method 2460 of FIGS. 24C, 24D and 24E can be implemented by a computing device such as a receiver device of a communication system.

It shall be recognized that the modules of the decoding system 2700 presented in FIG. 27A or the modules of the decoding system 2800 presented in FIG. 27B can be stored on a non-transitory computer-readable media and can be executed by a computing device.

It shall further be recognized that the modules of the decoding system 2700 presented in FIG. 27A or the modules of the decoding system 2800 presented in FIG. 27B can be stored on a non-transitory computer-readable media and can be executed by a receiver device of a communication system.

Moreover, it should be noted that although the described embodiments relate to fountain coding, the present is also applicable to other processes of generating encoded symbols from linear combinations of source symbols as exemplified in the presented matrix equations. Furthermore, an Encoding Symbol ID (ESI) refers to any information expressing how an encoded symbol was generated from the source symbols, including information about which input symbols were used to generate a specific encoded symbol (e.g. the mask or vector ($a_{i1}$, . . . , $a_{ik}$) corresponding to an encoded symbol $y_i$ as described earlier).

Also, it should be noted that the system of linear equations could be replaced by any set of suitable linear relationships between input signals (e.g. the source symbols) and output signals (e.g. the encoded symbols), without departing from the scope of the present application. Although a matrix form has been exemplified in the present application, the decoding is typically not performed using matrix inversion but rather by other simpler decoding techniques such as Gaussian elimination, belief propagation (also called peeling decoder or greedy decoder), inactivation, or by means of a schedule (but not limited to them). Generating a system of linear equations in that context means establishing a set of linear relationships between input signals and output signals that will enable various decoding approaches, not limited to the ones mentioned in the embodiments of the present application.

Figure 27C:
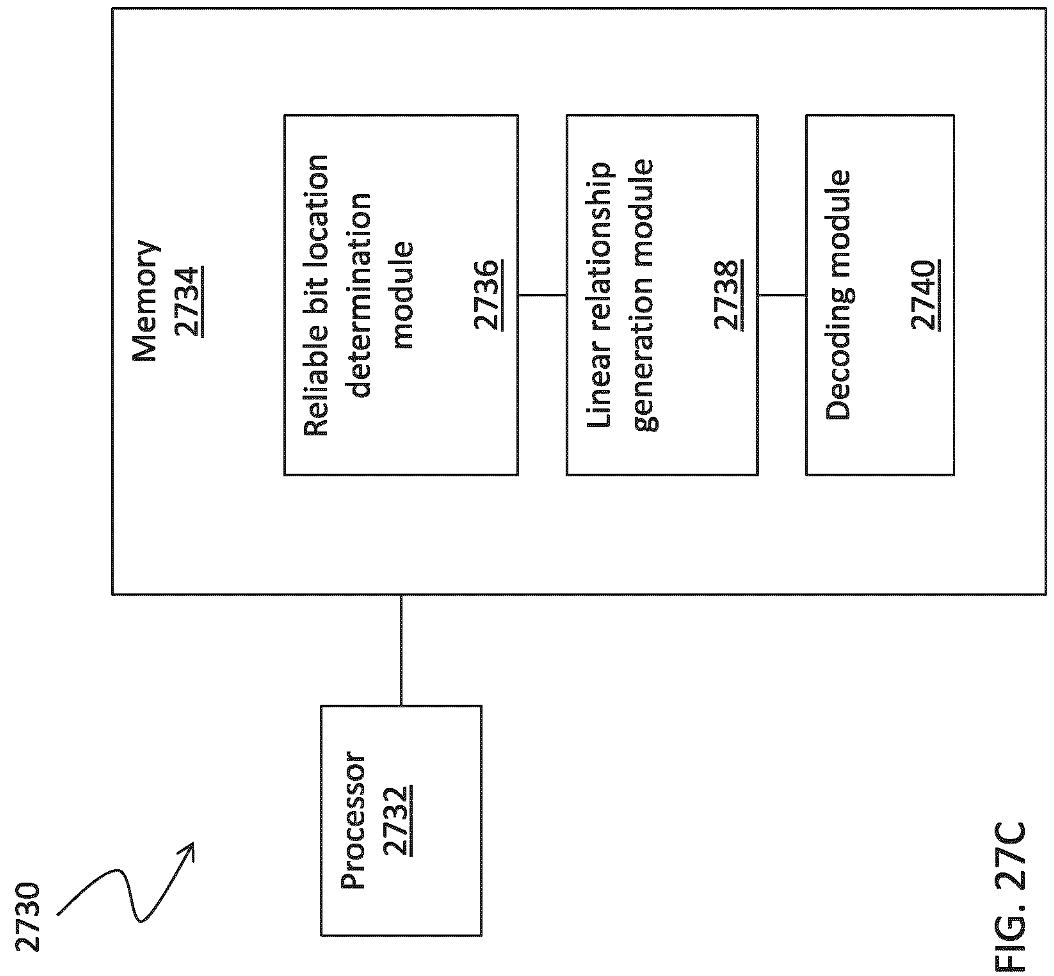
FIG. 27C presents a block diagram of a computing device having a bit level decoding system for fountain codes, according to one embodiment.

According to one aspect, as presented in FIG. 27C, there is a computing device 2730 having a processor 2732 and a memory 2734 coupled to the processor 2732. The memory has stored thereon a reliable bit location determination module 2736, a linear relationship generation module 2738 and a decoding module 2740. The reliable bit location determination module 2736 is adapted to determine bit locations having reliable bit values in each of the received encoded symbols. The linear relationship generation module 2738 is adapted to generate a system of linear relationships for each of the bit positions of the encoded symbols according to its reliable bit values at a corresponding bit position and according to the associated ESIs. The decoding module 2740 is adapted to recover the source symbols from the received encoded symbols with at least two systems of linear equations and associated reliable bit values.

According to yet another aspect, there is a computing device having a Field-Programmable Gate Array (FPGA) or any suitable dedicated hardware configured to determine bit locations having reliable bit values in each of the received encoded symbols. The FPGA is also configured to generate a system of linear relationships for each of the bit positions of the encoded symbols according to its reliable bit values at a corresponding bit position and according to the associated ESIs. The FPGA is further configured to recover the source symbols from the received encoded symbols with at least two systems of linear equations and associated reliable bit values.

Figure 27D:
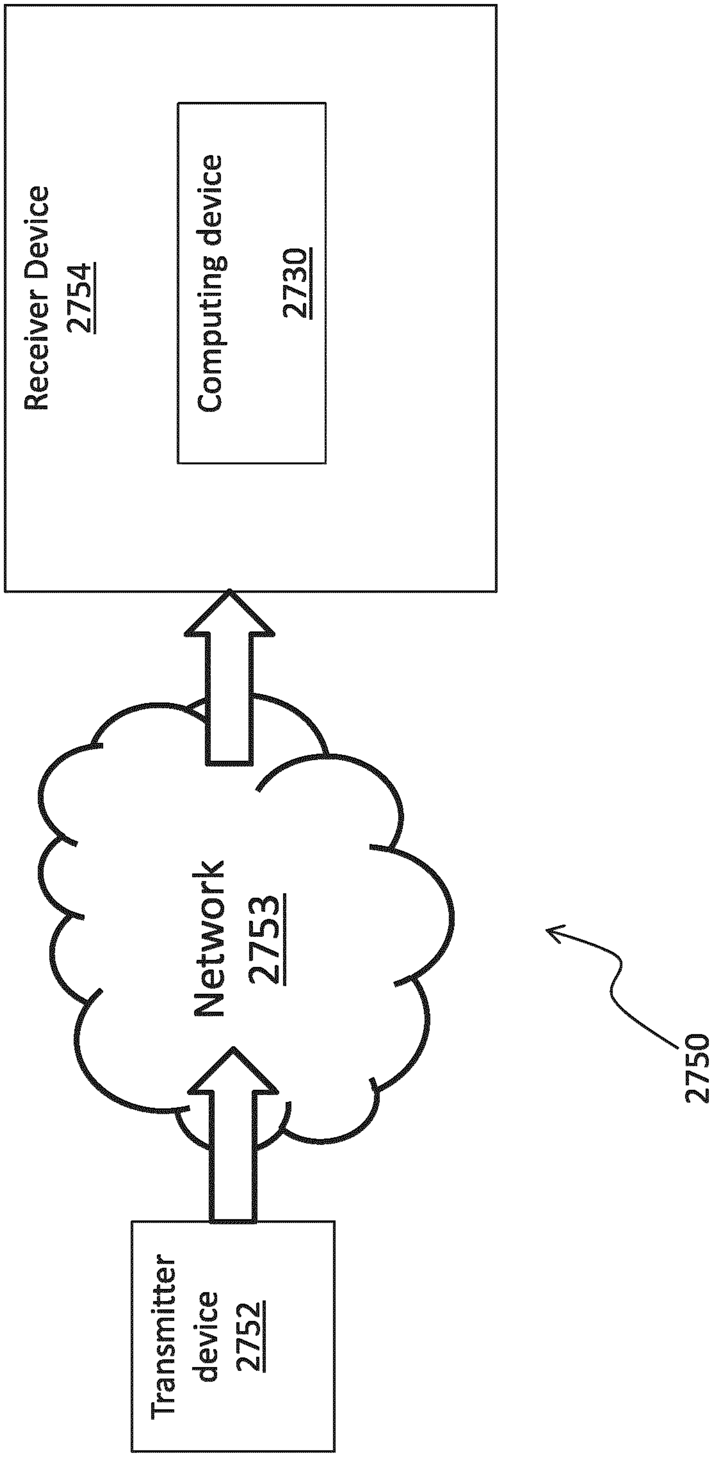
FIG. 27D presents a block diagram of a communication network having a transmitter and a receiver, the receiver having the computing device of FIG. 27C, according to one embodiment.

According to yet another aspect, as presented in FIG. 27D, there is a communication system 2750 for transceiving a plurality of fountain encoded symbols. The communication system 2750 has a transmitter device 2752 and a receiver device 2754. The transmitter device 2752 is adapted to generate fountain encoded symbols from source symbols using fountain coding and is further adapted to transmit the fountain encoded symbols via a network 2753. The receiver device 2754 is adapted to receive from the network received encoded symbols corresponding to the fountain encoded symbols. The receiver device 2754 is further adapted to determine that at least some of the received encoded symbols have at least one bit error such that the source symbols could not be readily decoded from the received encoded symbols. The receiver device 2754 has the computing device 2730 of FIG. 27C and is adapted to recover the source symbols from the received encoded symbols.

U.S. provisional patent application No. 62/385,475 is incorporated herein by reference.

In provisional patent application No. 62/472,124 which is incorporated herein by reference there is presented a MATLAB source code for simulating the method 2500, according to one embodiment.

The invention claimed is:

1. A computer-implemented method for generating potential bit error position data for correcting an error in a received packet, the method comprising:

calculating a checksum value of the received packet, the checksum value corresponding to a predefined checksum pattern type (CPT);

verifying if the checksum value is indicative of at least one bit error in the received packet;

identifying the predefined CPT according to the checksum value, each one of said CPT grouping together a number of checksum values having bit patterns characteristic of each one of said CPT; and determining at least one bit error event (BEE) according to the predefined CPT for correcting an error in the received packet.

2. The method of claim 1, further comprising identifying at least one potential error location in the received packet, according to the at least one BEE.

3. A computer-implemented method for correcting an error in a received packet, the method comprising:

calculating a checksum value of the received packet, the checksum value corresponding to a predefined checksum pattern type (CPT);

verifying if the checksum value is indicative of at least one bit error in the received packet;

identifying the predefined CPT according to the checksum value;

determining at least one bit error event (BEE) according to the predefined CPT for correcting an error in the received packet; and generating at least one candidate bitstream according to the at least one BEE.

4. The method of claim 3, further comprising validating if the at least one candidate bitstream is decodable.

5. The method of claim 4, further comprising correcting the received packet according to the at least one candidate bitstream and according to the validating.

6. A computer-implemented method for correcting an error in a received packet, the method comprising:

calculating a checksum value of the received packet, the checksum value corresponding to a predefined checksum pattern type (CPT);

verifying if the checksum value is indicative of at least one bit error in the received packet;

identifying the predefined CPT according to the checksum value;

determining at least one bit error event (BEE) according to the predefined CPT for correcting an error in the received packet; and ordering the at least one BEE according to a likelihood of occurrence depending on the determined predefined CPT and generating at least one candidate bitstream according to the ordering of the at least one BEE.

7. The method of claim 5, wherein the correcting the received packet further comprises determining a best candidate bitstream from the at least one candidate bitstream and correcting the received packet according to the best candidate bitstream.

8. The method of claim 7, wherein the best candidate bitstream is determined according to at least one predetermined criterion.

9. A computer-implemented method for generating potential bit error position data for correcting an error in a received packet, the method comprising:

calculating a checksum value of the received packet, the checksum value corresponding to a predefined checksum pattern type (CPT);

verifying if the checksum value is indicative of at least one bit error in the received packet, wherein the verifying further comprises determining if the received packet is decodable and evaluating if a number of blocks in the received packet is correct;

identifying the predefined CPT according to the checksum value; and determining at least one bit error event (BEE) according to the predefined CPT for correcting an error in the received packet.

10. The method of claim 5 wherein the validating further comprises determining if the at least one candidate bitstream is decodable and evaluating if a number of blocks in the candidate bitstream is correct.

11. A computing device for decoding a received packet, the computing device comprising:

a processor;

a memory coupled to the processor, the memory comprising computer readable instructions executable by the processor for performing the method of claim 1.

12. A computing device for decoding a received packet, the computing device comprising hardware having logic adapted to perform the method of claim 1.

13. A communication system for transceiving packet data, the system comprising:

a transmitter device for transmitting an original packet data;

a receiver device for receiving a received packet data corresponding to the original packet data, the receiver device being adapted to perform the method of claim 1.

14. A computing device for decoding a received packet, the computing device comprising:

a processor;

a memory coupled to the processor, the memory comprising computer readable instructions executable by the processor for performing the method of claim 3.

15. A computing device for decoding a received packet, the computing device comprising:

a processor;

a memory coupled to the processor, the memory comprising computer readable instructions executable by the processor for performing the method of claim 6.

16. A computing device for decoding a received packet, the computing device comprising:

a processor;

a memory coupled to the processor, the memory comprising computer readable instructions executable by the processor for performing the method of claim 9.

* * * * *